(12) United States Patent
Tanaka et al.

(10) Patent No.: US 7,910,914 B2
(45) Date of Patent: Mar. 22, 2011

(54) SEMICONDUCTOR MEMORY AND METHOD FOR MANUFACTURING THE SAME

(75) Inventors: Hiroyasu Tanaka, Tokyo (JP); Ryota Katsumata, Yokohama (JP); Hideaki Aochi, Kawasaki (JP); Masaru Kidoh, Kawasaki (JP); Masaru Kito, Yokohama (JP); Mitsuru Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 520 days.

(21) Appl. No.: 12/018,486

(22) Filed: Jan. 23, 2008

(65) Prior Publication Data

US 2008/0175032 A1 Jul. 24, 2008

(30) Foreign Application Priority Data

Jan. 23, 2007 (JP) ................................. 2007-013163

(51) Int. Cl.
*H01L 45/00* (2006.01)
(52) U.S. Cl. .................................... 257/5; 257/E45.002
(58) Field of Classification Search .......................... None
See application file for complete search history.

(56) References Cited

U.S. PATENT DOCUMENTS

| 5,599,724 A | 2/1997 | Yoshida |
| 5,707,885 A | 1/1998 | Lim |
| 2004/0124407 A1 * | 7/2004 | Kozicki et al. .................... 257/9 |
| 2004/0130939 A1 * | 7/2004 | Morikawa ...................... 365/158 |
| 2004/0213044 A1 * | 10/2004 | Seyyedy et al. ................ 365/173 |
| 2004/0245547 A1 | 12/2004 | Stipe |
| 2005/0035429 A1 * | 2/2005 | Yeh et al. ........................ 257/529 |
| 2005/0201182 A1 * | 9/2005 | Osada et al. ............. 365/230.03 |
| 2005/0243633 A1 * | 11/2005 | Symanczyk .................. 365/226 |
| 2006/0050547 A1 * | 3/2006 | Liaw et al. ..................... 365/148 |
| 2006/0197115 A1 * | 9/2006 | Toda ............................. 257/248 |
| 2008/0217600 A1 * | 9/2008 | Gidon ................................ 257/4 |

FOREIGN PATENT DOCUMENTS

JP 2003-78044 3/2003

OTHER PUBLICATIONS

U.S. Appl. No. 12/562,402, filed Sep. 18, 2009, Tanaka, et al.
U.S. Appl. No. 12/132,181, filed Jun. 3, 2008, Tanaka, et al.
Tetsuo Endoh, et al., "Novel Ultrahigh-Density Flash Memory With a Stacked-Surrounding Gate Transistor (S-SGT) Structured Cell", IEEE Transactions on Electron Devices, vol. 50, No. 4, Apr. 2003, pp. 945-951.
U.S. Appl. No. 12/408,249, filed Mar. 20, 2009, Tanaka, et al.
U.S. Appl. No. 12/504,959, filed Jul. 17, 2009, Tanaka, et al.

\* cited by examiner

*Primary Examiner* — Benjamin P Sandvik
(74) *Attorney, Agent, or Firm* — Oblon, Spivak, McClelland Maier & Neustadt, L.L.P.

(57) ABSTRACT

According to an aspect of the present invention, there is provided a nonvolatile semiconductor memory including: a plurality of memory devices each having: a resistance change element, and a diode connected serially to the resistance change element; and a source conductive layer spreading two-dimensionally to be connected to one ends of the plurality of memory devices.

18 Claims, 91 Drawing Sheets

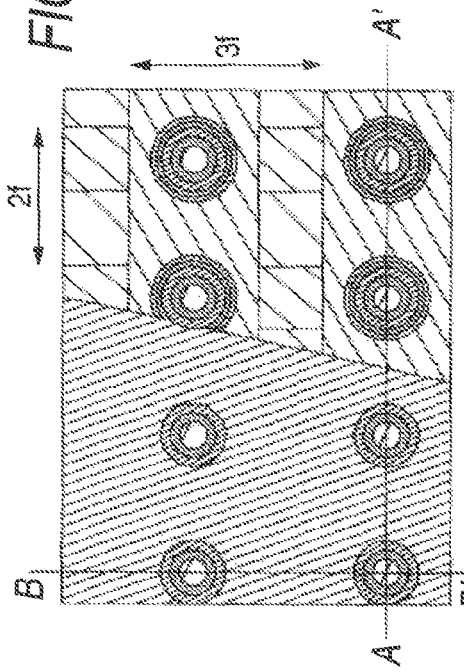
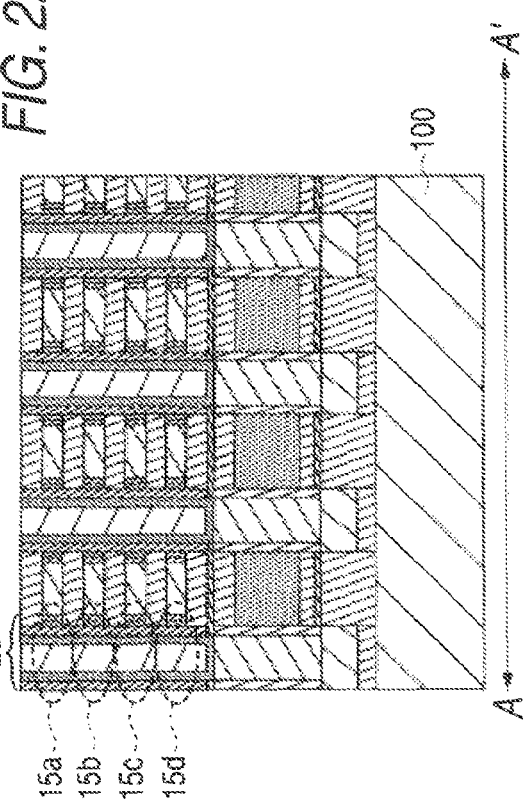
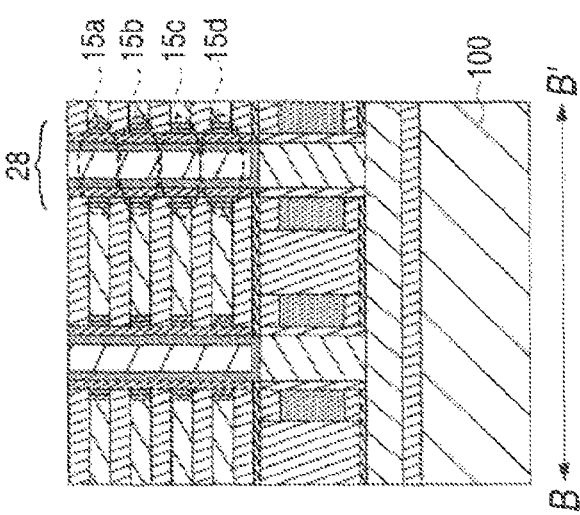
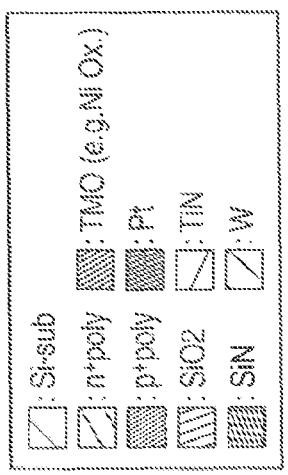
FIG. 2A
FIG. 2B
FIG. 2C

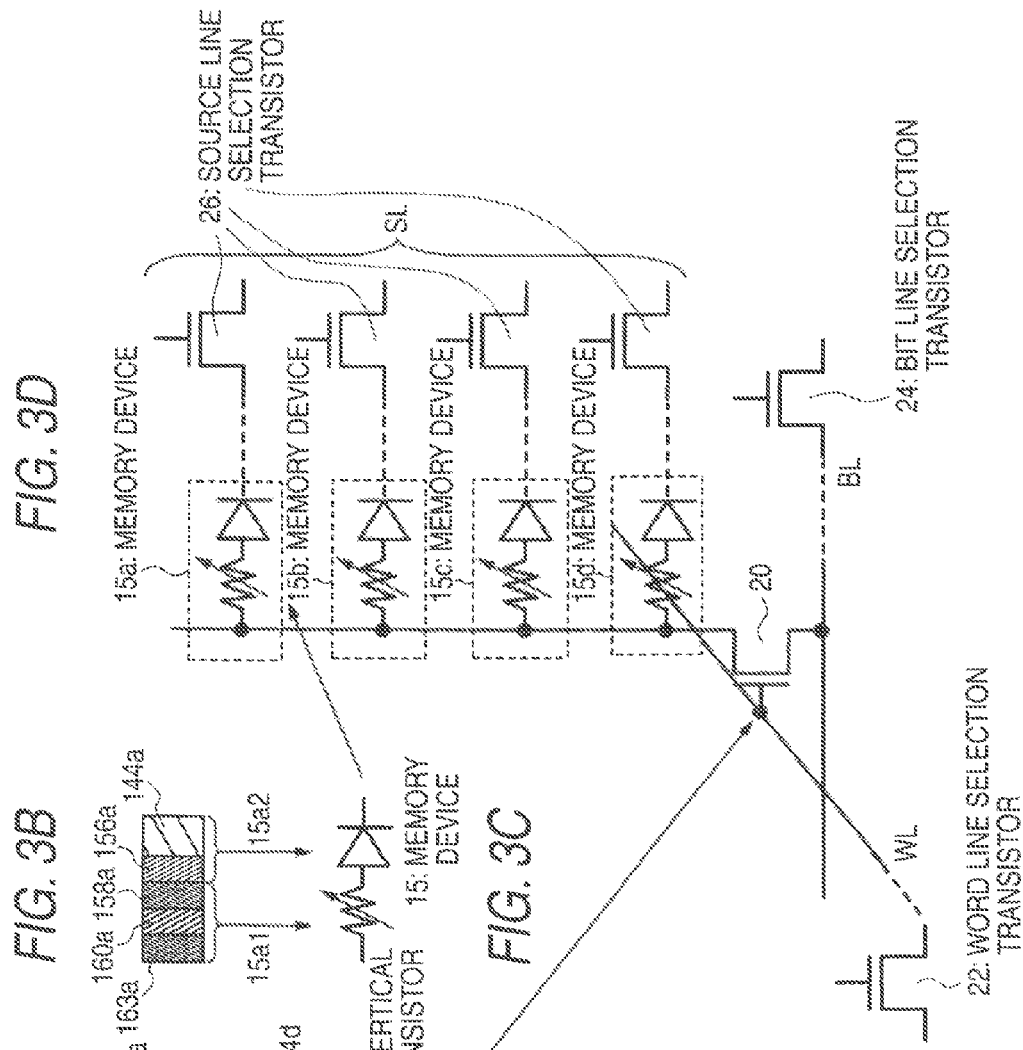

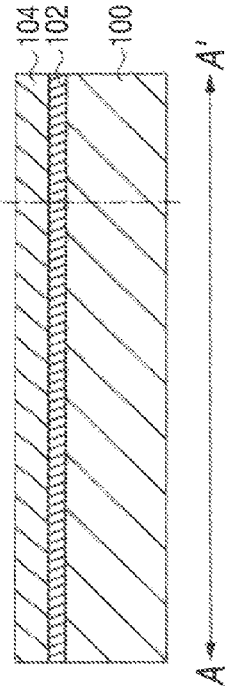
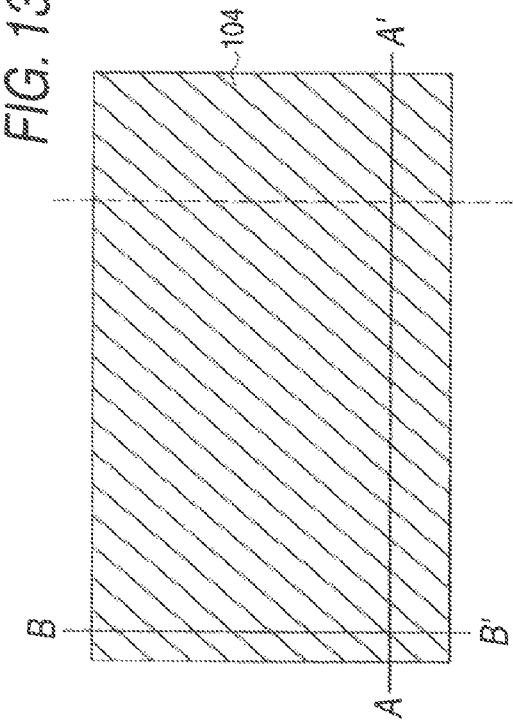
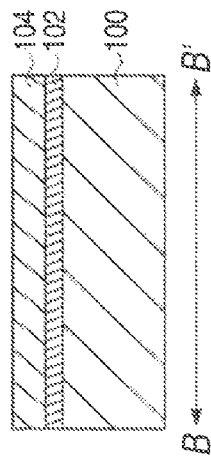
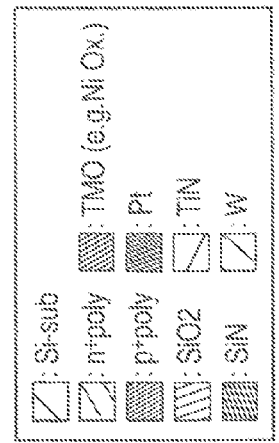

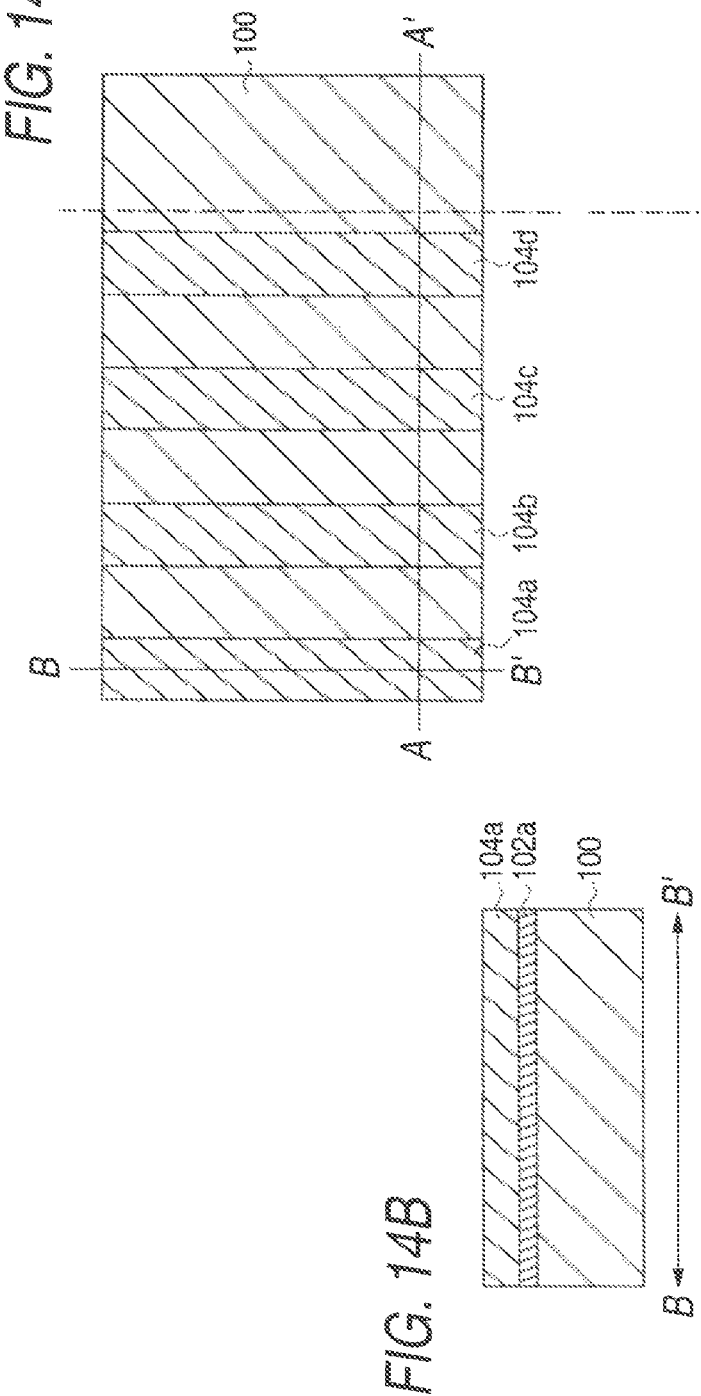

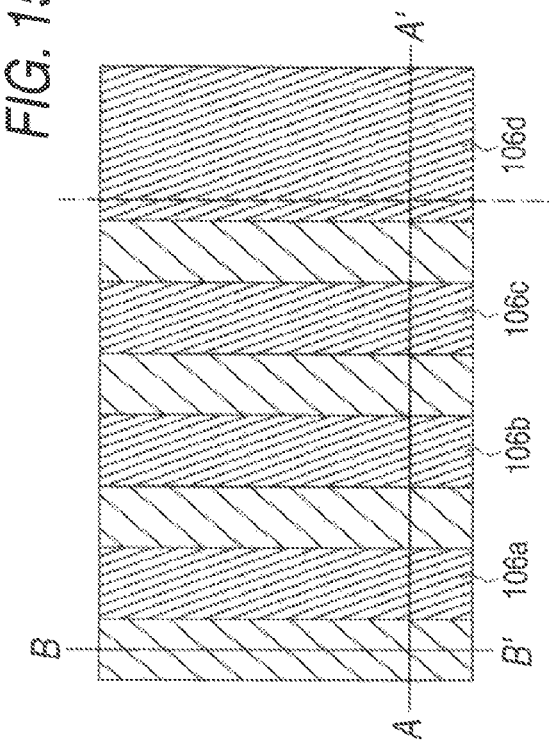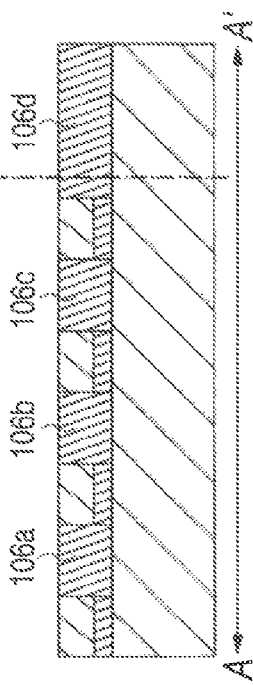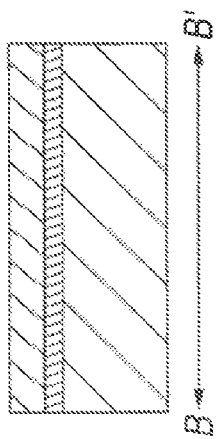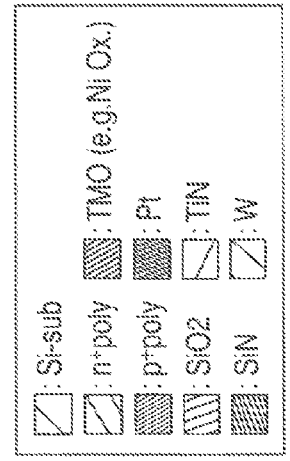

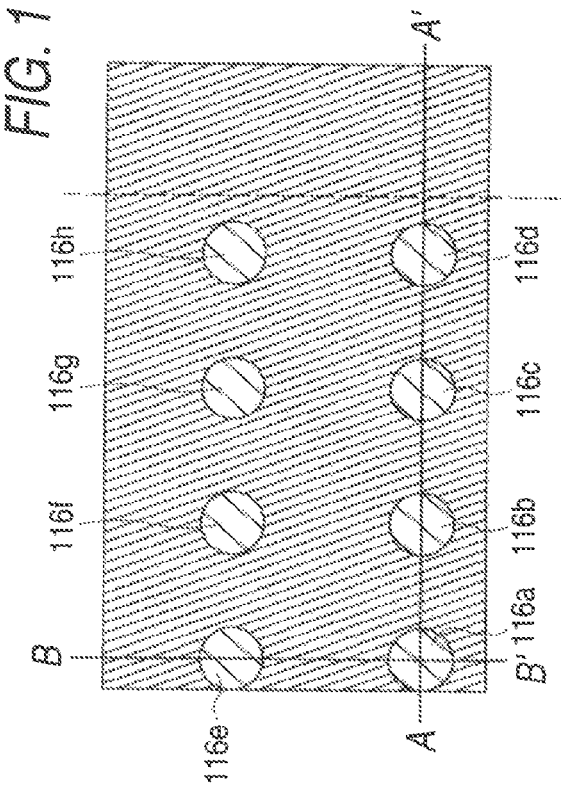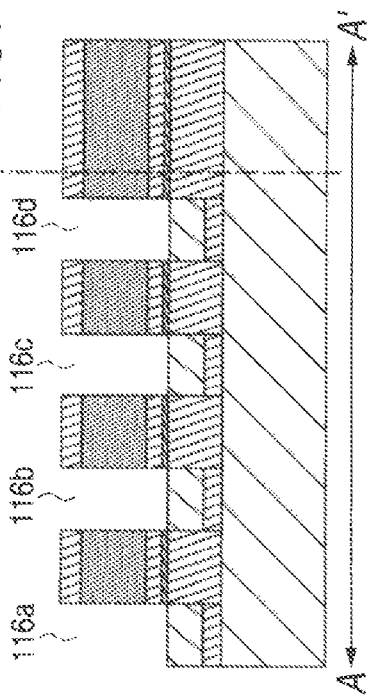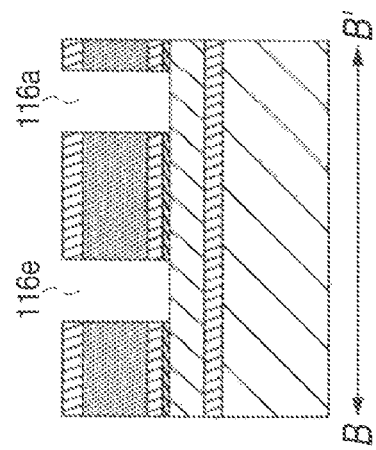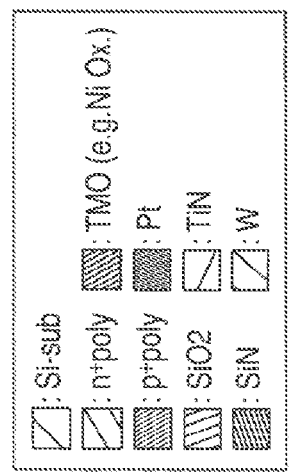

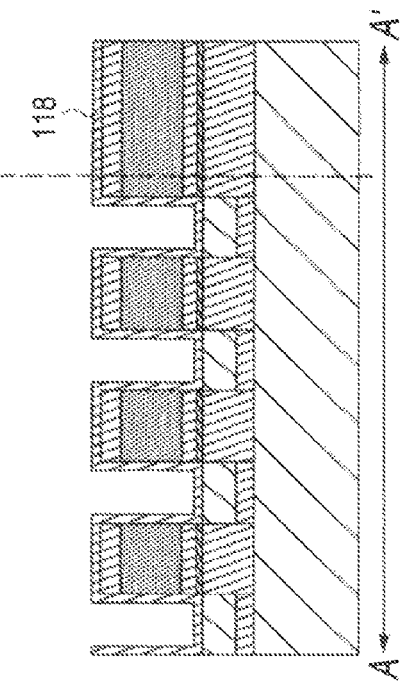
FIG. 18C
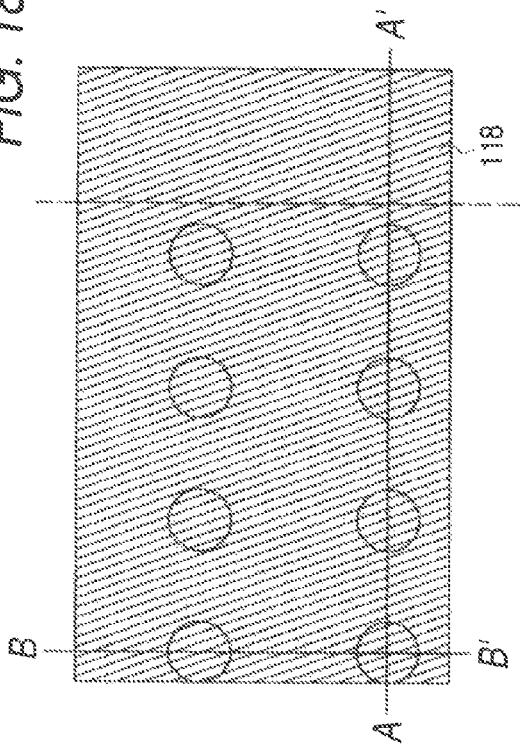
FIG. 18A
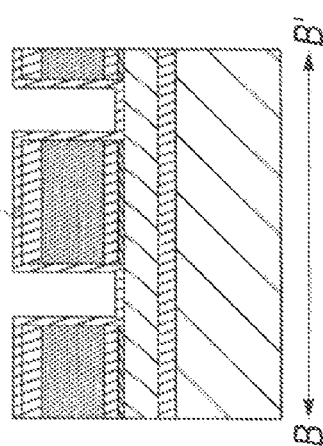
FIG. 18B
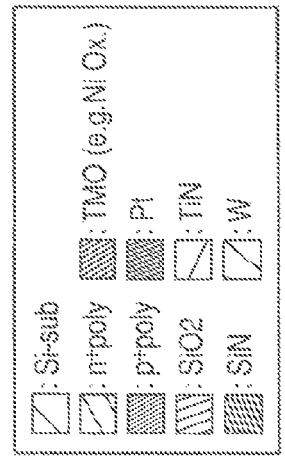

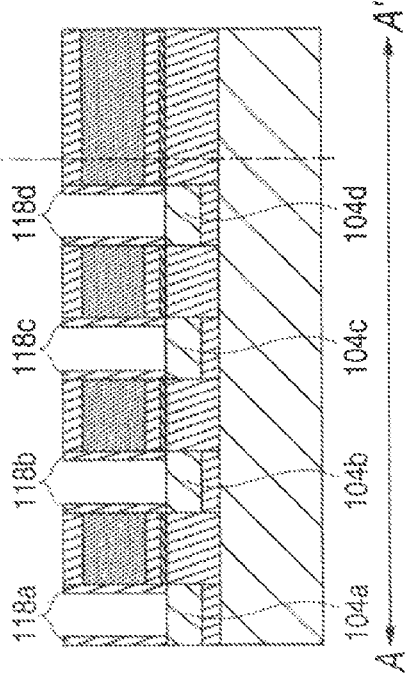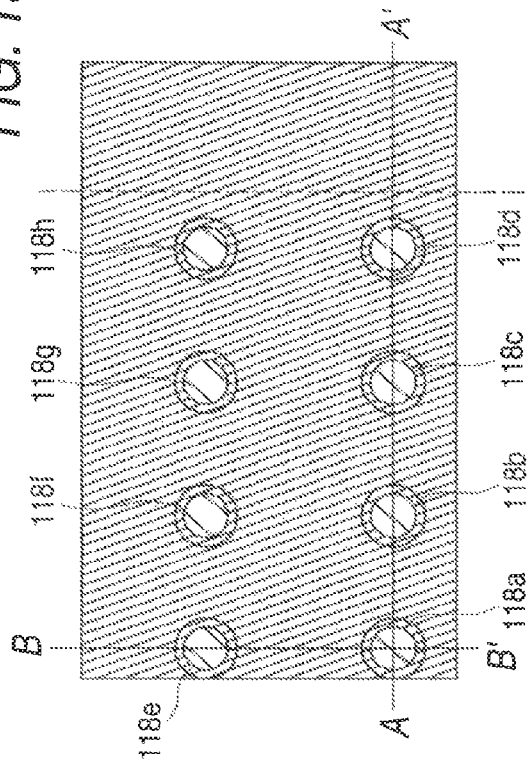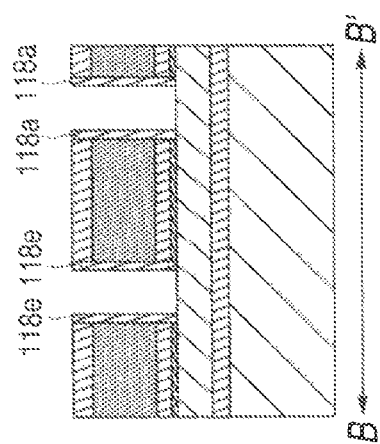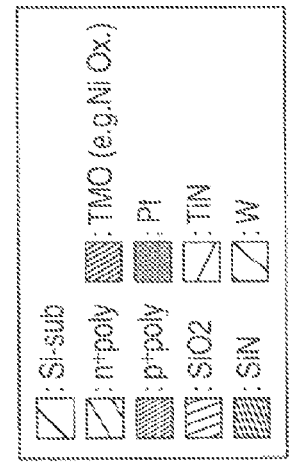

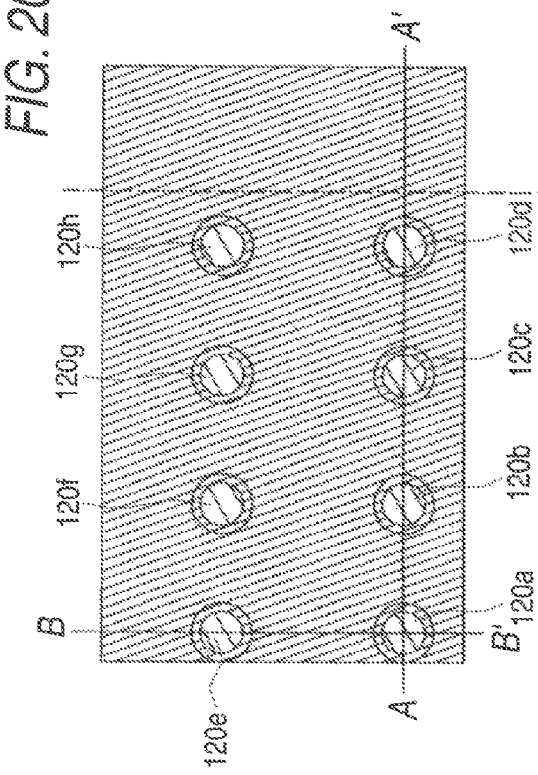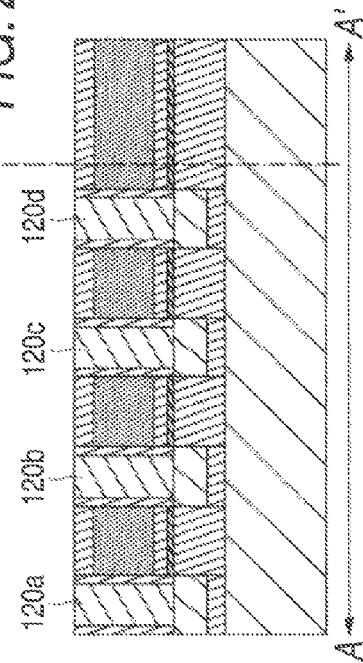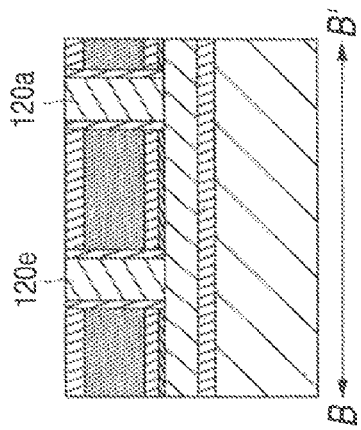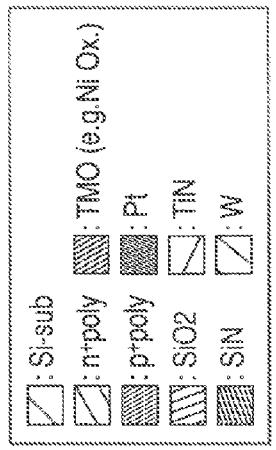

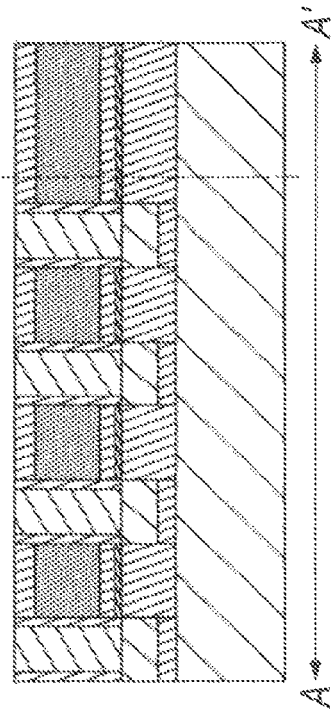
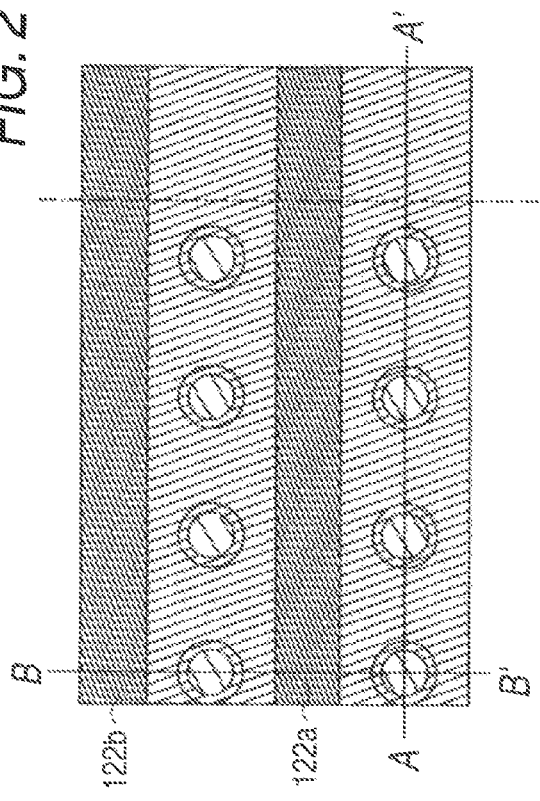
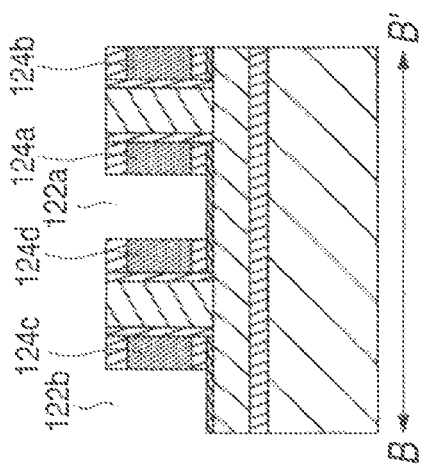
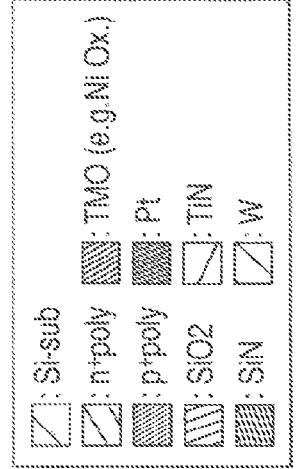

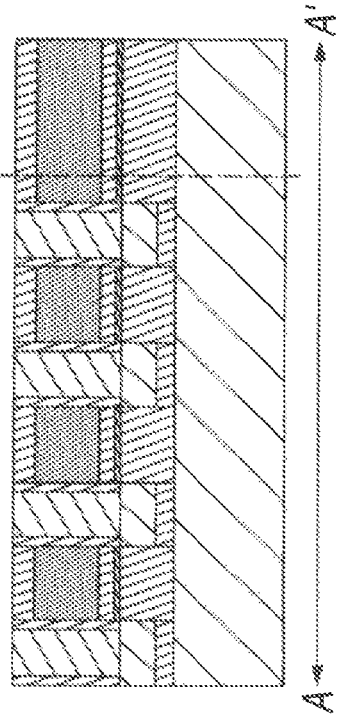
FIG. 22A
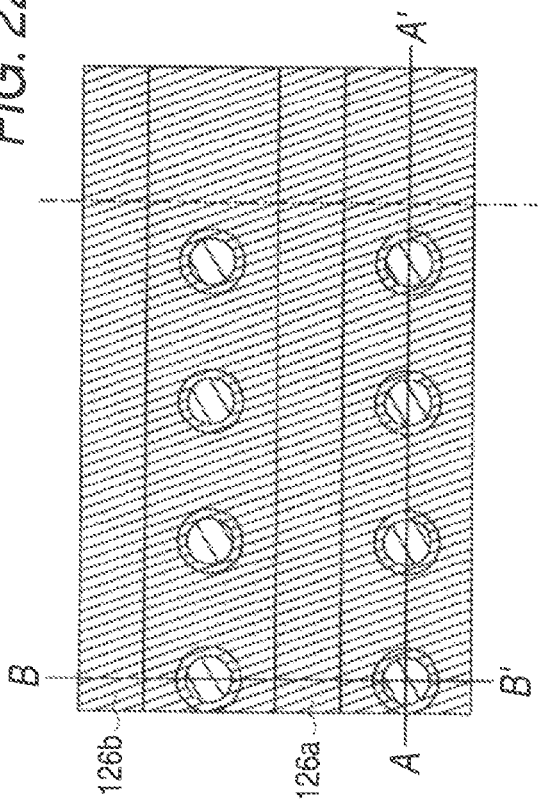
FIG. 22C
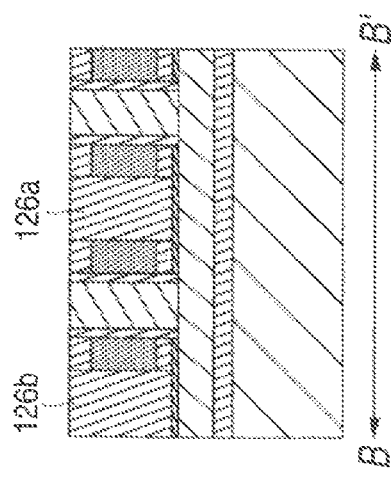
FIG. 22B
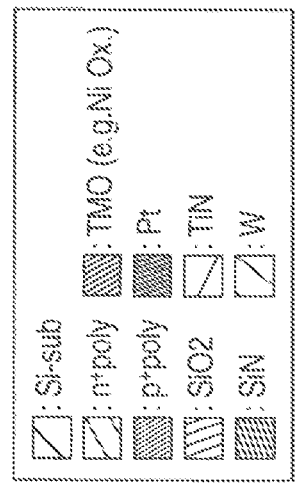

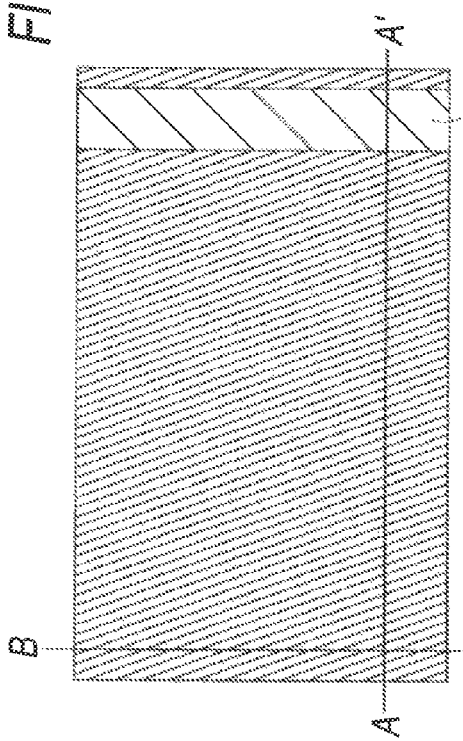
FIG. 24C
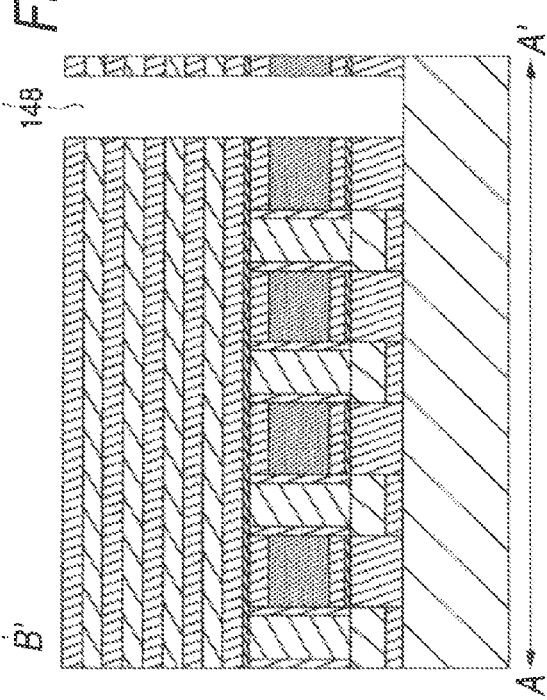
FIG. 24A
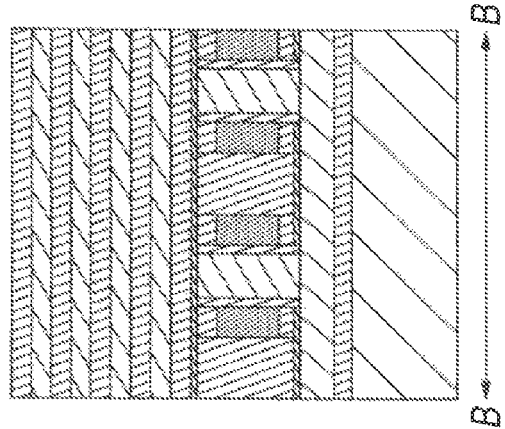
FIG. 24B
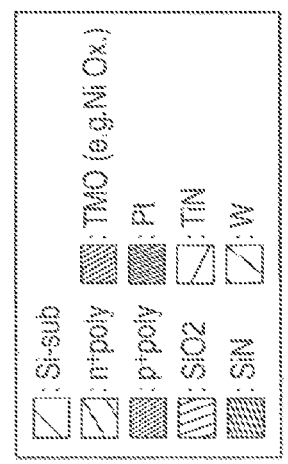

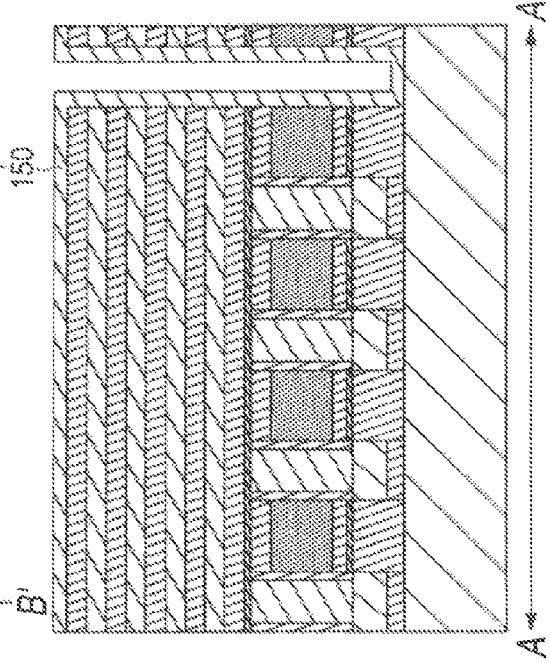
FIG. 25A
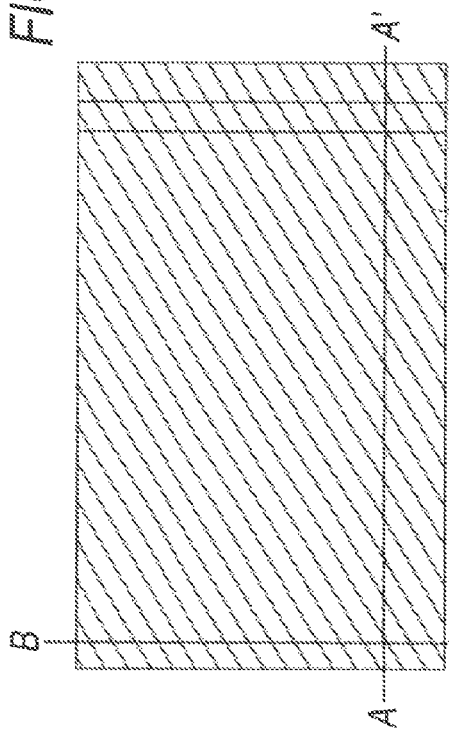
FIG. 25C
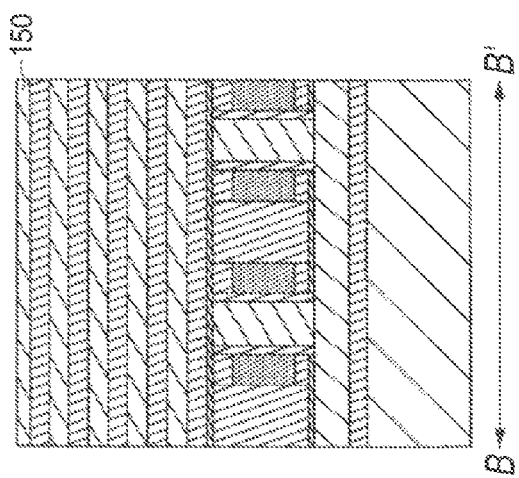
FIG. 25B
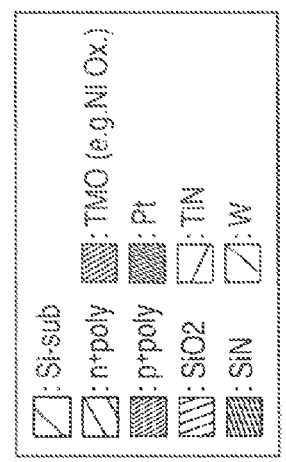

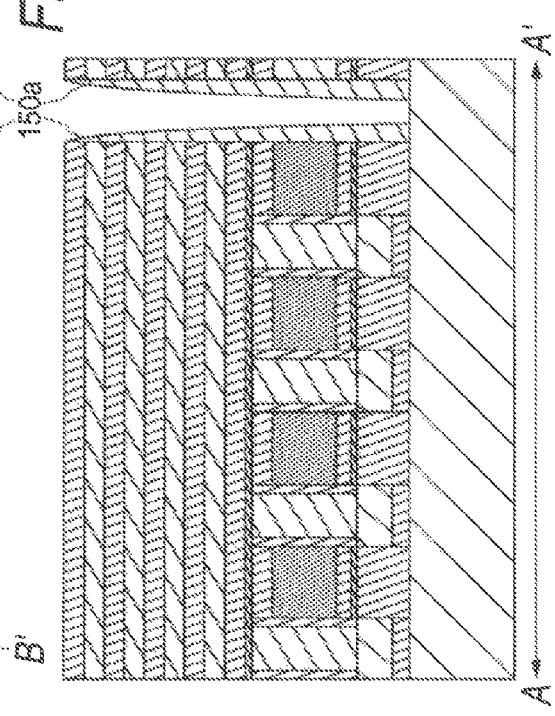
FIG. 26A
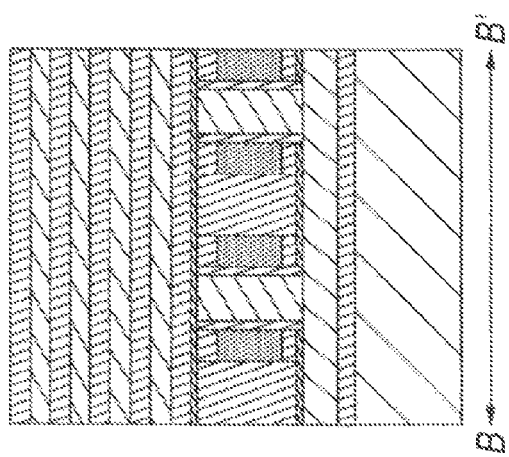
FIG. 26B
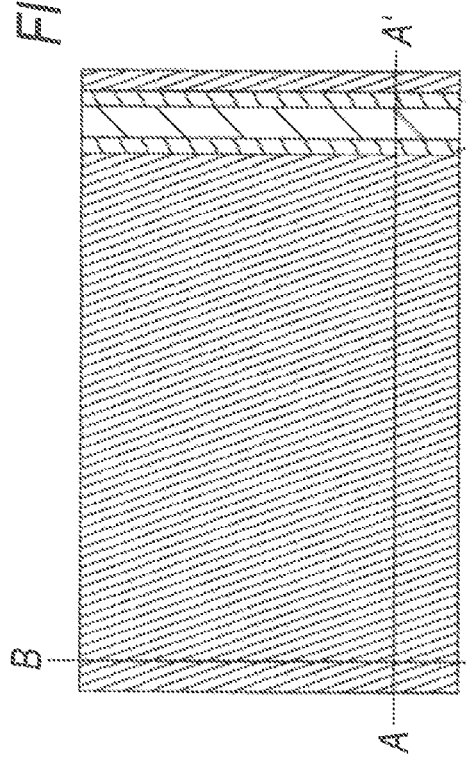
FIG. 26C
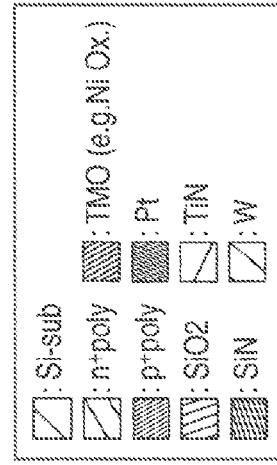

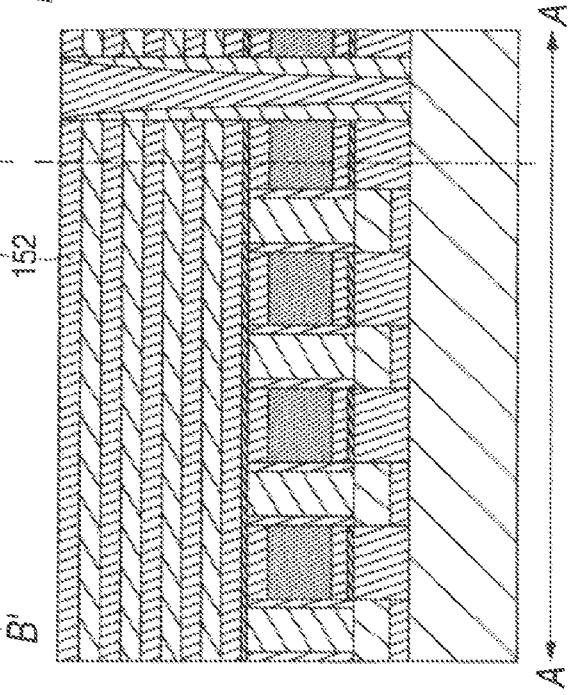
FIG. 27A
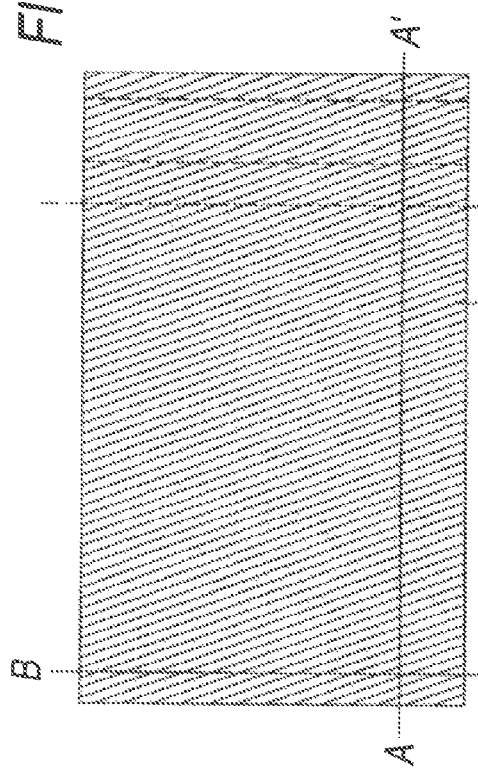
FIG. 27C
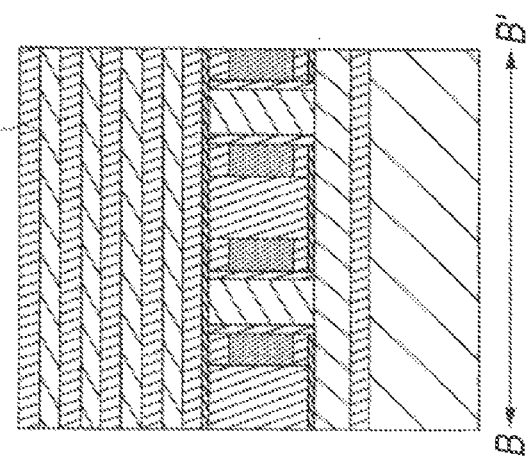
FIG. 27B
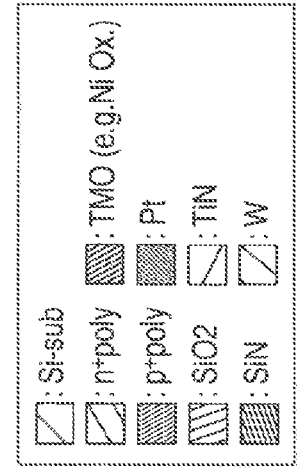

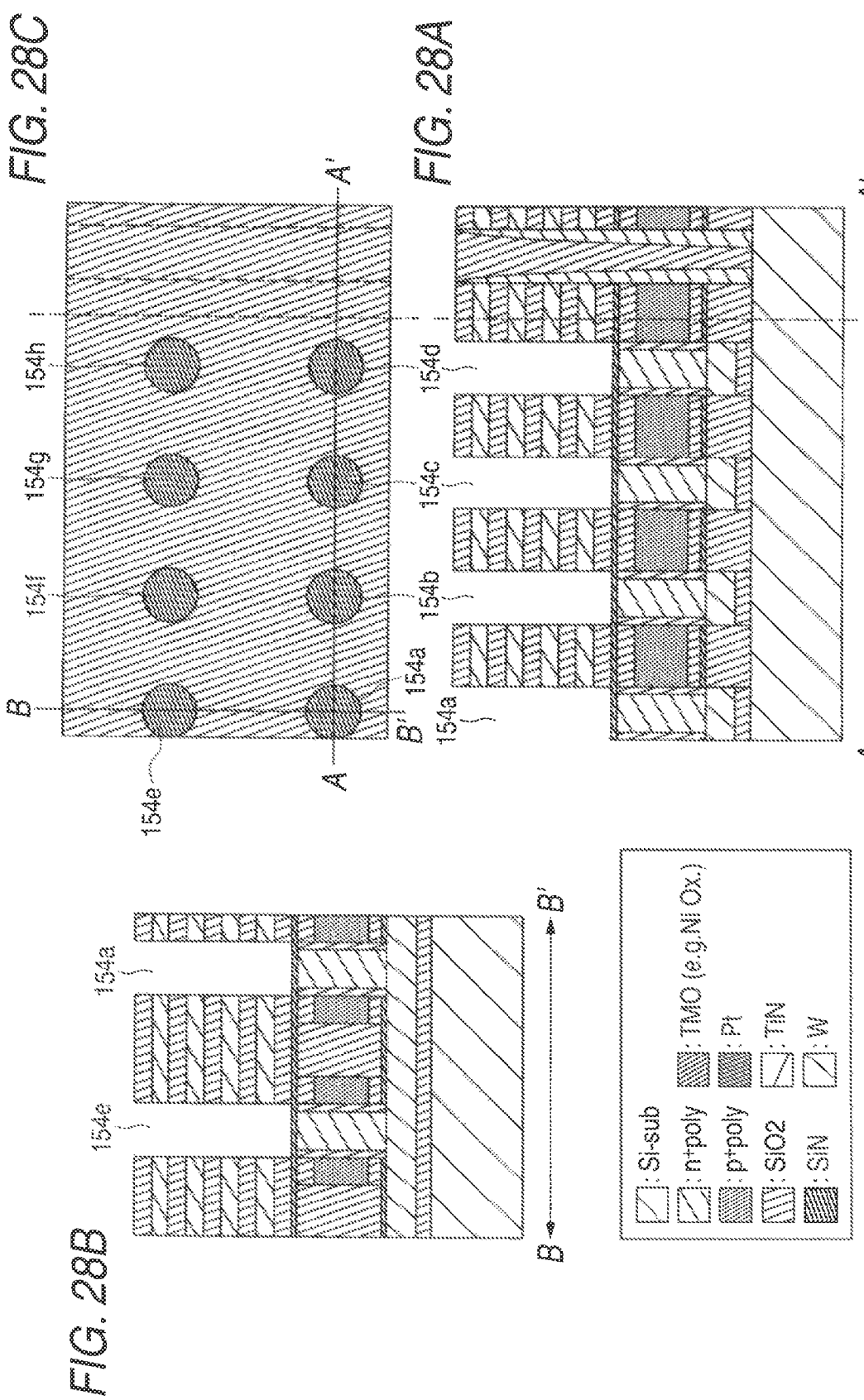

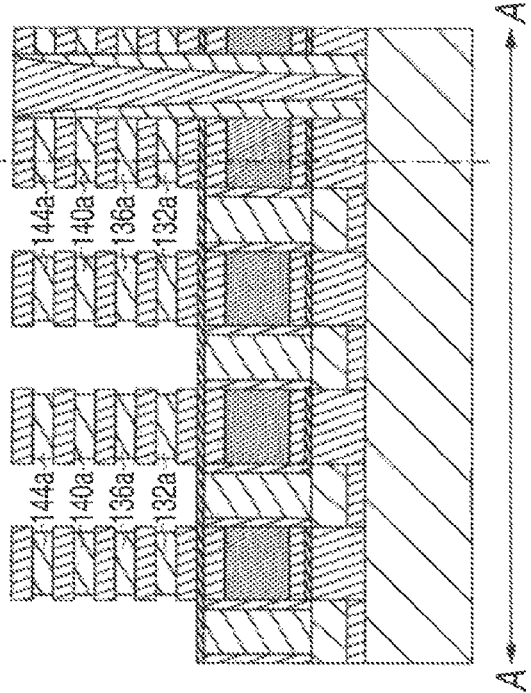
FIG. 29A
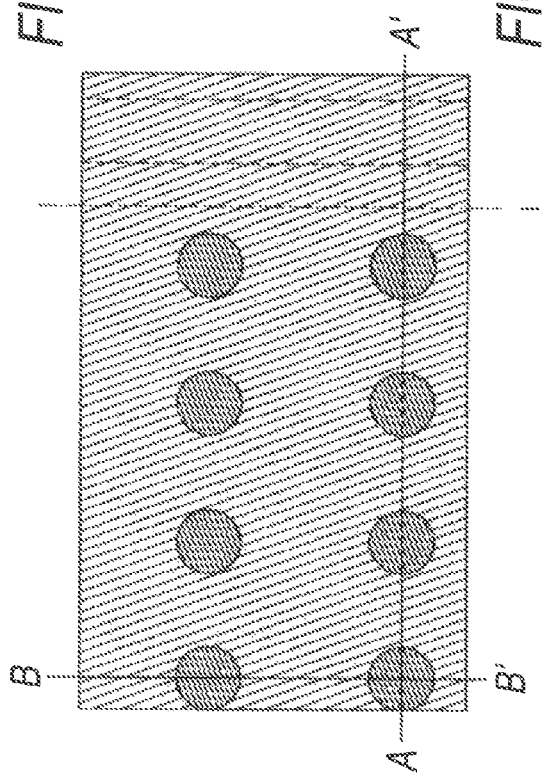
FIG. 29C
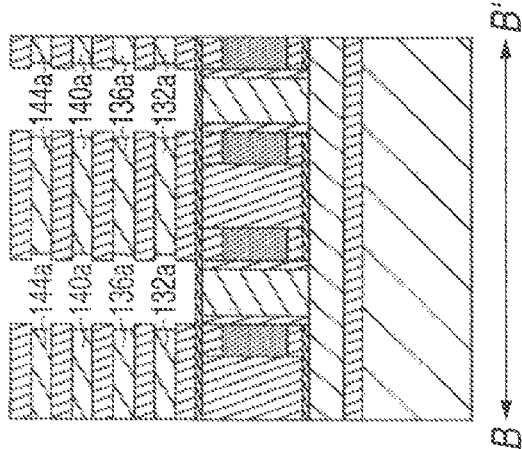
FIG. 29B
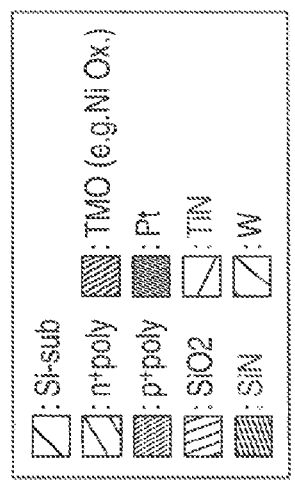

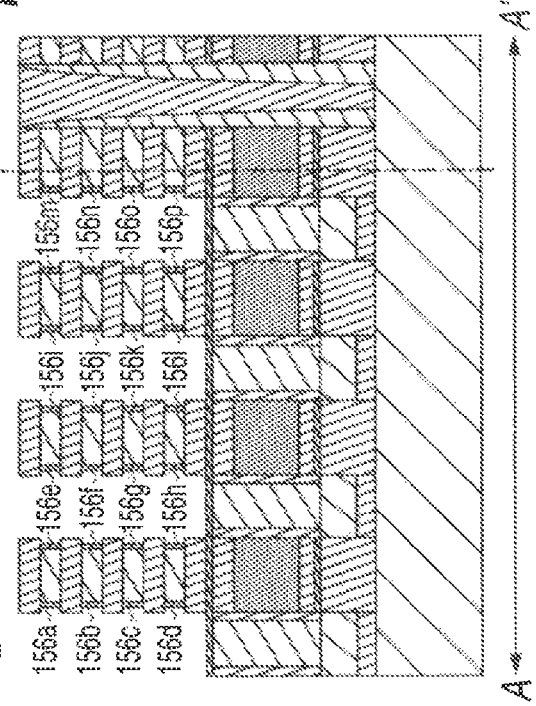
FIG. 30C
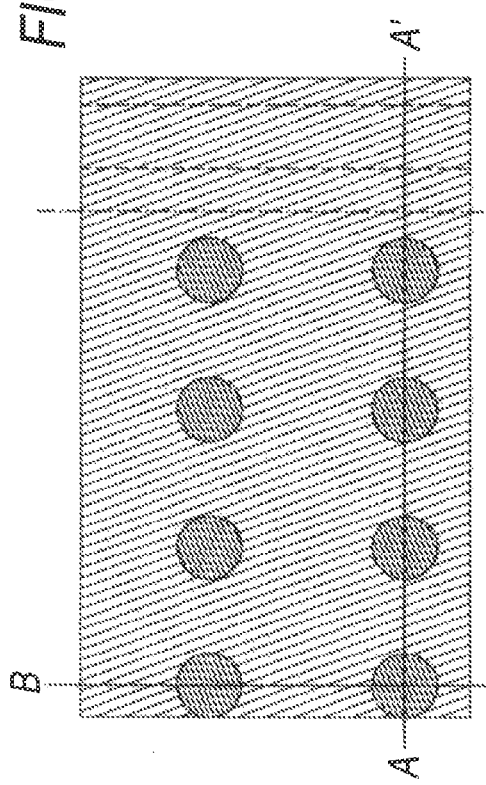
FIG. 30A
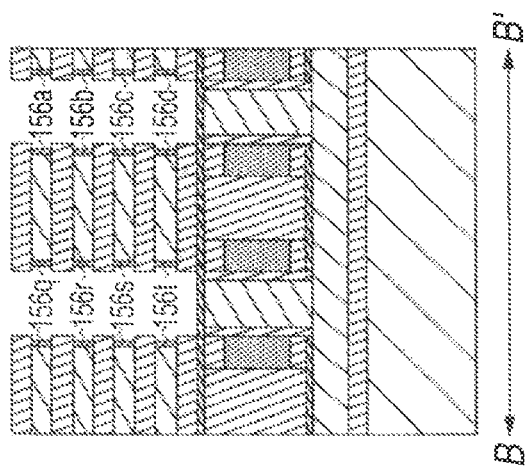
FIG. 30B
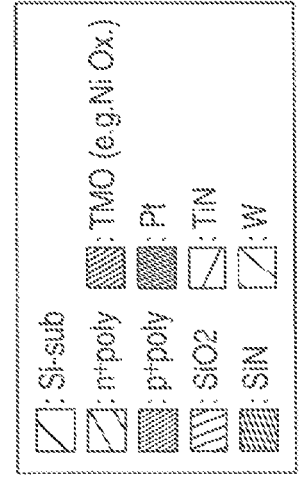

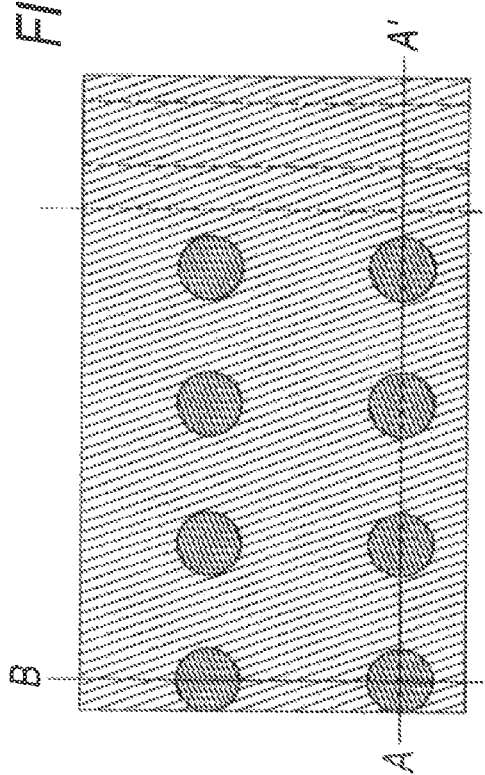
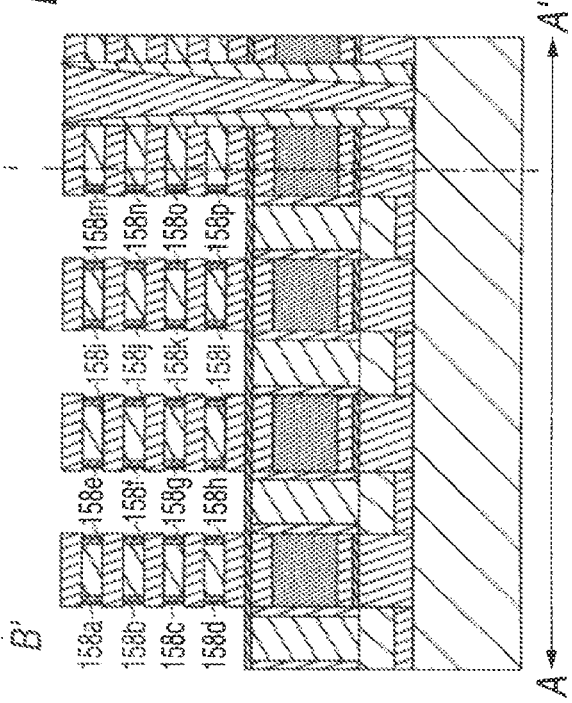
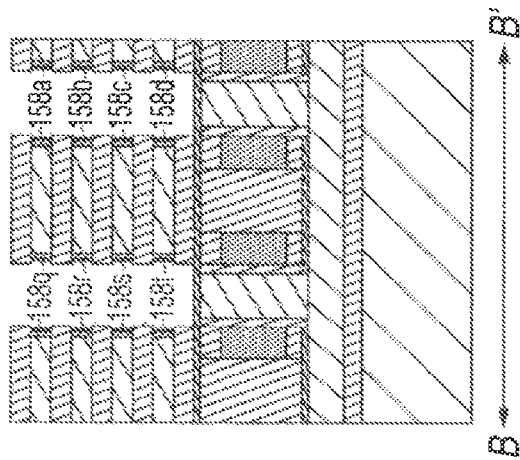
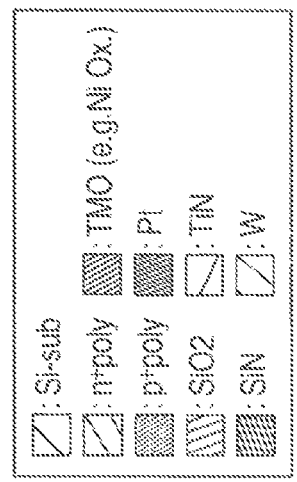
FIG. 31A  FIG. 31B  FIG. 31C

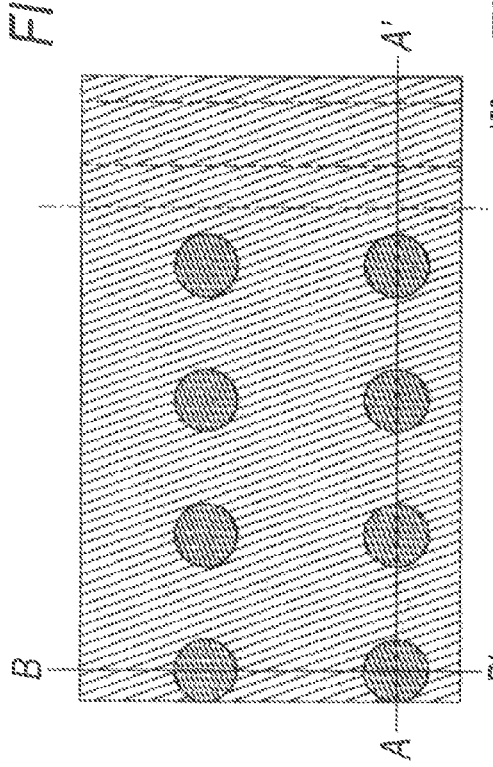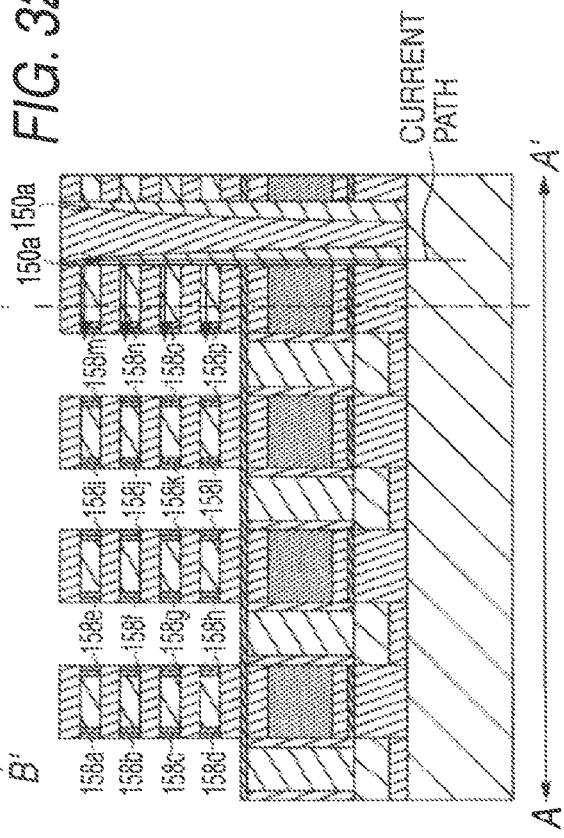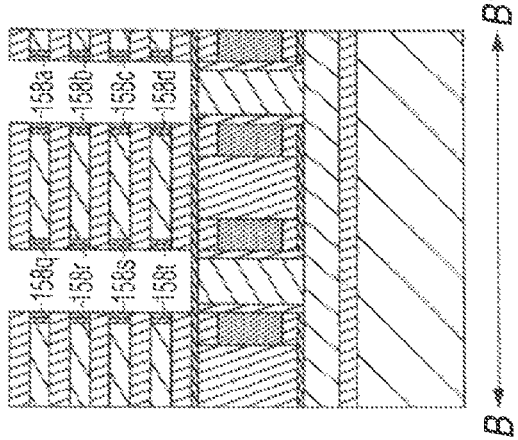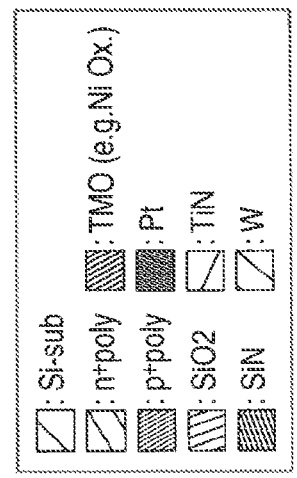
FIG. 32A
FIG. 32B
FIG. 32C

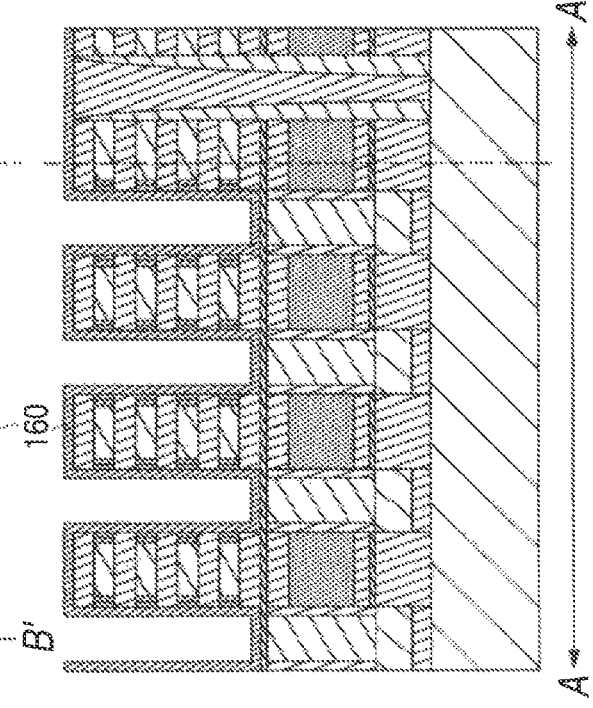
FIG. 33A
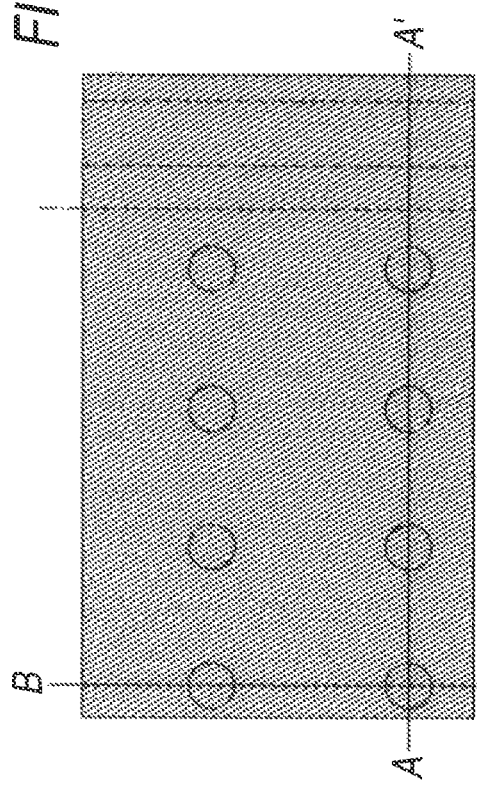
FIG. 33C
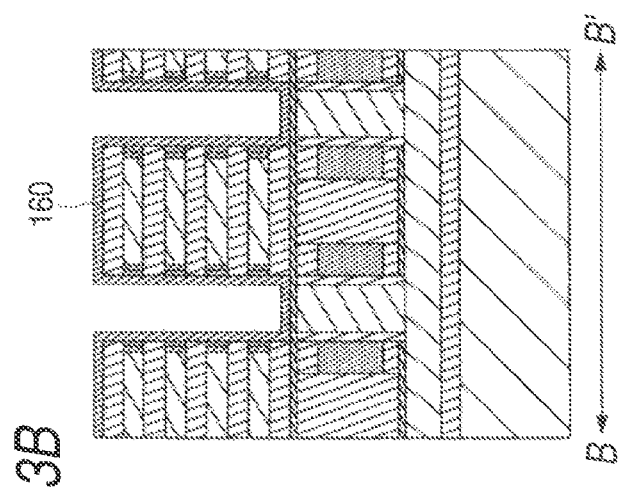
FIG. 33B
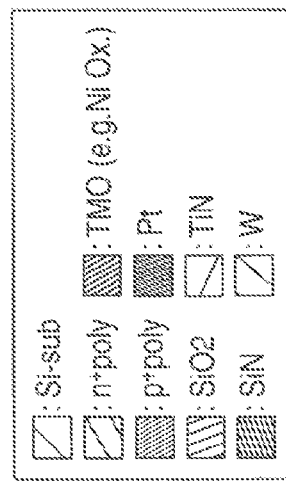

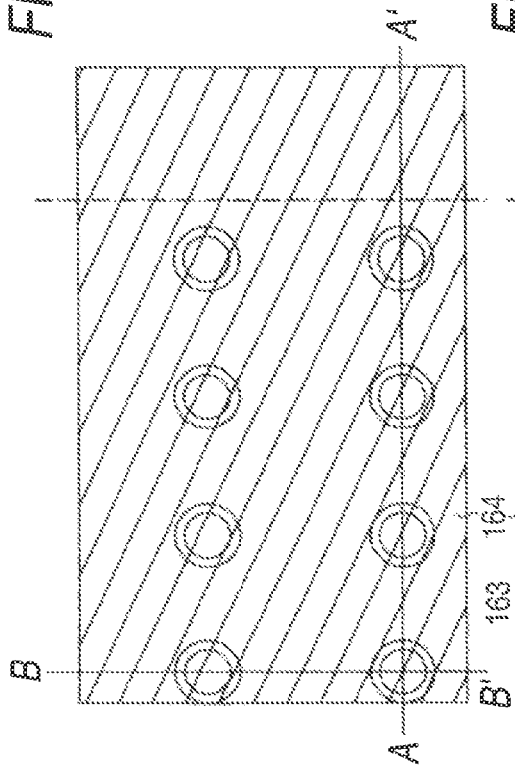
FIG. 35C
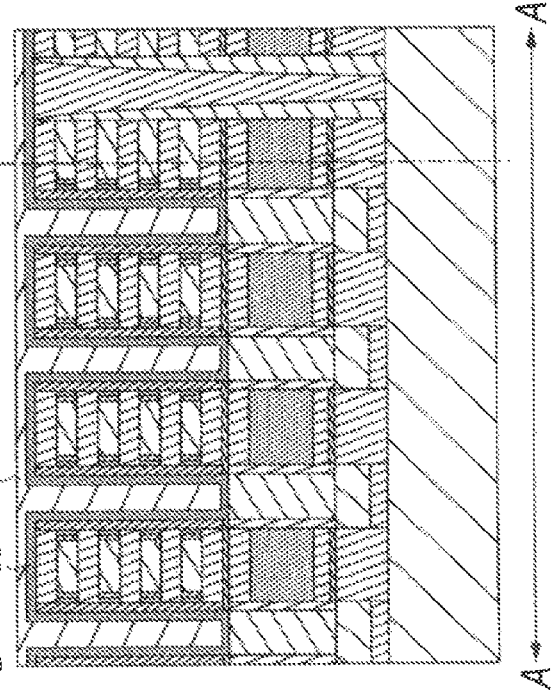
FIG. 35A
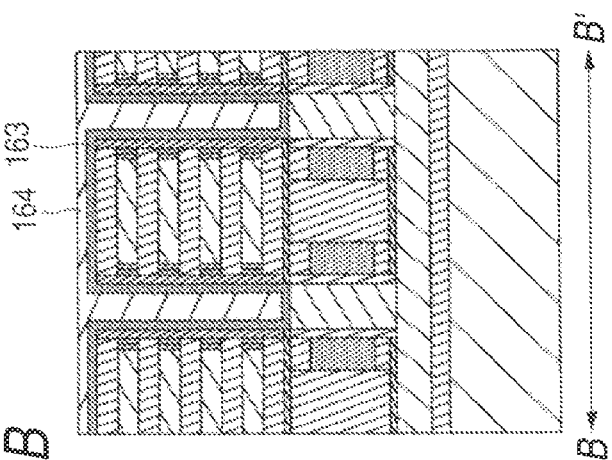
FIG. 35B
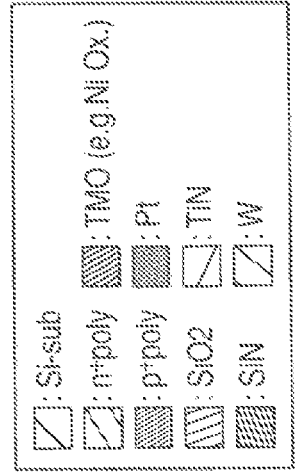

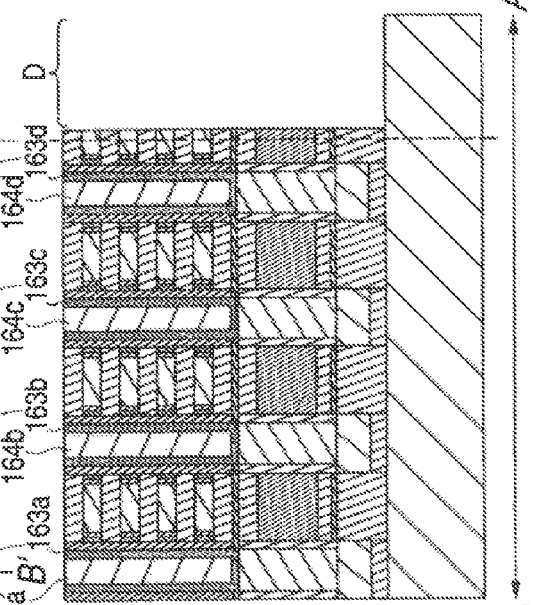
FIG. 36C
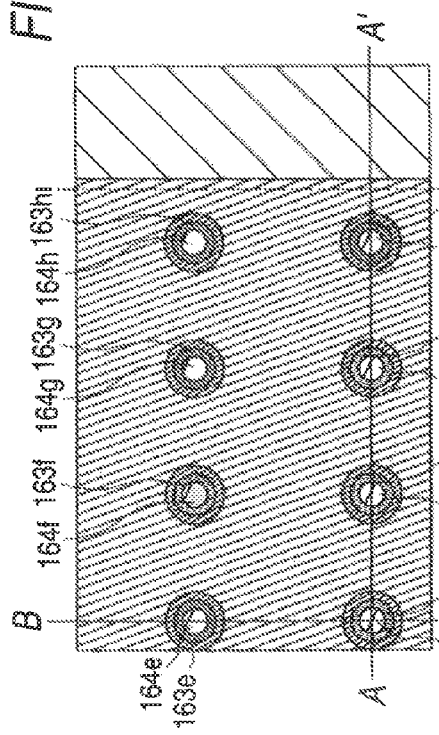
FIG. 36A
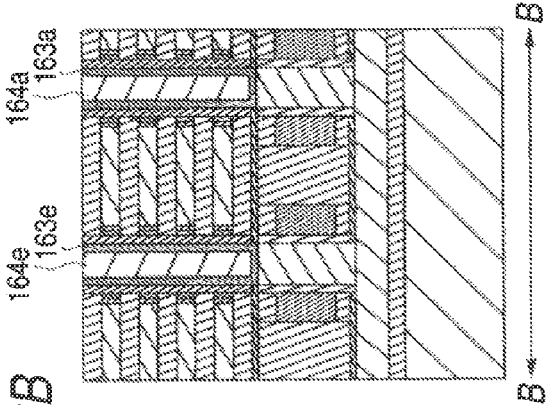
FIG. 36B
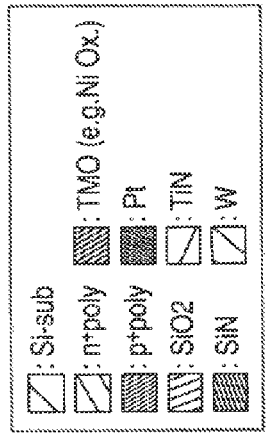

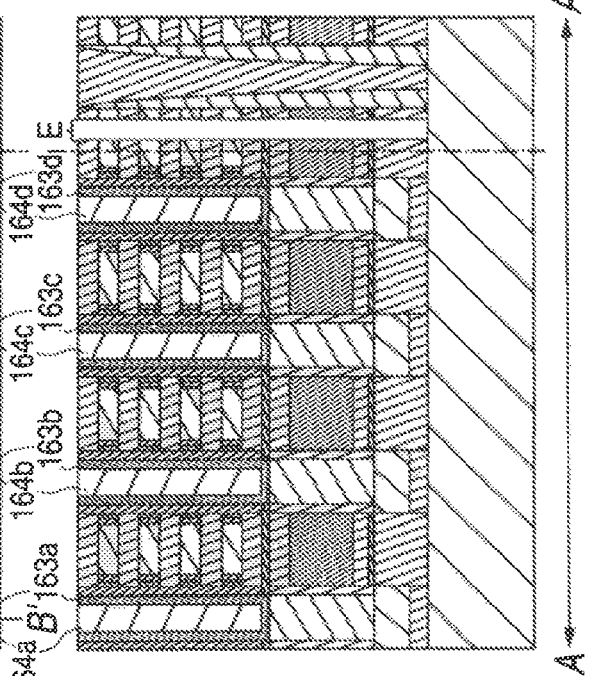
FIG. 37C
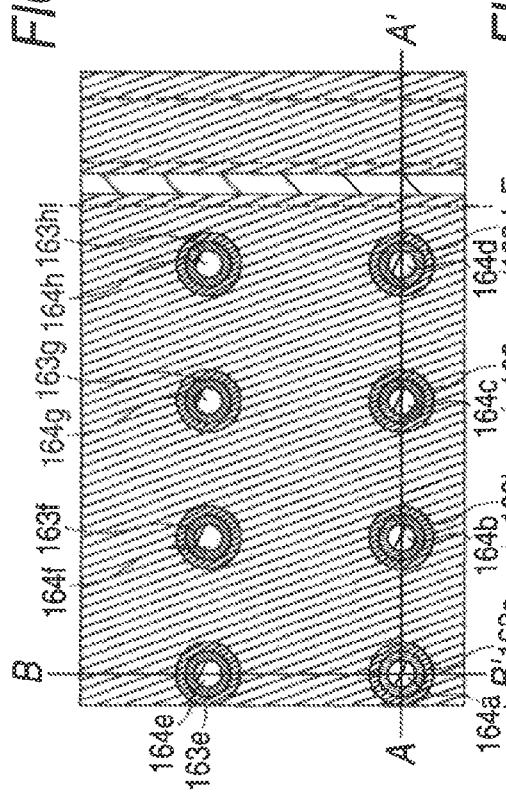
FIG. 37A
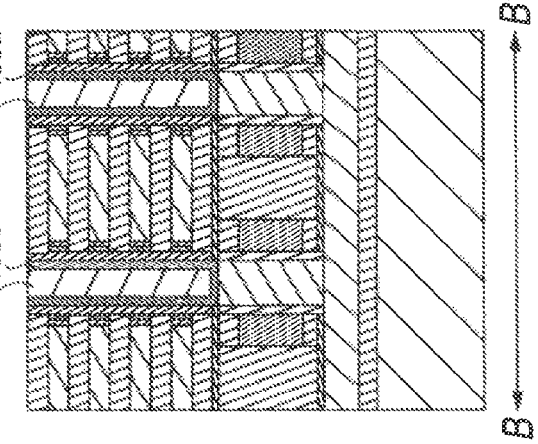
FIG. 37B
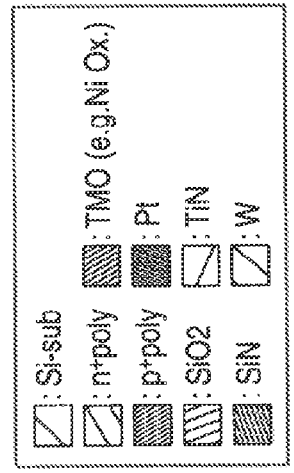

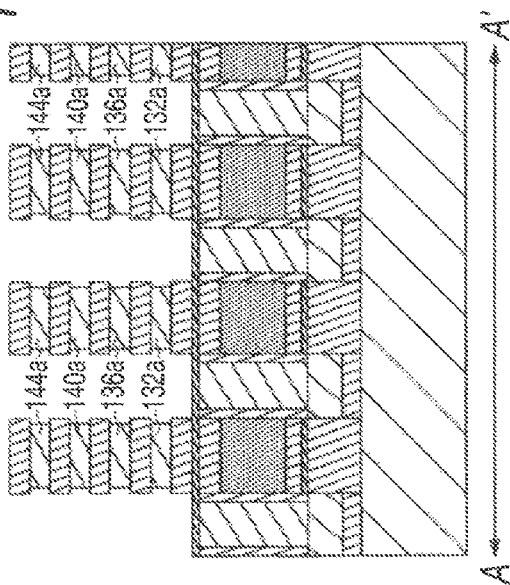
FIG. 41A
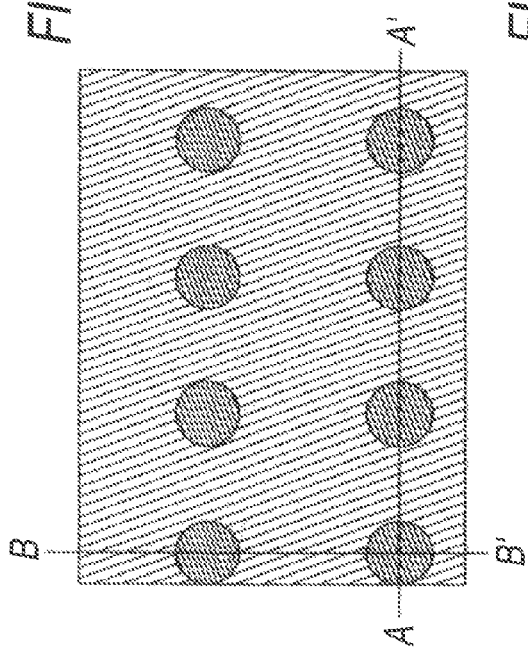
FIG. 41C
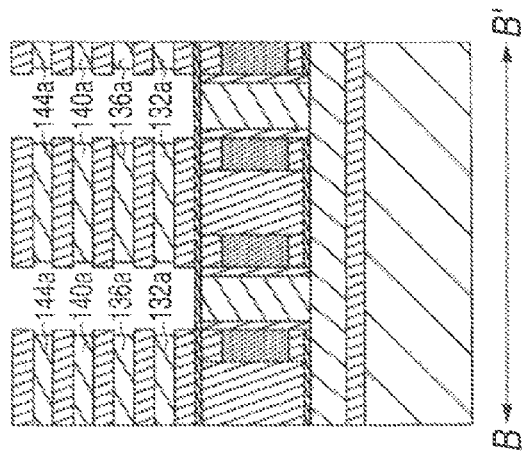
FIG. 41B
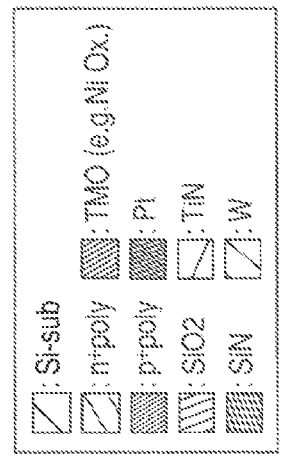

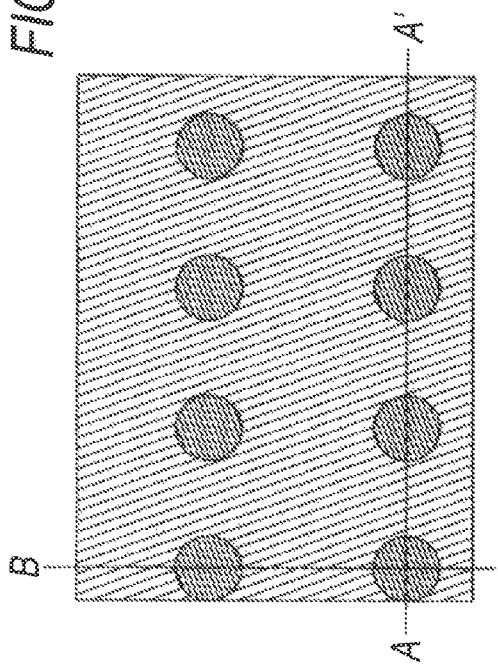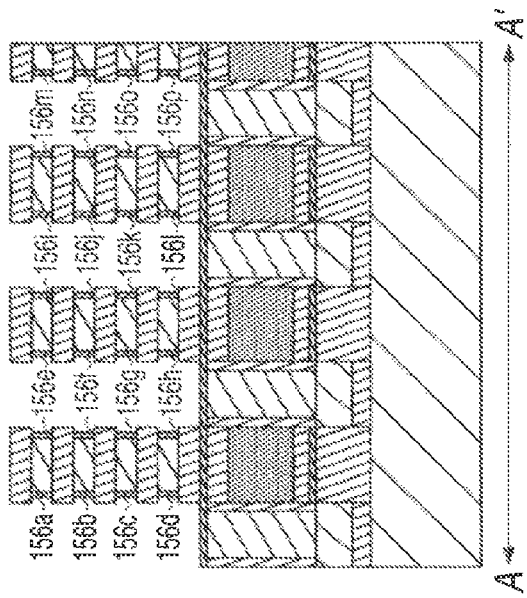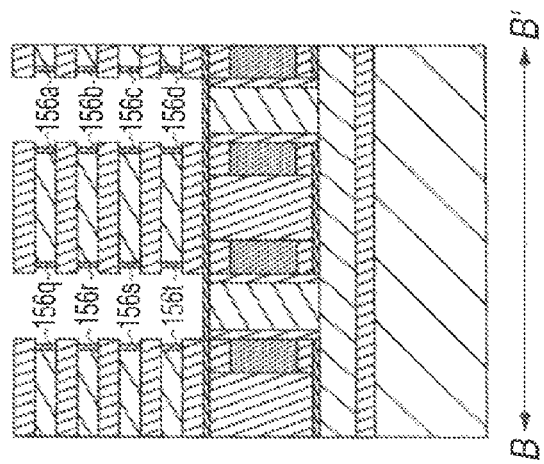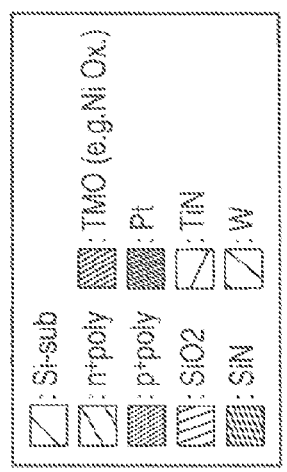
FIG. 42A, FIG. 42B, FIG. 42C

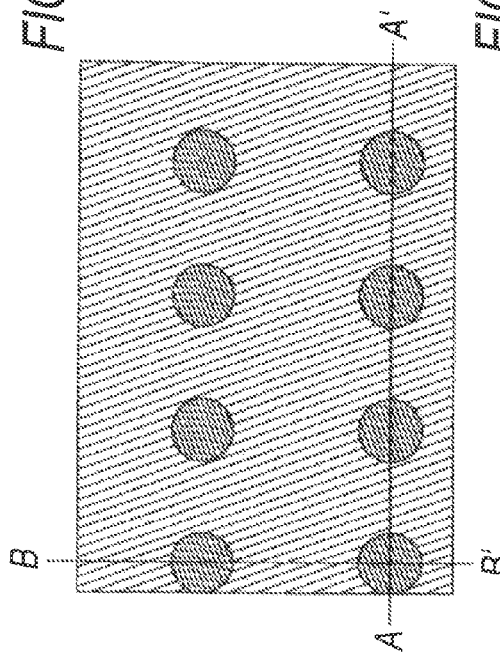
FIG. 43C
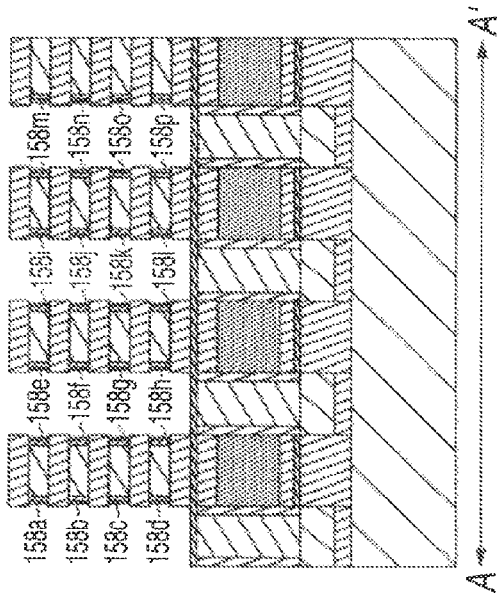
FIG. 43A
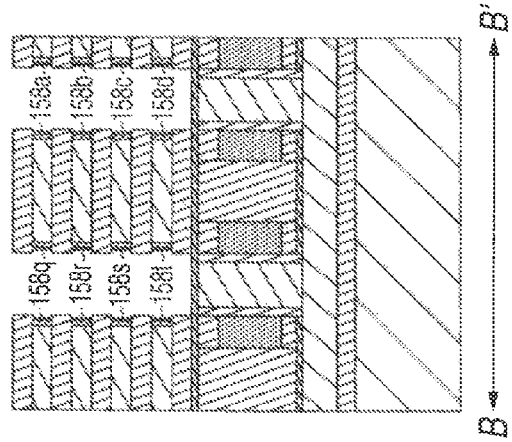
FIG. 43B
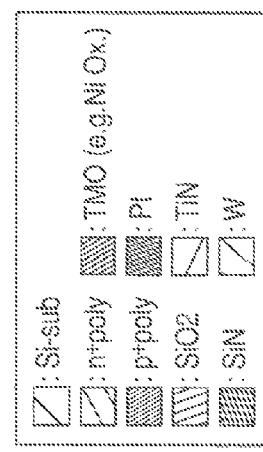

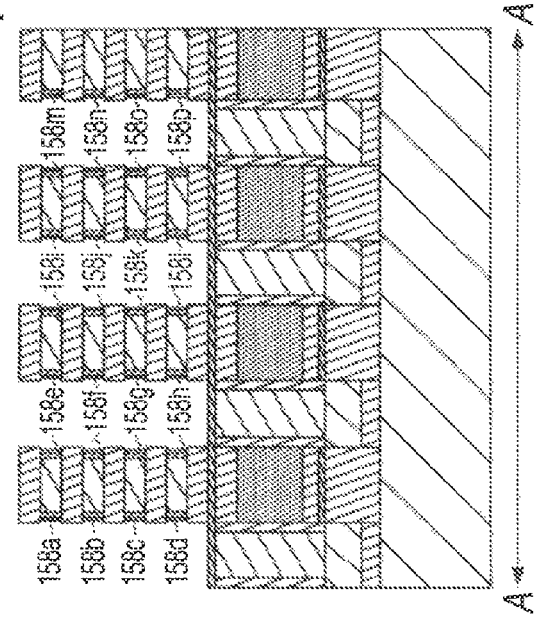
FIG. 44A
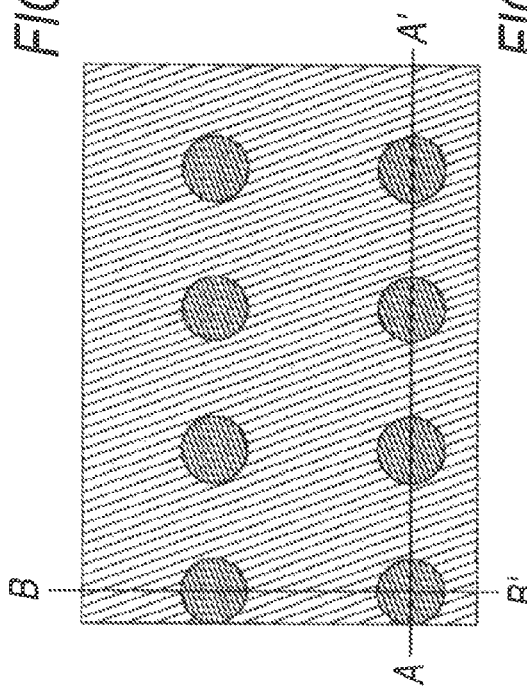
FIG. 44C
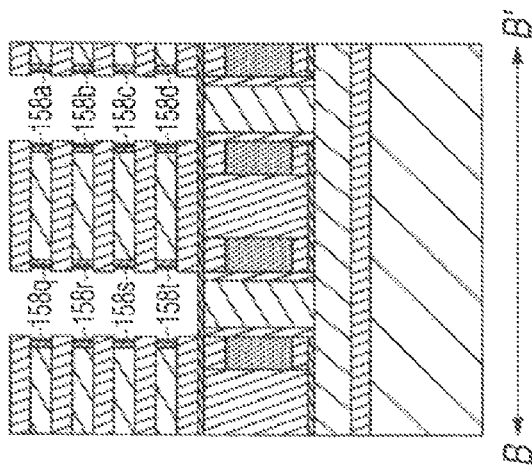
FIG. 44B
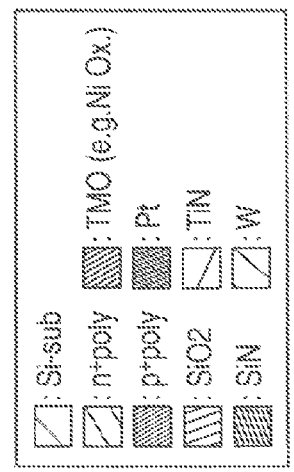

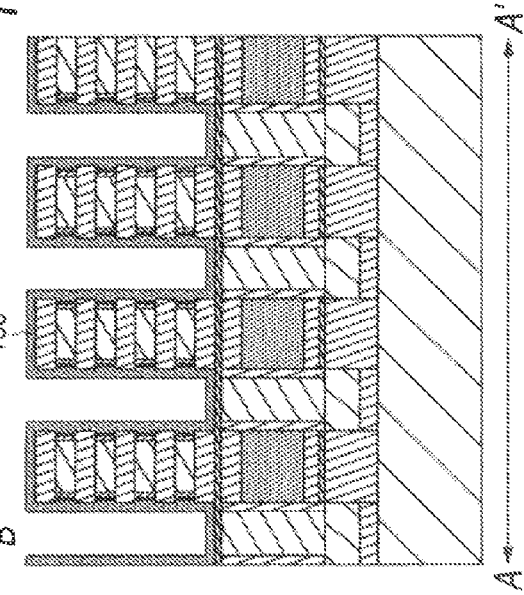
FIG. 45A
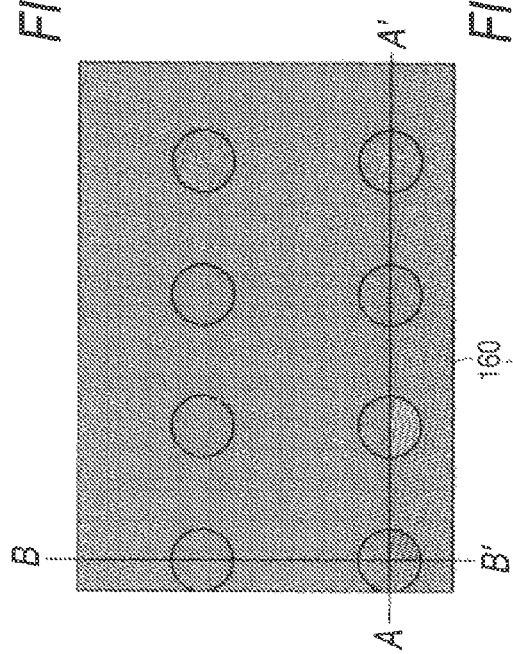
FIG. 45C
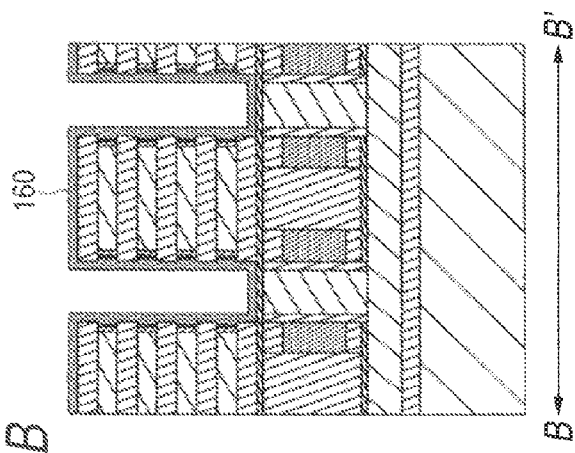
FIG. 45B
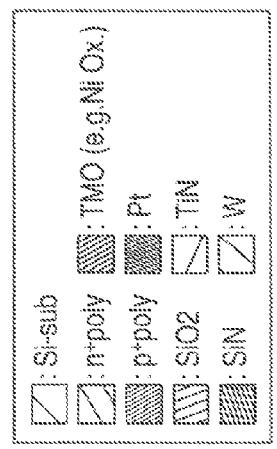

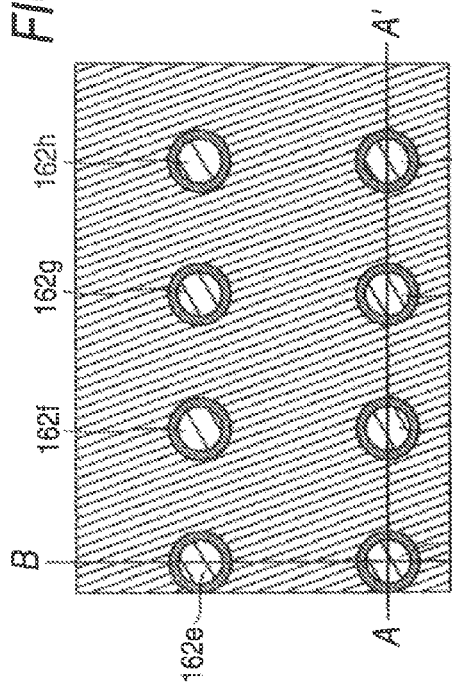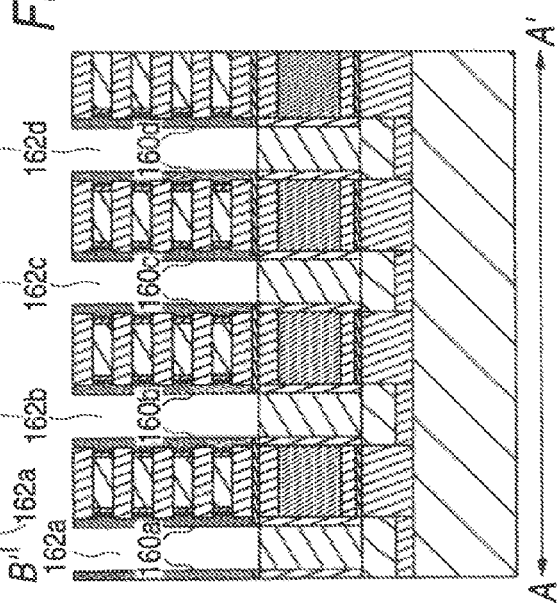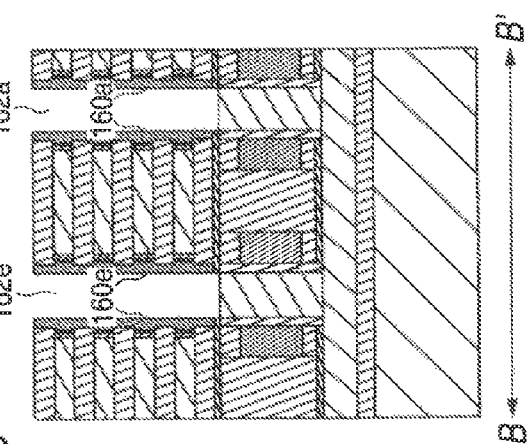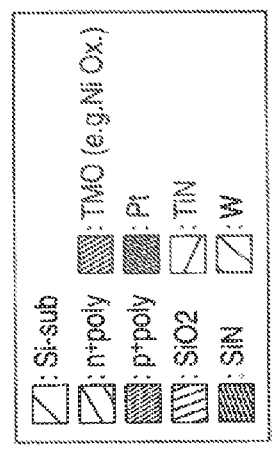

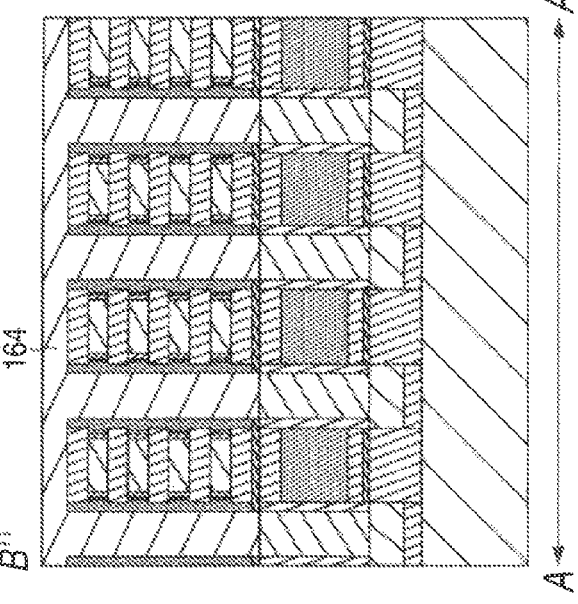
FIG. 47A
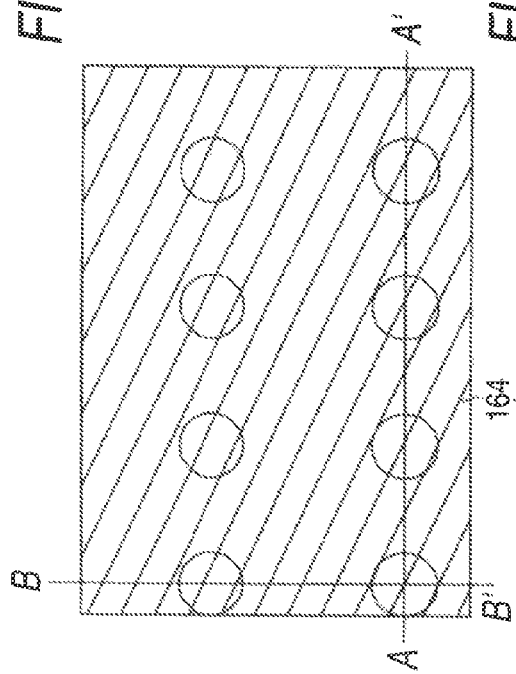
FIG. 47C
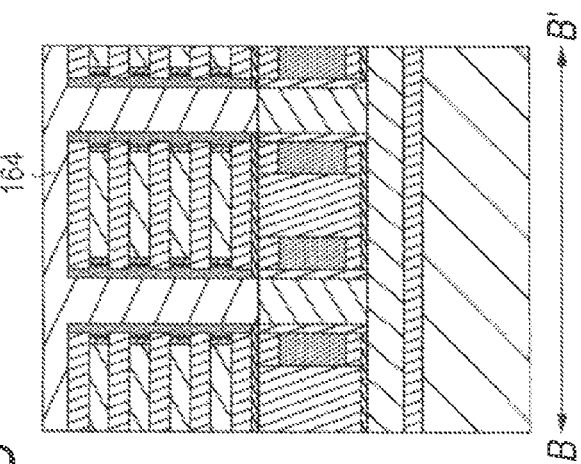
FIG. 47B
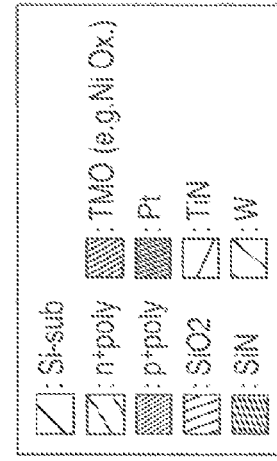

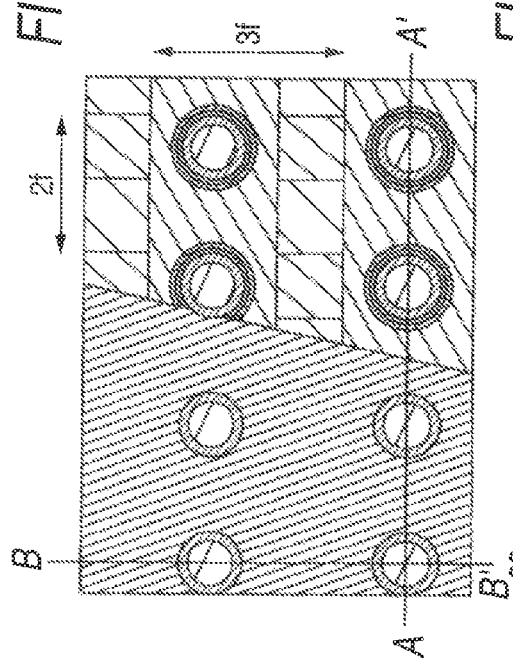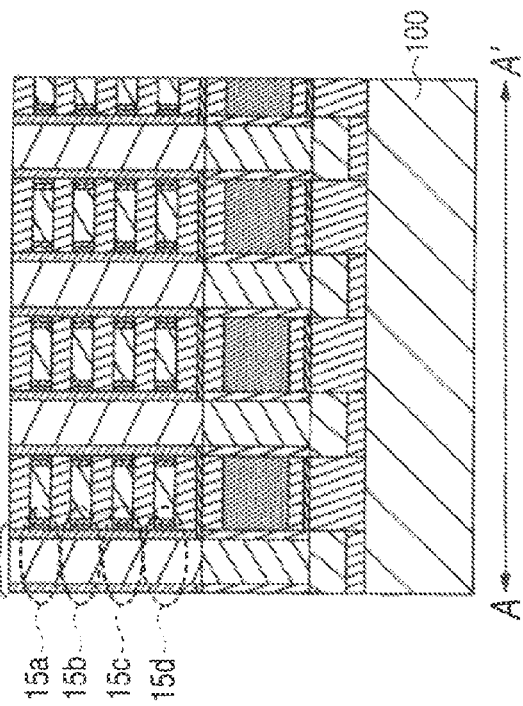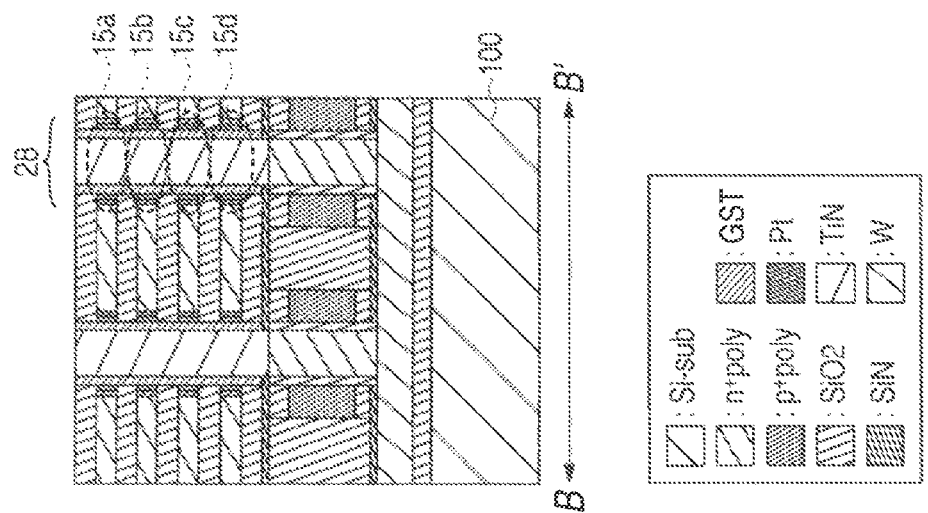

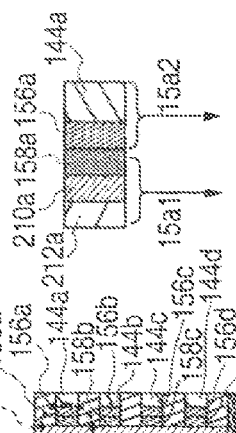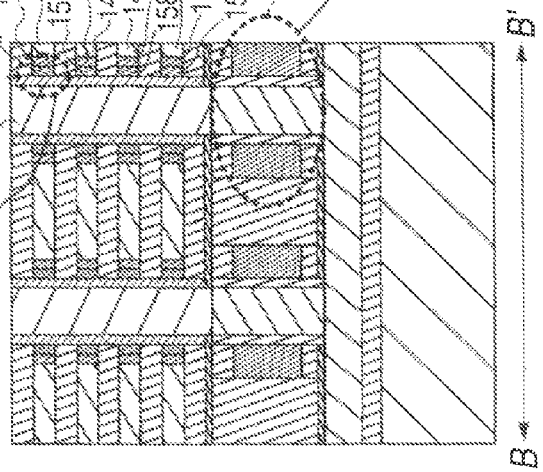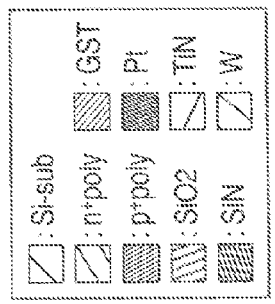
FIG. 51A   FIG. 51B   FIG. 51C   FIG. 51D

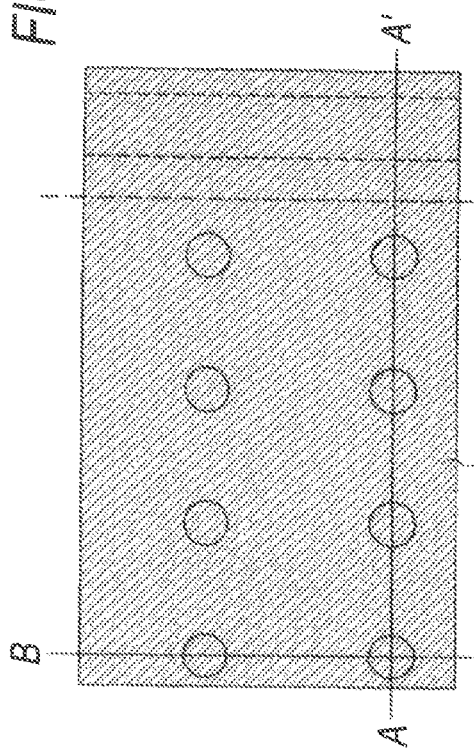
FIG. 53C
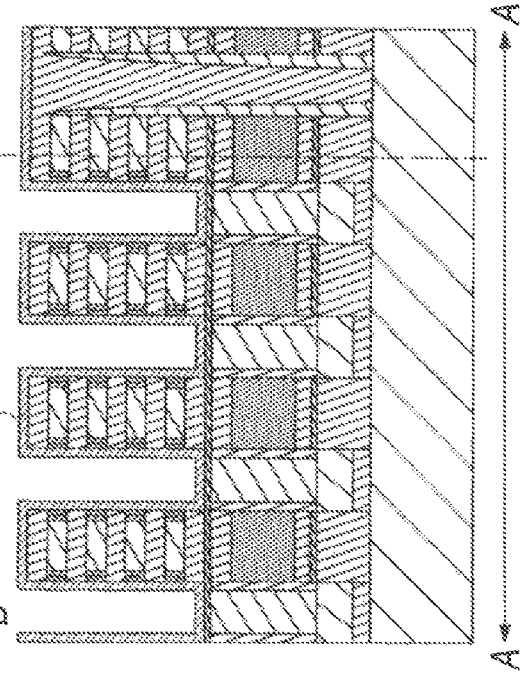
FIG. 53A
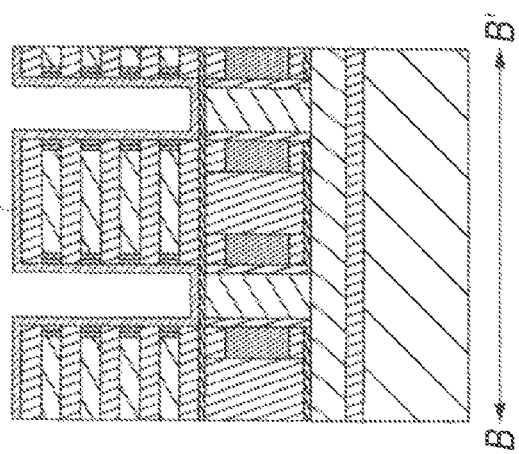
FIG. 53B
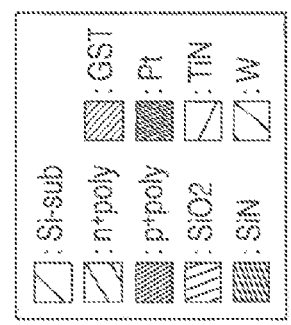

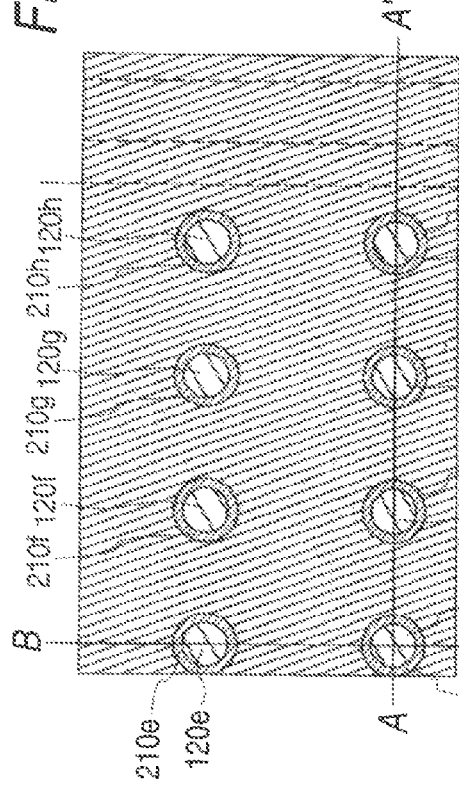
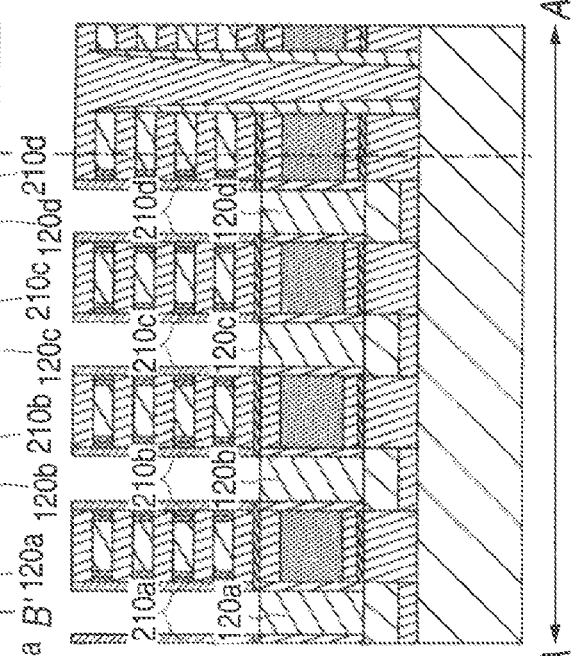
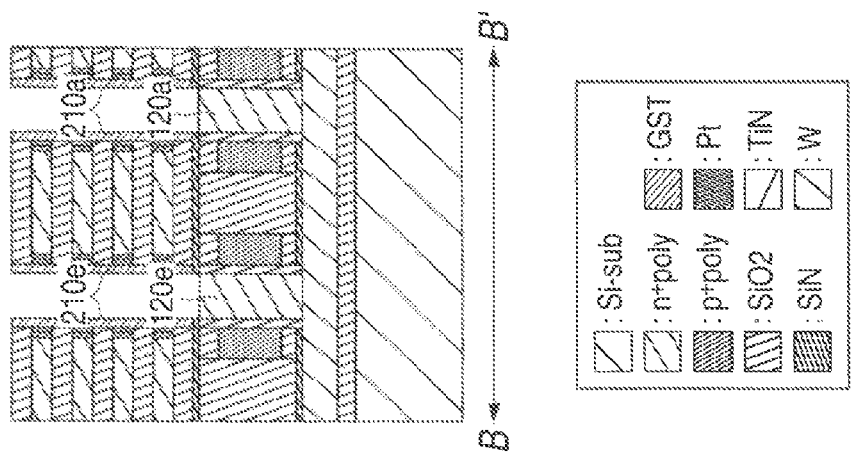

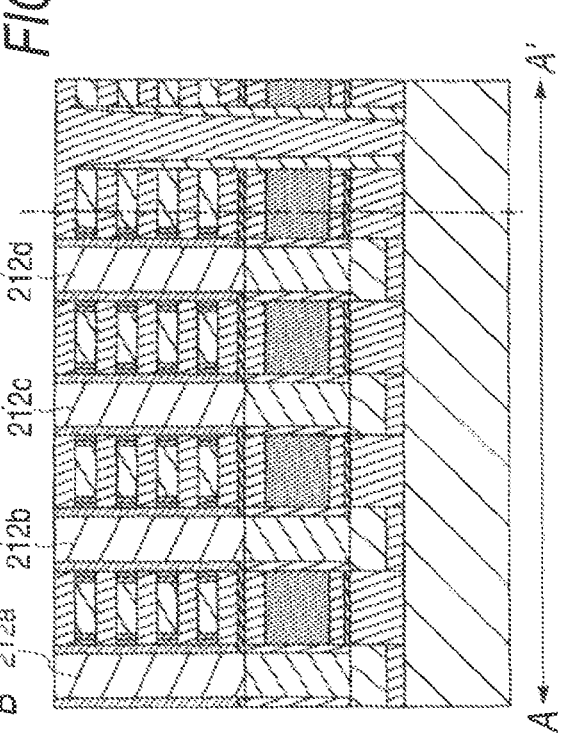
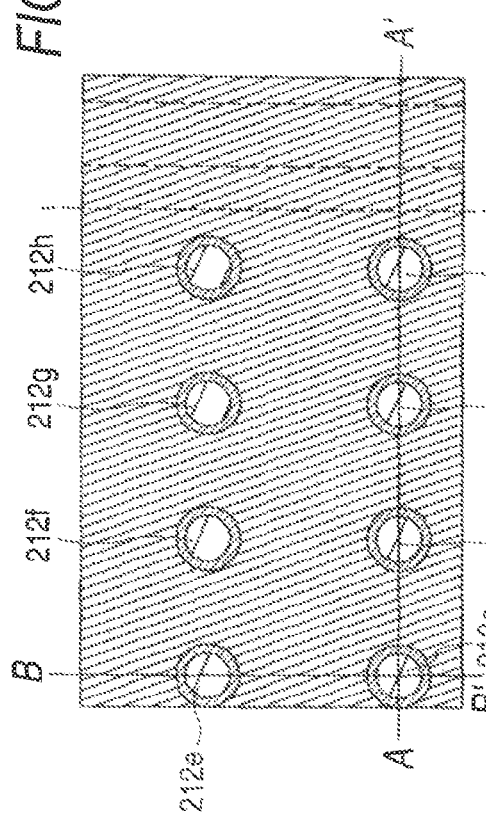
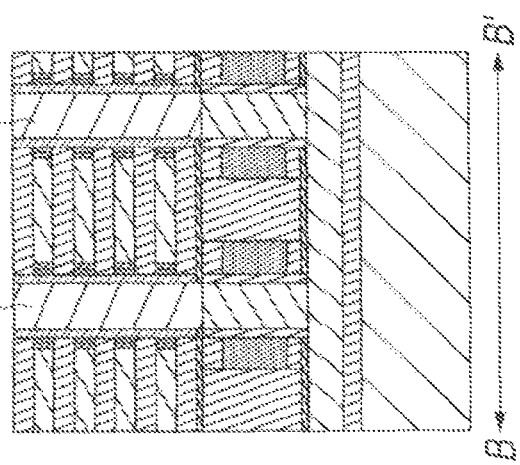
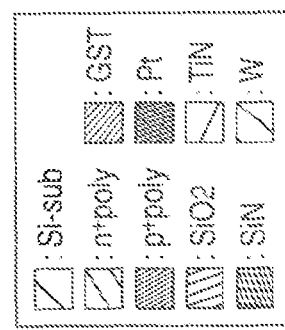

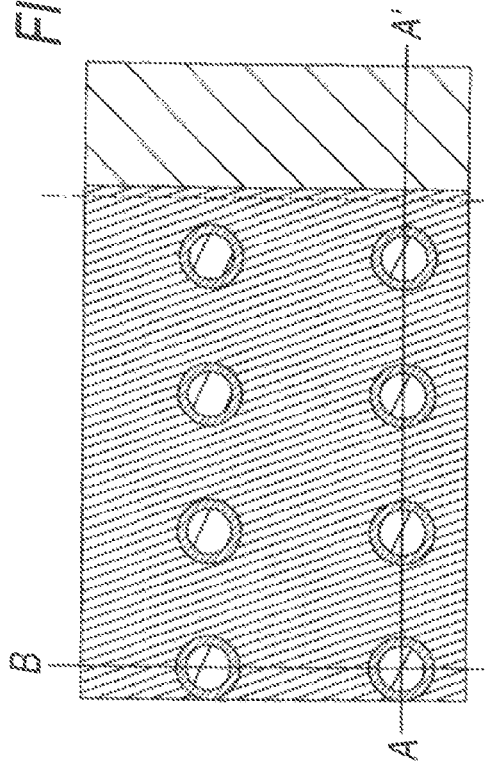
FIG. 56C
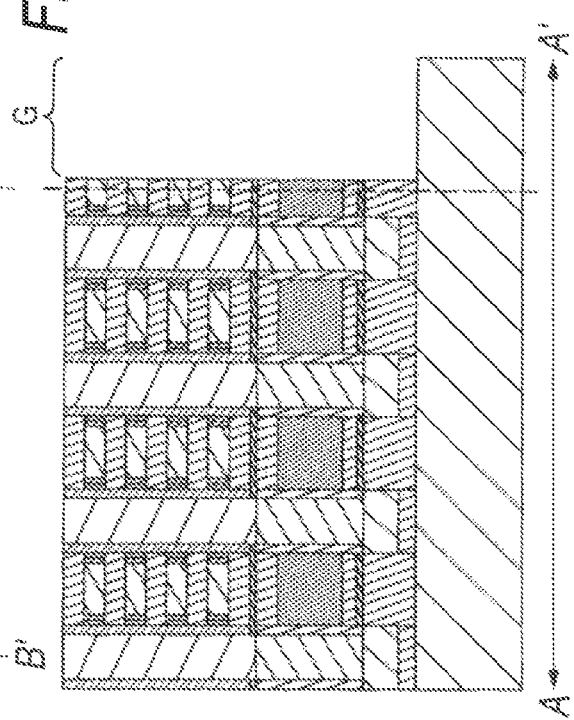
FIG. 56A
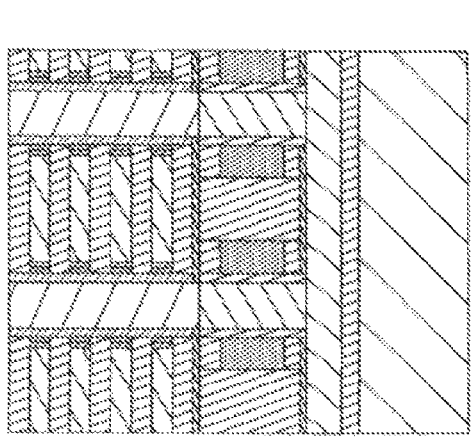
FIG. 56B
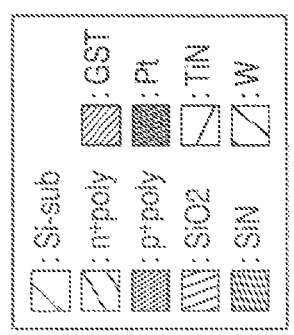

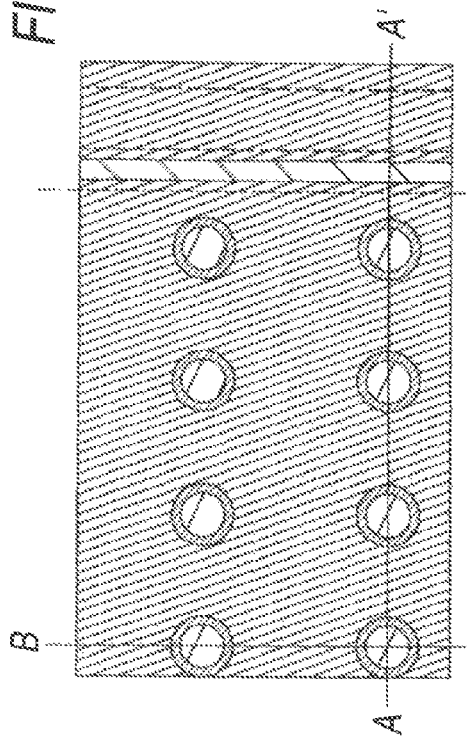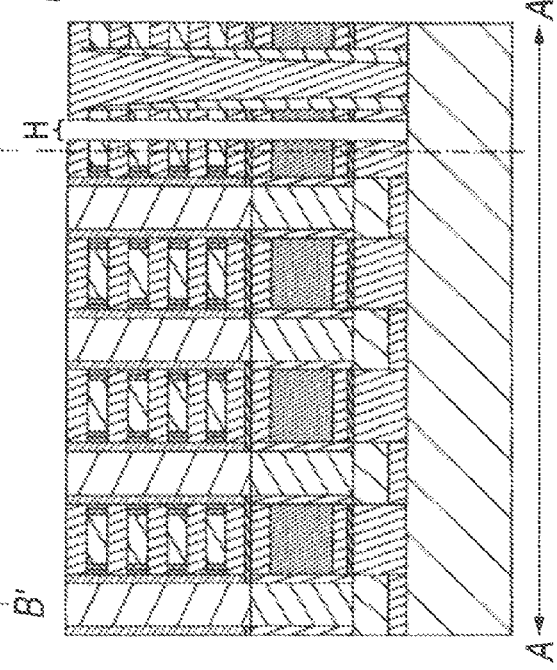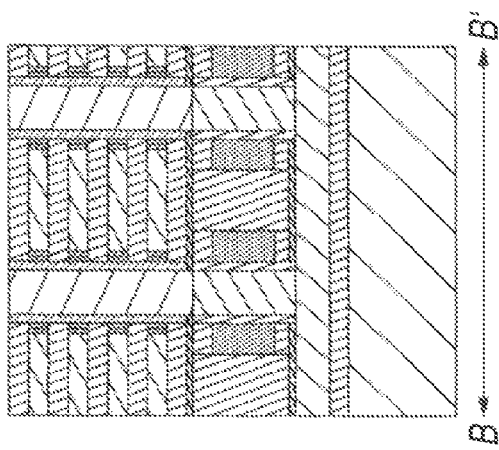

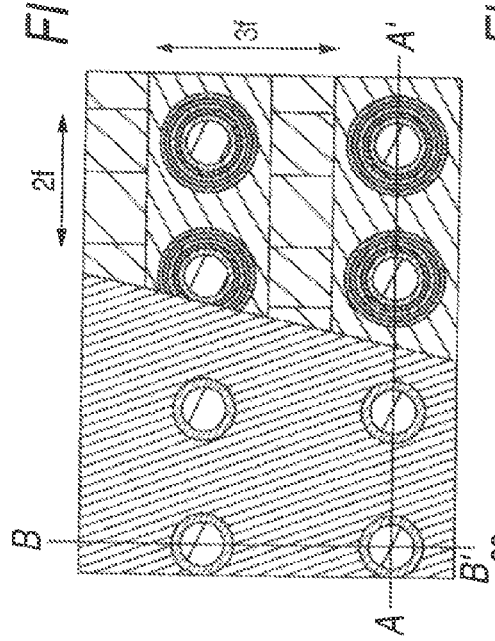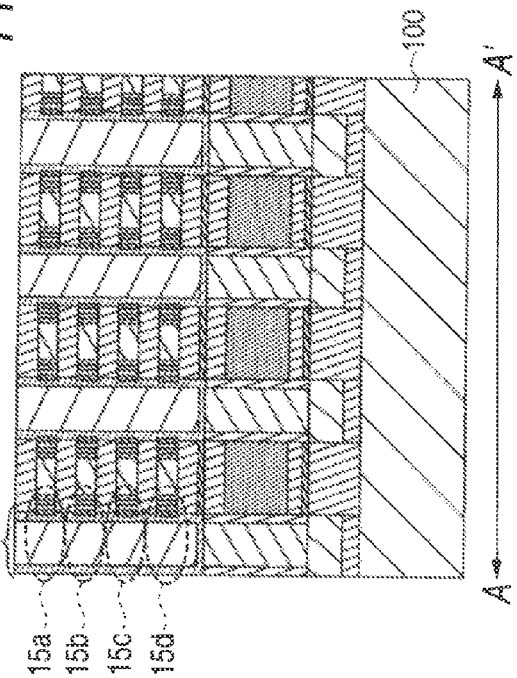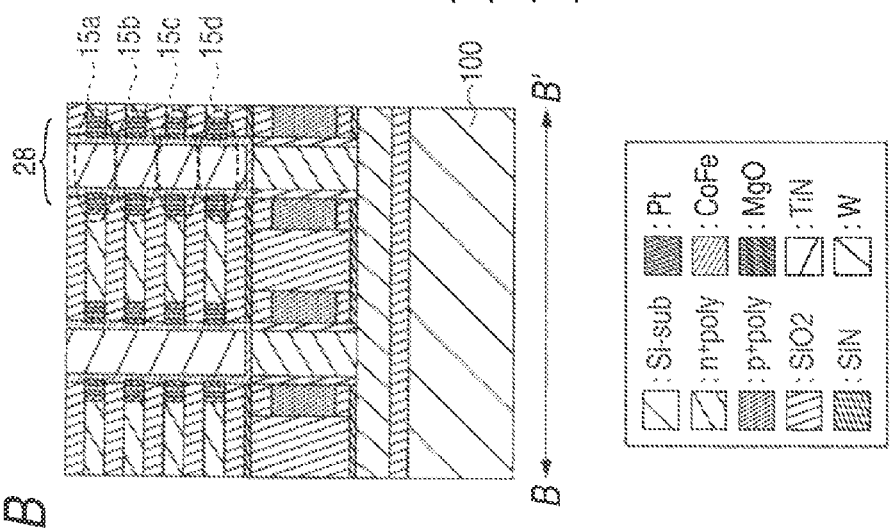

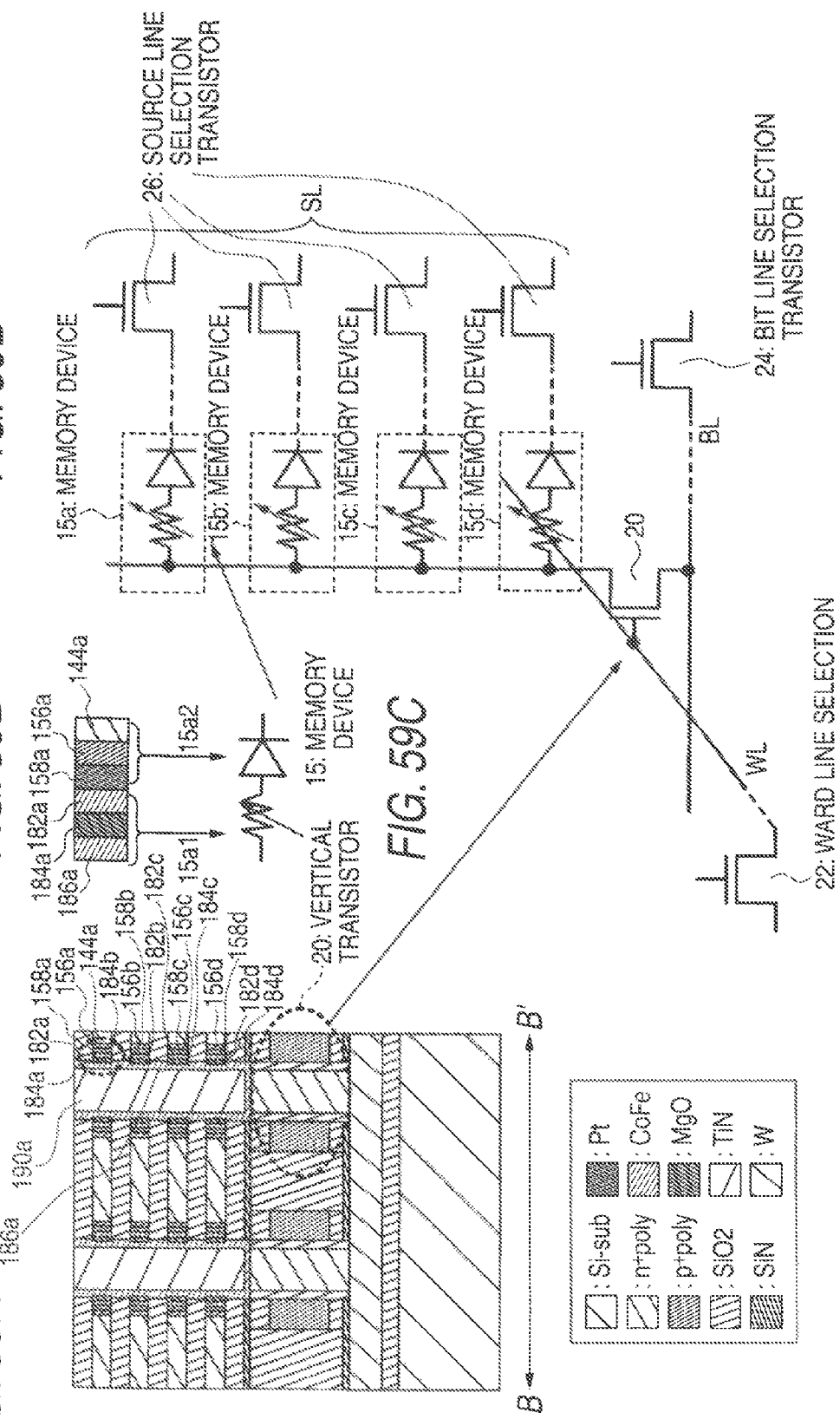

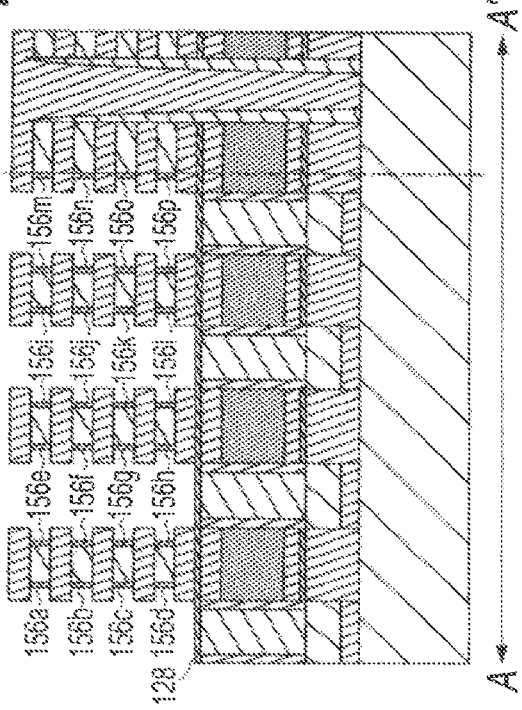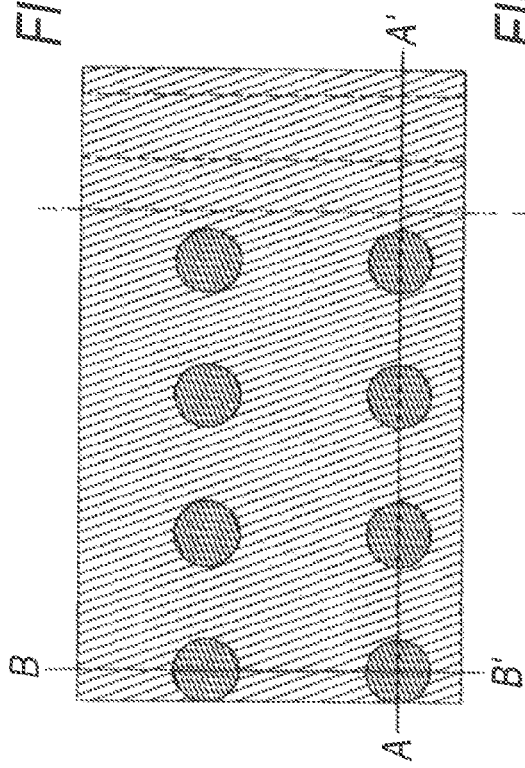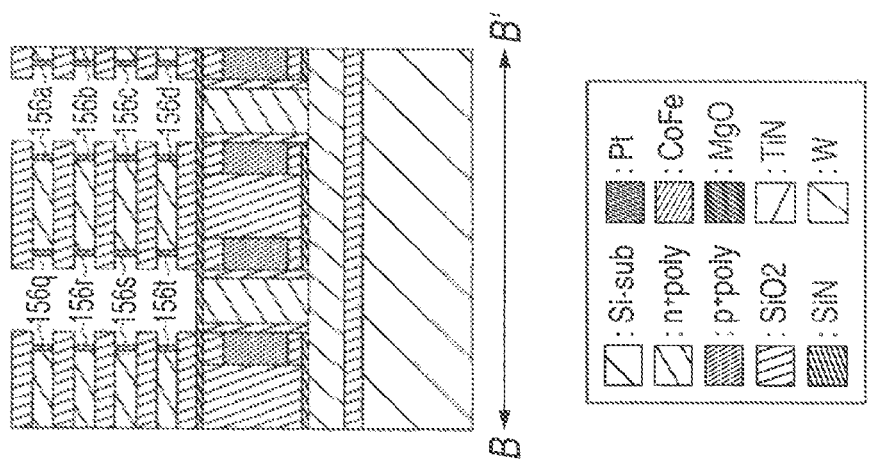

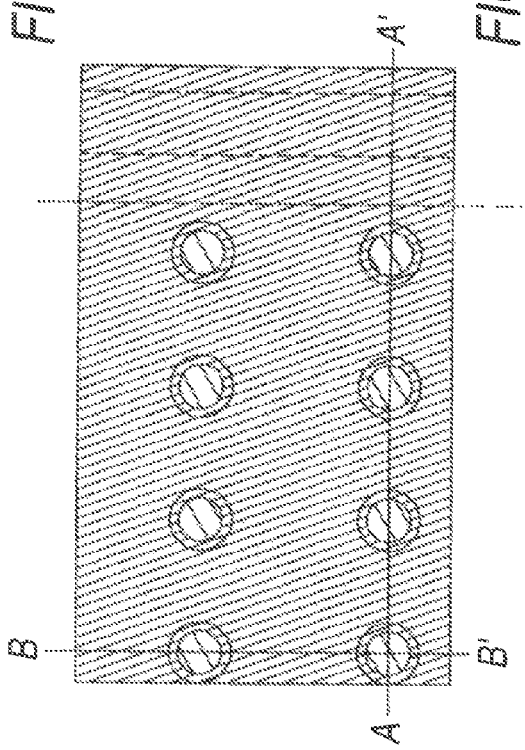
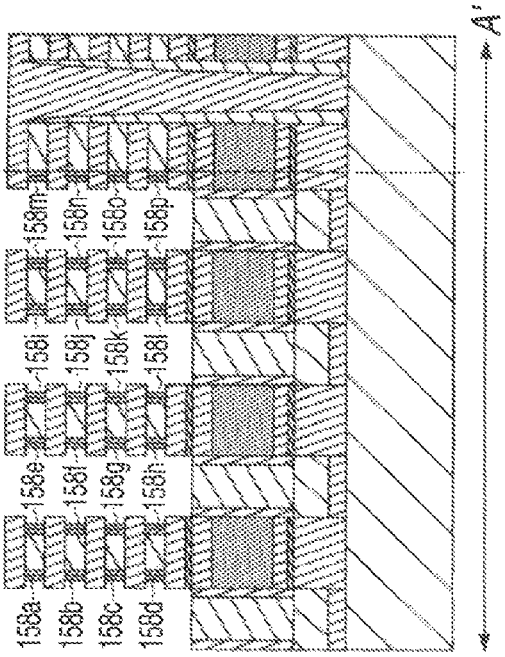
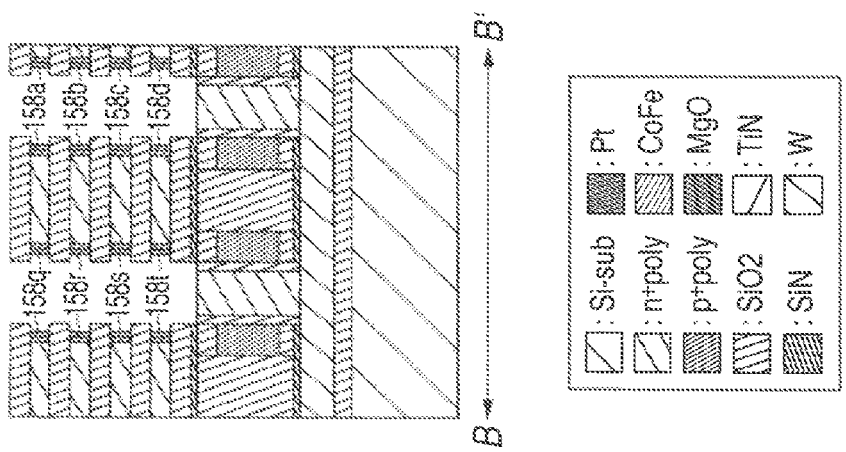
FIG. 63C
FIG. 63A
FIG. 63B

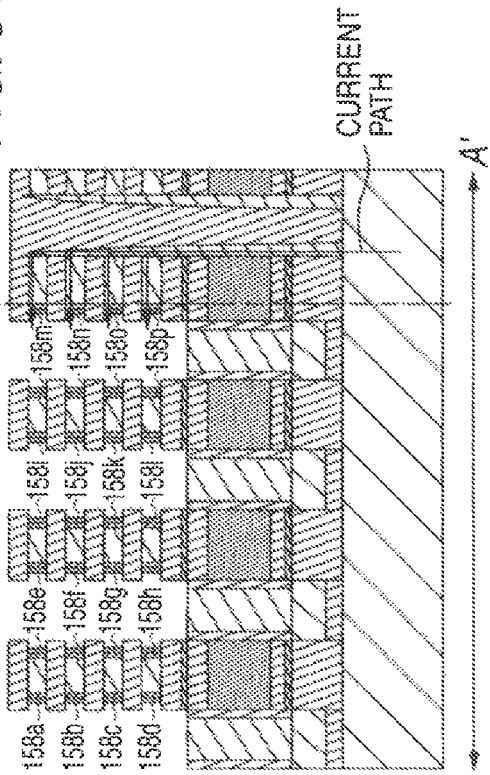
FIG. 64A
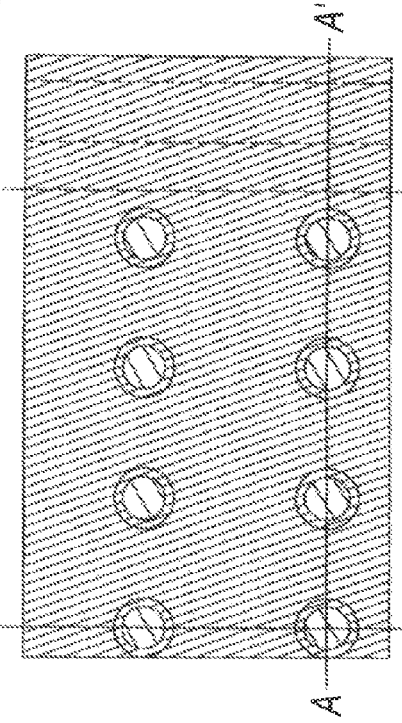
FIG. 64C
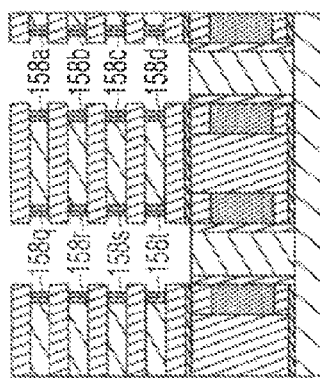
FIG. 64B
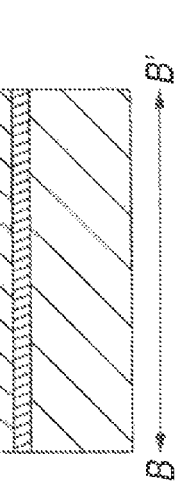

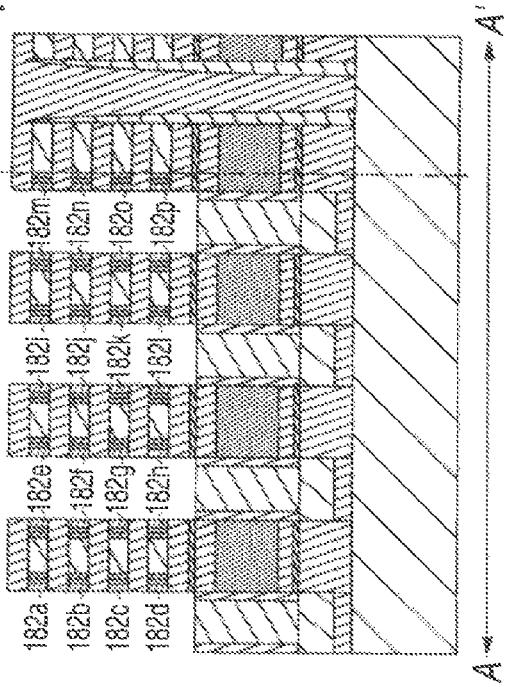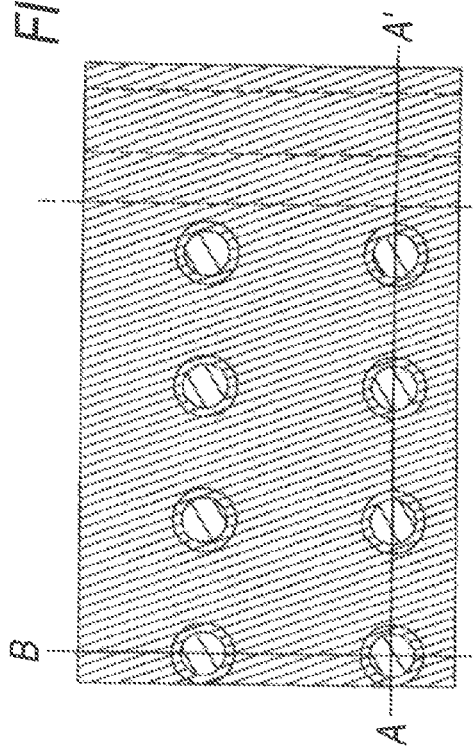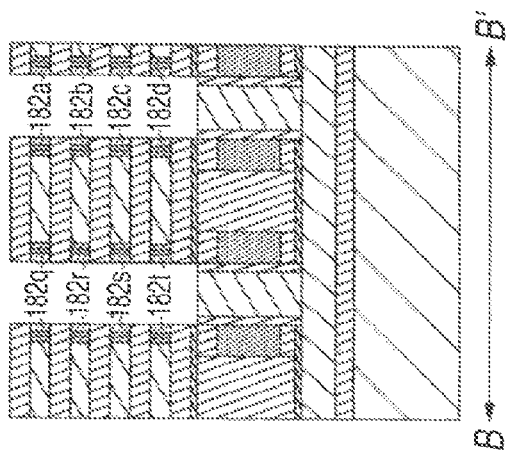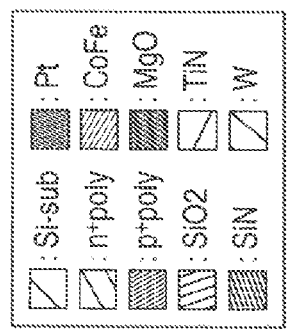

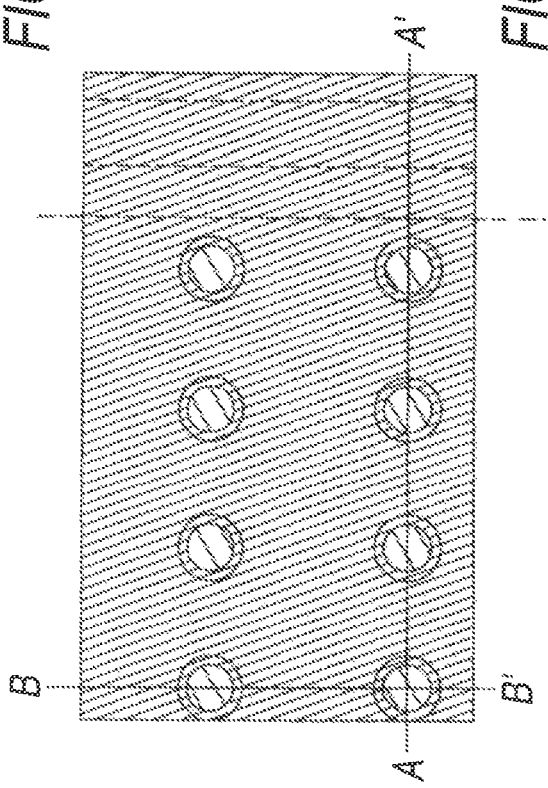
FIG. 66C
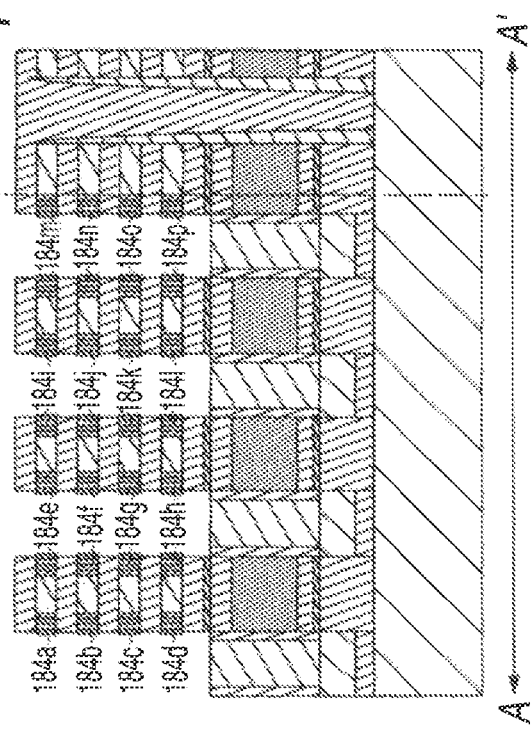
FIG. 66A
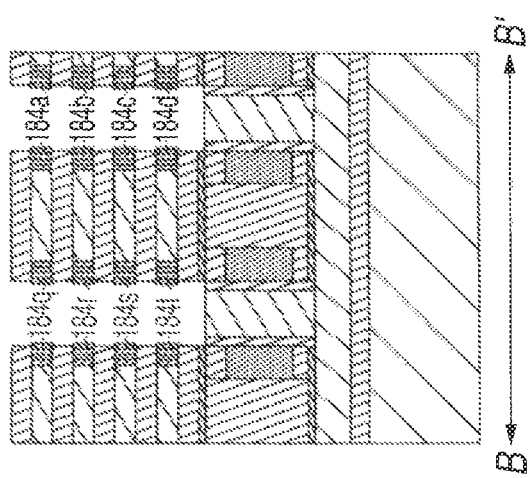
FIG. 66B
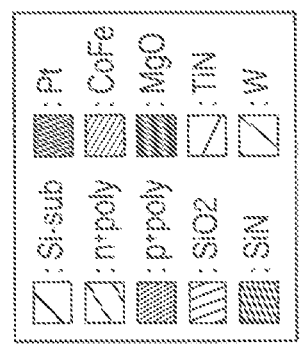

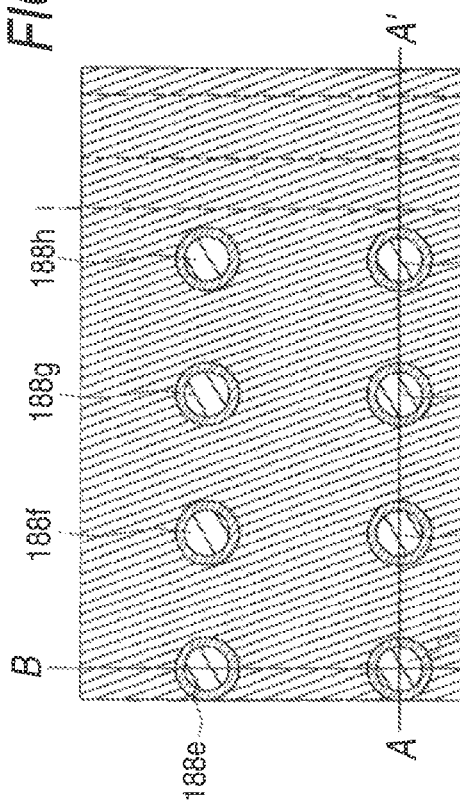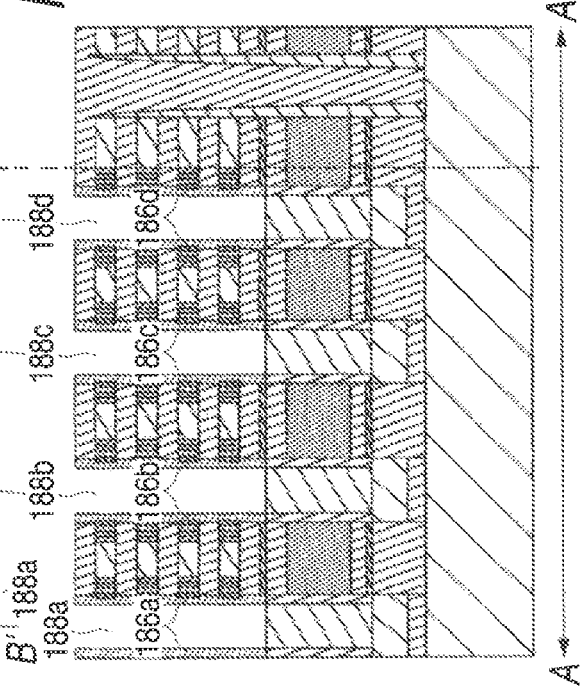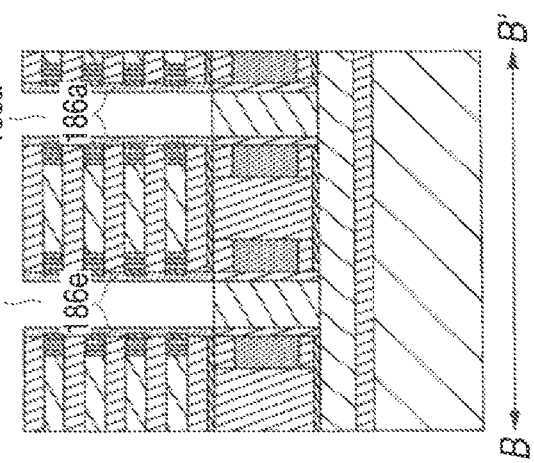

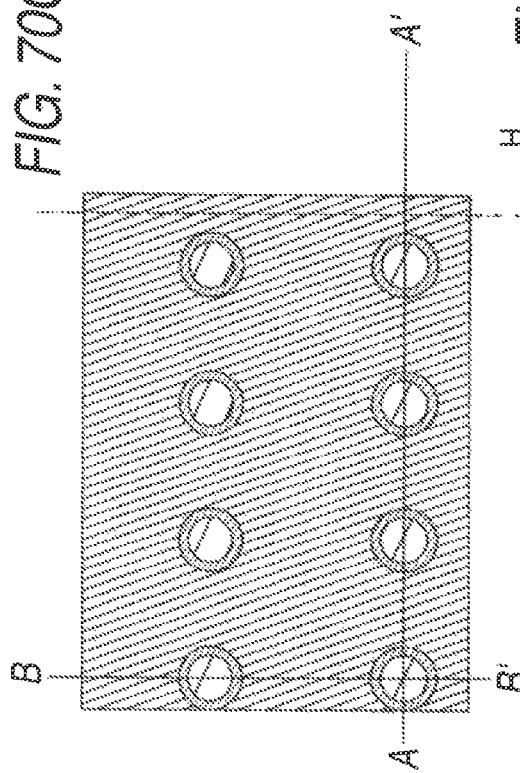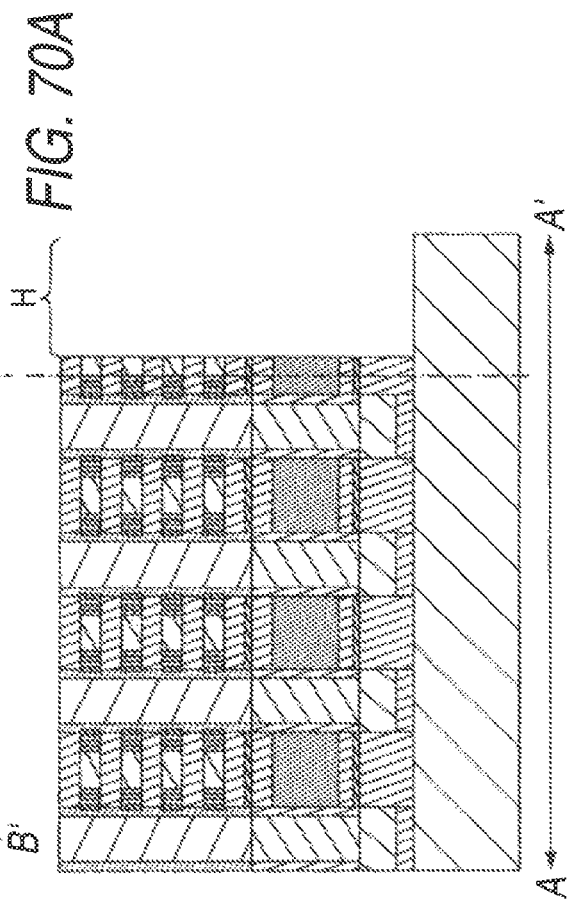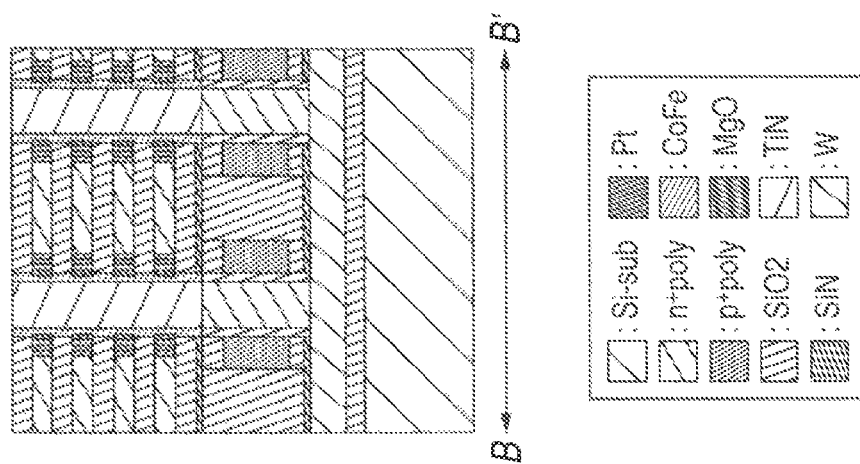

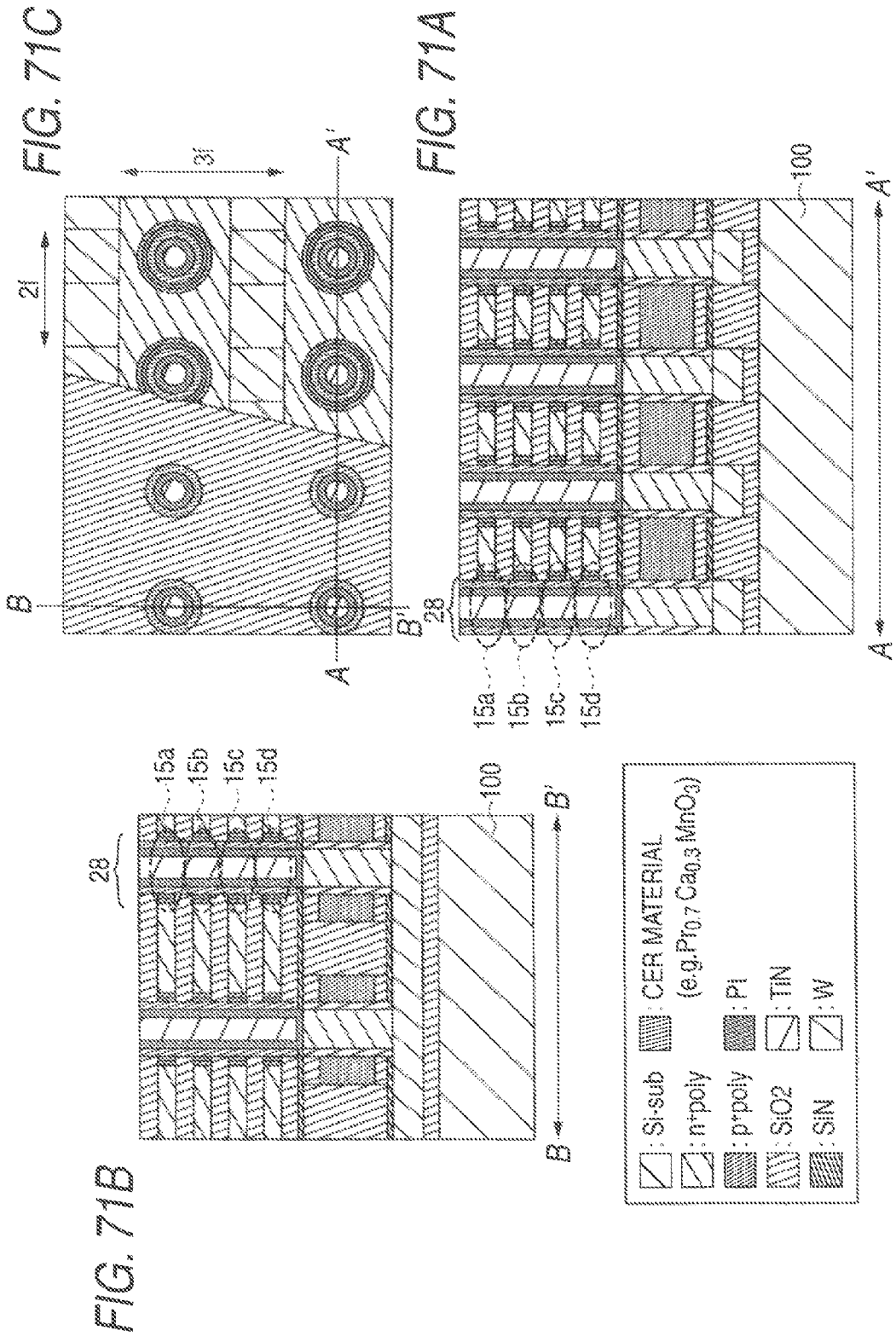

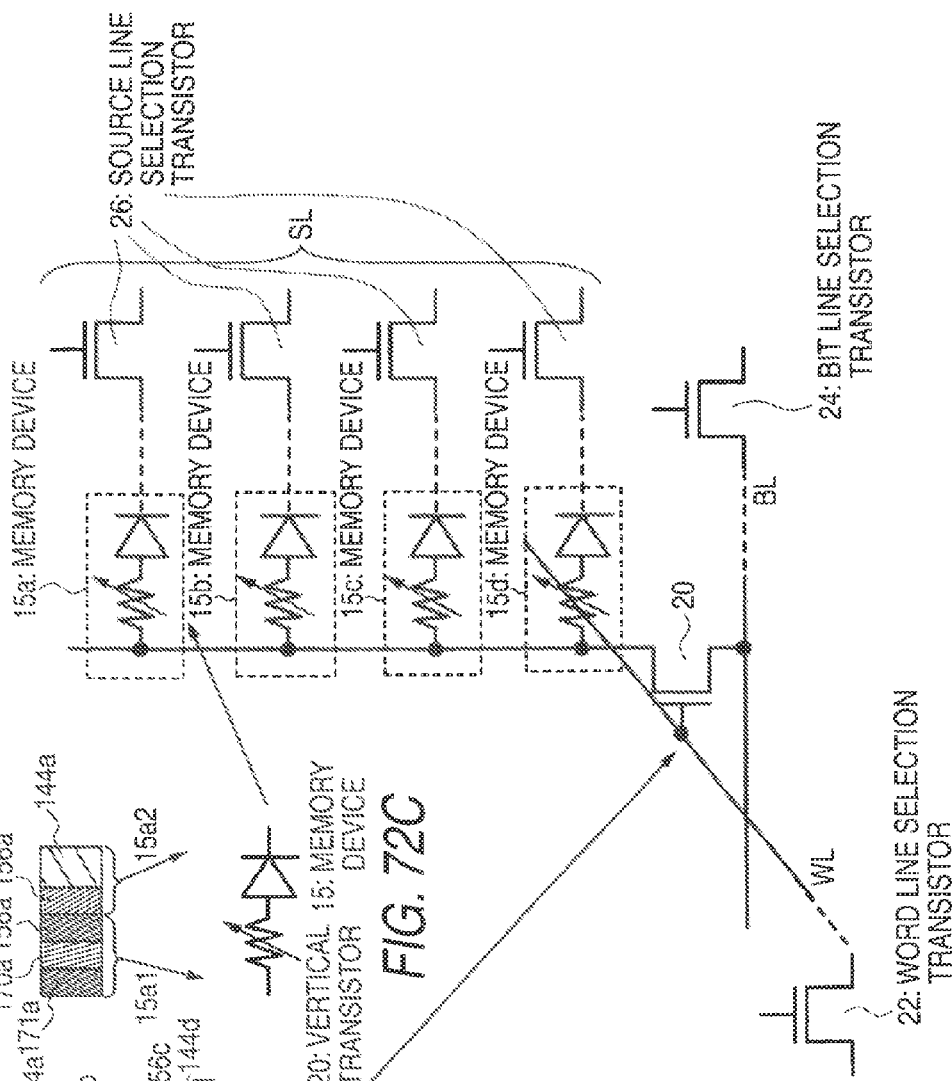

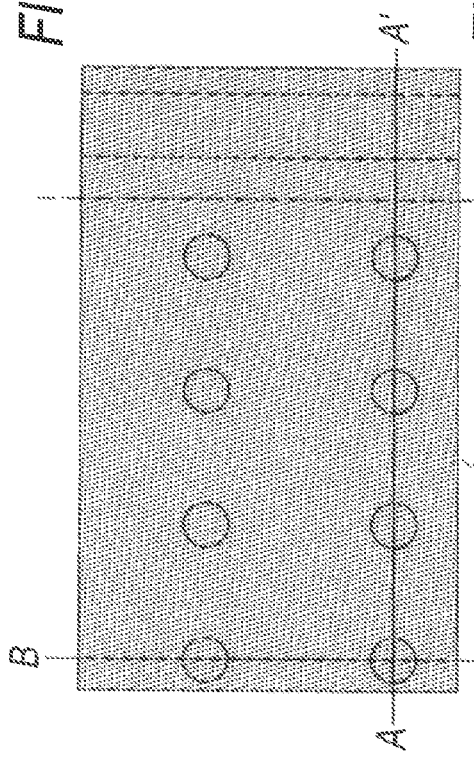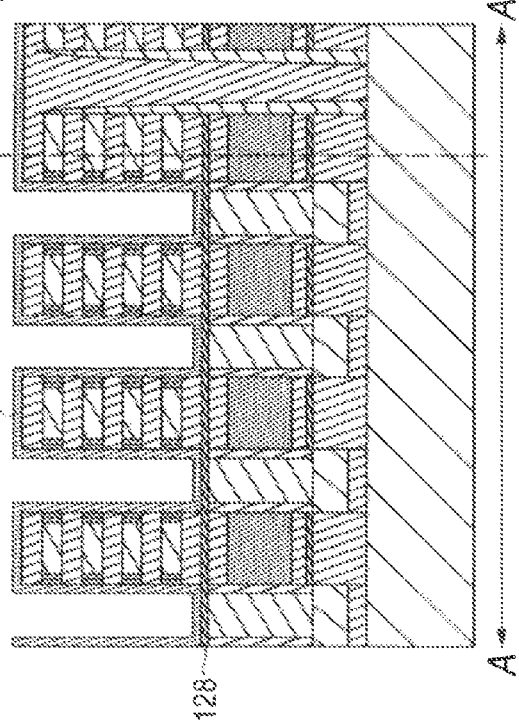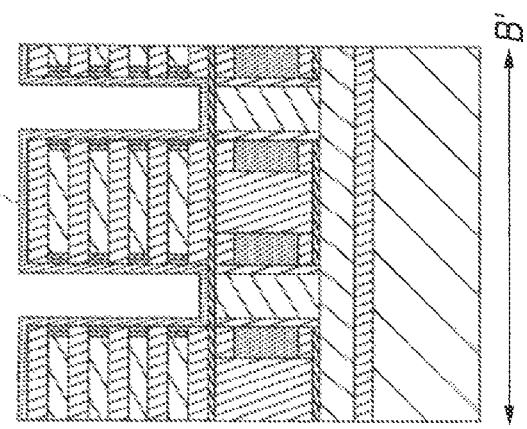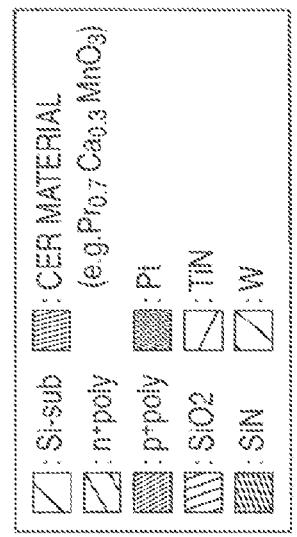

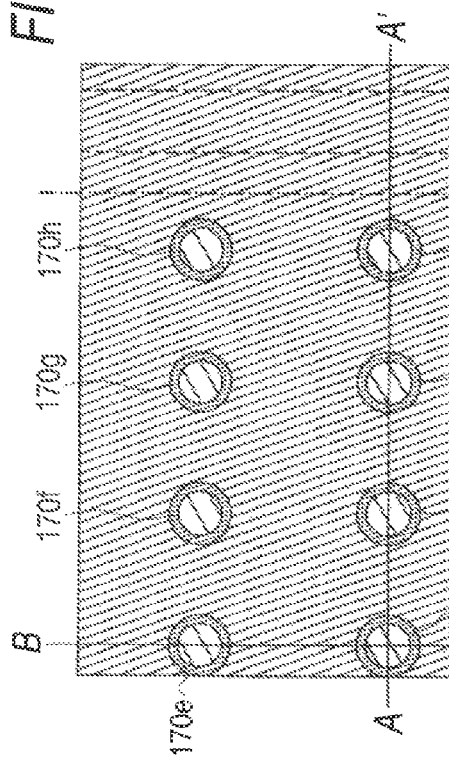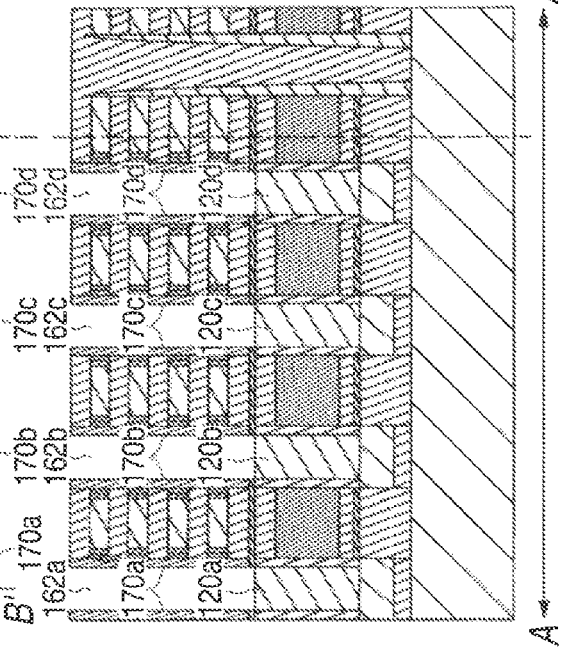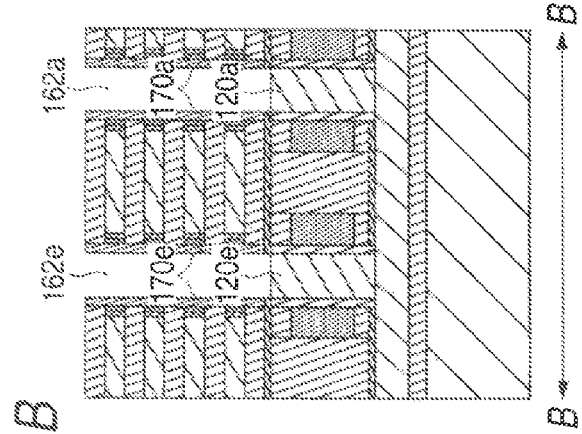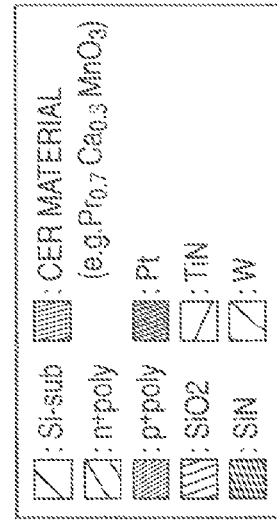
FIG. 74A
FIG. 74B
FIG. 74C

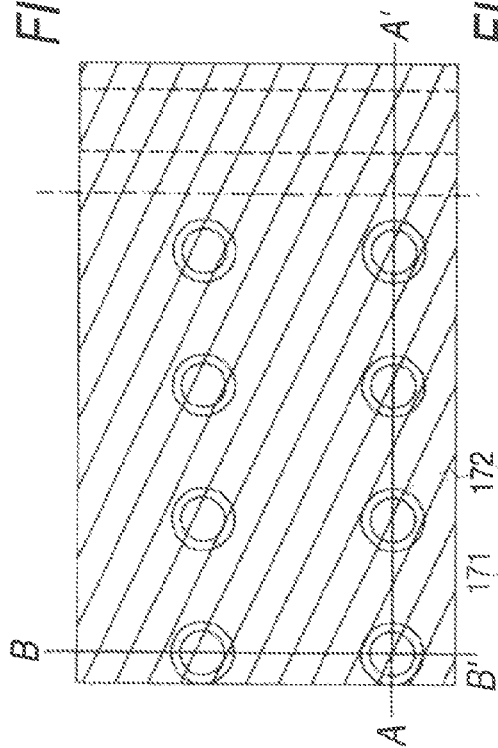
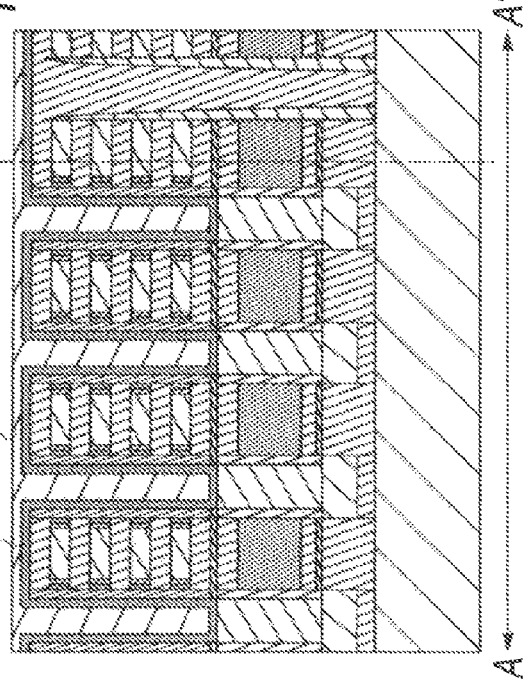
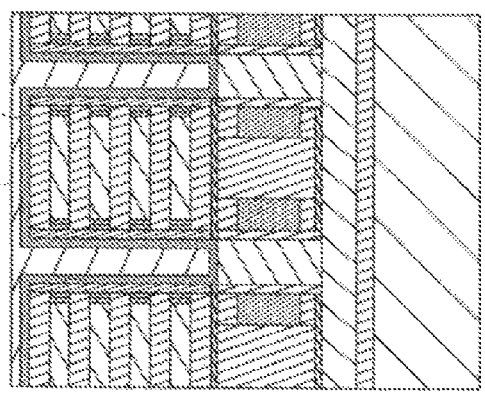
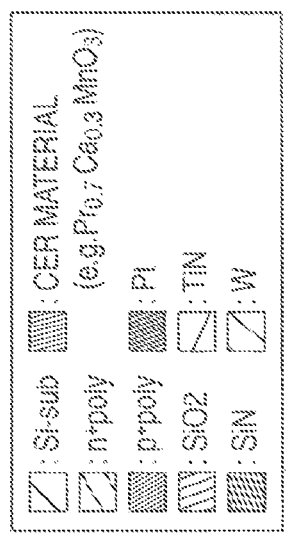
FIG. 75A
FIG. 75B
FIG. 75C

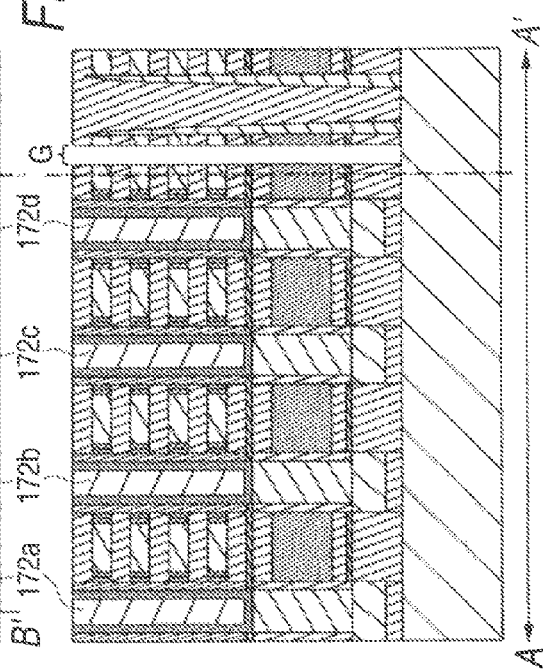
FIG. 77A
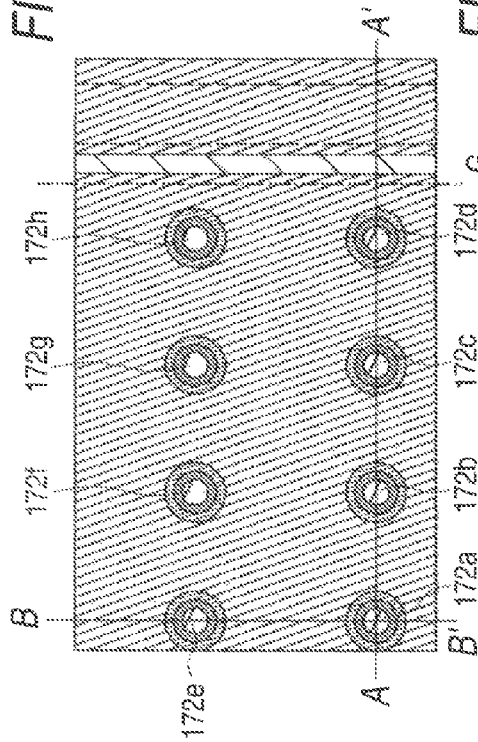
FIG. 77C
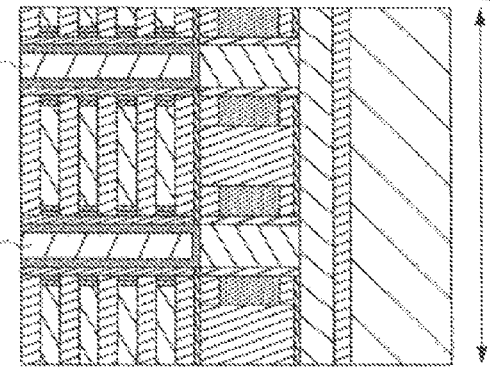
FIG. 77B
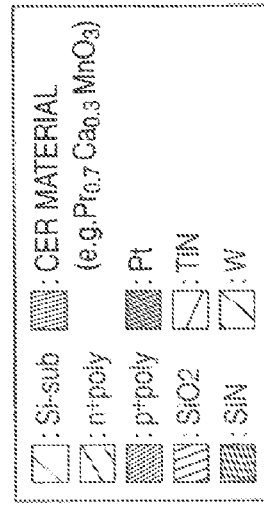

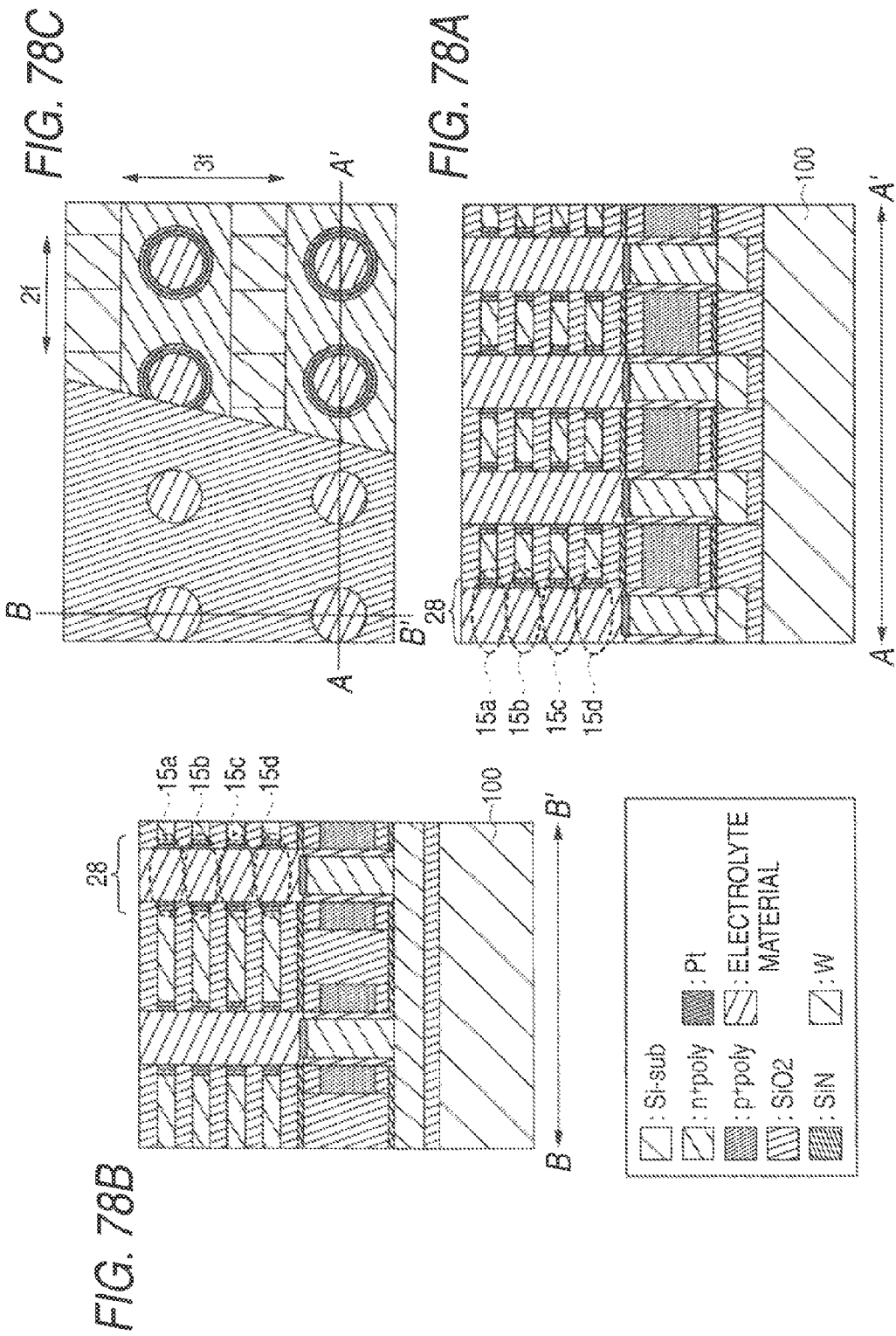

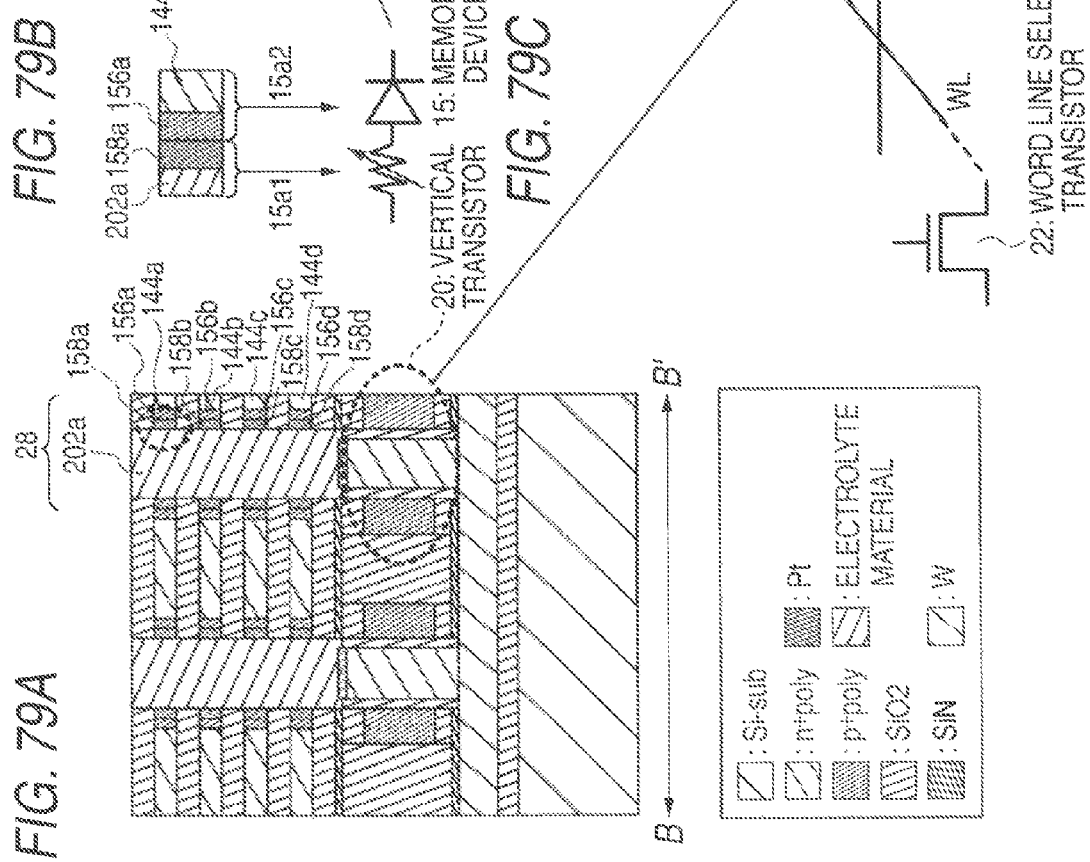

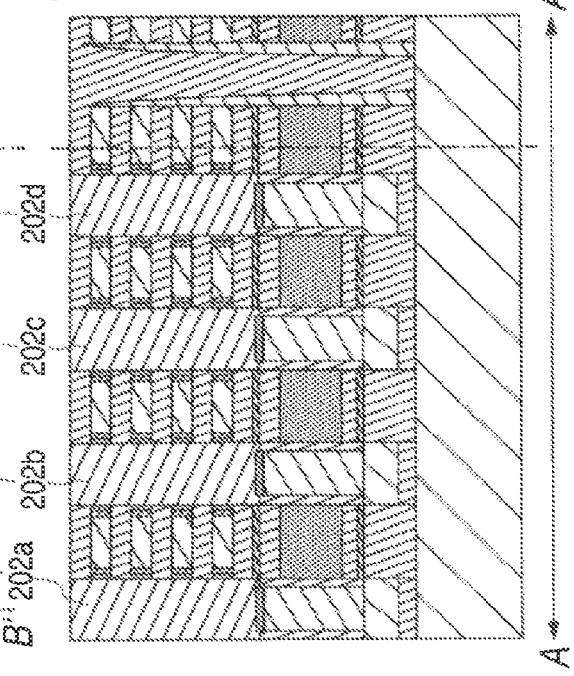
FIG. 80C
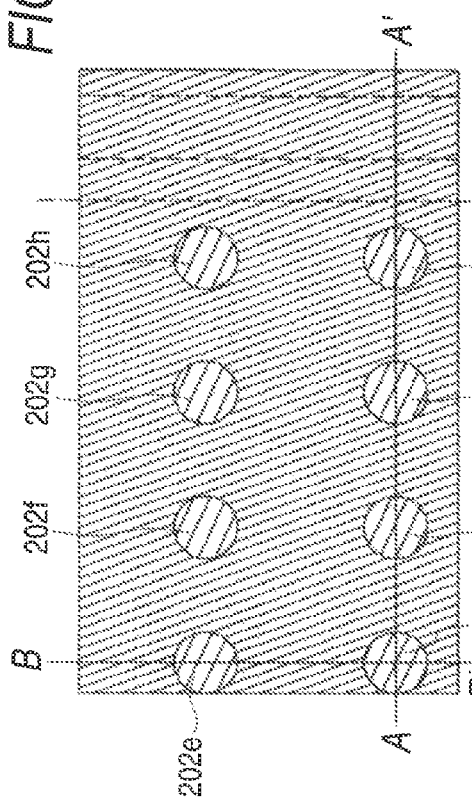
FIG. 80A
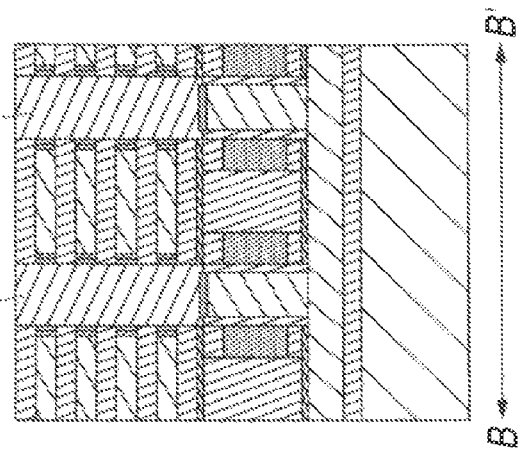
FIG. 80B
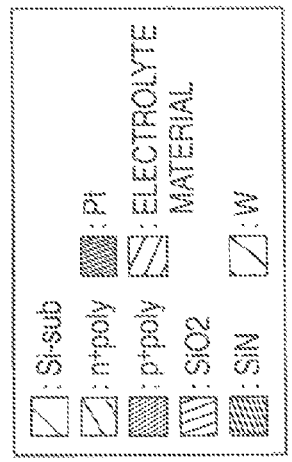

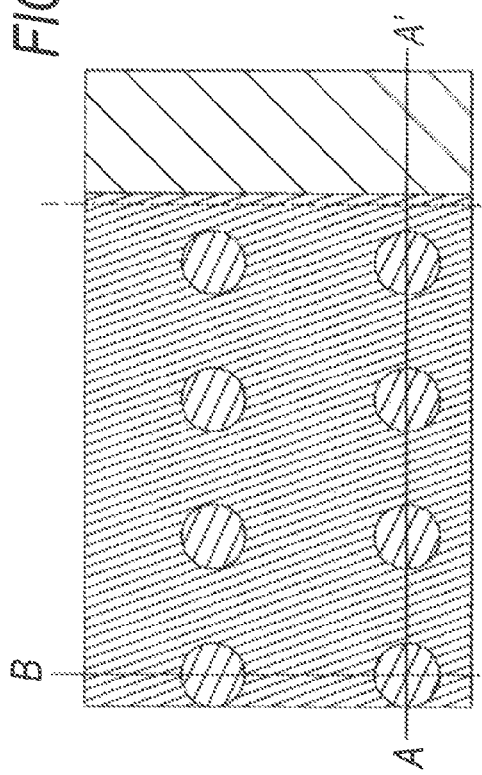
FIG. 81C
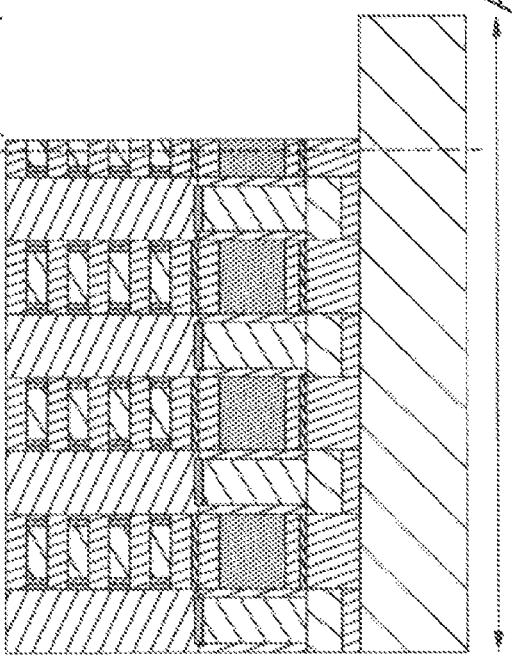
FIG. 81A
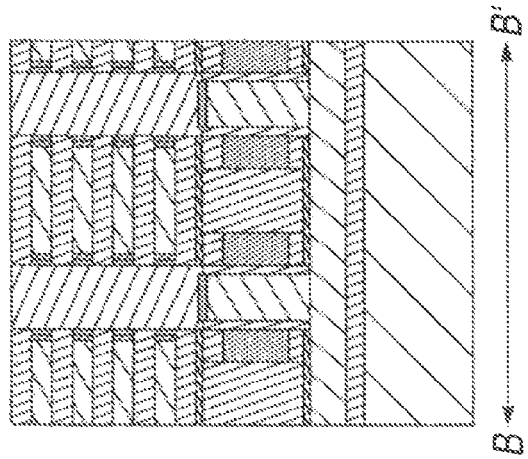
FIG. 81B
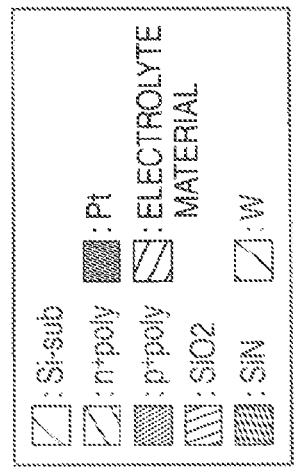

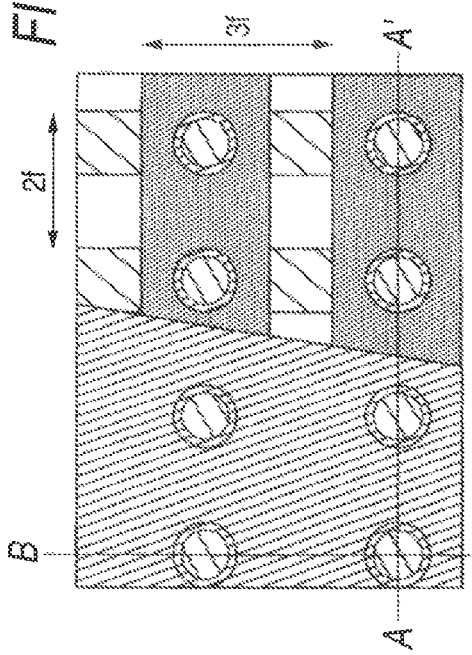
FIG. 83C
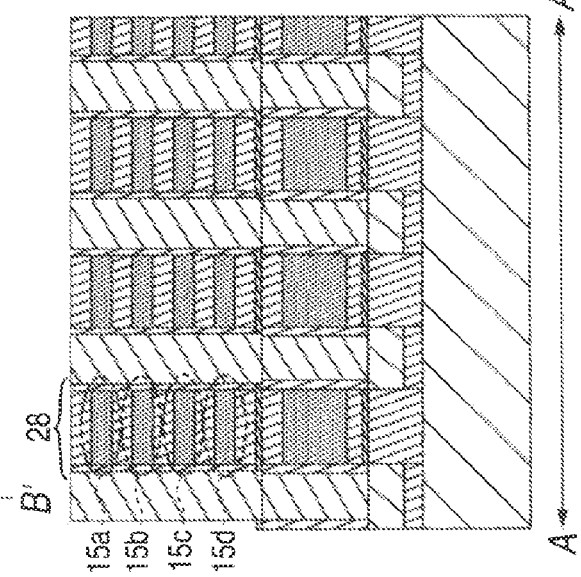
FIG. 83A
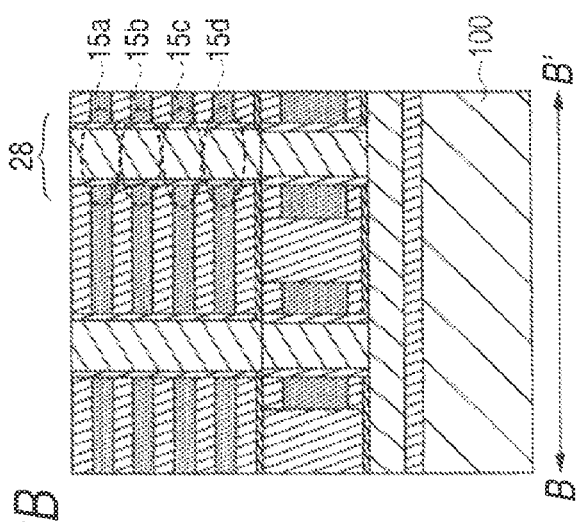
FIG. 83B
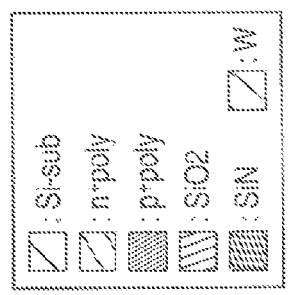

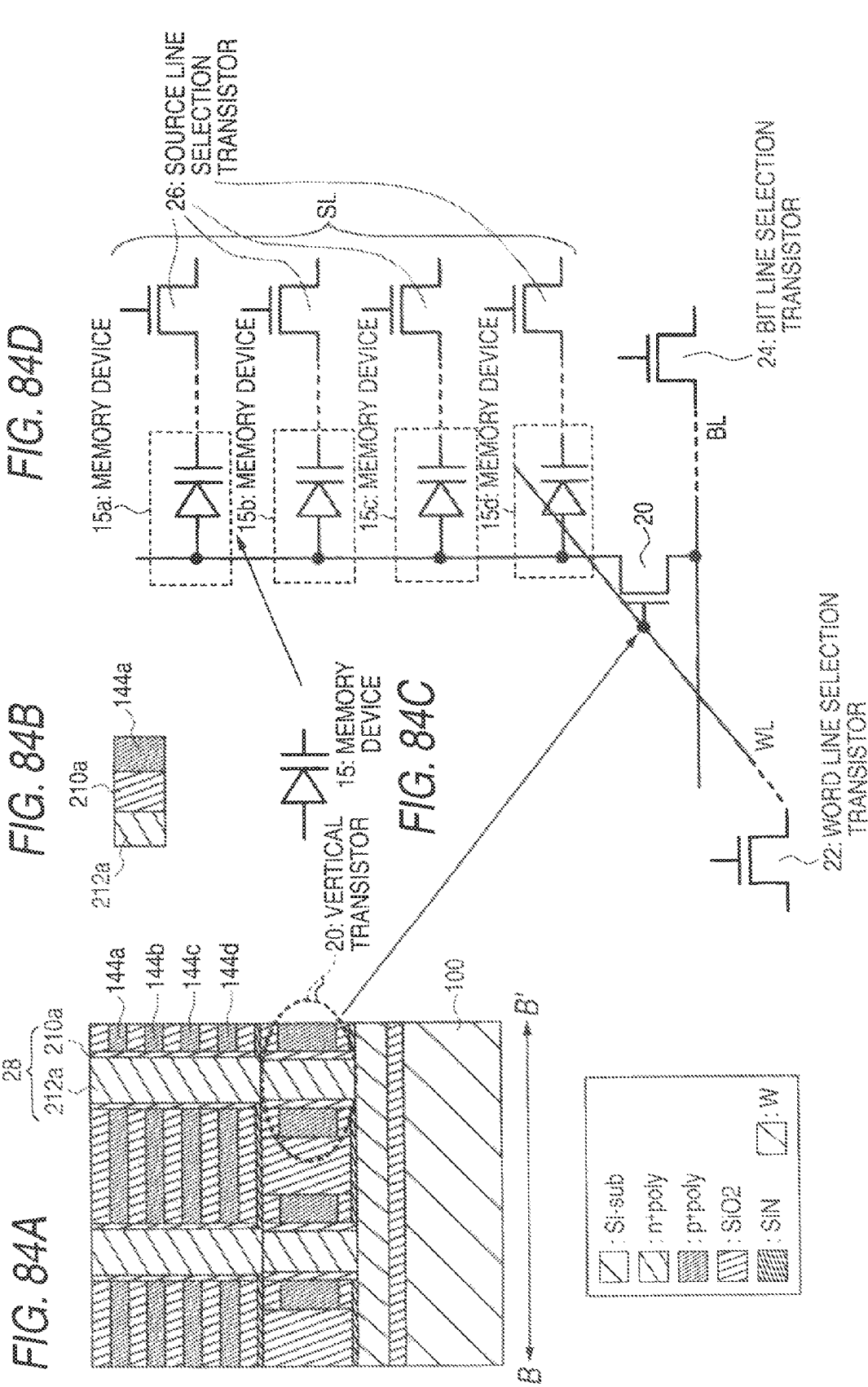

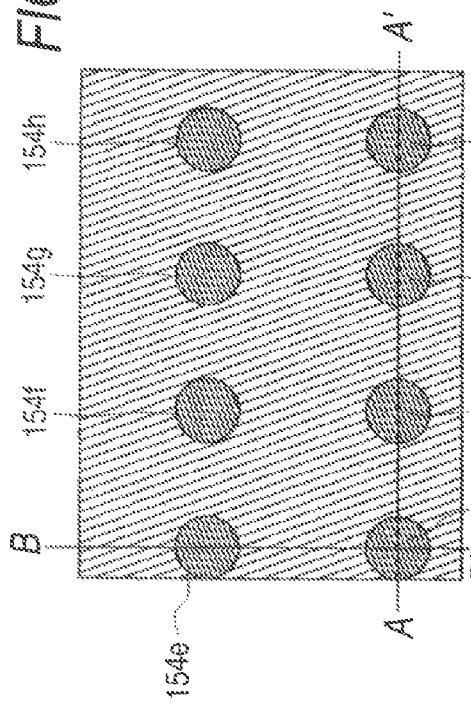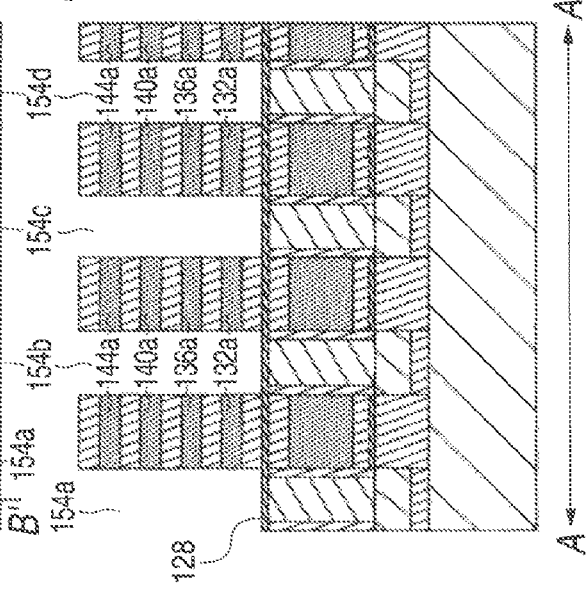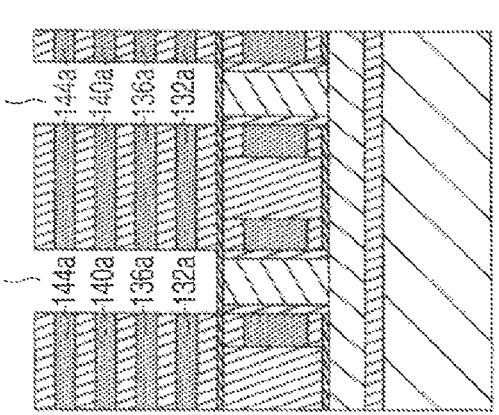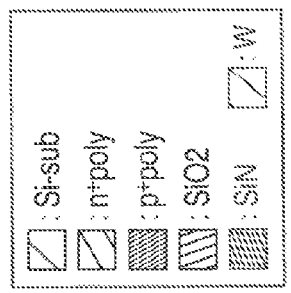

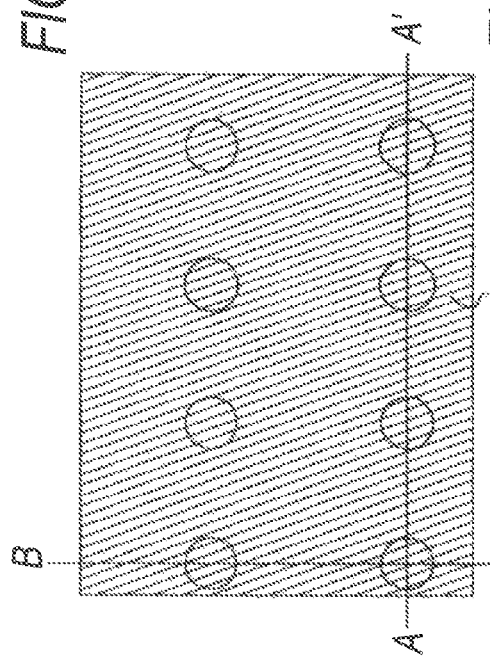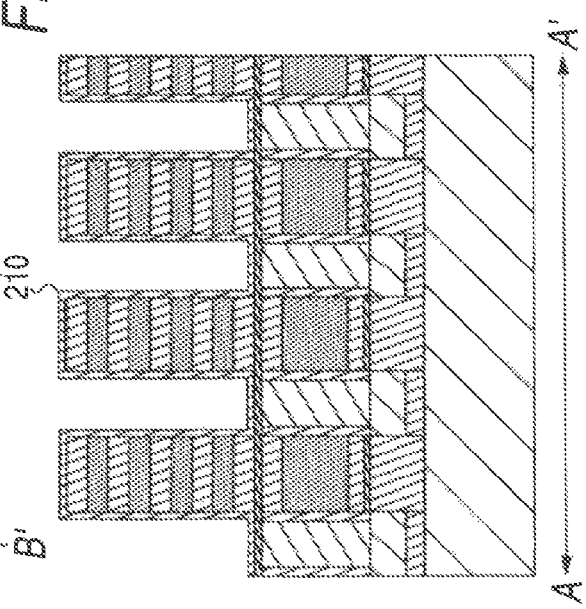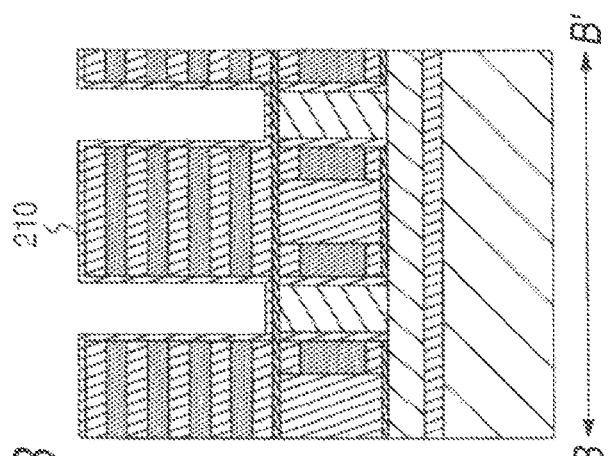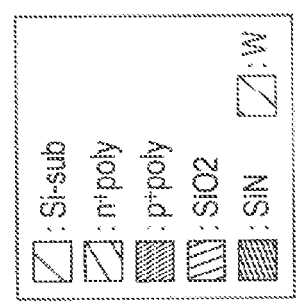

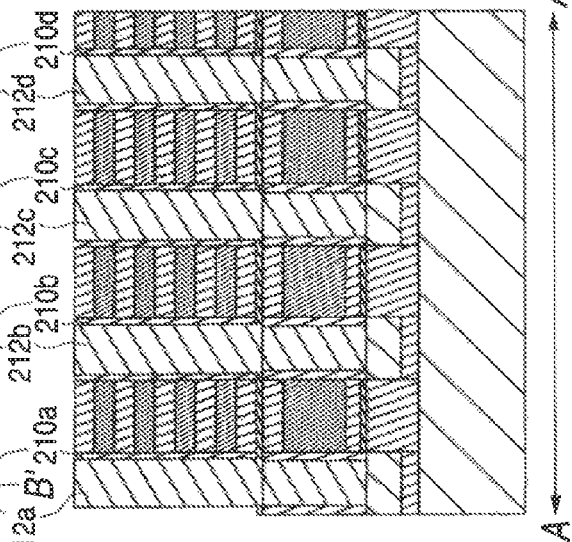
FIG. 87A
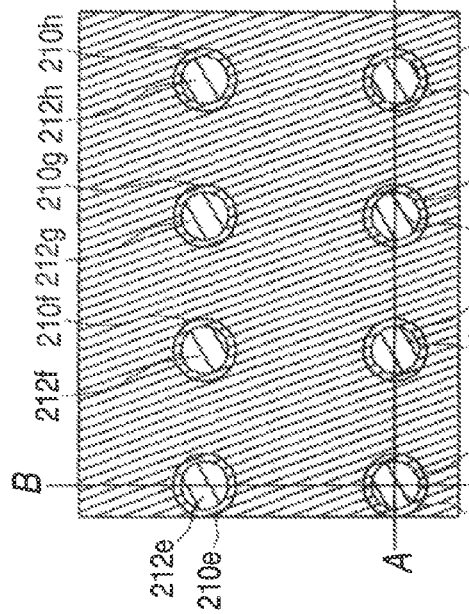
FIG. 87C
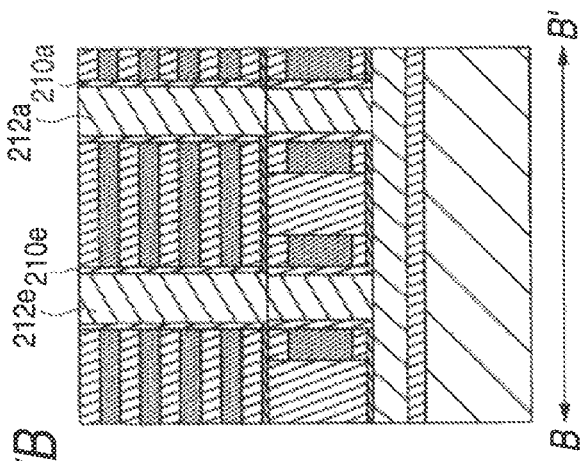
FIG. 87B
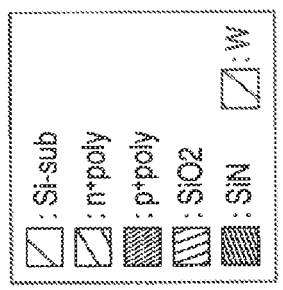

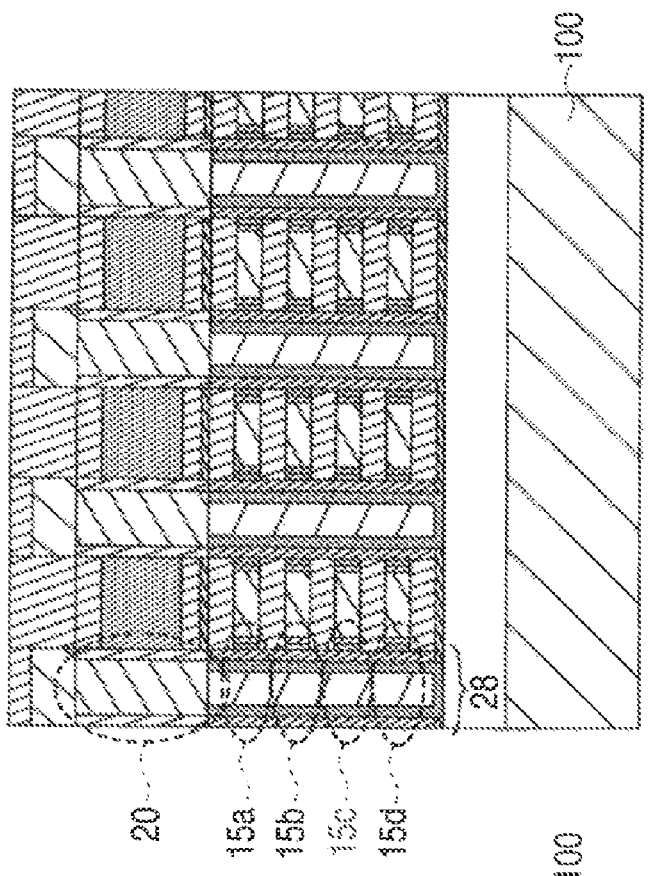
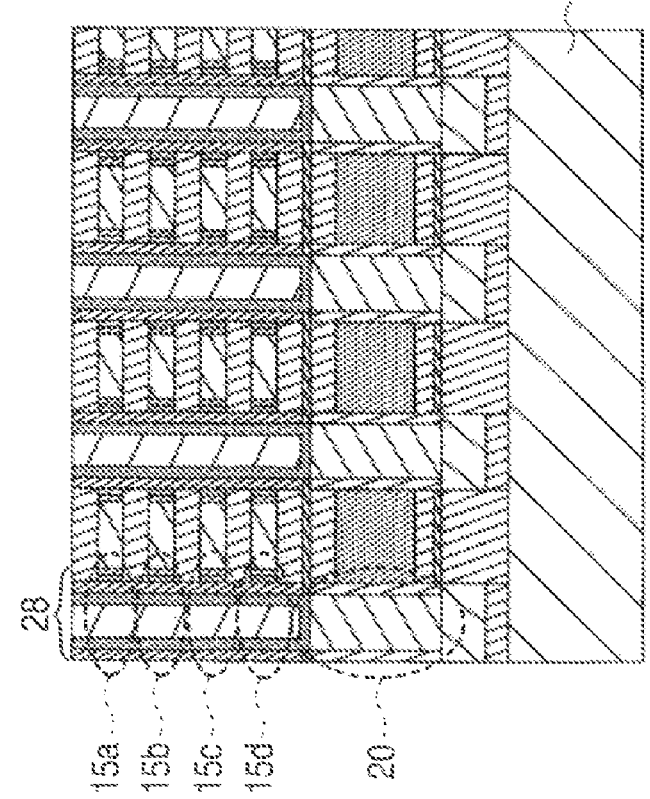

SEMICONDUCTOR MEMORY AND METHOD FOR MANUFACTURING THE SAME

CROSS-REFERENCE TO RELATED APPLICATIONS

The entire disclosure of Japanese Patent Application No. 2007-013163 filed on Jan. 23, 2007 including specification, claims, drawings and abstract is incorporated herein by reference in its entirety.

BACKGROUND OF THE INVENTION

1. Field of the Invention

An aspect of the present invention relates to semiconductor memory wherein data can be electrically rewritten and a manufacturing method thereof.

2. Description of the Related Art

To advance higher integration and larger capacity of semiconductor memory, the minimum design rule needs to be reduced. To reduce the minimum design rule, further micromachining of wiring patterns, etc., becomes necessary. To realize further micromachining of wiring patterns, etc., very advanced machining technique is required and therefore it becomes difficult to reduce the minimum design rule.

In recent years, to enhance the integration degree of memory, a large number of semiconductor memories each with memory cells placed three-dimensionally have been proposed. (For example, refer to JP-A-2003-078044, U.S. Pat. Nos. 5,599,724, 5,707,885 and Endo et al., "Novel Ultra-high-Density Flash Memory With a Stacked-Surrounding Gate Transistor (S-SGT) Structured Cell", IEEE TRANSACTIONS ON ELECTRON DEVICES, VOL. 50, NO 4, pp 945-951, April 2003.)

In most of the semiconductor memories in the related arts each with memory cells placed three-dimensionally, the memory cells are stacked simply and an increase in the cost with an increase in the number of stacks is not circumvented.

In stack-type nonvolatile semiconductor memory in the related arts, word lines, bit lines, and source lines exist independently for each layer. Therefore, as the number of stacks increases, the number of driver transistors for driving the word lines, the bit lines, and the source lines increases and an increase in the chip area is not circumvented.

SUMMARY OF THE INVENTION

According to an aspect of the present invention, there is provided a nonvolatile semiconductor memory including: a plurality of memory devices each having: a resistance change element, and a diode connected serially to the resistance change element; and a source conductive layer spreading two-dimensionally to be connected to one ends of the plurality of memory devices.

According to another aspect of the present invention, there is provided a nonvolatile semiconductor memory including: a semiconductor substrate; an insulating layer formed on the semiconductor substrate; a first conductive layer formed on the insulating layer; a first interlayer insulating layer formed on the first conductive layer; a second conductive layer formed on the first interlayer insulating layer; a first memory device having: a first n-type semiconductor formed in the first conductive layer, a first p-type semiconductor formed in the first n-type semiconductor, a first metal silicide formed in the first p-type semiconductor, and a first metal oxide formed in the first metal silicide; a second memory device having: a second n-type semiconductor formed in the second conductive layer, a second p-type semiconductor formed in the second n-type semiconductor, a second metal silicide formed in the second p-type semiconductor, and a second metal oxide formed in the second metal silicide; and a columnar conductor penetrating through the first conductive layer, the first interlayer insulating layer and the second conductive layer in the first metal oxide and the second metal oxide.

BRIEF DESCRIPTION OF THE DRAWINGS

Embodiments may be described in detail with reference to the accompanying drawings, in which:

FIGS. 2A, 2B and 2C show the schematic configuration of a part of a memory device region 3 of the nonvolatile semiconductor memory 1 according to the embodiment;

FIG. 3A is a sectional view of a part of the memory device region 3 of the nonvolatile semiconductor memory 1 according to the embodiment, FIG. 3B is a partially enlarged view of a memory device 15 of the nonvolatile semiconductor memory 1, FIG. 3C is an equivalent circuit diagram of the memory device 15, and FIG. 3D is an equivalent circuit diagram of a part of the nonvolatile semiconductor memory 1;

FIGS. 13A, 13B and 13C show a manufacturing process of the nonvolatile semiconductor memory according to the embodiment;

FIGS. 14A, 14B and 14C show the manufacturing process of the nonvolatile semiconductor memory according to the embodiment;

FIGS. 15A, 15B and 15C show the manufacturing process of the nonvolatile semiconductor memory according to the embodiment;

FIGS. 17A, 17B and 17C show the manufacturing process of the nonvolatile semiconductor memory according to the embodiment;

FIGS. 18A, 18B and 18C show the manufacturing process of the nonvolatile semiconductor memory according to the embodiment;

FIGS. 19A, 19B and 19C show the manufacturing process of the nonvolatile semiconductor memory according to the embodiment;

FIGS. 20A, 20B and 20C show the manufacturing process of the nonvolatile semiconductor memory according to the embodiment;

FIGS. 21A, 21B and 21C show the manufacturing process of the nonvolatile semiconductor memory according to the embodiment;

FIGS. 22A, 22B and 22C show the manufacturing process of the nonvolatile semiconductor memory according to the embodiment;

FIGS. 24A, 24B and 24C show the manufacturing process of the nonvolatile semiconductor memory according to the embodiment;

FIGS. 25A, 25B and 25C show the manufacturing process of the nonvolatile semiconductor memory according to the embodiment;

FIGS. 26A, 26B and 26C show the manufacturing process of the nonvolatile semiconductor memory according to the embodiment;

FIGS. 27A, 27B and 27C show the manufacturing process of the nonvolatile semiconductor memory according to the embodiment;

FIGS. 28A, 28B and 28C show the manufacturing process of the nonvolatile semiconductor memory according to the embodiment;

FIGS. 29A, 29B and 29C show the manufacturing process of the nonvolatile semiconductor memory according to the embodiment;

FIGS. 30A, 30B and 30C show the manufacturing process of the nonvolatile semiconductor memory according to the embodiment;

FIGS. 31A, 31B and 31C show the manufacturing process of the nonvolatile semiconductor memory according to the embodiment;

FIGS. 32A, 32B and 32C show the manufacturing process of the nonvolatile semiconductor memory according to the embodiment;

FIGS. 33A, 33B and 33C show the manufacturing process of the nonvolatile semiconductor memory according to the embodiment;

FIGS. 35A, 35B and 35C show the manufacturing process of the nonvolatile semiconductor memory according to the embodiment;

FIGS. 36A, 36B and 36C show the manufacturing process of the nonvolatile semiconductor memory according to the embodiment;

FIGS. 37A, 37B and 37C show the manufacturing process of the nonvolatile semiconductor memory according to the embodiment;

FIGS. 41A, 41B and 41C show a manufacturing process of nonvolatile semiconductor memory according to a third embodiment;

FIGS. 42A, 42B and 42C show the manufacturing process of the nonvolatile semiconductor memory according to the embodiment;

FIGS. 43A, 43B and 43C show the manufacturing process of the nonvolatile semiconductor memory according to the embodiment;

FIGS. 44A, 44B and 44C show the manufacturing process of the nonvolatile semiconductor memory according to the embodiment;

FIGS. 45A, 45B and 45C show the manufacturing process of the nonvolatile semiconductor memory according to the embodiment;

FIGS. 46A, 46B and 46C show the manufacturing process of the nonvolatile semiconductor memory according to the embodiment;

FIGS. 47A, 47B and 47C show the manufacturing process of the nonvolatile semiconductor memory according to the embodiment;

FIGS. 50A, 50B and 50C to show the schematic configuration of a part of a memory device region 3 of the nonvolatile semiconductor memory 200 according to the embodiment;

FIG. 51A is a sectional view of apart of the memory device region 3 of the nonvolatile semiconductor memory 200 according to the embodiment, FIG. 51B is a partially enlarged view of a memory device 15 of the nonvolatile semiconductor memory 200, FIG. 51C is an equivalent circuit diagram of the memory device 15, and FIG. 51D is an equivalent circuit diagram of a part of the nonvolatile semiconductor memory 200;

FIGS. 53A, 53B and 53C show the manufacturing process of the nonvolatile semiconductor memory according to the embodiment;

FIGS. 54A, 54B and 54C show the manufacturing process of the nonvolatile semiconductor memory according to the embodiment;

FIGS. 55A, 55B and 55C show the manufacturing process of the nonvolatile semiconductor memory according to the embodiment;

FIGS. 56A, 56B and 56C show the manufacturing process of the nonvolatile semiconductor memory according to the embodiment;

FIGS. 57A, 57B and 57C show the manufacturing process of the nonvolatile semiconductor memory according to the embodiment;

FIGS. 58A, 58B and 58C show the schematic configuration of a part of a memory device region 3 of nonvolatile semiconductor memory 300 according to a fifth embodiment;

FIG. 59A is a sectional view of apart of the memory device region 3 of the nonvolatile semiconductor memory 300 according to the embodiment, FIG. 59B is a partially enlarged view of a memory device 15 of the nonvolatile semiconductor memory 300, FIG. 59C is an equivalent circuit diagram of the memory device 15, and FIG. 59D is an equivalent circuit diagram of a part of the nonvolatile semiconductor memory 300;

FIGS. 61A, 61B and 61C show the manufacturing process of the nonvolatile semiconductor memory according to the embodiment;

FIGS. 63A, 63B and 63C show the manufacturing process of the nonvolatile semiconductor memory according to the embodiment;

FIGS. 64A, 64B and 64C show the manufacturing process of the nonvolatile semiconductor memory according to the embodiment;

FIGS. 65A, 65B and 65C show the manufacturing process of the nonvolatile semiconductor memory according to the embodiment;

FIGS. 66A, 66B and 66C show the manufacturing process of the nonvolatile semiconductor memory according to the embodiment;

FIGS. 68A, 68B and 68C show the manufacturing process of the nonvolatile semiconductor memory according to the embodiment;

FIGS. 70A, 70B and 70C show the manufacturing process of the nonvolatile semiconductor memory according to the embodiment;

FIGS. 71A, 71B and 71C show the schematic configuration of a part of a memory device region 3 of nonvolatile semiconductor memory 400 according to a sixth embodiment;

FIG. 72A is a sectional view of apart of the memory device region 3 of the nonvolatile semiconductor memory 400 according to the embodiment, FIG. 72B is a partially enlarged view of a memory device 15 of the nonvolatile semiconductor memory 400, FIG. 72C is an equivalent circuit diagram of the memory device 15, and FIG. 72D is an equivalent circuit diagram of a part of the nonvolatile semiconductor memory 400;

FIGS. 73A, 73B and 73C show a manufacturing process of the nonvolatile semiconductor memory according to the embodiment;

FIGS. 74A, 74B and 74C show the manufacturing process of the nonvolatile semiconductor memory according to the embodiment;

FIGS. 75A, 75B and 75C show the manufacturing process of the nonvolatile semiconductor memory according to the embodiment;

FIGS. 77A, 77B and 77C show the manufacturing process of the nonvolatile semiconductor memory according to the embodiment;

FIGS. 78A, 78B and 78C show the schematic configuration of a part of a memory device region 3 of nonvolatile semiconductor memory 500 according to a seventh embodiment;

FIG. 79A is a sectional view of apart of the memory device region 3 of the nonvolatile semiconductor memory 500 according to the embodiment, FIG. 79B is a partially enlarged view of a memory device 15 of the nonvolatile semiconductor memory 500, FIG. 79C is an equivalent circuit diagram of the memory device 15, and FIG. 79D is an equivalent circuit diagram of a part of the nonvolatile semiconductor memory 500;

FIGS. 80A, 80B and 80C show a manufacturing process of the nonvolatile semiconductor memory according to the embodiment;

FIGS. 81A, 81B and 81C show the manufacturing process of the nonvolatile semiconductor memory according to the embodiment;

FIGS. 83A, 83B and 83C show the schematic configuration of apart of a memory device region 3 of nonvolatile semiconductor memory 600 according to an eighth embodiment;

FIG. 84A is a sectional view of apart of the memory device region 3 of the nonvolatile semiconductor memory 600 according to the embodiment, FIG. 84B is a partially enlarged view of a memory device 15 of the nonvolatile semiconductor memory 600, FIG. 84C is an equivalent circuit diagram of the memory device 15, and FIG. 84D is an equivalent circuit diagram of a part of the nonvolatile semiconductor memory 600;

FIGS. 85A, 85B and 85C show a manufacturing process of the nonvolatile semiconductor memory according to the embodiment;

FIGS. 86A, 86B and 86C show the manufacturing process of the nonvolatile semiconductor memory according to the embodiment;

FIGS. 87A, 87B and 87C show the manufacturing process of the nonvolatile semiconductor memory according to the embodiment;

FIG. 88A is a sectional view of the memory device region of the nonvolatile semiconductor memory according to the above-described embodiments, and FIG. 88B is a sectional view of a memory device region of nonvolatile semiconductor memory according to a tenth embodiment;

DETAILED DESCRIPTION OF THE INVENTION

Figure 1:
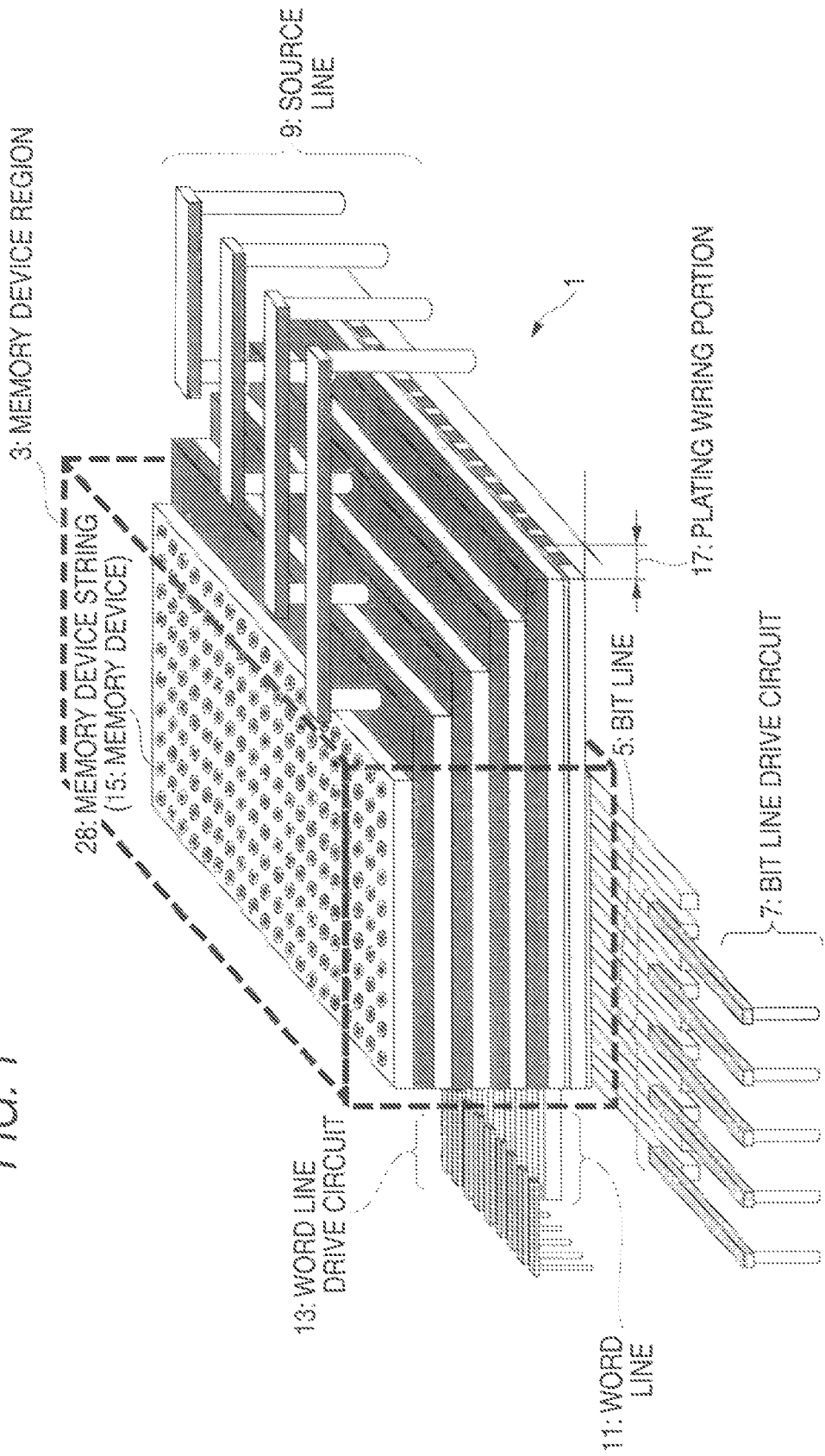
FIG. 1 shows the schematic configuration of a nonvolatile semiconductor memory 1 according to a first embodiment.

Embodiments of nonvolatile semiconductor memory and its manufacturing method of the invention will be discussed below, but the invention is not limited to the following embodiments. In the embodiments, similar components are denoted by the same reference numerals and description thereof may be skipped.

First Embodiment (Nonvolatile Semiconductor Memory 1 of Unipolar Operation)
(OxReRAM: Oxide Resistive RAM)

FIG. 1 shows the schematic configuration of a nonvolatile semiconductor memory 1 according to a first embodiment. The nonvolatile semiconductor memory 1 has a memory device region 3, bit lines 5, a bit line drive circuit 7, source lines 9, word lines 11, a word line drive circuit 13, etc. A plating wiring portion 17 of the nonvolatile semiconductor memory 1 according to the first embodiment indicates a portion cut after a plating process of the nonvolatile semiconductor memory 1. As shown in FIG. 1, in the nonvolatile semiconductor memory 1, memory devices 15 forming the memory device region 3 are formed by stacking semiconductor layers. As shown in FIG. 1, the source lines 9 of each layer are spread two-dimensionally. The source lines 9 of each layer have a plate-like flat structure made of the same layer. In the nonvolatile semiconductor memory 1, the direction of current flowing into the memory device 15 is constant. The nonvolatile semiconductor memory 1 may be called "nonvolatile semiconductor memory of unipolar operation."

The nonvolatile semiconductor memory 1 according to the embodiment may be called "OxReRAM (Oxide Resistive RAM)" because the memory device 15 has a resistance change element having a metal oxide.

FIGS. 2A, 2B and 2C show the schematic configuration of a part of the memory device region 3 of the nonvolatile semiconductor memory 1. FIG. 2C is a top view of the memory device region 3. In a part of FIG. 2C, the upper structure thereof is stripped for convenience of the description. FIG. 2A is a sectional view of the memory device region 3 taken on line A-A' in FIG. 2C. FIG. 2B is a sectional view of the memory device region 3 taken on line B-B' in FIG. 2C. As shown in FIGS. 2A to 2C, the memory device region 3 has a configuration wherein memory device strings 28 each having a plurality of memory devices 15 stacked in a longitudinal direction are arranged like a matrix. If the minimum machining dimension is F in the memory device region 3, the length of the memory device 15 in the A-A' direction thereof is 3 F and the length in the B-B' direction is 2 F and if one memory device string has n memory devices 15 (if n memory devices are stacked), the effective area of each memory device 15 (the area required to implement one memory device 15 on the substrate) is 6 $F^2/n$.

FIG. 3A is a sectional view of a part of the memory device region 3 of the nonvolatile semiconductor memory 1 like FIG. 2B. FIG. 3B is a partially enlarged view of the memory device 15 and FIG. 3C is an equivalent circuit diagram of the memory device 15. FIG. 3D is an equivalent circuit diagram of a part of the nonvolatile semiconductor memory 1. As shown in FIG. 3A, the memory device region 3 has vertical transistors 20 (selection transistors 20). A plurality of (in the embodiment, four) memory devices 15 are stacked on each of the vertical transistors 20. In the embodiment, a structure made up of a plurality of (in the embodiment, four) memory devices 15 stacked on each of the vertical transistors 20 is called memory device string 28. The memory device region 3 has 10×20=200 memory device strings 28 as shown in FIG. 1.

The memory device string 28 has memory devices 15a to 15d. The memory device 15a has a metal layer 163a, a transition metal oxide layer 160a, a metal silicide layer 158a, a p-type polysilicon layer 156a, and an n-type polysilicon layer 144a. The memory device 15b has a metal layer 163a, a transition metal oxide layer 160b, a metal silicide layer 158b, a p-type polysilicon layer 156b, and an n-type polysilicon layer 144b. The memory device 15c has a metal layer 163a, a transition metal oxide layer 160c, a metal silicide layer 158c, a p-type polysilicon layer 156c, and an n-type polysilicon layer 144c. The memory device 15d has a metal layer 163a, a transition metal oxide layer 160d, a metal silicide layer 158d, a p-type polysilicon layer 156d, and an n-type polysilicon layer 144d. In the embodiment, the p-type poly silicon layers 156a to 156d are formed to be smaller in a dimension than the n-type polysilicon layers 144a to 144d.

The memory devices 15a to 15d making up one memory device string 28 shown in FIGS. 3A to 3D have the common metal layer 163a and the ends of the memory devices 15a to 15d are electrically connected by the metal layer 163a. The n-type polysilicon layers 144a, 144b, 144c, 144d form the source lines 9 and each extend two-dimensionally. In the embodiment, each of the n-type polysilicon layers 144a, 144b, 144c, 144d are formed like a plate. In the memory device region 3, every memory device string 28 has the n-type polysilicon layers 144a, 144b, 144c, and 144d in common. A plurality of memory devices connected by the same source line 9 are called memory device group. The source line 9 becomes a drain line depending on the direction of current flowing into the memory device. Therefore, the source line 9 may be called simply wiring.

The memory device 15a of the nonvolatile semiconductor memory 1 has a resistance change element 15a1 made up of the metal layer 163a, the transition metal oxide layer 160a, and the metal silicide layer 158a, and a diode 15a2 made up of the p-type polysilicon layer 156a and the n-type polysilicon layer 144a, connected to one end of the resistance change element 15a1, as shown in FIG. 3B. That is, the memory device 15a has the resistance change element 15a1 and the diode 15a2 connected in series. It may be recognized that the memory device 15a is made of the resistance change element 15a1, and the diode 15a2 is connected to one end of the memory device 15a made of the resistance change element 15a1. Each of other memory devices 15b to 15d has a similar configuration to that of the memory device 15a. The memory device 15a of the nonvolatile semiconductor memory 1 has the diode 15a2 where the direction from the resistance change element 15a1 to a source line SL is a forward direction. The p-type polysilicon layer 156a and the n-type polysilicon layer 144a may be formed so that the direction of the diode 15a2 becomes opposite.

One end of the memory device 15 is connected to the source line 9 (SL) through a source line selection transistor 26. The source line 9 has a plate-like flat structure made of the same layer, as described above. An opposite end of the memory device 15 is connected to the bit line 5 (BL) through the vertical transistor 20. A bit line selection transistor 24 is connected to one end of the bit line 5 (BL). A signal is applied to the bit line 5 (BL) by the bit line selection transistor 24. The word line 11 (WL) is connected to a gate of the vertical transistor 20. A signal is applied to the word line 11 (WL) by a word line selection transistor 22.

One ends of the memory devices 15 stacked in the longitudinal direction are connected with each other and connected to the word line 11 (WL) through the vertical transistor 20, as shown in FIGS. 3A to 3D.

While one memory device string 28 has been described in FIGS. 2A to 2C and 3A to 3D, every memory device string 28 has a similar configuration in the nonvolatile semiconductor memory 1. The number of the memory device strings 28 and the number of the memory devices 15 making up one memory device string 28 can be changed appropriately as desired in response to the memory capacity.

Figure 6:
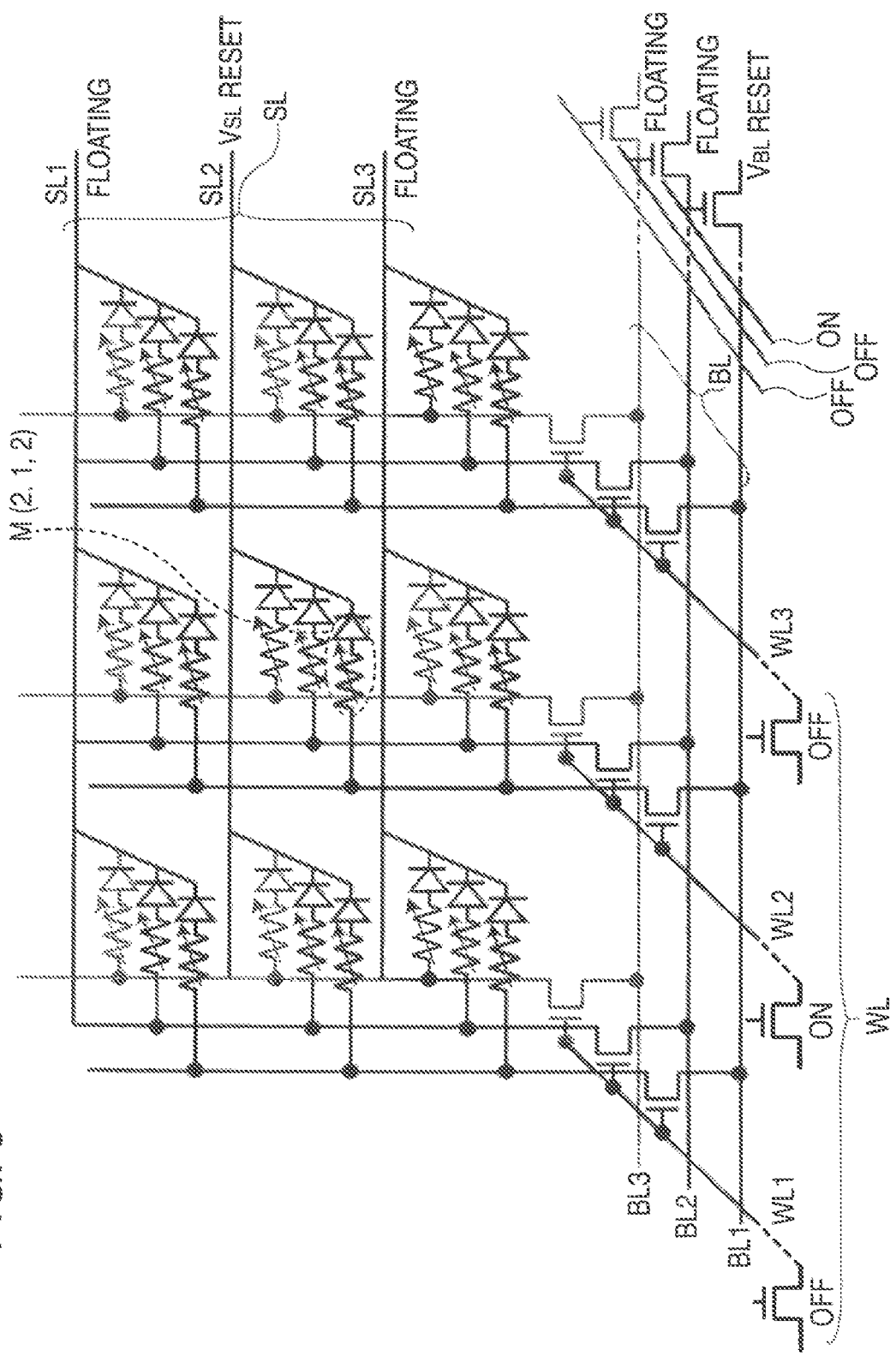
FIG. 6 shows a bias condition in erasing operation of the nonvolatile semiconductor memory according to the embodiment.
Figure 7:
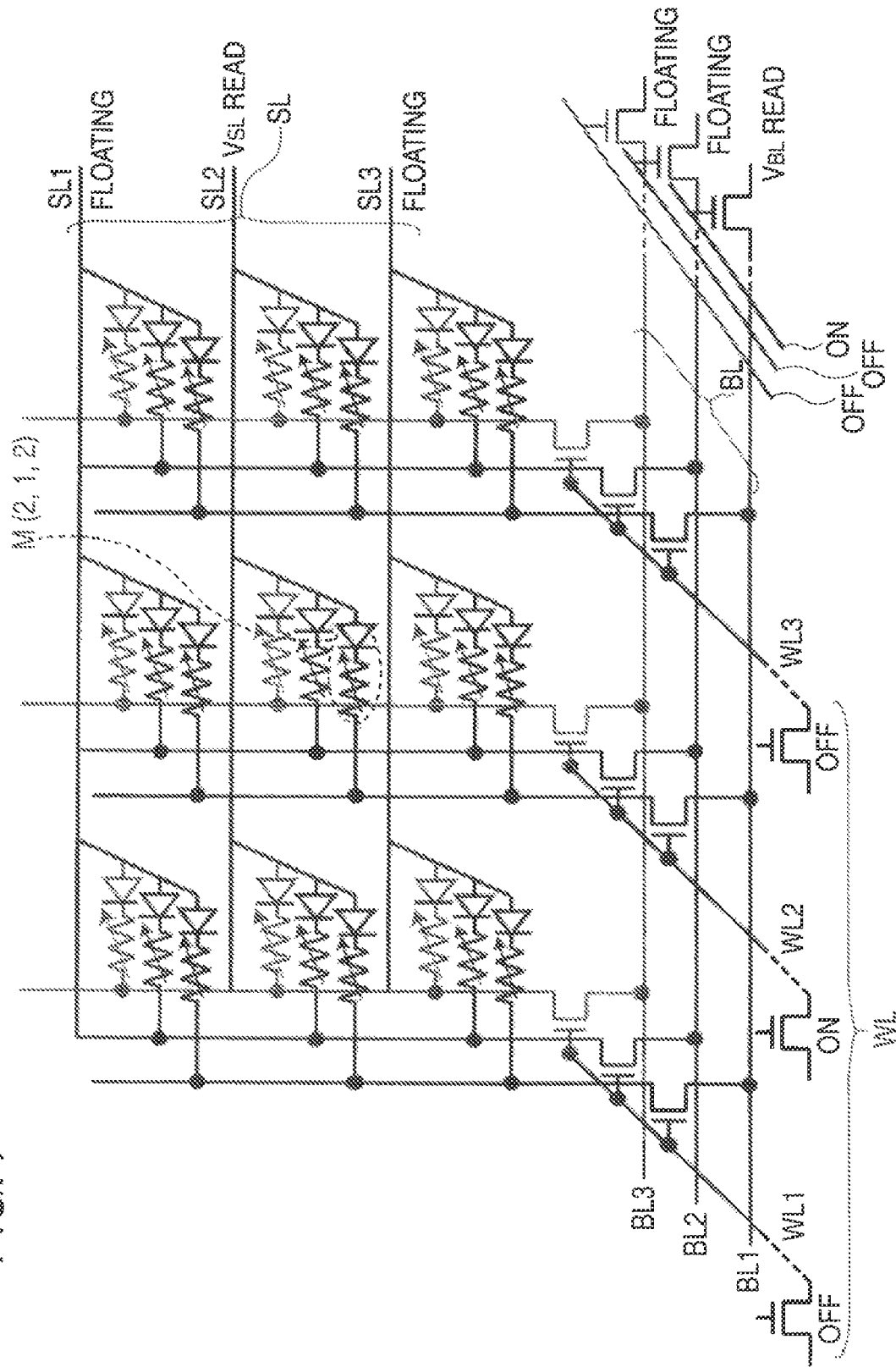
FIG. 7 shows a bias condition in read operation of the nonvolatile semiconductor memory according to the embodiment.
Figure 8:
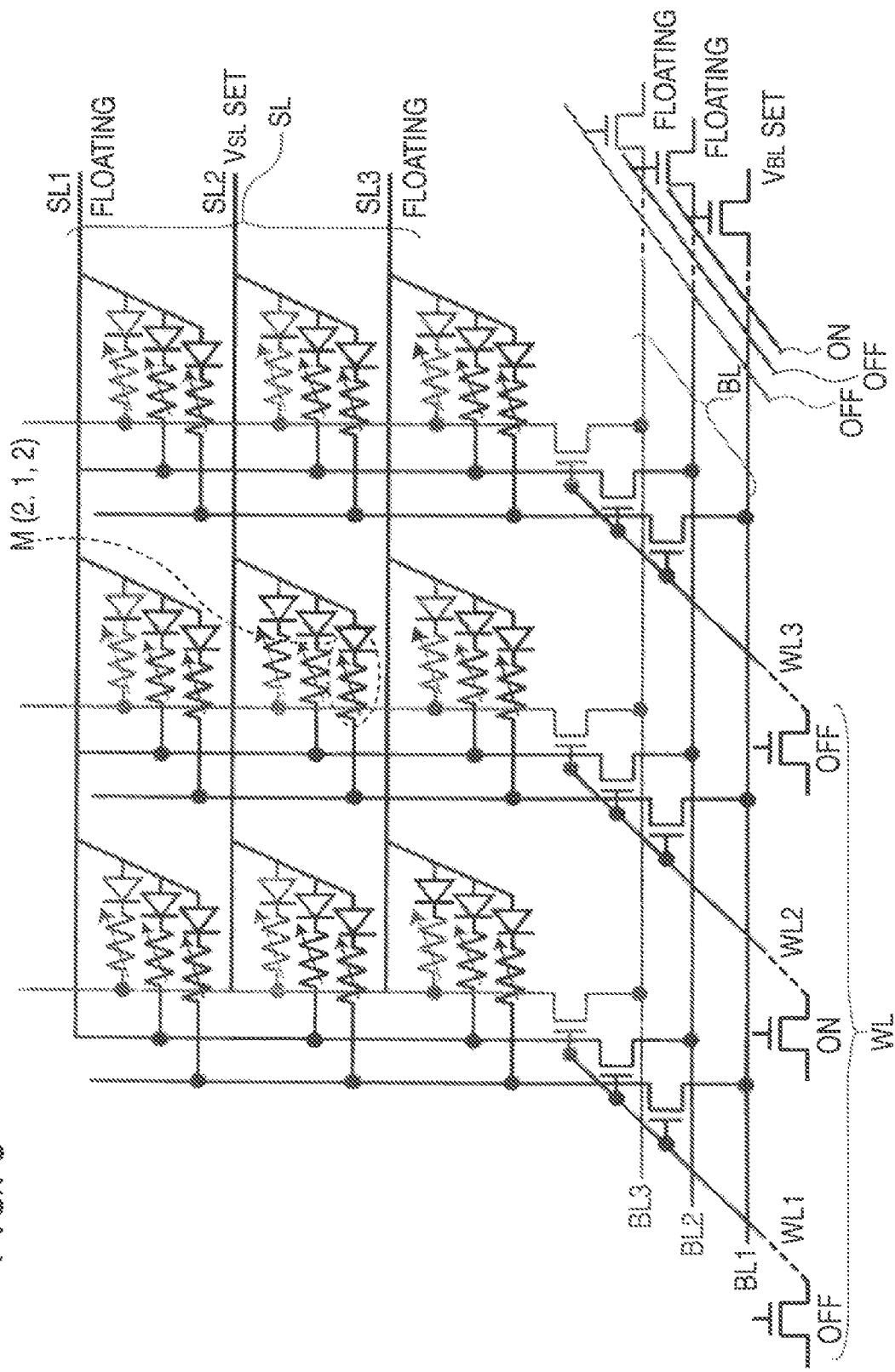
FIG. 8 shows a bias condition in write operation of the nonvolatile semiconductor memory according to the embodiment.
Figure 9:
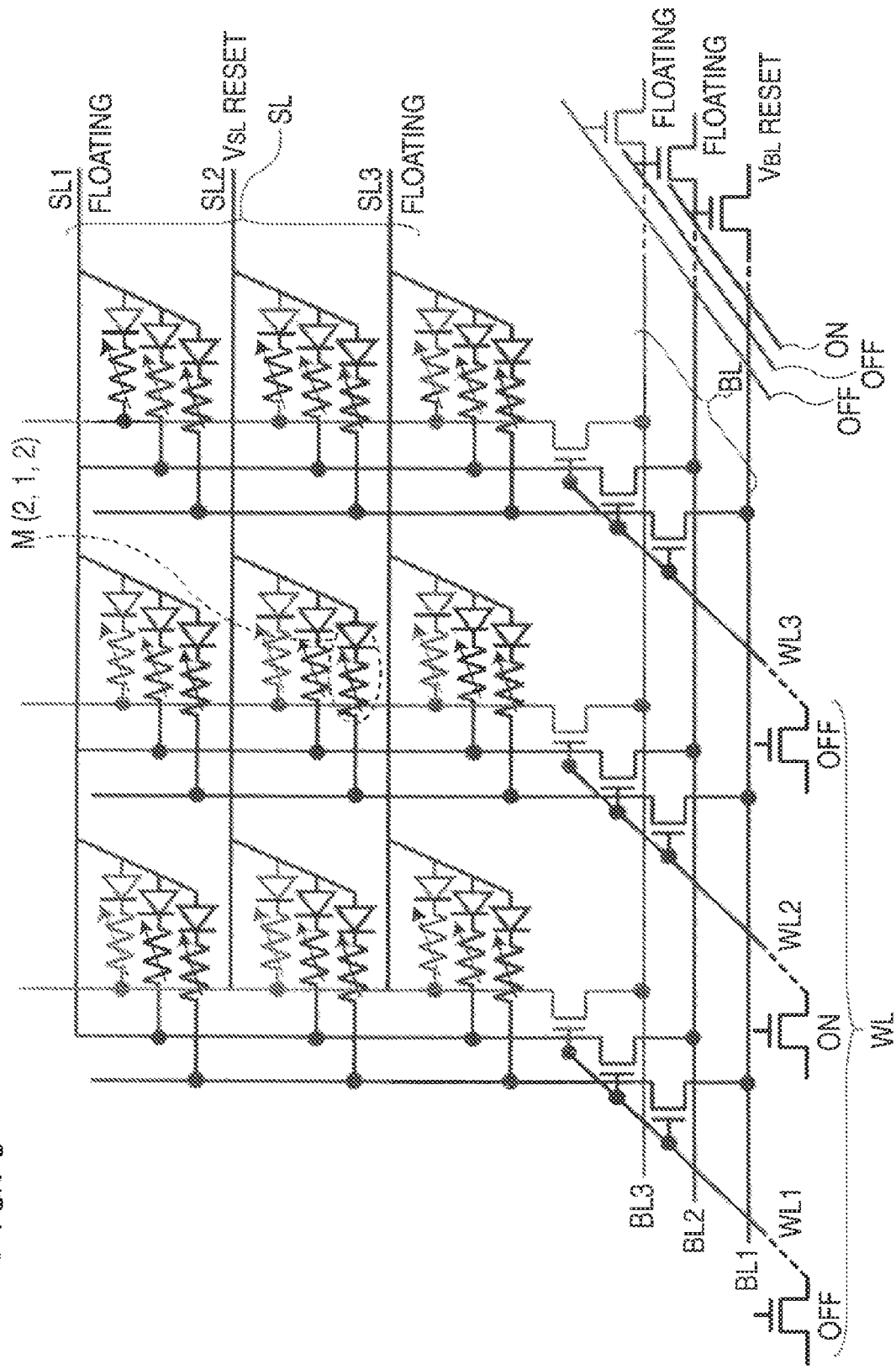
FIG. 9 shows a bias condition in erasing operation of the nonvolatile semiconductor memory according to the embodiment.

The "Read operation," the "write operation," and the "erasing operation" in the nonvolatile semiconductor memory 1 according to the embodiment will be discussed with reference to FIGS. 4 to 9. To describe the "read operation," the "write operation," and the "erasing operation" in the nonvolatile semiconductor memory 1, for convenience of the description, a memory device region 3 made up of 27 memory devices 15 is taken as an example, as shown in FIGS. 4 to 9. Three bit lines BL1 to BL3, three word lines WL1 to WL3, and three source lines SL1 to SL3 are used to the selection of the memory devices 15. The 27 memory devices 15 are indicated by M (i, j, k) where "i" corresponds to word line Wi, "j" corresponds to bit line Bj, and "k" corresponds to source line Sk. The configuration of the memory device region 3 is not limited to that shown in FIGS. 4 to 9. In the embodiment shown in FIGS. 4 to 6, each of the memory devices 15 has a resistance change element and a diode connected to one end of the resistance change element for placing the direction of current flowing from the resistance change element to the source line in a forward direction. The connection of the diode may be made opposite as shown in FIGS. 7 to 9. In the embodiment, memory device M may be called "bit."

Figure 82:
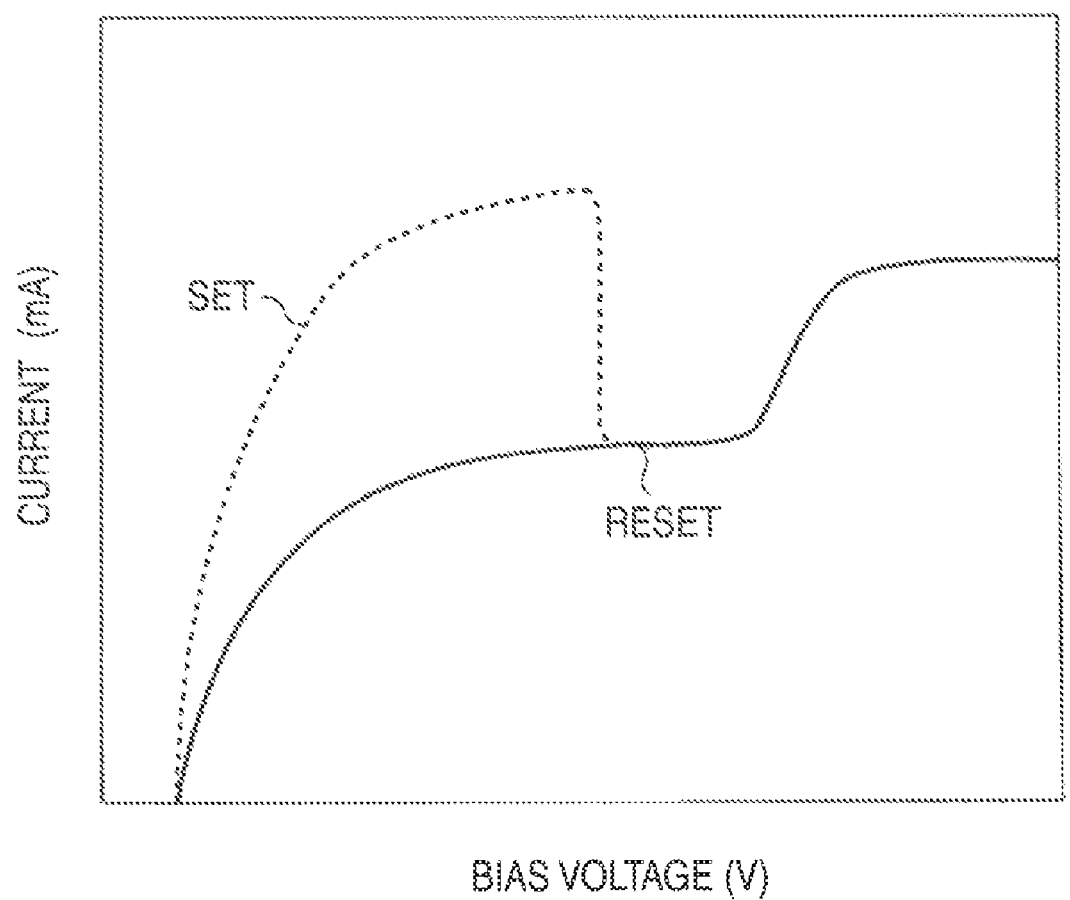
FIG. 82 is a graph indicating the magnitude of current flowing when voltage is applied to a memory device of unipolar operation of the nonvolatile semiconductor memory according to the embodiment.

It is assumed that the parameters of the memory device in the nonvolatile semiconductor memory 1 are as shown below, but are not limited to the following:

Write voltage V_set=0.5 V
Erasing voltage V_reset=1 V
Diode breakdown voltage VBD=2 V FIG. 82 shows an example of a graph indicating the magnitude of current flowing when voltage is applied to the memory device (resistance change element) of unipolar operation. In FIG. 82, applied voltage (bias voltage) is on the horizontal axis and current is on the vertical axis. The current is expressed in logarithmic scale. The dotted line indicates a graph at the data writing time (setting time) and the solid line indicates a graph at the data erasing time (resetting time). As shown in FIG. 82, in the applied voltage-current characteristic in the memory device of unipolar operation, the flowing current differs between the data writing time and the data erasing time. (Read operation of nonvolatile semiconductor memory according to embodiment (unipolar read operation (Read operation)))

Figure 4:
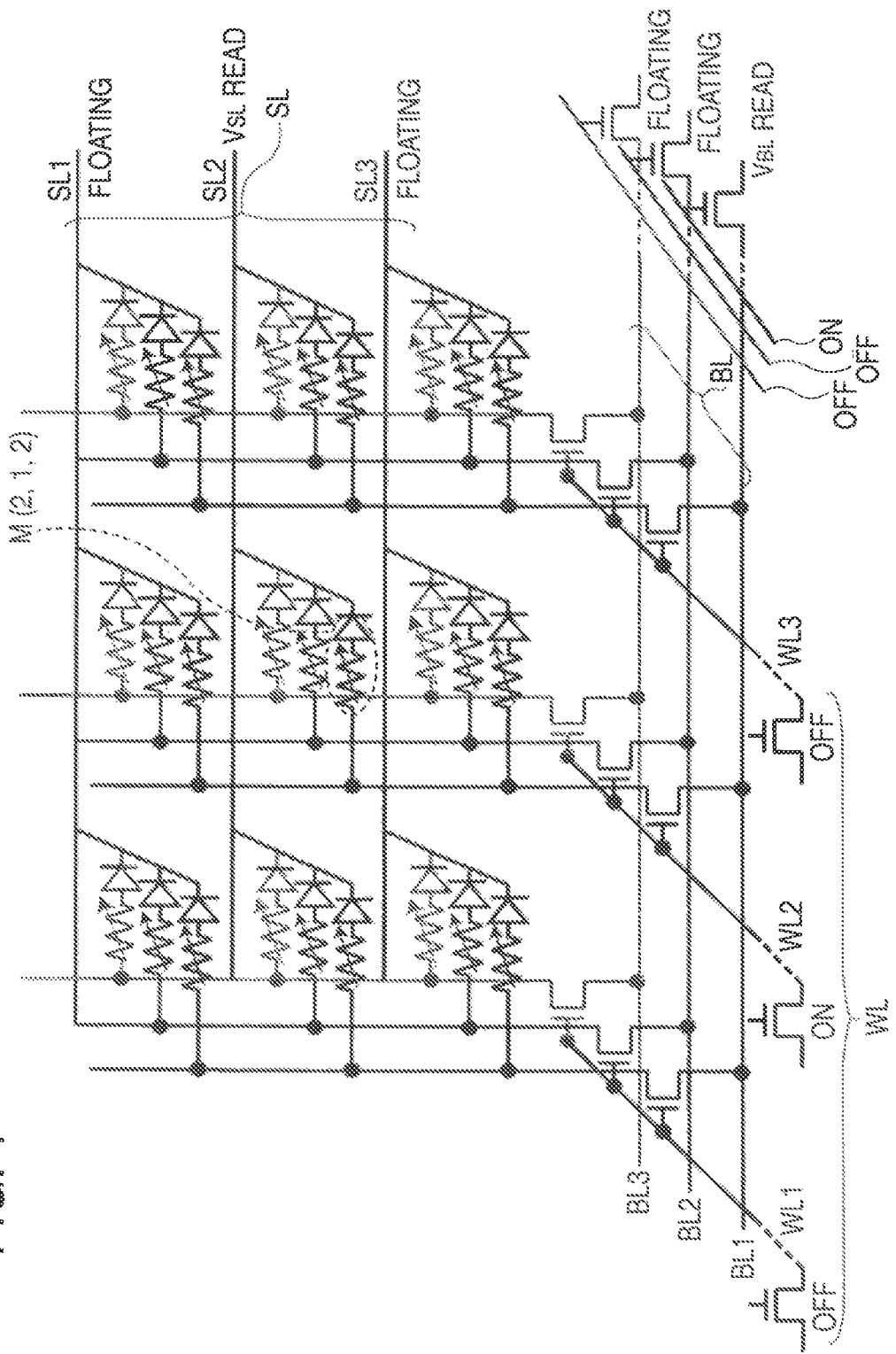
FIG. 4 shows a bias condition in read operation of the nonvolatile semiconductor memory according to the embodiment.

Referring to FIG. 4, the "read operation" of data (information) in the nonvolatile semiconductor memory 1 will be discussed by taking the read operation of data stored in the memory device M (2, 1, 2) as an example. In the nonvolatile semiconductor memory 1, the transistors connected to the word lines WL1 to WL3, the bit lines BL1 to BL3, and the source lines SL1 to SL3 are turned on or off, thereby applying a signal to the word lines WL1 to WL3, the bit lines BL1 to BL3, and the source lines SL1 to SL3. The bias relationship of the voltage applied to the word line, the bit line, the source line, etc., at the data read operation time in the nonvolatile semiconductor memory 1 described here is shown by way of example, and the invention is not limited to it.

First, Von (for example, 3 V) is applied to the word line WL2 connected to the selected memory device M (2, 1, 2) to read data therefrom and Voff (for example, 0 V) is applied to other word lines WL1 and WL3. VSLread (for example, 0 V) is applied to the source line SL2 connected to the selected memory device M (2, 1, 2) to read data therefrom and other source lines SL1 and SL3 are floated. VBLread (for example, 0.2 V) is applied to the bit line BL1 connected to the selected memory device M (2, 1, 2) to read data therefrom and other bit lines BL2 and BL3 are floated. The current flowing into the bit line BL1 is detected, whereby the information stored in the selected memory device M (2, 1, 2) can be read. That is, the value of the current flowing into the bit line BL1 changes according to the resistance of the selected memory device M (2, 1, 2) and the current value is detected, whereby the information stored in the selected memory device M (2, 1, 2) can be read. No current flows into any unselected memory device M because a diode with voltage set to a reverse bias always exists between the bit line BL and the source line SL between which the unselected memory device M is sandwiched.

To read data stored in any other memory device M (i, j, k), a similar signal to the signal applied to the memory device M (2, 1, 2) described above is applied to the word line, the bit line, and the source line connected to the memory device M (i, j, k) to read data therefrom, whereby the data stored in the memory device M (i, j, k) can be read.

In the embodiment, each of the memory devices 15 has a resistance change element and a diode connected to one end of the resistance change element for placing the direction of current flowing from the resistance change element to the source line in a forward direction. FIG. 7 shows the bias condition of a signal applied to the word lines WL1 to WL3, the bit lines BL1 to BL3, and the source lines SL1 to SL3 in the data read operation of the selected memory device M (2, 1, 2) in an example wherein the connection of the diode is made opposite. In the example shown in FIG. 7, the polarity of the signal applied to the bit lines BL1 to BL3 and the source lines SL1 to SL3 in the example shown in FIG. 4 is inverted, whereby the data in the selected memory device M can be read.

(Write Operation of Nonvolatile Semiconductor Memory According to Embodiment (Unipolar Write Operation (Set Operation)))

Figure 5:
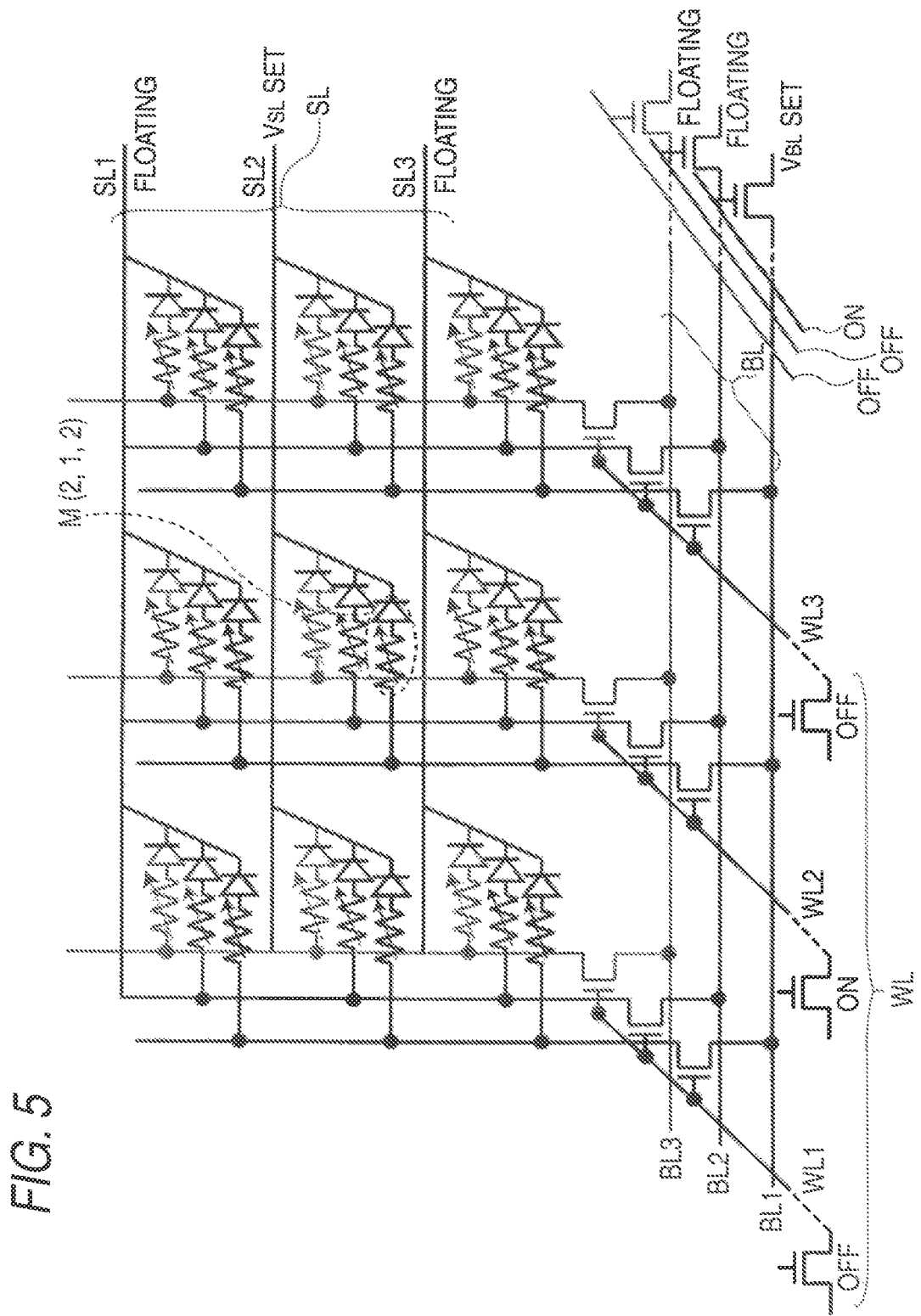
FIG. 5 shows a bias condition in write operation of the nonvolatile semiconductor memory according to the embodiment.

Referring to FIG. 5, the "write operation" of data in the nonvolatile semiconductor memory 1 will be discussed by taking the write operation of data into the memory device M (2, 1, 2) as an example. The bias relationship of the voltage applied to the word line, the bit line, the source line, etc., at the data write operation time in the nonvolatile semiconductor memory 1 described here is shown by way of example, and the invention is not limited to it.

First, Von (for example, 3 V) is applied to the word line WL2 connected to the selected memory device M (2, 1, 2) to write data thereinto and Voff (for example, 0 V) is applied to other word lines WL1 and WL3. VSLset (for example, 0 V) is applied to the source line SL2 connected to the selected memory device M (2, 1, 2) to write data thereinto and other source lines SL1 and SL3 are floated. VBLset (for example, 0.7 V) is applied to the bit line BL1 connected to the selected memory device M (2, 1, 2) to write data thereinto and other bit lines BL2 and BL3 are floated. At this time, a current flows into the bit line BL1, and the resistance of the resistance change element of the selected memory device M (2, 1, 2) changes with the current amount flowing into the resistance change element. The resistance of the selected memory device M (2, 1, 2) is thus changed, whereby data can be written into the selected memory device M (2, 1, 2). No current flows into any unselected memory device M because a diode with voltage set to a reverse bias always exists between the bit line BL and the source line SL between which the unselected memory device M is sandwiched.

To write data into any other memory device M (i, j, k), a similar signal to the signal applied to the memory device M (2, 1, 2) described above is applied to the word line, the bit line, and the source line connected to the memory device M (i, j, k) to write data thereinto, whereby the data can be written into the memory device M (i, j, k).

In the embodiment, each of the memory devices 15 has a resistance change element and a diode connected to one end of the resistance change element for placing the direction of current flowing from the resistance change element to the source line in a forward direction. FIG. 8 shows the bias condition of a signal applied to the word lines WL1 to WL3, the bit lines BL1 to BL3, and the source lines SL1 to SL3 in the data write operation of the selected memory device M (2, 1, 2) in an example wherein the connection of the diode is made opposite. In the example shown in FIG. 8, the polarity of the signal applied to the bit lines BL1 to BL3 and the source lines SL1 to SL3 in the example shown in FIG. 5 is inverted, whereby the data can be written into the selected memory device M.

(Erasing Operation of Nonvolatile Semiconductor Memory According to Embodiment (Unipolar Erasing Operation (Reset Operation)))

Using FIG. 6, the "erasing operation" of data in the nonvolatile semiconductor memory 1 will be discussed by taking the erasing operation of data in the memory device M (2, 1, 2) as an example.

First, Von (for example, 3 V) is applied to the word line WL2 connected to the selected memory device M (2, 1, 2) to erase data therein and Voff (for example, 0 V) is applied to other word lines WL1 and WL3. VSLreset (for example, 0 V) is applied to the source line SL2 connected to the selected memory device M (2, 1, 2) to erase data therein and other source lines SL1 and SL3 are floated. VBLreset (for example, 1.5 V) is applied to the bit line BL1 connected to the selected memory device M (2, 1, 2) to erase data therein and other bit lines BL2 and BL3 are floated.

Such a bias state is formed, whereby a larger current than the current flowing at the data write operation time flows into the selected memory device M (2, 1, 2) and the resistance of the resistance change element of the selected memory device M (2, 1, 2) changes and the data in the selected memory device M (2, 1, 2) is erased. Since the diode of the selected memory device M (2, 1, 2) to erase data therein is placed in a forward bias state, a current flows into the selected memory device M (2, 1, 2). On the other hand, no current flows into any unselected memory device M because a diode with voltage set to a reverse bias always exists between the bit line BL and the source line SL between which the unselected memory device M is sandwiched.

To erase data in any other memory device M (i, j, k), a similar signal to the signal applied to the memory device M (2, 1, 2) described above is applied to the word line, the bit line, and the source line connected to the memory device M (i, j, k) to erase data therein, whereby the data in the memory device M (i, j, k) can be erased.

In the embodiment, each of the memory devices 15 has a resistance change element and a diode connected to one end of the resistance change element for placing the direction of current flowing from the resistance change element to the source line in a forward direction. FIG. 9 shows the bias condition of a signal applied to the word lines WL1 to WL3, the bit lines BL1 to BL3, and the source lines SL1 to SL3 in the data erasing operation of the selected memory device M (2, 1, 2) in an example wherein the connection of the diode is made opposite. In the example shown in FIG. 9, the polarity of the signal applied to the bit lines BL1 to BL3 and the source lines SL1 to SL3 in the example shown in FIG. 6 is inverted, whereby the data can be erased from the selected memory device M.

Figure 10:
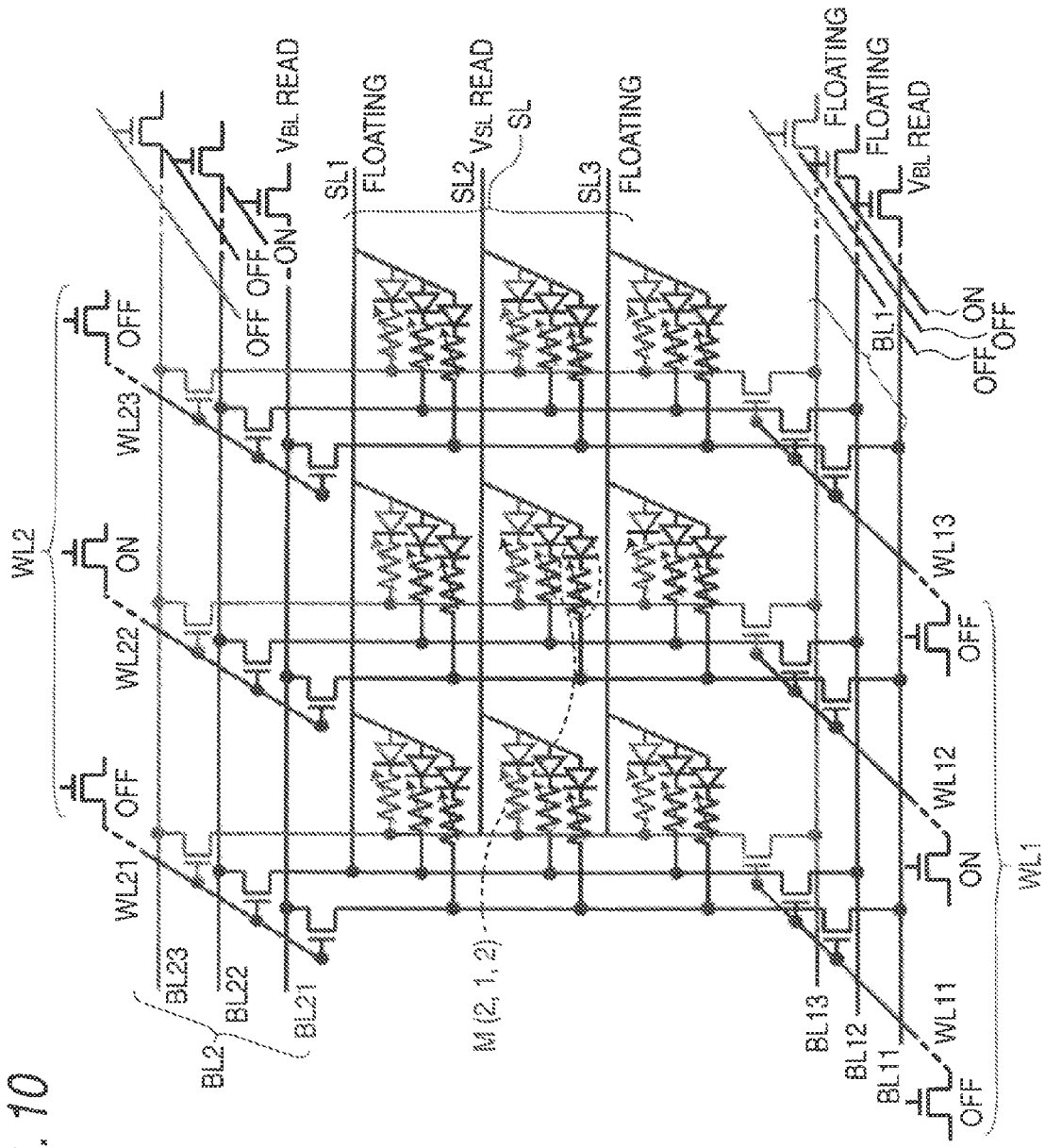
FIG. 10 shows a bias condition in write operation of the nonvolatile semiconductor memory according to the embodiment.
Figure 11:
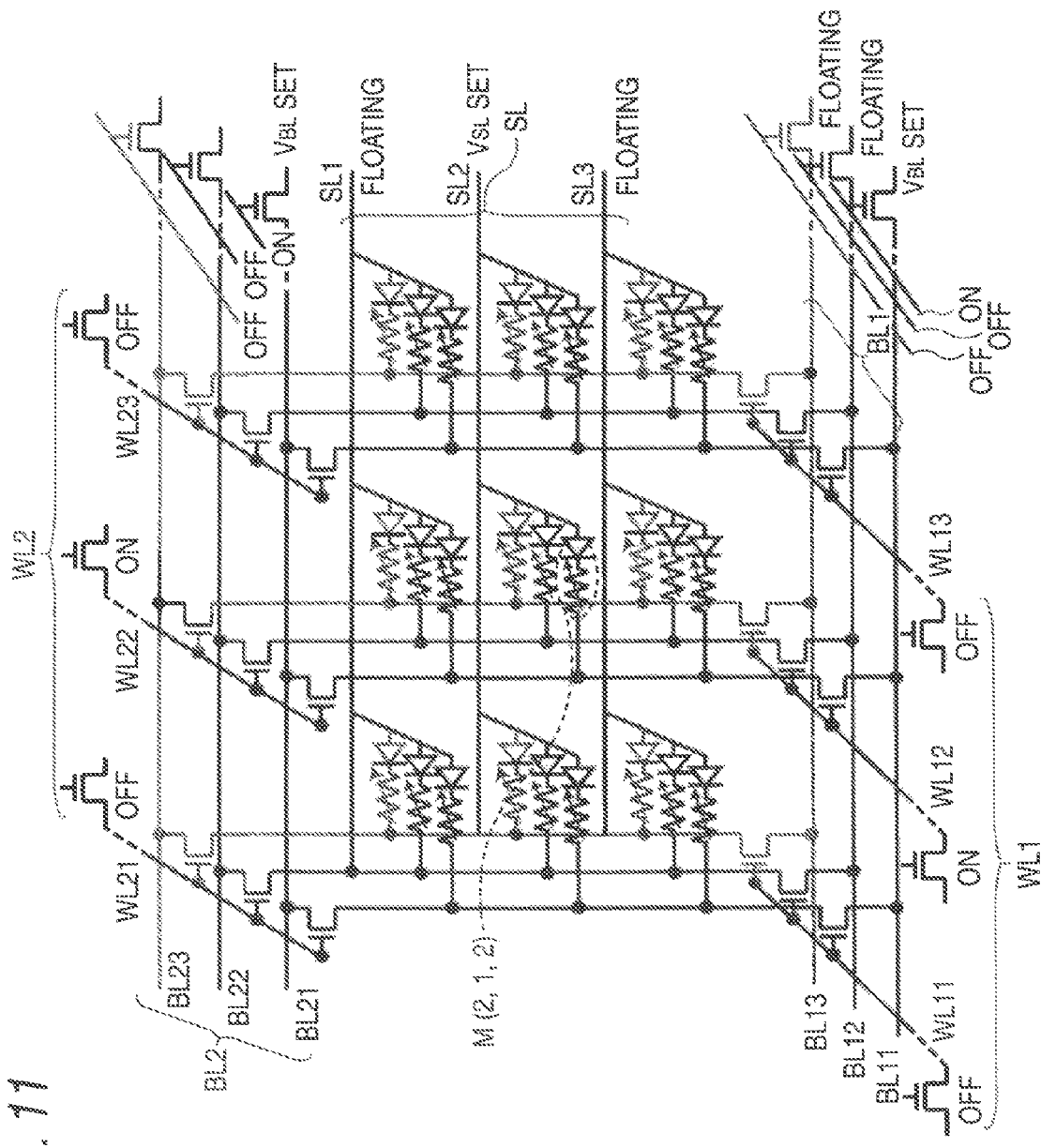
FIG. 11 shows a bias condition in erasing operation of the nonvolatile semiconductor memory according to the embodiment.
Figure 12:
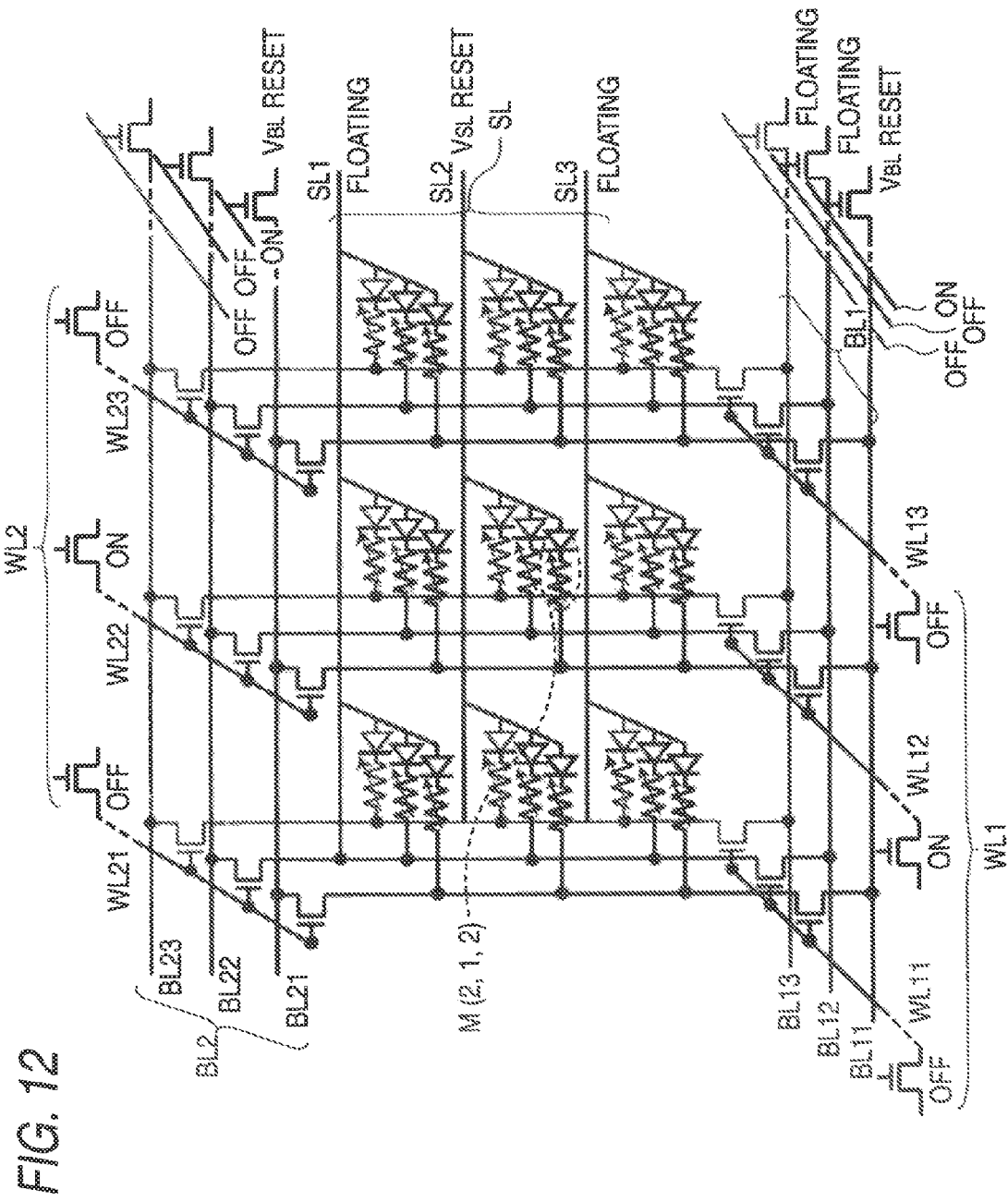
FIG. 12 shows a bias condition in read operation of the nonvolatile semiconductor memory according to the embodiment.

Next, FIGS. 10 to 12 show an other example of the nonvolatile semiconductor memory. In the example shown in FIGS. 10 to 12, selection transistors, word lines, and bit lines are provided above and below the memory device section. The transistors connected to lower word lines WL11 to WL13, upper word lines WL21 to WL23, lower bit lines BL11 to BL13, upper bit lines BL21 to BL23, and the source lines SL1 to SL3 are turned on or off, thereby applying a signal to the lower word lines WL11 to WL13, the upper word lines WL21 to WL23, the lower bit lines BL11 to BL13, the upper bit lines BL21 to BL23, and the source lines SL1 to SL3. In the example shown in FIGS. 10 to 12, the following methods are available to set bias voltage to be applied to each memory device M (i, j, k) when data is read, written, and erased:

(1) The lower word lines WL11 to WL13, the lower bit lines BL11 to BL13, and the source lines SL1 to SL3 are selected.

(2) The upper word lines WL21 to WL23, the upper bit lines BL21 to BL23, and the source lines SL1 to SL3 are selected.

(3) The lower word lines WL11 to WL13, the upper word lines WL21 to WL23, the lower bit lines BL11 to BL13, the upper bit lines BL21 to BL23, and the source lines SL1 to SL3 are selected.

In the example shown in FIG. 10, the bias relationship for reading the data in the memory device M (2, 1, 2) is shown. In the example shown in FIG. 11, the bias relationship for writing data into the memory device M (2, 1, 2) is shown. In the example shown in FIG. 12, the bias relationship for erasing the data in the memory device M (2, 1, 2) is shown. The bias relationship of the voltage applied to the word line, the bit line, the source line, etc., at the data read operation time in the nonvolatile semiconductor memory 1 described here is shown byway of example, and the invention is not limited to it. The "read operation," the "write operation," and the "erasing operation" of the nonvolatile semiconductor memory according to the embodiment shown in FIGS. 10 to 12 are similar to the "read operation," the "write operation," and the "erasing operation" of the nonvolatile semiconductor memory 1 according to the first embodiment described above and therefore will not be discussed again.

In the example shown in FIGS. 10 to 12, each of the memory devices 15 has a resistance change element and a diode connected to one end of the resistance change element for placing the direction of current flowing from the resistance change element to the source line in a forward direction. The connection of the diode may be made opposite as described above.

Manufacturing Process of Nonvolatile Semiconductor Memory of Unipolar Operation According to First Embodiment (OxReRAM: Oxide Resistive RAM)

A manufacturing process of the nonvolatile semiconductor memory 1 according to the embodiment will be discussed with reference to FIGS. 13A to 37C. FIGS. 13A to 37C show each a part of the memory device region 3 of the nonvolatile semiconductor memory 1. FIGS. 13C to 37C are top views of the memory device region 3. FIGS. 13A to 37A are sectional views of the memory device region 3 taken on line A-A' in FIGS. 13C to 37C. FIGS. 13B to 37B are sectional views of the memory device region 3 taken on line B-B' in FIGS. 13C to 37C. In FIGS. 13A to 37A and FIGS. 13C to 37C, each right portion indicated by the dashed line shows a wiring portion for plating treatment described later. The manufacturing process of the memory device region 3 described below is only one example and the invention is not limited to it.

An insulating film 102 is formed on a silicon substrate 100, as shown in FIGS. 13A to 13C. A glass substrate, a quartz substrate, etc., formed with a polysilicon or metal film may be used in place of the silicon substrate. In the embodiment, a silicon oxide film ($SiO_2$) according to plasma CVD is used as the insulating film 102. A silicon nitride film ($Si_xN_y$), etc., is used as the insulating film 102. Next, a metal layer 104 is formed (FIGS. 13A to 13C). In the embodiment, tungsten (W) is formed by a sputtering method as the metal layer 104.

Next, a resist mask is formed (not shown) and dry etching is performed, thereby patterning the metal layer 104 and the insulating film 102 to form a pattern made up of 102a and 104a, a pattern made up of 102b and 104b, a pattern made up of 102c and 104c, and a pattern made up of 102d and 104d (FIGS. 14A to 14C). 104a, 104b, 104c, and 104d become bit lines BL.

Next, an interlayer insulating film 106 is formed and is planarized, thereby forming interlayer insulating films 106a, 106b, 106c, and 106d (FIGS. 15A to 15C). In the embodiment, a silicon oxide film ($SiO_2$) according to plasma CVD is used as the interlayer insulating film 106. As the interlayer insulating film 106, TEOS (tetraethoxy silane) may be used. To planarize the interlayer insulating film 106, for example, CMP (chemical-mechanical polishing) is used.

Figure 16A:
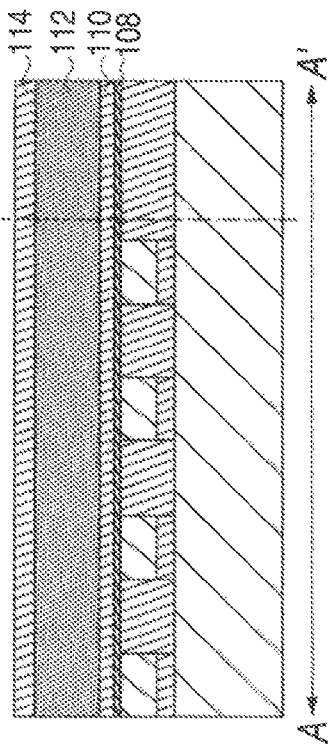
FIGS. 16A, 16B and 16C show the manufacturing process of the nonvolatile semiconductor memory according to the embodiment.
Figure 16B:
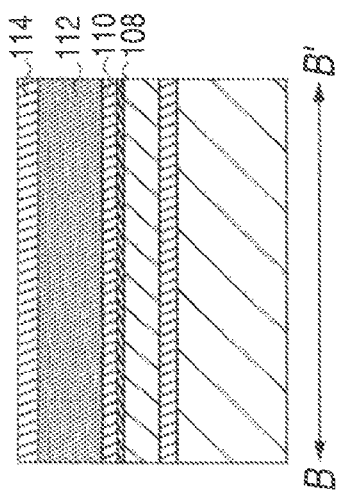
Figure 16C:
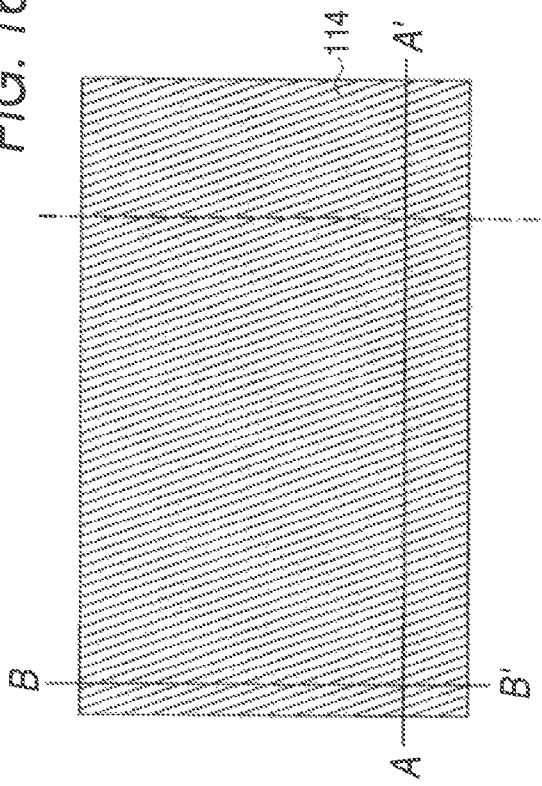

Next, a silicon nitride film 108 is formed as an etching stopper film in later forming holes, a silicon oxide film 110 is formed as an insulating film, a conductive polysilicon film 112 doped with impurities is formed, and a silicon oxide film 114 is formed as an insulating film in order (FIGS. 16A to 16C). In the embodiment, a p-type polysilicon film 112 is formed as the polysilicon film 112.

Next, a resist mask is formed (not shown) and the silicon oxide film 114, the polysilicon film 112, the silicon oxide film 110, and the silicon nitride film 108 are dry-etched, thereby forming holes 116a to 116h (FIGS. 17A to 17C). In the embodiment, cylindrical holes 116a to 116h are formed, but the invention is not limited to the cylindrical holes, and holes of various shapes of prism holes, elliptic cylindrical holes, etc., may be formed.

Next, a silicon oxide film 118 is formed as an insulating film 118 (FIGS. 18A to 18C). A part of the silicon oxide film 118 becomes a gate insulating film of the vertical transistor 20.

Next, a part of the silicon oxide film 118 is etched by RIE (Reactive Ion Etching) until the surfaces of the metal layers 104a, 104b, 104c, and 104d are exposed to form silicon oxide films 118a to 118h (FIGS. 19A to 19C).

Next, a conductive polysilicon film 120 doped with impurities is formed and is planarized, thereby forming polysilicon films 120a to 120h (FIGS. 20A to 20C). In the embodiment, n-type polysilicon films are formed as the polysilicon films 120a to 120h. To polarize the polysilicon film 120, CMP or etching back may be used. The polysilicon films 120a to 120h will later become channel formation regions of the vertical transistors 20.

Next, a resist mask is formed (not shown) and parts of the insulating film 110, the polysilicon film 112, and the insulating film 114 are etched (122a and 122b), thereby forming patterned polysilicon films 124a to 124c (FIGS. 21A to 21C). The patterned polysilicon films 124a to 124c will later become word lines WL.

Next, an interlayer insulating film 126 is formed and is planarized, thereby forming interlayer insulating films 126a and 126b (FIGS. 22A to 22C). In the embodiment, n-type polysilicon films are formed as the polysilicon films 120a to 120h. In the embodiment, a silicon oxide film ($SiO_2$) according to plasma CVD is used as the interlayer insulating film 126. As the interlayer insulating film 126, TEOS may be used. To planarize the interlayer insulating film 126, for example, CMP is used.

Figure 23C:
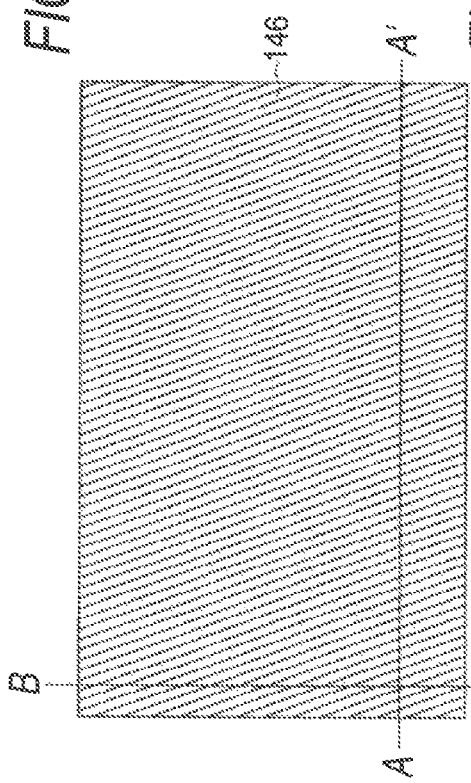
FIGS. 23A, 23B and 23C show the manufacturing process of the nonvolatile semiconductor memory according to the embodiment.
Figure 23A:
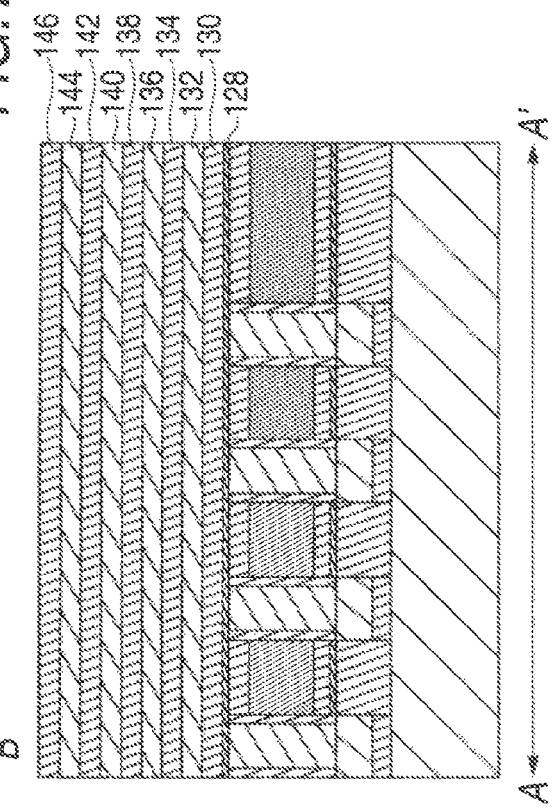
Figure 23B:
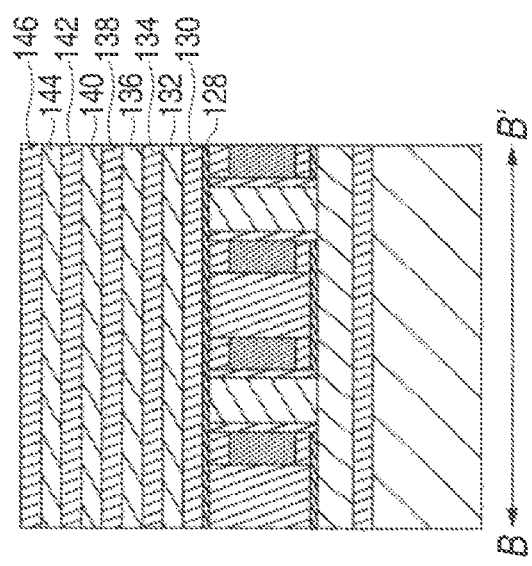

Next, a silicon nitride film 128 is formed as an etching stopper film in later forming holes (FIGS. 23A to 23C). A silicon oxide film and a conductive polysilicon film doped with n-type impurities are formed alternately as insulating film to form a silicon oxide film 130, an n-type polysilicon film 132, a silicon oxide film 134, an n-type polysilicon film 136, a silicon oxide film 138, an n-type polysilicon film 140, a silicon oxide film 142, an n-type polysilicon film 144, and a silicon oxide film 146 (FIGS. 23A to 23C). An n-type amorphous silicon film may be formed in place of the n-type polysilicon film 132, the n-type polysilicon film 136, the n-type polysilicon film 140 and the n-type polysilicon film 144.

Next, a resist mask is formed (not shown) and etching is performed to the substrate 100, thereby forming a groove 148 (FIGS. 24A to 24C).

Next, a conductive polysilicon film 150 doped with n-type impurities is formed (FIGS. 25A to 25C).

Next, a part of the n-type polysilicon film 150 is etched by reactive ion etching until the surface of the substrate 100 is exposed to form an n-type polysilicon film 150a (FIGS. 26A to 26C). The n-type polysilicon film 150a formed in the groove 148 will become plating wiring at the memory device forming time.

Next, an interlayer insulating film 152 is formed and is planarized (FIGS. 27A to 27C). In the embodiment, a silicon oxide film ($SiO_2$) according to plasma CVD is used as the interlayer insulating film 152. As the interlayer insulating film 152, TEOS may be used. To planarize the interlayer insulating film 152, CMP or etching back may be used.

Next, a resist mask is formed (not shown) and parts of the silicon oxide films 130, 134, 138, 142, and 146 and the n-type polysilicon films 132, 136, 140, and 144 are etched, thereby forming holes 154a to 154h (FIGS. 28A to 28C). At this time, the silicon nitride film 128 functions as an etching stopper film. In the embodiment, cylindrical holes 154a to 154h are formed, but the invention is not limited to the cylindrical holes, and holes of various shapes of prism holes, elliptic cylindrical holes, etc., may be formed.

Next, for example, isotropic dry etching is performed, thereby retreating the n-type polysilicon films 132, 136, 140, and 144 on the sides of the holes 154a to 154h to form n-type polysilicon films 132a, 136a, 140a, and 144a (FIGS. 29A to 29C)

Next, the substrate 100 is subjected to high temperature treatment in a gas atmosphere containing p-type impurities, thereby diffusing the p-type impurities into the n-type polysilicon films 132a, 136a, 140a, and 144a to form p-type diffusion regions 156a to 156t (FIGS. 30A to 30C). The p-type diffusion regions 156a to 156t and the n-type polysilicon films 132a, 136a, 140a, and 144a form pn junctions to implement diodes.

The p-type diffusion regions 156a to 156t correspond to the p-type polysilicon layers 156a to 156d shown in FIG. 3A. The n-type polysilicon films 132a to 144a correspond to the n-type polysilicon layers 144a to 144d shown in FIG. 3A.

Next, the surfaces of the p-type diffusion regions 156a to 156t are put into silicide with platinum (Pt), thereby forming platinum silicides (PtSi) 158a to 158t (FIGS. 31A to 31C).

Next, platinum (Pt) is formed on the surfaces of the platinum silicides (PtSi) 158a to 58t by electric field plating with the substrate 100 as one electrode and the platinum silicides (PtSi) 158a to 158t as an opposite electrode (FIGS. 32A to 32C). To use the electric field plating, metal is deposited on the portion as an electrode for transferring electrons to and from a plating solution. The platinum silicides (PtSi) 158a to 158t become an electrode for transferring electrons to and from a plating solution and platinum (Pt) is formed on the surfaces of the platinum silicides (PtSi) 158a to 158t. To use the substrate 100 as an electrode, a current may be allowed to flow into the back of the substrate 100 or a bevel part. At this time, a current flows from the substrate 100 through the n-type polysilicon film 150a into the platinum silicides (PtSi) 158a to 158t as indicated by the arrow (current path) in FIGS. 32A to 32C. In the embodiment, an electrode protective film made of platinum (Pt) is formed on the surfaces of the platinum silicides (PtSi) 158a to 158t by electric field plating, but an electrode may be formed on the surfaces of the platinum silicides (PtSi) 158a to 158t by electroless plating. The electroless plating eliminates the need for wiring like the n-type polysilicon film 150a for allowing a current to flow from the substrate 100 into the platinum silicides (PtSi) 158a to 158t.

Next, a transition metal layer is formed on the full face of the substrate 100 and is oxidized, thereby forming a transition metal oxide layer 160 (FIGS. 33A to 33C). In the embodiment, nickel oxide (NiO) is used as the transition metal oxide layer 160. As the transition metal oxide layer 160, NiO, MnO, $Cr_2O_3$, $Mn_2O_3$, $Fe_2O_3$, $Al_2O_3$, $CuO_2$, $TiO_2$, $ZrO_2$, ZnO, etc., may be used.

Figure 34C:
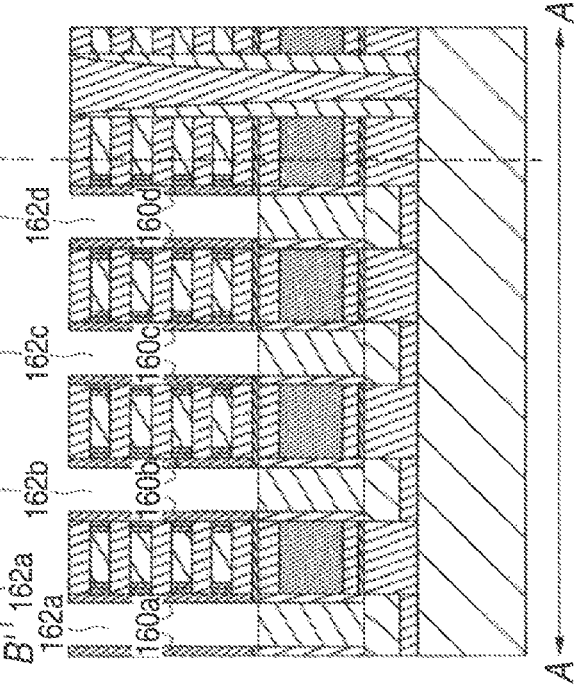
FIGS. 34A, 34B and 34C show the manufacturing process of the nonvolatile semiconductor memory according to the embodiment.
Figure 34A:
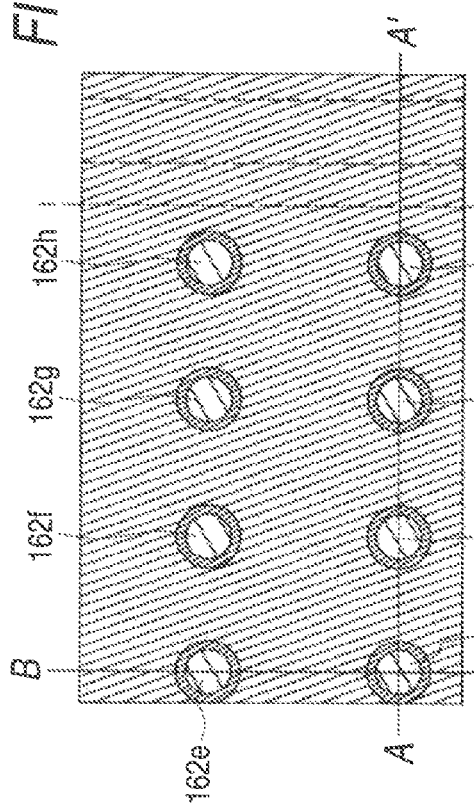
Figure 34B:
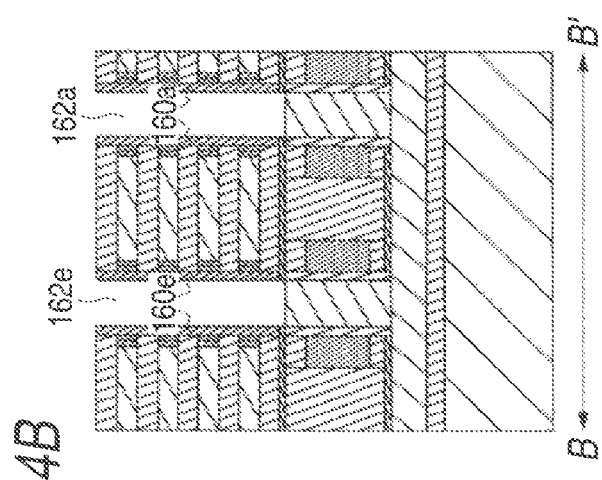

Next, a part of the transition metal oxide layer 160 and a part of the silicon nitride film 128 are etched and removed by reactive ion etching to form holes 162a to 162h (FIGS. 34A to 34C).

Next, a platinum layer 163 is formed as a metal layer (FIGS. 35A to 35C). Then, a titanium nitride (TiN) layer 164 is formed so as to fill in the holes 162a to 162h (FIGS. 35A to 35C). As the metal layer, not only platinum, but also $ReO_3$, $IrO_2$, $OsO_2$, $RhO_2$, $NMoO_2$, $RuO_2$, TiN, etc., may be used. W, etc., may be used in place of the titanium nitride layer 164. Then, the platinum layer 163 and the titanium nitride layer 164 are planarized by CMP, etching back, etc., to expose the surface of the silicon oxide film 146.

When the memory device region 3 of the nonvolatile semiconductor memory 1 is complete, if the n-type polysilicon film 150a remains, all source lines conduct. Therefore, a resist mask is formed (not shown) and the portion indicated by D in FIG. 36A is etched and removed (FIGS. 36A to 36C). As the step is executed, the wiring used to form the electrode protective film (polysilicon film 150a) by the electric field plating is removed and the sources lines are electrically insulated from each other.

Then, various wirings are formed and the memory device region 3 of the nonvolatile semiconductor memory 1 is complete (FIG. 1).

Figure 38:
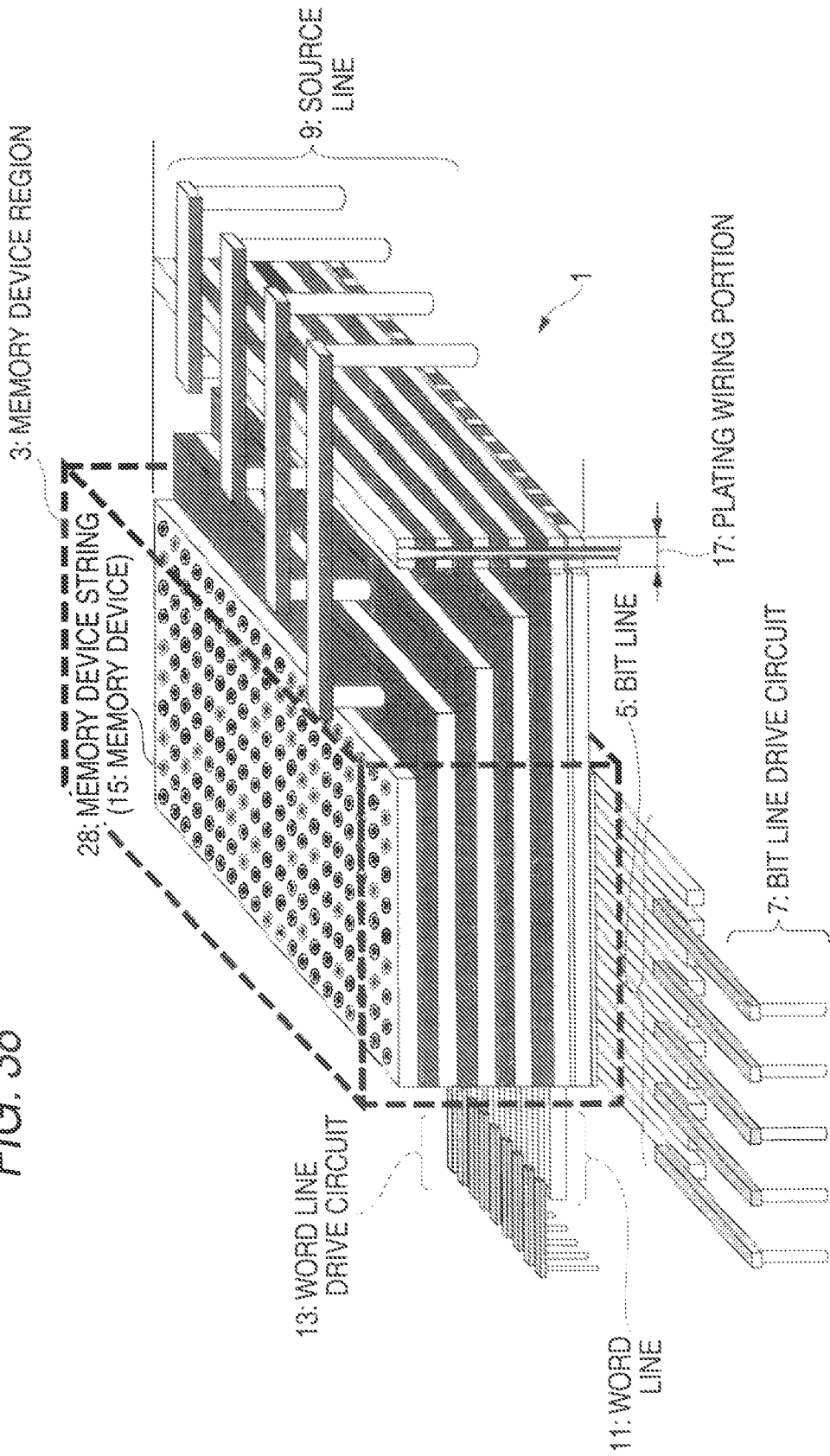
FIG. 38 shows the schematic configuration of a nonvolatile semiconductor memory 1 according to a second embodiment.

After the step shown in FIGS. 35A to 35C, a resist mask may be formed (not shown), the portion indicated by E in FIG. 37A may be etched and removed, and the sources lines may be electrically insulated from each other. In this case, the plating wiring (polysilicon film 150a) portion remains. Then, various wirings are formed and the memory device region 3 of the nonvolatile semiconductor memory 1 is complete (FIG. 38).

(Nonvolatile Semiconductor Memory 1 of Bipolar Operation)
(OxReRAM: Oxide Resistive RAM)

In nonvolatile semiconductor memory 1 according to a second embodiment, a current flows into a memory device 15 bidirectionally. The nonvolatile semiconductor memory 1 wherein a current flows into the memory device 15 bidirectionally may be called "nonvolatile semiconductor memory of bipolar operation."

The nonvolatile semiconductor memory 1 according to the second embodiment will be discussed by taking OxReRAM (Oxide Resistive RAM) with each memory device 15 having a resistance change element having a metal oxide as an example. The nonvolatile semiconductor memory 1 according to the second embodiment has a similar structure to that of the nonvolatile semiconductor memory 1 according to the first embodiment and therefore the structure will not be discussed again. However, in the nonvolatile semiconductor memory 1 according to the second embodiment, a current flows into each memory device 15 bidirectionally and the bias condition of a signal applied to a word line WL, a bit line BL, and a source line SL differs.

The "erasing operation" in the nonvolatile semiconductor memory 1 according to the embodiment will be discussed with reference to FIG. 39. The "read operation" and the "write operation" in the nonvolatile semiconductor memory 1 are similar to those in the nonvolatile semiconductor memory 1 according to the first embodiment described above (nonvolatile semiconductor memory of unipolar operation) and therefore will not be discussed again.

Figure 39:
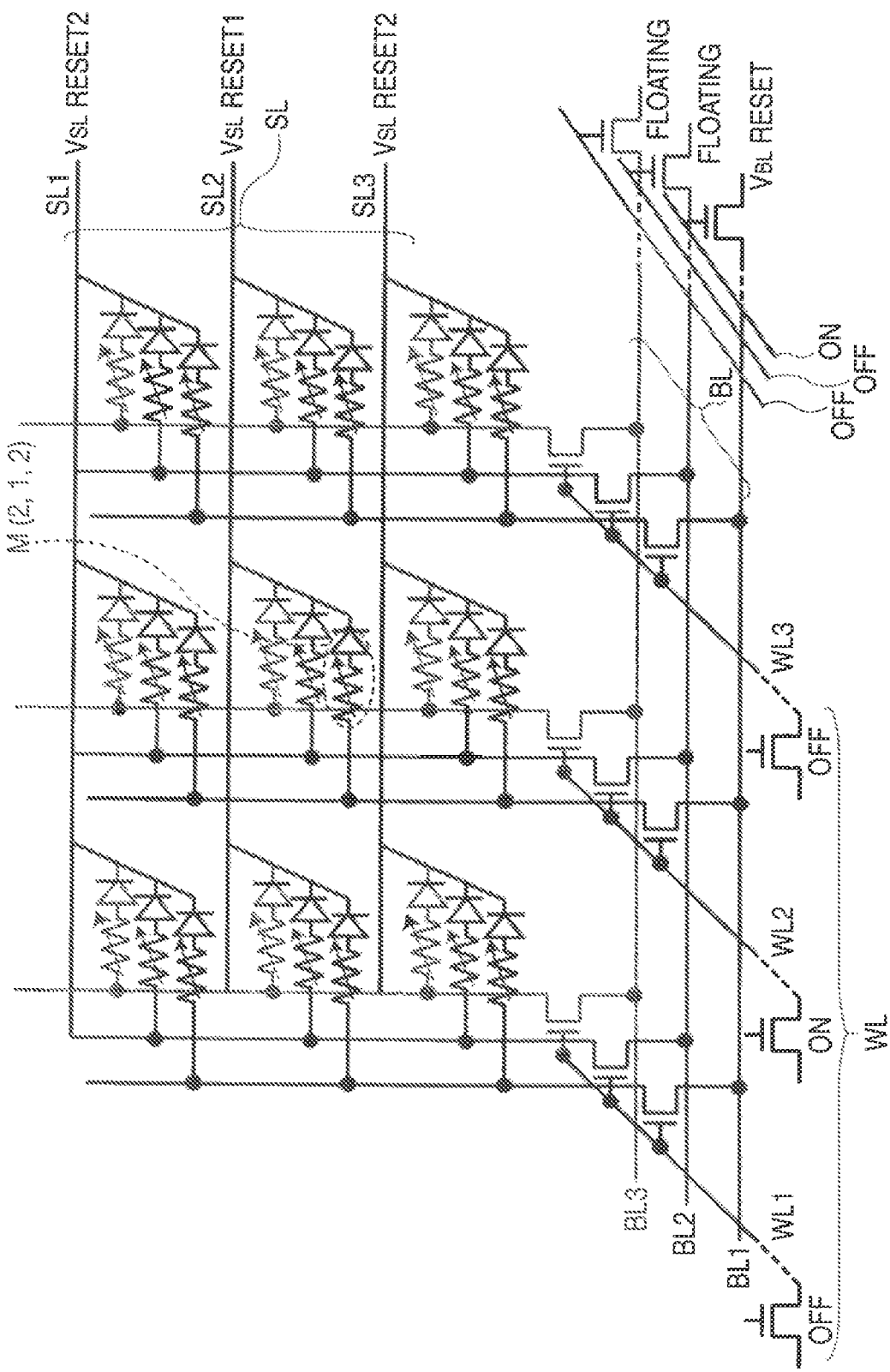
FIG. 39 shows a bias condition in erasing operation of the nonvolatile semiconductor memory according to the embodiment.
Figure 40:
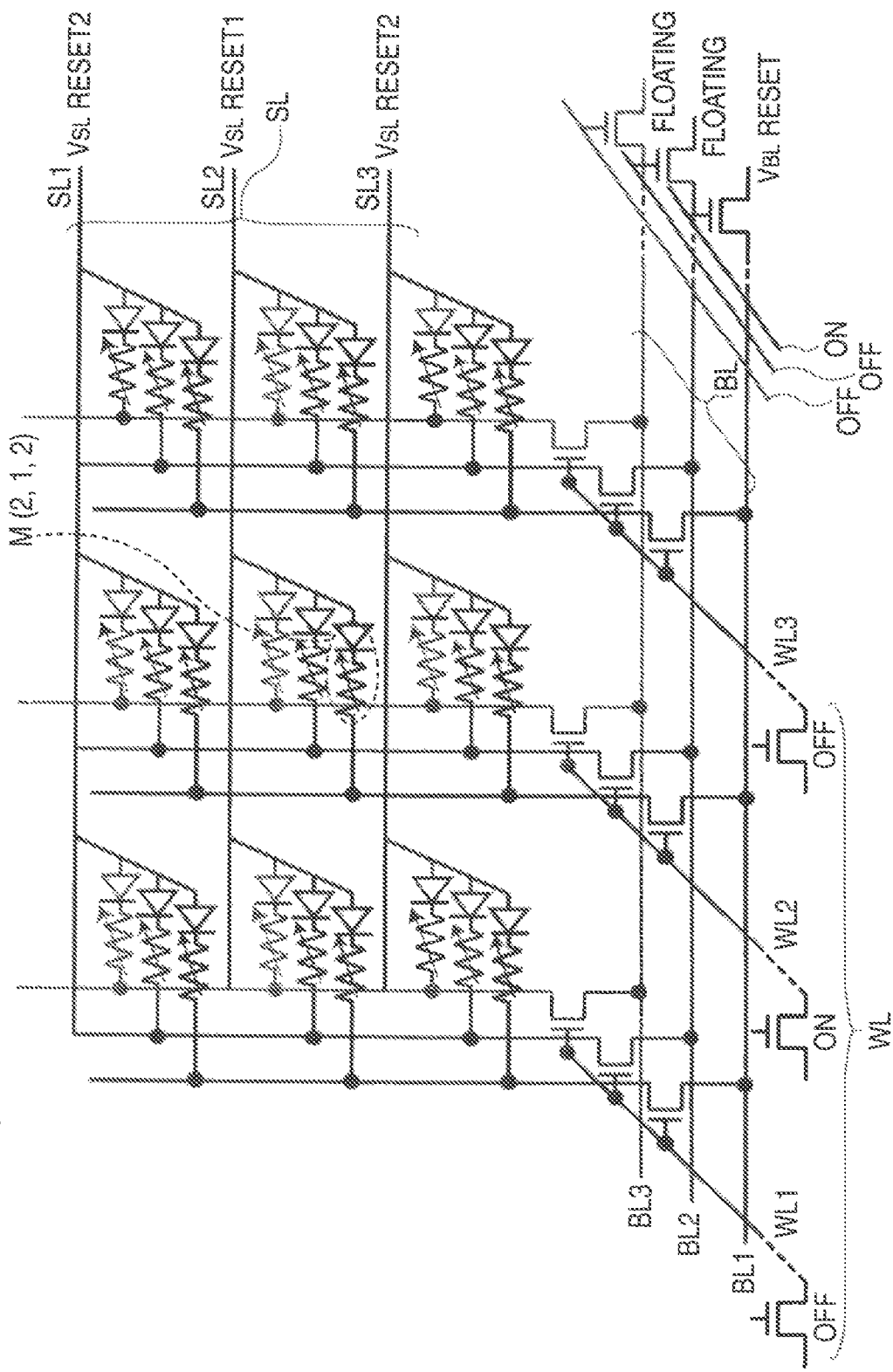
FIG. 40 shows a bias condition in erasing operation of the nonvolatile semiconductor memory according to the embodiment.

To describe the "read operation," the "write operation," and the "erasing operation" in the nonvolatile semiconductor memory 1 according to the second embodiment, for convenience of the description as with the first embodiment, a memory device region 3 made up of 27 memory devices 15 selected according to three bit lines BL1 to BL3, three word lines WL1 to WL3, and three source lines SL1 to SL3 is taken as an example, as shown in FIG. 39. The 27 memory devices 15 are indicated by M (i, j, k). In the second embodiment shown in FIG. 39, each of the memory devices 15 has a resistance change element and a diode connected to one end of the resistance change element for placing the direction of current flowing from the resistance change element to the source line in a forward direction. The memory device, the resistance change element, and the diode of the nonvolatile semiconductor memory 1 are connected in series. The connection of the diode may be made opposite as shown in FIG. 40.

It is assumed that the parameters of the memory device in the nonvolatile semiconductor memory 1 are as shown below, but are not limited to the following:

Write voltage V_set=0.5 V
Erasing voltage V_reset=−0.5 V
Diode breakdown voltage VBD=1 V Erasing Operation of Nonvolatile Semiconductor Memory of Bipolar Operation According to Embodiment The "erasing operation" of data in the nonvolatile semiconductor memory 1 will be discussed by taking the erasing operation of data in the memory device M (2, 1, 2) as an example.

In the nonvolatile semiconductor memory 1 according to the second embodiment, the memory device M is a bipolar memory device M wherein the direction of a current flowing into the resistance change element changes. To erase data in the bipolar memory device M, a current in an opposite direction needs to be made to flow into the diode connected to the selected memory device M to erase data therein. That is, it is necessary to break down the diode connected to the selected memory device M. At this time, to prevent a current from sneaking from any unselected memory device M other than the selected memory device M to the selected bit line BL, a current must be prevented from flowing into the diodes of the unselected memory devices M. That is, a bias condition must be set such that if a reverse bias voltage is applied to the diode of the unselected memory device M, breakdown does not occur. To realize the bias condition, for example, the following voltages are applied to the word lines WL1 to WL3, the bit lines BL1 to BL3, and the source lines SL1 to SL3:

First, Von (for example, 3 V) is applied to the word line WL2 connected to the selected memory device M (2, 1, 2) and Voff (for example, 0 V) is applied to other word lines WL1 and WL3. VSLreset1 (for example, 1.2 V) is applied to the source line SL2 connected to the selected memory device M (2, 1, 2) and VSLreset2 (for example, 0.6 V) is applied to other source lines SL1 and SL3. VBLreset (for example, 0 V) is applied to the bit line BL1 connected to the selected memory device M (2, 1, 2) and other bit lines BL2 and BL3 are floated. At this time, it is assumed that the breakdown voltage of the selected memory device and unselected memory devices is VBD (for example, 1 V).

Such a bias state is formed, whereby a larger current than the current flowing at the data write operation time flows into the selected memory device M (2, 1, 2) and the resistance of the resistance change element of the selected memory device M (2, 1, 2) changes and the data in the selected memory device M (2, 1, 2) is erased. The diode of selected memory device M (2, 1, 2) to erase data therein is placed in a reverse bias state. Since a voltage more than the breakdown voltage is applied to the diode, a current flows into the selected memory device M (2, 1, 2). On the other hand, each diode of the unselected memory device M (i, j, k) is placed in a reverse bias state, but the applied voltage is less than the breakdown voltage different from that to the selected memory device and thus no current flows into any unselected memory device M (i, j, k).

To erase data in any other memory device M (i, j, k), a similar signal to the signal applied to the memory device M (2, 1, 2) described above is applied to the word line, the bit line, and the source line connected to the memory device M (i, j, k) to erase data therein, whereby the data in the memory device M (i, j, k) can be erased.

In the embodiment, each of the memory devices 15 has a resistance change element and a diode connected to one end of the resistance change element for placing the direction of current flowing from the resistance change element to the source line in a forward direction. FIG. 40 shows the bias condition of a signal applied to the word lines WL1 to WL3, the bit lines BL1 to BL3, and the source lines SL1 to SL3 in the data erasing operation of the selected memory device M (2, 1, 2) in an example wherein the connection of the diode is made opposite. In the example shown in FIG. 40, the polarity of the signal applied to the bit lines BL1 to BL3 and the source lines SL1 to SL3 in the example shown in FIG. 39 is inverted, whereby the data can be erased from the selected memory device M.

Also in the nonvolatile semiconductor memory of bipolar operation according to the embodiment, selection transistors, word lines, and bit lines may be provided above and below the memory device section as shown in FIGS. 10 to 12.

Third Embodiment (Manufacturing Process of Nonvolatile Semiconductor Memory of Unipolar Operation)
(OxReRAM: Oxide Resistive RAM)

A manufacturing process of nonvolatile semiconductor memory 1 according to a third embodiment will be discussed with reference to FIGS. 41A to 48C. In the embodiment, to form a resistance change element forming a part of a memory device 15, the surface of a titanium nitride (TiN) silicide forming the resistance change element is oxidized. In the embodiment, plating wiring need not be formed because a plating process as described in the first embodiment is not required.

FIGS. 41A to 48C show each a part of the memory device region 3 of the nonvolatile semiconductor memory 1 according to the third embodiment as in the first embodiment. FIGS. 41C to 48C are top views of the memory device region 3.

FIGS. 41A to 48A are sectional views of the memory device region 3 taken on line A-A' in FIGS. 41C to 48C. FIGS. 41B to 48B are sectional views of the memory device region 3 taken on line B-B' in FIGS. 41C to 48C. The manufacturing process of the memory device region 3 described below is only one example and the invention is not limited to it.

Parts similar to those of the manufacturing process of the nonvolatile semiconductor memory 1 according to the first embodiment will not be discussed again.

A resist mask is formed (not shown) and parts of the silicon oxide films 130, 134, 138, 142, and 146 and then-type polysilicon films 132, 136, 140, and 144 are etched, thereby forming holes 154a to 154h as in the step of the first embodiment shown in FIGS. 28A to 28C. In the embodiment, cylindrical holes 154a to 154h are formed, but the invention is not limited to the cylindrical holes, and holes of various shapes of prism holes, elliptic cylindrical holes, etc., may be formed.

Next, for example, isotropic dry etching is performed, thereby retreating the n-type polysilicon films 132, 136, 140, and 144 on the sides of the holes 154a to 154h to form n-type polysilicon films 132a, 136a, 140a, and 144a, as shown in FIGS. 41A to 41C.

Next, a substrate 100 is subjected to high temperature treatment in a gas atmosphere containing p-type impurities, thereby diffusing the p-type impurities into the n-type polysilicon films 132a, 136a, 140a, and 144a to form p-type diffusion regions 156a to 156t (FIGS. 42A to 42C). The p-type diffusion regions 156a to 156t and the n-type polysilicon films 132a, 136a, 140a, and 144a form pn junctions to implement diodes.

Next, titanium nitrides (TiN) 158a to 158t are formed on the surfaces of the p-type diffusion regions 156a to 156t (FIGS. 43A to 43C). Then, heating treatment is performed, thereby putting the titanium nitrides 158a to 158t into silicide to form titanium nitride silicides (TinSi) 158a to 158t (FIGS. 43A to 43C).

Next, the whole substrate is heated in an atmosphere of oxygen, thereby oxidizing the surfaces of the titanium nitride silicides 158a to 158t to form titanium oxide layers 159a to 159t (FIGS. 44A to 44C).

Next, a transition metal layer 160 is formed as a protective film of the memory devices (FIGS. 45A to 45C). In the embodiment, while platinum (Pt) is used as the protective film of the memory devices, not only platinum, but also $ReO_3$, $IrO_2$, $OsO_2$, $Rho_2$, $NMoO_2$, $RuO_2$, TiN, etc., can be used.

Next, a part of the transition metal layer 160 and a part of a silicon nitride film 128 are etched and removed by reactive ion etching to form holes 162a to 162h (FIGS. 46A to 46C).

Next, a titanium nitride (TiN) layer 164 is formed so as to fill in the holes 162a to 162h (FIGS. 47A to 47C). W. etc., may be used in place of the titanium nitride layer 164.

Figure 48A:
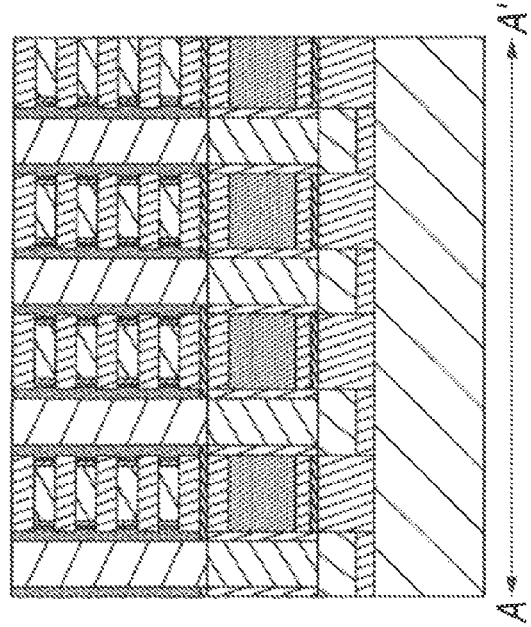
FIGS. 48A, 48B and 48C show the manufacturing process of the nonvolatile semiconductor memory according to the embodiment.
Figure 48C:
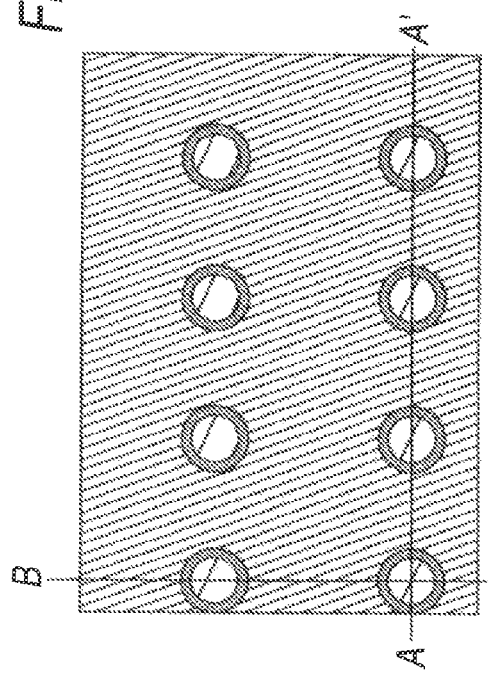
Figure 48B:
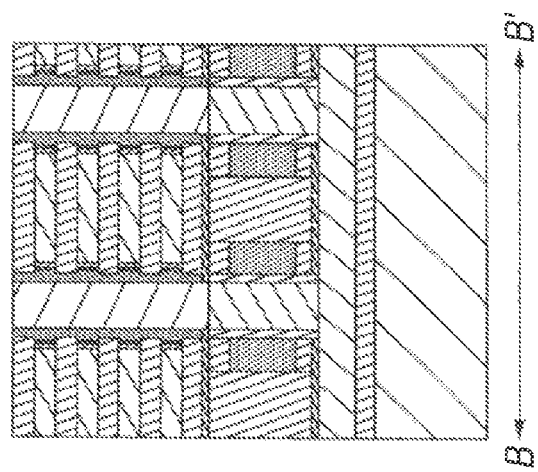

Next, the titanium nitride layer 164 is planarized using CMP or etching back (FIGS. 48A to 48C).

Then, various wirings are formed and the memory device region 3 of the nonvolatile semiconductor memory 1 according to the embodiment is complete (FIG. 1).

The manufacturing process of the nonvolatile semiconductor memory 1 in the embodiment does not require a plating process as used in the first embodiment, so that the nonvolatile semiconductor memory 1 can be manufactured by a simpler manufacturing method.

Fourth Embodiment (PRAM: Phase Change RAM)

In a fourth embodiment, a nonvolatile semiconductor memory of phase change type using a phase change film of GST (GeSbTe), etc., (PRAM: Phase Change RAM) will be discussed as an example of nonvolatile semiconductor memory of unipolar operation.

Figure 49:
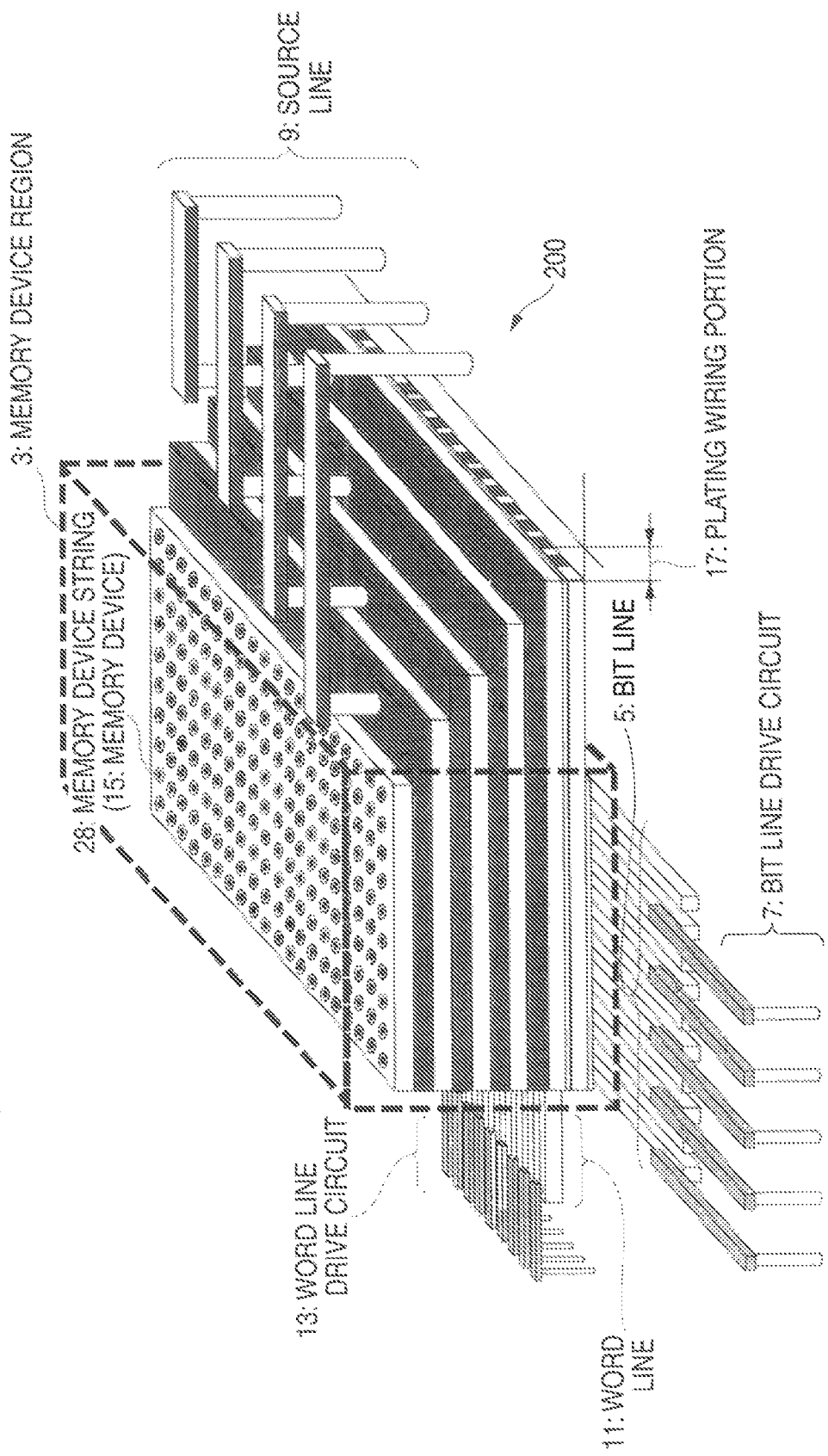
FIG. 49 shows the schematic configuration of a nonvolatile semiconductor memory 200 according to a fourth embodiment.

FIG. 49 shows the schematic configuration of a nonvolatile semiconductor memory 200 according to the fourth embodiment. The nonvolatile semiconductor memory 200 according to the fourth embodiment has a memory device region 3, bit lines 5, a bit line drive circuit 7, source lines 9, word lines 11, a word line drive circuit 13, etc. A plating wiring portion 17 of the nonvolatile semiconductor memory 200 according to the fourth embodiment indicates a portion cut after a plating process performed in manufacturing the nonvolatile semiconductor memory 200. As shown in FIG. 49, in the nonvolatile semiconductor memory 200, memory devices 15 forming the memory device region 3 are formed by stacking semiconductor layers.

The nonvolatile semiconductor memory 200 according to the embodiment is similar to the nonvolatile semiconductor memory 1 according to the first embodiment except for the configuration of the memory device region 3. Therefore, description of the components of the nonvolatile semiconductor memory 200 according to the fourth embodiment may be skipped.

In the nonvolatile semiconductor memory 200, each memory device 15 has a phase change film of GST (GeSbTe), etc. The phase change film is a film where the crystalline state changes and the resistance changes according to the current flowing into the film. In the nonvolatile semiconductor memory 200 according to the embodiment, a current is allowed to flow into each memory device 15, thereby changing the crystalline state of the phase change film and changing the resistance of the memory device 15. The change in the resistance of the memory device 15 is used to store information.

FIGS. 50A, 50B and 50C show the schematic configuration of a part of the memory device region 3 of the nonvolatile semiconductor memory 200. FIG. 50C is a top view of the memory device region 3. In a part of FIG. 50C, the upper structure thereof is stripped for convenience of the description as in FIG. 2C. FIG. 50A is a sectional view of the memory device region 3 taken on line A-A' in FIG. 50C. FIG. 50B is a sectional view of the memory device region 3 taken on line B-B' in FIG. 50C. As shown in FIGS. 50A to 50C, the memory device region 3 has a configuration wherein memory device strings 28 each having a plurality of memory devices 15a to 15d stacked in a longitudinal direction are arranged like a matrix. If the minimum machining dimension is F in the memory device region 3, the length of the memory device 15 in the A-A' direction thereof is 3 F and the length in the B-B' direction is 2 F and if one memory device string has n memory devices 15 (if n memory devices are stacked), the effective area of each memory device 15 is 6 $F^2/n$.

FIG. 51A is a sectional view of a part of the memory device region 3 of the nonvolatile semiconductor memory 200 like FIG. 50B. FIG. 51B is a partially enlarged view of the memory device 15 and FIG. 51C is an equivalent circuit diagram of the memory device 15. FIG. 51D is an equivalent circuit diagram of a part of the nonvolatile semiconductor memory 200. As shown in FIG. 51A, the memory device region 3 has vertical transistors 20. A plurality of (in the embodiment, four) memory devices 15a to 15d are stacked on each of the vertical transistors 20. In the embodiment, a structure made up of a plurality of (in the embodiment, four) memory devices 15a to 15d stacked on each of the vertical transistors 20 is called memory device string 28. The memory device region 3 has 10×20=200 memory device strings 28 as shown in FIG. 49.

The memory device string 28 has the memory devices 15a to 15d. The memory device 15a has a metal layer 212a, a GST layer 210a, a metal silicide layer 158a, a p-type polysilicon layer 156a, and an n-type polysilicon layer 144a. The memory device 15b has a metal layer 212a, a GST layer 210a, a metal silicide layer 158b, a p-type polysilicon layer 156b, and an n-type polysilicon layer 144b. The memory device 15c has a metal layer 212a, a GST layer 210a, a metal silicide layer 158c, a p-type polysilicon layer 156c, and an n-type polysilicon layer 144c. The memory device 15d has a metal layer 212a, a GST layer 210a, a metal silicide layer 158d, a p-type polysilicon layer 156d, and an n-type polysilicon layer 144d.

The memory devices 15a to 15d making up one memory device string 28 have the common metal layer 212a and the ends of the memory devices 15a to 15d are electrically connected by the metal layer 212a. The n-type polysilicon layers 144a, 144b, 144c, and 144d form the source line 9 and are formed each like a plate. In the memory device region 3, every memory device string 28 has the n-type polysilicon layers 144a, 144b, 144c, and 144d in common.

The memory device 15a of the nonvolatile semiconductor memory 200 has a resistance change element 15a1 made up of the metal layer 212a, the GST layer 210a of a phase change film, and the metal silicide layer 158a, and a diode 15a2 made up of the p-type polysilicon layer 156a and the n-type polysilicon layer 144a, connected to one end of the resistance change element 15a1, as shown in FIG. 51B. The memory device 15a has the resistance change element 15a1 and the diode 15a2 connected in series as with other embodiments. It may be recognized that the memory device 15a is made of the resistance change element 15a1, and the diode 15a2 is connected to one end of the memory device 15a made of the resistance change element 15a1. Each of other memory devices 15b to 15d has a similar configuration to that of the memory device 15a. The memory device 15a of the nonvolatile semiconductor memory 200 has the diode 15a2 where the direction from the resistance change element 15a1 to a source line SL is a forward direction. The p-type polysilicon layer 156a and the n-type polysilicon layer 144a may be formed so that the direction of the diode 15a2 becomes opposite.

One end of the memory device 15 is connected to the source line 9 (SL) through a source line selection transistor 26 as with the first embodiment. The source line 9 has a plate-like flat structure made of the same layer, as described above. An opposite end of the memory device 15 is connected to the bit line 5 (BL) through the vertical transistor 20. A bit line selection transistor 24 is connected to one end of the bit line 5 (BL). A signal is applied to the bit line 5 (BL) by the bit line selection transistor 24. The word line 11 (WL) is connected to a gate of the vertical transistor 20. A signal is applied to the word line 11 (WL) by a word line selection transistor 22.

One ends of the memory devices 15 stacked in the longitudinal direction are connected with each other and connected to the word line 11 (WL) through the vertical transistor 20, as shown in FIGS. 51A to 51D, as with the first embodiment.

While one memory device string 28 has been described in FIGS. 50A to 50C and 51A to 51D, every memory device string 28 has a similar configuration in the nonvolatile semiconductor memory 200. The number of the memory device strings 28 and the number of the memory devices 15 making up one memory device string 28 can be changed appropriately as desired in response to the memory capacity.

The nonvolatile semiconductor memory 200 according to the embodiment is nonvolatile semiconductor memory of unipolar operation. The read operation, the write operation, and the erasing operation of data in the nonvolatile semiconductor memory 200 according to the embodiment are similar to those described in the first embodiment and therefore will not be discussed again. In the nonvolatile semiconductor memory 200, examples of parameters of the memory device M and examples of voltages applied to the word lines WL1 to WL3, the source lines SL1 to SL3, and the bit lines BL1 to BL3 for selecting the memory device M (2, 1, 2) are shown below as in the first embodiment:

(Memory Device Parameters)
   Write voltage V_set=0.5 V
   Erasing voltage V_reset=1 V
   Diode breakdown voltage VBD=2 V (At Read Operation Time)
Voltage of word line connected to selected memory device M (2, 1, 2): Von=3 V
Voltage of any word line other than word line connected to selected memory device M (2, 1, 2): Voff=0 V
Voltage of source line connected to selected memory device M (2, 1, 2): VSLread=0 V
Voltage of any source line other than source line connected to selected memory device M (2, 1, 2): Floated
Voltage of bit line connected to selected memory device M (2, 1, 2): VBLread=0.2 V
Voltage of any bit line other than bit line connected to selected memory device M (2, 1, 2): Floated (At Write Operation Time)
Voltage of word line connected to selected memory device M (2, 1, 2): Von=3 V
Voltage of any word line other than word line connected to selected memory device M (2, 1, 2): Voff=0 V
Voltage of source line connected to selected memory device M (2, 1, 2): VSLset=0 V
Voltage of any source line other than source line connected to selected memory device M (2, 1, 2): Floated
Voltage of bit line connected to selected memory device M (2, 1, 2): VBLset=0.7 V
Voltage of any bit line other than bit line connected to selected memory device M (2, 1, 2): Floated (At Erasing Operation Time)
Voltage of word line connected to selected memory device M (2, 1, 2): Von=3 V
Voltage of any word line other than word line connected to selected memory device M (2, 1, 2): Voff=0 V
Voltage of source line connected to selected memory device M (2, 1, 2): VSLset=0 V
Voltage of any source line other than source line connected to selected memory device M (2, 1, 2): Floated
Voltage of bit line connected to selected memory device M (2, 1, 2): VBLset=1.5 V
Voltage of any bit line other than bit line connected to selected memory device M (2, 1, 2): Floated A manufacturing process of the nonvolatile semiconductor memory 200 according to the embodiment will be discussed. Parts similar to those of the manufacturing process of the nonvolatile semiconductor memory 1 according to the first embodiment will not be discussed again.

A resist mask is formed (not shown) and parts of the silicon oxide films 130, 134, 138, 142, and 146 and then-type polysilicon films 132, 136, 140, and 144 are etched, thereby forming holes 154a to 154h as in the step of the first embodiment shown in FIGS. 28A to 28C. In the embodiment, cylindrical holes 154a to 154h are formed, but the invention is not limited to the cylindrical holes, and holes of various shapes of prism holes, elliptic cylindrical holes, etc., may be formed.

Next, wet etching using hydrofluoric acid, etc., is performed, thereby retreating the n-type polysilicon films 132, 136, 140, and 144 on the sides of the holes 154a to 154h to form n-type polysilicon films 132a, 136a, 140a, and 144a as in the step of the first embodiment shown in FIGS. 29A to 29C.

Then, the substrate 100 is subjected to high temperature treatment in a gas atmosphere containing p-type impurities, thereby diffusing the p-type impurities into the n-type polysilicon films 132a, 136a, 140a, and 144a to form p-type diffusion regions 156a to 156t as in the step of the first embodiment shown in FIGS. 30A to 30C. The p-type diffusion regions 156a to 156t and the n-type polysilicon films 132a, 136a, 140a, and 144a form pn junctions to implement diodes.

Figure 52A:
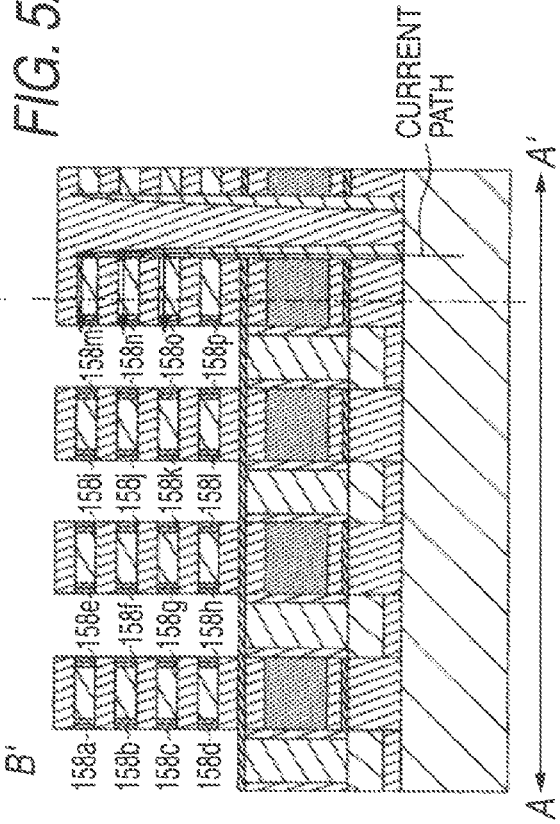
FIGS. 52A, 52B and 52C show a manufacturing process of the nonvolatile semiconductor memory according to the embodiment.
Figure 52C:
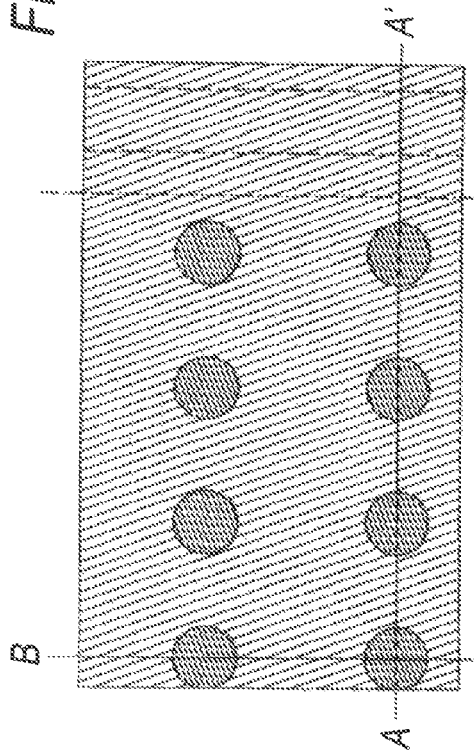
Figure 52B:
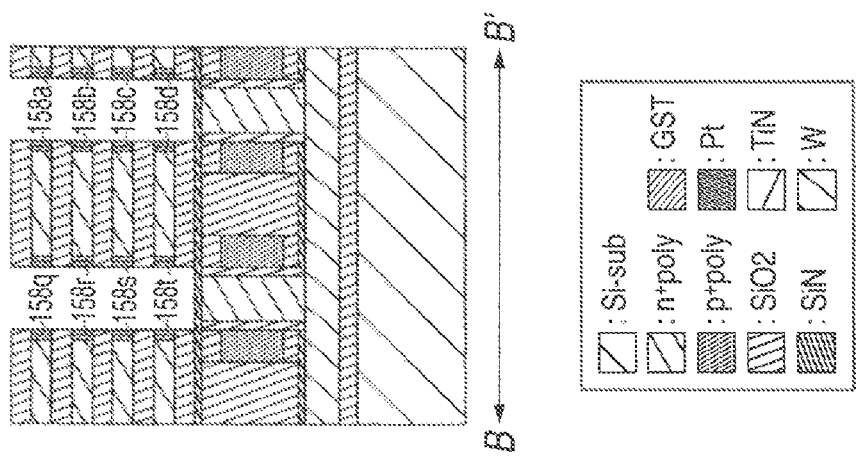

Next, the surfaces of the p-type diffusion regions 156a to 156t are put into silicide with platinum (Pt), thereby forming platinum silicides (PtSi) 158a to 158t (FIGS. 52A to 52C).

Next, platinum (Pt) is formed on the surfaces of the platinum silicides (PtSi) 158a to 158t by electric field plating with the substrate 100 as one electrode and the platinum silicides (PtSi) 158a to 158t as an opposite electrode (FIGS. 52A to 52C) as with the electric field plating described in the first embodiment with reference to FIGS. 32A to 32C. The platinum silicides (PtSi) 158a to 158t become an electrode for transferring electrons to and from a plating solution and platinum (Pt) is formed on the surfaces of the platinum silicides (PtSi) 158a to 158t. In the embodiment, electrode made of platinum (Pt) is formed on the surfaces of the platinum silicides (PtSi) 158a to 158t by electric field plating, but electrode may be formed on the surfaces of the platinum silicides (PtSi) 158a to 158t by electroless plating. The electroless plating eliminates the need for wiring like the n-type polysilicon film 150a for allowing a current to flow from the substrate 100 into the platinum silicides (PtSi) 158a to 158t as described also in the first embodiment.

Next, a phase change film 210 is formed on the full face of the substrate 100 (FIGS. 53A to 53C). In the embodiment, a GST (GeSbTe) film is used as the phase change film 210. Not only GST, but also GeTe, Ag—In—Sb—Te, Tb—Sb—Te—Ge, etc., can be used as the phase change film 210.

Next, a part of the phase change film 210 and a part of a silicon nitride film 128 are etched and removed by reactive ion etching to form phase change films 210a to 210h (FIGS. 54A to 54C).

Next, a titanium nitride (TiN) layer is formed so as to fill in the phase change films 210a to 210h and is planarized by CMP, etching back, etc., to form titanium nitride layers 212a to 212h (FIGS. 55A to 55C).

Next, a resist mask is formed (not shown) and the portion indicated by G in FIG. 56A is etched and removed (FIGS. 56A to 56C). As the step is executed, the wiring used to form the electrode protective film (polysilicon film 150a) by the electric field plating is removed and the platinum silicides (PtSi) 158a to 158t are electrically insulated from each other. Then, various wirings are formed and the memory device region 3 of the nonvolatile semiconductor memory 200 is complete (FIG. 49).

After the step shown in FIGS. 55A to 55C, a resist mask may be formed (not shown), the portion indicated by H in FIG. 57A may be etched and removed, and the sources lines may be electrically insulated from each other. Then, various wirings are formed and the memory device region 3 of the nonvolatile semiconductor memory 200 is complete.

Fifth Embodiment (MRAM: Magnetic RAM)
In a fifth embodiment, a nonvolatile semiconductor memory using a ferromagnetic layer of CoFe, etc., (MRAM:

Magnetic RAM) will be discussed as an example of nonvolatile semiconductor memory of bipolar operation.

A nonvolatile semiconductor memory 300 according to the fifth embodiment is similar to the nonvolatile semiconductor memory 1 or 200 according to the first or fourth embodiment except for the configuration of memory device region 3. Description of the components of the nonvolatile semiconductor memory 300 according to the fifth embodiment may be skipped.

In the nonvolatile semiconductor memory 300, each memory device 15 has a pair of ferromagnetic layers (films) of CoFe, etc., between which an insulator is sandwiched. In the nonvolatile semiconductor memory 300, in each memory device 15, the direction of magnetization of one of the paired ferromagnetic layers is constant and the direction of magnetization of the other can be changed by spin-polarized electrons emitted from a ferromagnetic material. As the direction of magnetization of one ferromagnetic layer changes, the electric resistance of the ferromagnetic layers forming each memory device 15 changes according to the direction of magnetization. The change in the electric resistance of the memory device 15 is used to store information.

FIGS. 58A, 58B and 58C show the schematic configuration of a part of a memory device region 3 of the nonvolatile semiconductor memory 300. FIG. 58C is a top view of the memory device region 3. In a part of FIG. 58C, the upper structure thereof is stripped for convenience of the description as in FIG. 2C. FIG. 58A is a sectional view of the memory device region 3 taken on line A-A' in FIG. 58C. FIG. 58B is a sectional view of the memory device region 3 taken on line B-B' in FIG. 58C. As shown in FIGS. 58A to 58C, the memory device region 3 has a configuration wherein memory device strings 28 each having a plurality of memory devices 15a to 15d stacked in a longitudinal direction are arranged like a matrix similarly to the first to fourth embodiments. If the minimum machining dimension is F in the memory device region 3, the length of the memory device 15 in the A-A' direction thereof is 3 F and the length in the B-B' direction is 2 F and if one memory device string has n memory devices 15 (if n memory devices are stacked), the effective area of each memory device 15 is 6 $F^2/n$.

FIG. 59A is a sectional view of a part of the memory device region 3 of the nonvolatile semiconductor memory 300. FIG. 59B is a partially enlarged view of the memory device 15 and FIG. 59C is an equivalent circuit diagram of the memory device 15. FIG. 59D is an equivalent circuit diagram of a part of the nonvolatile semiconductor memory 300. As shown in FIG. 59A, the memory device region 3 has vertical transistors 20. A plurality of (in the embodiment, four) memory devices 15a to 15d are stacked on each of the vertical transistors 20. In the embodiment, a structure made up of a plurality of (in the embodiment, four) memory devices 15a to 15d stacked on each of the vertical transistors 20 is called memory device string 28. The memory device region 3 has 10×20=200 memory device strings 28 as shown in FIG. 49.

The memory device string 28 has the memory devices 15a to 15d. The memory device 15a has a ferromagnetic layer 186a, a metal oxide layer 184a, a ferromagnetic layer 182a, a metal silicide layer 158a, a p-type polysilicon layer 156a, and an n-type polysilicon layer 144a. The memory device 15b has a ferromagnetic layer 186a, a metal oxide layer 184b, a ferromagnetic layer 182b, a metal silicide layer 158b, a p-type polysilicon layer 156b, and an n-type polysilicon layer 144b. The memory device 15c has a ferromagnetic layer 186a, a metal oxide layer 184c, a ferromagnetic layer 182c, a metal silicide layer 158c, a p-type polysilicon layer 156c, and an n-type polysilicon layer 144c. The memory device 15d has a ferromagnetic layer 186a, a metal oxide layer 184d, a ferromagnetic layer 182d, a metal silicide layer 158d, a p-type polysilicon layer 156d, and an n-type polysilicon layer 144d.

The memory devices 15a to 15d making up one memory device string 28 have the common ferromagnetic layer 186a. The memory devices 15a to 15d are electrically connected by a metal layer 190a. The n-type polysilicon layers 144a, 144b, 144c, and 144d form source lines 9 and are formed each like a plate. In the memory device region 3, every memory device string 28 has the n-type polysilicon layers 144a, 144b, 144c, and 144d in common.

The memory device 15a of the nonvolatile semiconductor memory 300 has a resistance change element 15a1 made up of the ferromagnetic layer 186a, the tunnel barrier layer (metal oxide layer) 184a, and the ferromagnetic layer 182a, and a diode 15a2 made up of metal silicide layer 158a, the p-type polysilicon layer 156a and the n-type polysilicon layer 144a, connected to one end of the resistance change element 15a1, as shown in FIG. 59B. One of the ferromagnetic layers 182a and 186a is functioning as the pinned layer, and the other of the ferromagnetic layers 182a and 186a is functioning as the free layer.

The memory device 15a has a resistance change element 15a1 and the diode 15a2 connected in series as with other embodiments. It may be recognized that the memory device 15a is made of the resistance change element 15a1, and the diode 15a2 is connected to one end of the memory device 15a made of the resistance change element 15a1. Each of other memory devices 15b to 15d has a similar configuration to that of the memory device 15a. The memory device 15a of the nonvolatile semiconductor memory 300 has the diode 15a2 where the direction from the resistance change element 15a1 to a source line SL is a forward direction. The p-type polysilicon layer 156a and the n-type polysilicon layer 144a may be formed so that the direction of the diode 15a2 becomes opposite.

One end of the memory device 15 is connected to the source line 9 (SL) through a source line selection transistor 26 as with the first embodiment. The source line 9 has a flat structure made of the same layer (plate-like flat structure), as described above. An opposite end of the memory device 15 is connected to the bit line 5 (BL) through the vertical transistor 20. A bit line selection transistor 24 is connected to one end of the bit line 5 (BL). A signal is applied to the bit line 5 (BL) by the bit line selection transistor 24. The word line 11 (WL) is connected to a gate of the vertical transistor 20. A signal is applied to the word line 11 (WL) by a word line selection transistor 22.

One ends of the memory devices 15 stacked in the longitudinal direction are connected with each other and connected to the word line 11 (WL) through the vertical transistor 20, as shown in FIGS. 59A to 59D, as with the first embodiment.

While one memory device string 28 has been described in FIGS. 58A to 58C and 59A to 59D, every memory device string 28 has a similar configuration in the nonvolatile semiconductor memory 300. The number of the memory device strings 28 and the number of the memory devices 15 making up one memory device string 28 can be changed appropriately as desired in response to the memory capacity.

The nonvolatile semiconductor memory 300 according to the embodiment is nonvolatile semiconductor memory of bipolar operation. The read operation, the write operation, and the erasing operation of data in the nonvolatile semiconductor memory 300 according to the embodiment are similar to those described in the second embodiment and therefore will not be discussed again. In the nonvolatile semiconductor memory 300 according to the embodiment, examples of parameters of the memory device M and examples of voltages applied to the word lines WL1 to WL3, the source lines SL1 to SL3, and the bit lines BL1 to BL3 for selecting the memory device M (2, 1, 2) are shown below as in the second embodiment:

(Memory Device Parameters)
  Write voltage V_set=1 V
  Erasing voltage V_reset=−1 V
  Diode breakdown voltage VBD=2 V
(At Read Operation Time)
Voltage of word line connected to selected memory device M (2, 1, 2): Von=3 V
Voltage of any word line other than word line connected to selected memory device M (2, 1, 2): Voff=0 V
Voltage of source line connected to selected memory device M (2, 1, 2): VSLread=0 V
Voltage of any source line other than source line connected to selected memory device M (2, 1, 2): Floated
Voltage of bit line connected to selected memory device M (2, 1, 2): VBLread=0.2 V
Voltage of any bit line other than bit line connected to selected memory device M (2, 1, 2): Floated
(At Write Operation Time)
Voltage of word line connected to selected memory device M (2, 1, 2): Von=3 V
Voltage of any word line other than word line connected to selected memory device M (2, 1, 2): Voff=0 V
Voltage of source line connected to selected memory device M (2, 1, 2): VSLset=0 V
Voltage of any source line other than source line connected to selected memory device M (2, 1, 2): Floated
Voltage of bit line connected to selected memory device M (2, 1, 2): VBLset=1.2 V
Voltage of any bit line other than bit line connected to selected memory device M (2, 1, 2): Floated
(At Erasing Operation Time)
Voltage of word line connected to selected memory device M (2, 1, 2): Von=3 V
Voltage of any word line other than word line connected to selected memory device M (2, 1, 2): Voff=0 V
Voltage of source line connected to selected memory device M (2, 1, 2): VSLset=2.5 V
Voltage of any source line other than source line connected to selected memory device M (2, 1, 2): 1.5 V
Voltage of bit line connected to selected memory device M (2, 1, 2): VBLset=0 V
Voltage of any bit line other than bit line connected to selected memory device M (2, 1, 2): Floated A manufacturing process of the nonvolatile semiconductor memory 300 according to the embodiment will be discussed. Parts similar to those of the manufacturing process of the nonvolatile semiconductor memory 1 or 200 according to the first or fourth embodiment will not be discussed again.

A resist mask is formed (not shown) and parts of the silicon oxide films 130, 134, 138, 142, and 146 and the n-type polysilicon films 132, 136, 140, and 144 are etched, thereby forming holes 154a to 154h as in the step of the first embodiment shown in FIGS. 28A to 28C. In the embodiment, cylindrical holes 154a to 154h are formed, but the invention is not limited to the cylindrical holes, and holes of various shapes of prism holes, elliptic cylindrical holes, etc., may be formed.

Figure 60C:
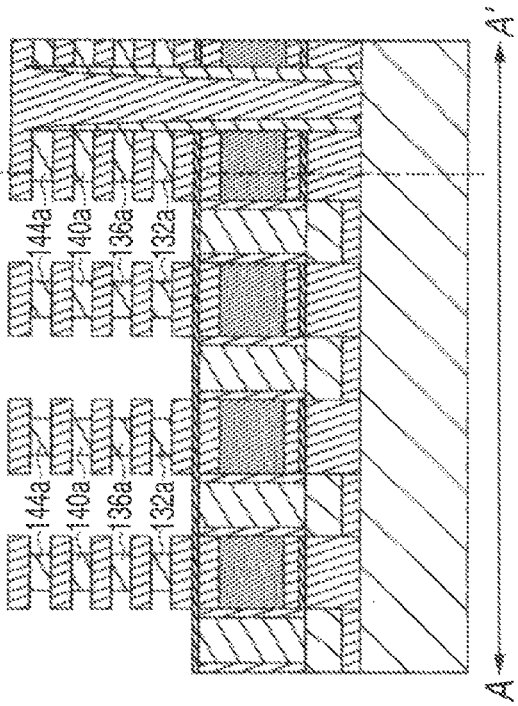
FIGS. 60A, 60B and 60C show a manufacturing process of the nonvolatile semiconductor memory according to the embodiment.
Figure 60A:
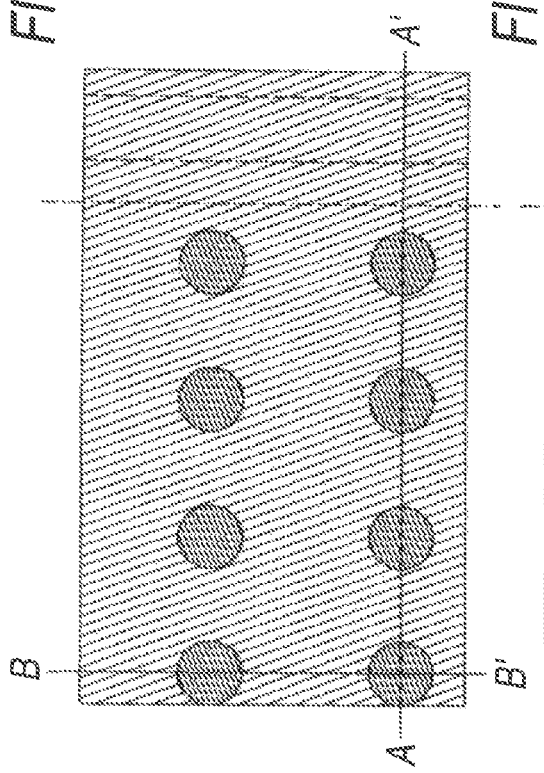
Figure 60B:
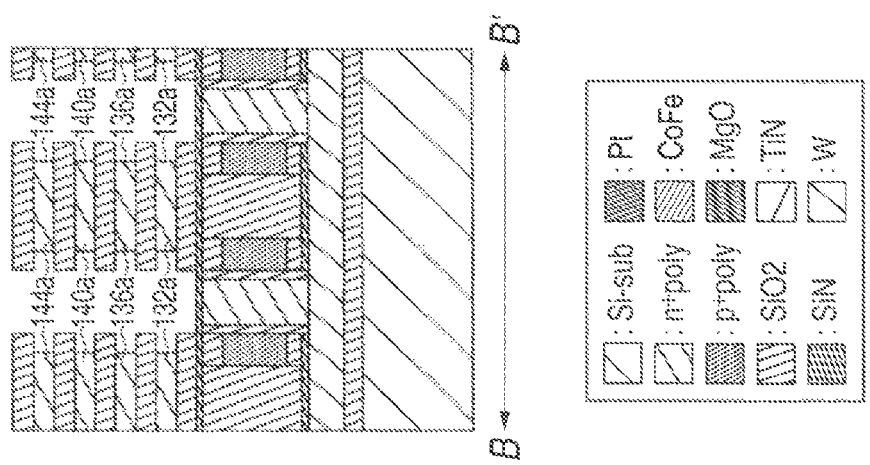

Next, for example, isotropic dry etching is performed, thereby retreating the n-type polysilicon films 132, 136, 140, and 144 on the sides of the holes 154a to 154h to form n-type polysilicon films 132a, 136a, 140a, and 144a (FIGS. 60A to 60C) as in the step of the first embodiment shown in FIGS. 29A to 29C.

Next, a substrate 100 is subjected to high temperature treatment in a gas atmosphere containing p-type impurities, thereby diffusing the p-type impurities into the n-type polysilicon films 132a, 136a, 140a, and 144a to form p-type diffusion regions 156a to 156t (FIGS. 61A to 61C). The p-type diffusion regions 156a to 156t and the n-type polysilicon films 132a, 136a, 140a, and 144a form pn junctions to implement diodes.

Figure 62C:
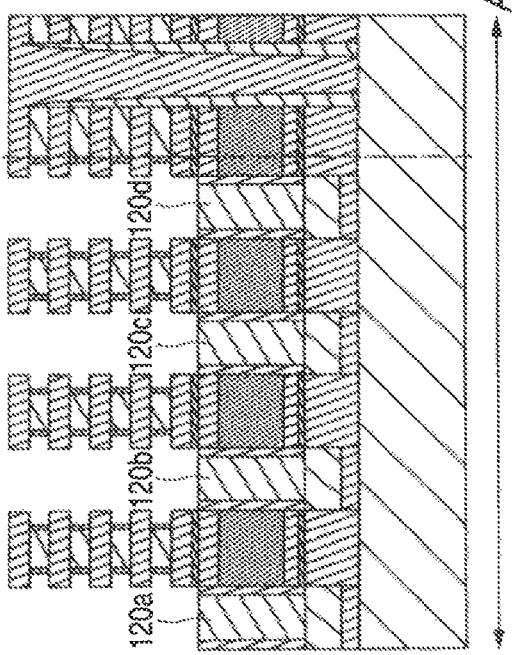
FIGS. 62A, 62B and 62C show the manufacturing process of the nonvolatile semiconductor memory according to the embodiment.
Figure 62A:
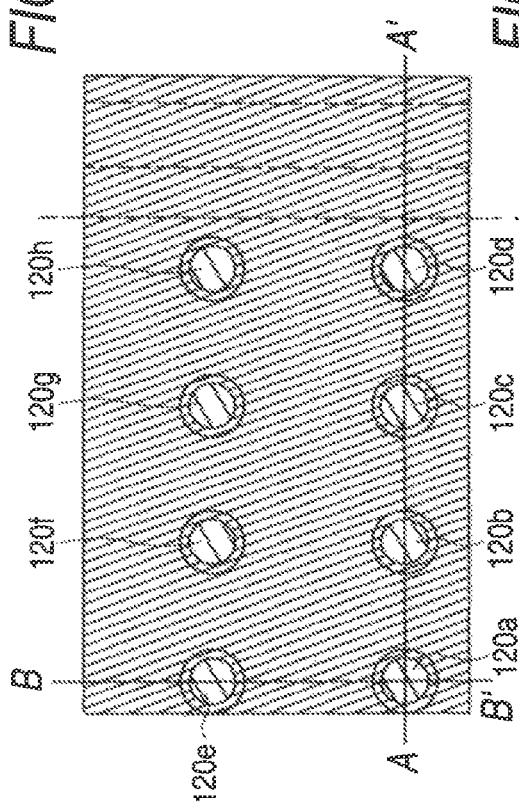
Figure 62B:
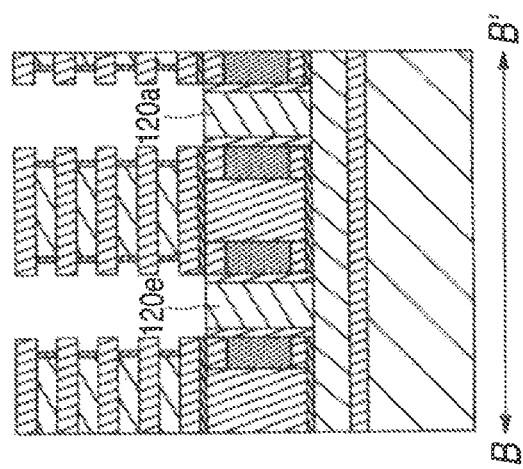

Next, a part of a silicon nitride film 128 is etched and removed by reactive ion etching to expose polysilicon films 120a to 120h (FIGS. 62A to 62C).

Next, the surfaces of the p-type diffusion regions 156a to 156t are put into silicide with platinum (Pt), thereby forming platinum silicides (PtSi) 158a to 158t (FIGS. 63A to 63C)

Next, platinum (Pt) is formed on the surfaces of the platinum silicides (PtSi) 158a to 158t by electric field plating with the substrate 100 as one electrode and the platinum silicides (PtSi) 158a to 158t as an opposite electrode (FIGS. 64A to 64C) as with the electric field plating described in the first embodiment with reference to FIGS. 32A to 32C. Electrons are transferred between the platinum silicides (PtSi) 158a to 158t and a plating solution, and platinum (Pt) is formed on the surfaces of the platinum silicides (PtSi) 158a to 158t. In the embodiment, electrode made of platinum (Pt) is formed on the surfaces of the platinum silicides (PtSi) 158a to 158t by electric field plating, but electrode may be formed on the surfaces of the platinum silicides (PtSi) 158a to 158t by electroless plating. The electroless plating eliminates the need for wiring like the n-type polysilicon film 150a for allowing a current to flow from the substrate 100 into the platinum silicides (PtSi) 158a to 158t as described also in the first embodiment.

Next, the ferromagnetic layers 182a to 182t are formed on the surfaces of platinum formed on the surfaces of the platinum silicides (PtSi) 158a to 158t by electroless plating (FIGS. 65A to 65C). In the embodiment, cobalt iron (CoFe) is used as the ferromagnetic layers 182a to 182t, but the material of the ferromagnetic layers 182a to 182t is not limited to cobalt iron (CoFe); CoFeB, etc., may be used as the ferromagnetic layers 182a to 182t. In the embodiment, the CoFe layers of the ferromagnetic layers are formed by the electroless plating, but the method is not limited to it.

Next, a metal layer is formed on the surfaces of the ferromagnetic layers 182a to 182t by electroless plating and then is heated in an atmosphere of oxygen, thereby forming metal oxide layers 184a to 184t which will become tunnel barrier layer (FIGS. 66A to 66C). For example, MgO is used as the tunnel barrier layer.

Figure 67C:
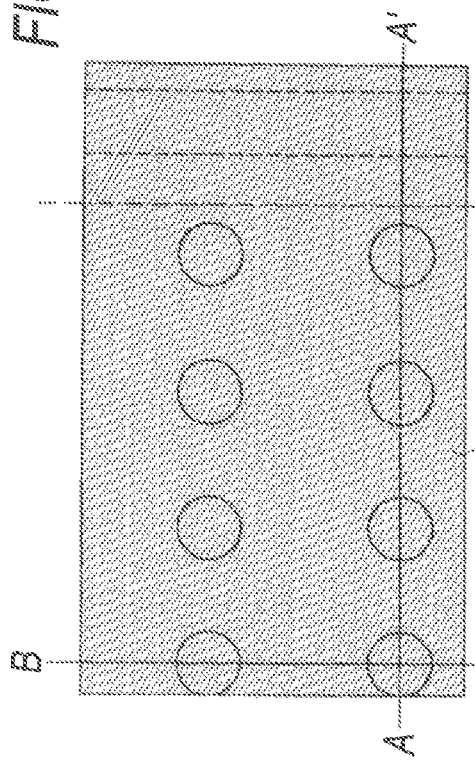
FIGS. 67A, 67B and 67C show the manufacturing process of the nonvolatile semiconductor memory according to the embodiment.
Figure 67A:
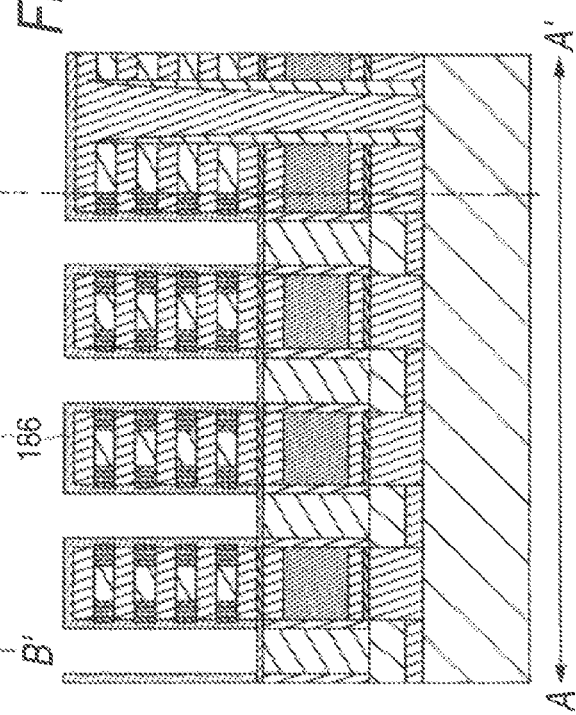
Figure 67B:
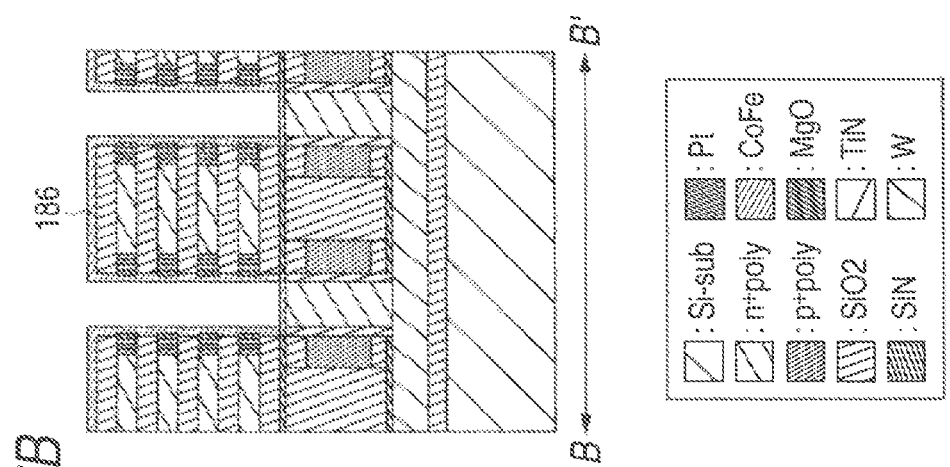

Next, ferromagnetic layer 186 is formed on the full face of the substrate by a sputtering method (FIGS. 67A to 67C). In the embodiment, cobalt iron (CoFe) is used as the ferromagnetic layer 186, but the material of the ferromagnetic layer 186 is not limited to cobalt iron (CoFe); CoFeB, etc., may be used as the ferromagnetic layer 186.

Next, a part of the ferromagnetic layer 186 is etched and removed by reactive ion etching to expose polysilicon films 120a to 120h for forming ferromagnetic layers 186a to 186h (FIGS. 68A to 68C).

Figure 69A:
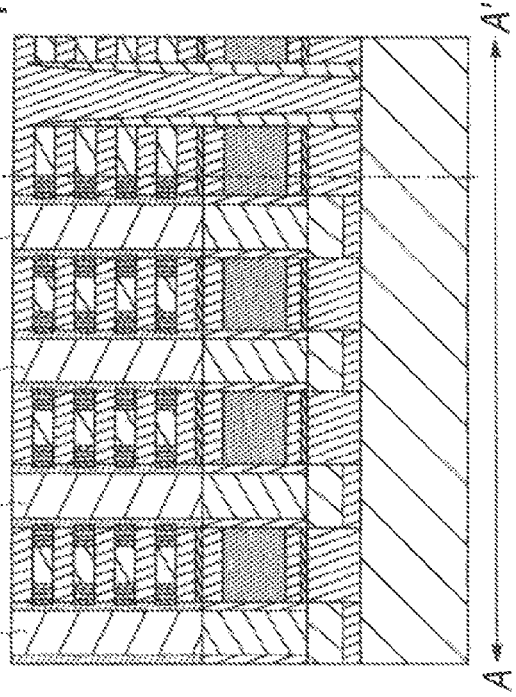
FIGS. 69A, 69B and 69C show the manufacturing process of the nonvolatile semiconductor memory according to the embodiment.
Figure 69C:
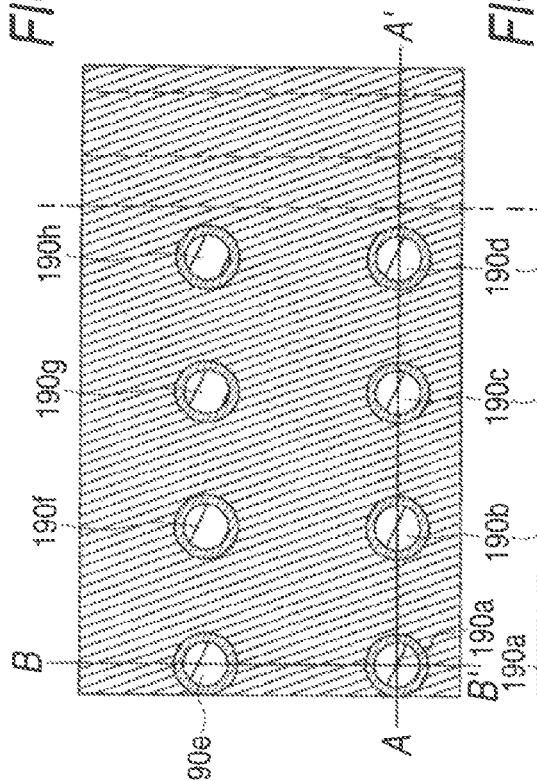
Figure 69B:
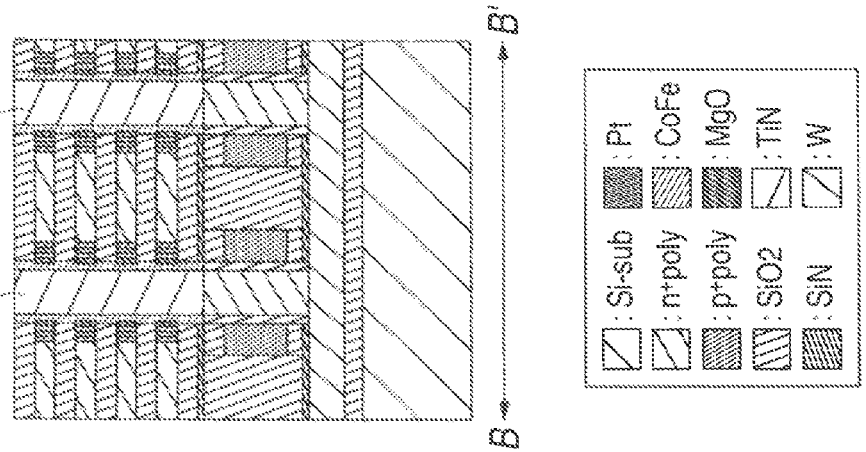

Next, a titanium nitride (TiN) layer is formed so as to fill in holes 188a to 188h surrounded by the ferromagnetic layers 186a to 186h and CMP treatment is performed, thereby forming titanium nitride layers 190a to 190h (FIGS. 69A to 69C).

Next, a resist mask is formed (not shown) and the portion indicated by H in FIG. 70A is etched and removed. As the step is executed, the wiring used to form the electrode (polysilicon film 150a) by the electric field plating is removed and the source lines are electrically insulated from each other. Then, various wirings are formed and the memory device region 3 of the nonvolatile semiconductor memory 300 is complete (FIGS. 70A to 70C).

After the step shown in FIGS. 69A to 69C, a resist mask may be formed (not shown), an etching step similar to the step previously described with reference to FIGS. 57A to 57C in the fourth embodiment may be executed, and the sources lines may be electrically insulated from each other. Then, various wirings are formed and the memory device region 3 of the nonvolatile semiconductor memory 300 according to the fifth embodiment is complete.

Sixth Embodiment (ReRAM: Resistive RAM)

In a sixth embodiment, a nonvolatile semiconductor memory using a material having a colossal electro-resistance (CER) effect such as $Pr_{0.7}Ca_{0.3}MnO_3$ (ReRAM: Resistive RAM) will be discussed as an example of nonvolatile semiconductor memory of bipolar operation.

A nonvolatile semiconductor memory 400 according to the sixth embodiment is similar to the nonvolatile semiconductor memory 1 or 200 according to the first or fourth embodiment except for the configuration of memory device region 3. Therefore, description of the components of the nonvolatile semiconductor memory 400 according to the sixth embodiment may be skipped.

In the nonvolatile semiconductor memory 400, each memory device 15 has a material having a colossal electro-resistance (CER) effect such as $Pr_{0.7}Ca_{0.3}MnO_3$ (the material will be hereinafter referred to as "CER material"). The colossal electro-resistance (CER) effect is a phenomenon in which the electric resistance changes by applying an electric field. The nonvolatile semiconductor memory 400 according to the embodiment stores information using change in the electric resistance of the memory device 15. The electric resistance of the CER material forming each memory device 15 does not change after the electric field is removed. Therefore, each memory device continues to store the information still after the electric field is removed.

The nonvolatile semiconductor memory 400 according to the embodiment is nonvolatile semiconductor memory of bipolar operation.

FIGS. 71A, 71B and 71C show the schematic configuration of a part of a memory device region 3 of the nonvolatile semiconductor memory 400. FIG. 71C is a top view of the memory device region 3. In a part of FIG. 71C, the upper structure thereof is stripped for convenience of the description as in FIG. 2C. FIG. 71A is a sectional view of the memory device region 3 taken on line A-A' in FIG. 71C. FIG. 71B is a sectional view of the memory device region 3 taken on line B-B' in FIG. 71C. As shown in FIGS. 71A to 71C, the memory device region 3 has a configuration wherein memory device strings 28 each having a plurality of memory devices 15a to 15d stacked in a longitudinal direction are arranged like a matrix similarly to the first to fifth embodiments. If the minimum machining dimension is F in the memory device region 3, the length of the memory device 15 in the A-A' direction thereof is 3 F and the length in the B-B' direction is 2 F and if one memory device string has n memory devices 15 (if n memory devices are stacked), the effective area of each memory device 15 is $6 F^2/n$.

FIG. 72A is a sectional view of a part of the memory device region 3 of the nonvolatile semiconductor memory 400. FIG. 72B is a partially enlarged view of the memory device 15 and FIG. 72C is an equivalent circuit diagram of the memory device 15. FIG. 72D is an equivalent circuit diagram of a part of the nonvolatile semiconductor memory 400. As shown in FIG. 72A, the memory device region 3 has vertical transistors 20. A plurality of (in the embodiment, four) memory devices 15a to 15d are stacked on each of the vertical transistors 20. In the embodiment, a structure made up of a plurality of (in the embodiment, four) memory devices 15a to 15d stacked on each of the vertical transistors 20 is called memory device string 28. The memory device region 3 has 10×20=200 memory device strings 28.

The memory device string 28 has the memory devices 15a to 15d. The memory device 15a has a metal layer 171a, a CER layer 170a, a metal silicide layer 158a, a p-type polysilicon layer 156a, and an n-type polysilicon layer 144a. The memory device 15b has a metal layer 171a, a CER layer 170a, a metal silicide layer 158b, a metal silicide layer 158b, a p-type polysilicon layer 156b, and an n-type polysilicon layer 144b. The memory device 15c has a metal layer 171a, a CER layer 170a, a metal silicide layer 158c, a metal silicide layer 158c, a p-type polysilicon layer 156c, and an n-type polysilicon layer 144c. The memory device 15d has a metal layer 171a, a CER layer 170a, a metal silicide layer 158d, a p-type polysilicon layer 156d, and an n-type polysilicon layer 144d.

The memory devices 15a to 15d making up one memory device string 28 have the common metal layer 171a and the common CER layer 170a. The memory devices 15a to 15d are electrically connected by a metal layer 171a. The n-type polysilicon layers 144a, 144b, 144c, and 144d form source lines 9 and are formed each like a plate. In the memory device region 3, every memory device string 28 has the n-type polysilicon layers 144a, 144b, 144c, and 144d in common.

The memory device 15a of the nonvolatile semiconductor memory 400 has a resistance change element 15a1 made up of the metal layer 171a, the CER layer 170a, and the metal silicide layer, and a diode 15a2 made up of the p-type polysilicon layer 156a and the n-type polysilicon layer 144a, connected to one end of the resistance change element 15a1, as shown in FIG. 72B. The memory device 15a has a resistance change element 15a1 and the diode 15a2 connected in series as with other embodiments. It may be recognized that the memory device 15a is made of the resistance change element 15a1, and the diode 15a2 is connected to one end of the memory device 15a made of the resistance change element 15a1. Each of other memory devices 15b to 15d has a similar configuration to that of the memory device 15a. The memory device 15a of the nonvolatile semiconductor memory 400 has the diode 15a2 where the direction from the resistance change element 15a1 to a source line SL is a forward direction. The p-type polysilicon layer 156a and the n-type polysilicon layer 144a may be formed so that the direction of the diode 15a2 becomes opposite.

One end of the memory device 15 is connected to the source line 9 (SL) through a source line selection transistor 26 as with the first embodiment. The source line 9 has a plate-like flat structure made of the same layer, as described above. An opposite end of the memory device 15 is connected to the bit line 5 (BL) through the vertical transistor 20. A bit line selection transistor 24 is connected to one end of the bit line 5 (BL). A signal is applied to the bit line 5 (BL) by the bit line selection transistor 24. The word line 11 (WL) is connected to a gate of the vertical transistor 20. A signal is applied to the word line 11 (WL) by a word line selection transistor 22.

One ends of the memory devices 15 stacked in the longitudinal direction are connected with each other and connected to the word line 11 (WL) through the vertical transistor 20, as shown in FIGS. 72A to 72D, as with the first embodiment.

While one memory device string 28 has been described in FIGS. 71A to 71C and 72A to 72D, every memory device string 28 has a similar configuration in the nonvolatile semiconductor memory 400. The number of the memory device strings 28 and the number of the memory devices 15 making up one memory device string 28 can be changed appropriately as desired in response to the memory capacity.

The nonvolatile semiconductor memory 400 according to the embodiment is nonvolatile semiconductor memory of bipolar operation. The read operation, the write operation, and the erasing operation of data in the nonvolatile semiconductor memory 400 according to the embodiment are similar to those described in the second embodiment and therefore will not be discussed again. In the nonvolatile semiconductor memory 400, examples of parameters of the memory device M and examples of voltages applied to the word lines WL1 to WL3, the source lines SL1 to SL3, and the bit lines BL1 to BL3 for selecting the memory device M (2, 1, 2) are shown below as in the second embodiment:

(Memory Device Parameters)
    Write voltage V_set=0.5 V
    Erasing voltage V_reset=−0.5 V
    Diode breakdown voltage VBD=1 V
(At Read Operation Time)
Voltage of word line connected to selected memory device M (2, 1, 2): Von=3 V
Voltage of any word line other than word line connected to selected memory device M (2, 1, 2): Voff=0 V
Voltage of source line connected to selected memory device M (2, 1, 2): VSLread=0 V
Voltage of any source line other than source line connected to selected memory device M (2, 1, 2): Floated
Voltage of bit line connected to selected memory device M (2, 1, 2): VBLread=0.2 V
Voltage of any bit line other than bit line connected to selected memory device M (2, 1, 2): Floated
(At Write Operation Time)
Voltage of word line connected to selected memory device M (2, 1, 2): Von=3 V
Voltage of any word line other than word line connected to selected memory device M (2, 1, 2): Voff=0 V
Voltage of source line connected to selected memory device M (2, 1, 2): VSLset=0 V
Voltage of any source line other than source line connected to selected memory device M (2, 1, 2): Floated
Voltage of bit line connected to selected memory device M (2, 1, 2): VBLset=0.7 V
Voltage of any bit line other than bit line connected to selected memory device M (2, 1, 2): Floated
(At Erasing Operation Time)
Voltage of word line connected to selected memory device M (2, 1, 2): Von=3 V
Voltage of any word line other than word line connected to selected memory device M (2, 1, 2): Voff=0 V
Voltage of source line connected to selected memory device M (2, 1, 2): VSLset=1.2 V
Voltage of any source line other than source line connected to selected memory device M (2, 1, 2): 0.6 V
Voltage of bit line connected to selected memory device M (2, 1, 2): VBLset=0 V
Voltage of any bit line other than bit line connected to selected memory device M (2, 1, 2): Floated A manufacturing process of the nonvolatile semiconductor memory 400 according to the embodiment will be discussed. Parts similar to those of the manufacturing process of the nonvolatile semiconductor memory 1 or 200 according to the first or fourth embodiment will not be discussed again.

After a similar step to the step of the first embodiment shown in FIGS. 32A to 32C, a CER layer 170 is formed on the full face of a substrate (FIGS. 73A to 73C).

Next, a part of the CER layer 170 and a part of a silicon nitride film 128 are removed by reactive ion etching. As the step is executed, polysilicon films 120a to 120h are exposed and CER layers 170a to 170h are formed (FIGS. 74A to 74C).

Next, a platinum (Pt) layer 171 is formed as a metal layer on the full face of the substrate. Then, a titanium nitride (TiN) layer 172 is formed so as to fill in holes 162a to 162h (FIGS. 75A to 75C). As the metal layer, not only platinum, but also $ReO_3$, $IrO_2$, $OsO_2$, $RhO_2$, $NMoO_2$, $RuO_2$, TiN, etc., may be used. W may be used in place of the titanium nitride layer 172. Next, the full face of the substrate is planarized using CMP or etching back to form platinum layers 171a to 171h and titanium nitride layers 172a to 172h (FIGS. 76A to 76C).

Figure 76C:
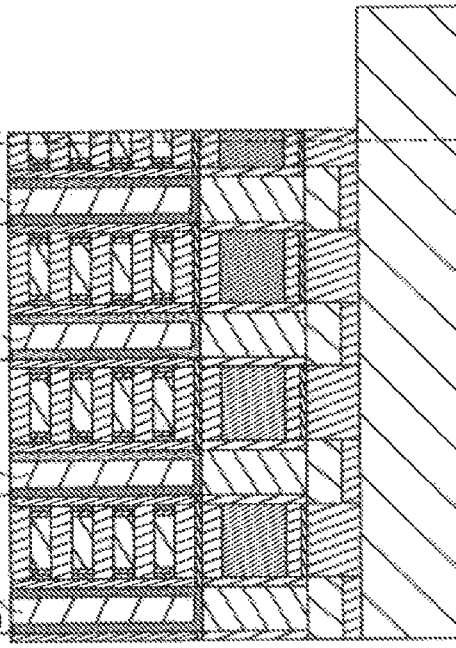
FIGS. 76A, 76B and 76C show the manufacturing process of the nonvolatile semiconductor memory according to the embodiment.
Figure 76A:
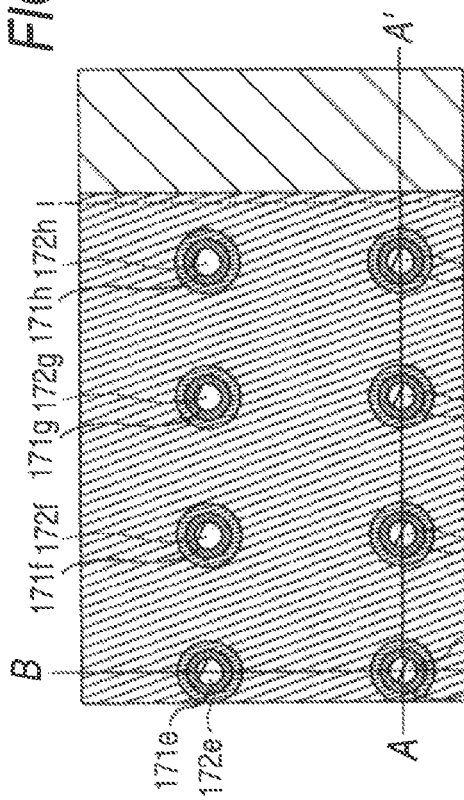
Figure 76B:
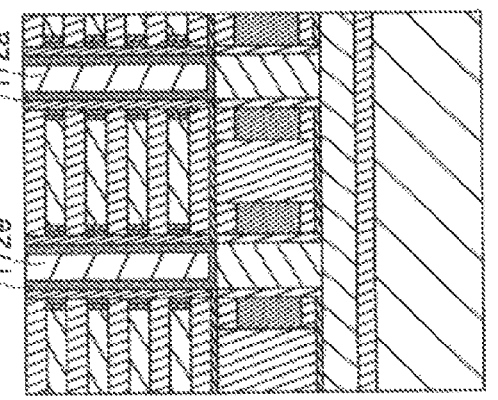

Then, a resist mask is formed (not shown) and the portion indicated by F in FIG. 76A is etched and removed (FIGS. 76A to 76C). As the step is executed, the wiring used to form an electrode protective film (polysilicon film 150a) by electric field plating is removed and platinum silicides (PtSi) 158a to 158t are electrically insulated from each other.

Then, various wirings are formed and the memory device region 3 of the nonvolatile semiconductor memory 400 is complete.

After the step shown in FIGS. 75A to 75C, a resist mask may be formed (not shown), the portion indicated by G in FIG. 77A may be etched and removed, and the sources lines may be electrically insulated from each other (FIGS. 77A to 77C). In this case, the plating wiring (polysilicon film 150a) portion remains. Then, various wirings are formed and the memory device region 3 of the nonvolatile semiconductor memory 400 is complete.

Seventh Embodiment (PMCRAM: Programmable Metallization RAM)

In a seventh embodiment, a nonvolatile semiconductor memory using an electrolyte material of CuS, AgGeS, CuGeS, AgGeSe, etc., (PMCRAM: Programmable Metallization RAM) will be discussed as an example of nonvolatile semiconductor memory of bipolar operation.

A nonvolatile semiconductor memory 500 according to the seventh embodiment is similar to the nonvolatile semiconductor memory 1 or 200 according to the first or fourth embodiment except for the configuration of memory device region 3. Therefore, description of the components of the nonvolatile semiconductor memory 500 according to the seventh embodiment may be skipped.

In the nonvolatile semiconductor memory 500 according to the embodiment, each memory device 15 has an electrolyte material of CuS, AgGeS, CuGeS, AgGeSe, etc. In the nonvolatile semiconductor memory 500, a voltage is applied to each memory device 15, whereby metal ions of $Ag^+$, $Cu^+$, etc., move in an electrolyte material (colloid) and a metal "bridge" is formed in the electrolyte material, thereby changing the resistance of the memory device 15. Information is stored using change in the resistance of the memory device 15.

FIGS. 78A, 78B and 78C show the schematic configuration of a part of a memory device region 3 of the nonvolatile semiconductor memory 500. FIG. 78C is a top view of the memory device region 3. In a part of FIG. 78C, the upper structure thereof is stripped for convenience of the description, as described above in the first embodiment. FIG. 78A is a sectional view of the memory device region 3 taken on line A-A' in FIG. 78C. FIG. 78B is a sectional view of the memory device region 3 taken on line B-B' in FIG. 78C. As shown in FIGS. 78A to 78C, the memory device region 3 has a configuration wherein memory device strings 28 each having a plurality of memory devices 15a to 15d stacked in a longitudinal direction are arranged like a matrix. If the minimum machining dimension is F in the memory device region 3, the length of the memory device 15 in the A-A' direction thereof is 3 F and the length in the B-B' direction is 2 F and if one memory device string has n memory devices 15 (if n memory devices are stacked), the effective area of each memory device 15 is 6 $F^2/n$.

FIG. 79A is a sectional view of apart of the memory device region 3 of the nonvolatile semiconductor memory 500 like FIG. 78B. FIG. 79B is a partially enlarged view of the memory device 15 and FIG. 79C is an equivalent circuit diagram of the memory device 15. FIG. 79D is an equivalent circuit diagram of a part of the nonvolatile semiconductor memory 500. As shown in FIG. 79A, the memory device region 3 has vertical transistors 20. A plurality of (in the embodiment, four) memory devices 15a to 15d are stacked on each of the vertical transistors 20. In the embodiment, a structure made up of a plurality of (in the embodiment, four) memory devices 15a to 15d stacked on each of the vertical transistors 20 is called memory device string 28. The memory device region 3 has 10×20=200 memory device strings 28 like that shown in FIG. 49.

The memory device string 28 has the memory devices 15a to 15d. The memory device 15a has an electrolyte material 202a, a metal silicide layer 158a, a p-type polysilicon layer 156a, and an n-type polysilicon layer 144a. The memory device 15b has an electrolyte material 202a, a metal silicide layer 158b, a p-type polysilicon layer 156b, and an n-type polysilicon layer 144b. The memory device 15c has an electrolyte material 202a, a metal silicide layer 158c, a p-type polysilicon layer 156c, and an n-type polysilicon layer 144c. The memory device 15d has an electrolyte material 202a, a metal silicide layer 158d, a p-type polysilicon layer 156d, and an n-type polysilicon layer 144d.

The memory devices 15a to 15d making up one memory device string 28 have the common electrolyte material 202a. The n-type polysilicon layers 144a, 144b, 144c, and 144d form source lines 9 and are formed each like a plate. In the memory device region 3, every memory device string 28 has the n-type polysilicon layers 144a, 144b, 144c, and 144d in common.

The memory device 15a of the nonvolatile semiconductor memory 500 has a resistance change element 15a1 made up of the electrolyte material 202a and the metal silicide layer 158a, and a diode 15a2 made up of the p-type polysilicon layer 156a and the n-type polysilicon layer 144a, connected to one end of the resistance change element 15a1, as shown in FIG. 79B. The memory device 15a has a resistance change element 15a1 and the diode 15a2 connected in series as with other embodiments. It may be recognized that the memory device 15a is made of the resistance change element 15a1, and the diode 15a2 is connected to one end of the memory device 15a made of the resistance change element 15a1 as with other embodiments. Each of other memory devices 15b to 15d has a similar configuration to that of the memory device 15a. The memory device 15a of the nonvolatile semiconductor memory 500 has the diode 15a2 where the direction from the resistance change element 15a1 to a source line SL is a forward direction. The p-type polysilicon layer 156a and the n-type polysilicon layer 144a may be formed so that the direction of the diode 15a2 becomes opposite as with other embodiments.

One end of the memory device 15 is connected to the source line 9 (SL) through a source line selection transistor 26 as with the first embodiment. The source line 9 has a plate-like flat structure made of the same layer, as described above. An opposite end of the memory device 15 is connected to the bit line 5 (BL) through the vertical transistor 20. A bit line selection transistor 24 is connected to one end of the bit line 5 (BL). A signal is applied to the bit line 5 (BL) by the bit line selection transistor 24. The word line 11 (WL) is connected to a gate of the vertical transistor 20. A signal is applied to the word line 11 (WL) by a word line selection transistor 22.

One ends of the memory devices 15 stacked in the longitudinal direction are connected with each other and connected to the word line 11 (WL) through the vertical transistor 20, as shown in FIGS. 79A to 79D, as with the first embodiment.

While one memory device string 28 has been described in FIGS. 78A to 78C and 79A to 79D, every memory device string 28 has a similar configuration in the nonvolatile semiconductor memory 500. The number of the memory device strings 28 and the number of the memory devices 15 making up one memory device string 28 can be changed appropriately as desired in response to the memory capacity.

The nonvolatile semiconductor memory 500 according to the embodiment is nonvolatile semiconductor memory of bipolar operation. The read operation, the write operation, and the erasing operation of data in the nonvolatile semiconductor memory 500 according to the embodiment are similar to those described in the second embodiment and therefore will not be discussed again. In the nonvolatile semiconductor memory 500, examples of parameters of the memory device M and examples of voltages applied to the word lines WL1 to WL3, the source lines SL1 to SL3, and the bit lines BL1 to BL3 for selecting the memory device M (2, 1, 2) are shown below as in the second embodiment:

(Memory Device Parameters)
    Write voltage V_set=0.5 V
    Erasing voltage V_reset=−0.5 V
    Diode breakdown voltage VBD=1 V
(At Read Operation Time)
Voltage of word line connected to selected memory device M (2, 1, 2): Von=3 V
Voltage of any word line other than word line connected to selected memory device M (2, 1, 2): Voff=0 V
Voltage of source line connected to selected memory device M (2, 1, 2): VSLread=0 V
Voltage of any source line other than source line connected to selected memory device M (2, 1, 2): Floated
Voltage of bit line connected to selected memory device M (2, 1, 2): VBLread=0.2 V
Voltage of any bit line other than bit line connected to selected memory device M (2, 1, 2): Floated
(At Write Operation Time)
Voltage of word line connected to selected memory device M (2, 1, 2): Von=3 V
Voltage of any word line other than word line connected to selected memory device M (2, 1, 2): Voff=0 V
Voltage of source line connected to selected memory device M (2, 1, 2): VSLset=0 V
Voltage of any source line other than source line connected to selected memory device M (2, 1, 2): Floated
Voltage of bit line connected to selected memory device M (2, 1, 2): VBLset=0.7 V
Voltage of any bit line other than bit line connected to selected memory device M (2, 1, 2): Floated
(At Erasing Operation Time)
Voltage of word line connected to selected memory device M (2, 1, 2): Von=3 V Voltage of any word line other than word line connected to selected memory device M (2, 1, 2): Voff=0 V Voltage of source line connected to selected memory device M (2, 1, 2): VSLset=1.2 V Voltage of any source line other than source line connected to selected memory device M (2, 1, 2): 0.6 V Voltage of bit line connected to selected memory device M (2, 1, 2): VBLset=0 V Voltage of any bit line other than bit line connected to selected memory device M (2, 1, 2): Floated A manufacturing process of the nonvolatile semiconductor memory 500 according to the embodiment will be discussed. Parts similar to those of the manufacturing process of the nonvolatile semiconductor memory 1 or 200 according to the first or fourth embodiment will not be discussed again.

Platinum (Pt) is formed on the surfaces of the platinum silicides (PtSi) 158a to 158t by electric field plating as with the electric field plating described in the first embodiment with reference to FIGS. 32A to 32C. Electrons are transferred between the platinum silicides (PtSi) 158a to 158t and a plating solution, and platinum (Pt) is formed on the surfaces of the platinum silicides (PtSi) 158a to 158t. In the embodiment, electrode made of platinum (Pt) is formed on the surfaces of the platinum silicides (PtSi) 158a to 158t by electric field plating, but electrode may be formed on the surfaces of the platinum silicides (PtSi) 158a to 158t by electroless plating. The electroless plating eliminates the need for wiring like the n-type polysilicon film 150a for allowing a current to flow from the substrate 100 into the platinum silicides (PtSi) 158a to 158t as described also in the first embodiment.

Next, an electrolyte material is deposited on the full face of the substrate 100 and electrolyte layers 202a to 202h are formed using CMP or etching back (FIGS. 80A to 80C). In the embodiment, CuS is used as the electrolyte material. Not only CuS, but also AgGeS, CuGeS, AgGeSe, etc., can be used as the electrolyte material.

Next, a resist mask is formed (not shown) and the portion indicated by G in FIG. 81A is etched and removed (FIGS. 81A to 81C). As the step is executed, the wiring used to form an electrode protective film (polysilicon film 150a) by electric field plating is removed and the source lines are electrically insulated from each other. Then, various wirings are formed and the memory device region 3 of the nonvolatile semiconductor memory 500 is complete.

After the step shown in FIGS. 80A to 80C, a resist mask may be formed (not shown), the portion indicated by E in FIGS. 37A to 37C in the first embodiment may be etched and removed, and the sources lines may be electrically insulated from each other. In this case, the plating wiring (polysilicon film 150a) portion remains. Then, various wirings are formed and the memory device region 3 of the nonvolatile semiconductor memory 500 is complete.

Eighth Embodiment (OTP Memory: One Time Programmable Memory)

In an eighth embodiment, a nonvolatile semiconductor memory with each memory device 15 having an insulating film of an oxide film, etc., between p and n of pn junction (OTP Memory: One Time Programmable Memory) will be discussed as an example of nonvolatile semiconductor memory.

A nonvolatile semiconductor memory 600 according to the eighth embodiment is similar to the nonvolatile semiconductor memory 1 or 200 according to the first or fourth embodiment except for the configuration of memory device region 3. Therefore, description of the components of the nonvolatile semiconductor memory 600 according to the eighth embodiment may be skipped.

In the nonvolatile semiconductor memory 600 according to the embodiment, each memory device 15 has an insulating film of an oxide film, etc., between p and n of pn junction. In the nonvolatile semiconductor memory 600, when data is written, a large current is made to flow into the memory device 15 and the insulating film existing between p and n of pn junction of the memory device 15 is dielectrically broken down. As the insulating film is dielectrically broken down, the memory device 15 operates as a diode. On the other hand, almost no current flows into each memory device 15 whose insulating film is not dielectrically broken down. Thus, a large difference occurs in the current amounts flowing into the memory devices 15 depending on whether or not the insulating film is dielectrically broken down. The current amount flowing into each memory device 15 is detected, whereby data stored in the memory device 15 is read.

FIGS. 83A, 83B and 83C show the schematic configuration of a part of a memory device region 3 of the nonvolatile semiconductor memory 600. FIG. 83C is a top view of the memory device region 3. In a part of FIG. 83C, the upper structure thereof is stripped for convenience of the description, as described above in the first embodiment. FIG. 83A is a sectional view of the memory device region 3 taken on line A-A' in FIG. 83C. FIG. 83B is a sectional view of the memory device region 3 taken on line B-B' in FIG. 83C. As shown in FIGS. 83A to 83C, the memory device region 3 has a configuration wherein memory device strings 28 each having a plurality of memory devices 15a to 15d stacked in a longitudinal direction are arranged like a matrix. If the minimum machining dimension is F in the memory device region 3, the length of the memory device 15 in the A-A' direction thereof is 3 F and the length in the B-B' direction is 2 F and if one memory device string has n memory devices 15 (if n memory devices are stacked), the effective area of each memory device 15 is 6 $F^2$/n.

FIG. 84A is a sectional view of a part of the memory device region 3 of the nonvolatile semiconductor memory 600 like FIG. 83B. FIG. 84B is a partially enlarged view of the memory device 15 and FIG. 84C is an equivalent circuit diagram of the memory device 15. FIG. 84D is an equivalent circuit diagram of a part of the nonvolatile semiconductor memory 600. As shown in FIG. 84A, the memory device region 3 has vertical transistors 20. A plurality of (in the embodiment, four) memory devices 15a to 15d are stacked on each of the vertical transistors 20. In the embodiment, a structure made up of a plurality of (in the embodiment, four) memory devices 15a to 15d stacked on each of the vertical transistors 20 is called memory device string 28. The memory device region 3 has 10×20=200 memory device strings 28 like that shown in FIGS. 1 and 49.

The memory device string 28 has the memory devices 15a to 15d. The memory device 15a has an n-type polysilicon layer 212a, an insulating film 210a, and a p-type polysilicon layer 144a. The memory device 15b has an n-type polysilicon layer 212a, an insulating film 210a, and a p-type polysilicon layer 144b. The memory device 15c has an n-type polysilicon layer 212a, an insulating film 210a, and a p-type polysilicon layer 144c. The memory device 15d has an n-type polysilicon layer 212a, an insulating film 210a, and a p-type polysilicon layer 144d.

The memory devices 15a to 15d making up one memory device string 28 have the common n-type polysilicon layer 212a and the common insulating film 210a. The p-type polysilicon layers 144a, 144b, 144c, and 144d form source lines 9 and are formed each like a plate. In the memory device region 3, every memory device string 28 has the p-type polysilicon layers 144a, 144b, 144c, and 144d in common.

The memory device 15a of the nonvolatile semiconductor memory 600 according to the embodiment has a structure wherein an insulating film (the insulating film 210a) of an oxide film, etc., is sandwiched between p and n of pn junction made up of the n-type polysilicon layer 212a, and the p-type polysilicon layer 144a. As describe above, the memory device 15a has a structure wherein the insulating film 210a is sandwiched between the n-type polysilicon layer 212a and the p-type polysilicon layer 144a. In the memory device 15a, the polysilicon layer 212a may be formed as p type and the polysilicon layer 144a as n type so that the pn junction becomes opposite as with other embodiments.

One end of the memory device 15 is connected to the source line 9 (SL) through a source line selection transistor 26 as with the first embodiment. The source line 9 has a flat structure made of the same layer (plate-like flat structure), as described above. An opposite end of the memory device 15 is connected to the bit line 5 (BL) through the vertical transistor 20. A bit line selection transistor 24 is connected to one end of the bit line 5 (BL). A signal is applied to the bit line 5 (BL) by the bit line selection transistor 24. The word line 11 (WL) is connected to a gate of the vertical transistor 20. A signal is applied to the word line 11 (WL) by a word line selection transistor 22.

One ends of the memory devices 15 stacked in the longitudinal direction are connected with each other and connected to the word line 11 (WL) through the vertical transistor 20, as shown in FIGS. 84A to 84D, as with the first embodiment.

While one memory device string 28 has been described in FIGS. 83A to 83C and 84A to 84D, every memory device string 28 has a similar configuration in the nonvolatile semiconductor memory 600. The number of the memory device strings 28 and the number of the memory devices 15 making up one memory device string 28 can be changed appropriately as desired in response to the memory capacity.

It can be considered that the nonvolatile semiconductor memory 600 according to the embodiment is similar to the nonvolatile semiconductor memory of unipolar operation described above in the first embodiment except that it cannot perform erasing operation. The read operation and the write operation of data in the nonvolatile semiconductor memory 600 according to the embodiment are similar to those described in the first embodiment and therefore will not be discussed again. In the nonvolatile semiconductor memory 600, examples of parameters of the memory device M and examples of voltages applied to the word lines WL1 to WL3, the source lines SL1 to SL3, and the bit lines BL1 to BL3 for selecting the memory device M (2, 1, 2) are shown below as in the second embodiment:

(Memory Device Parameters)
  Write voltage V_set=4.0 V
  Diode breakdown voltage VBD=2 V
(At Read Operation Time)
Voltage of word line connected to selected memory device M (2, 1, 2): Von=3 V
Voltage of any word line other than word line connected to selected memory device M (2, 1, 2): Voff=0 V
Voltage of source line connected to selected memory device M (2, 1, 2): VSLread=0 V
Voltage of any source line other than source line connected to selected memory device M (2, 1, 2): Floated
Voltage of bit line connected to selected memory device M (2, 1, 2): VBLread=1.0 V
Voltage of any bit line other than bit line connected to selected memory device M (2, 1, 2): Floated
(At Write Operation Time)
Voltage of word line connected to selected memory device M (2, 1, 2): Von=3 V
Voltage of any word line other than word line connected to selected memory device M (2, 1, 2): Voff=0 V
Voltage of source line connected to selected memory device M (2, 1, 2): VSLset=0 V
Voltage of any source line other than source line connected to selected memory device M (2, 1, 2): Floated
Voltage of bit line connected to selected memory device M (2, 1, 2): VBLset=5.0 V
Voltage of any bit line other than bit line connected to selected memory device M (2, 1, 2): Floated A manufacturing process of the nonvolatile semiconductor memory 600 according to the embodiment will be discussed. Parts similar to those of the manufacturing process of the nonvolatile semiconductor memory 1 according to the first embodiment will not be discussed again.

A resist mask is formed (not shown) and parts of silicon oxide films 130, 134, 138, 142, and 146 and p-type polysilicon films 132, 136, 140, and 144 are etched, thereby forming holes 154a to 154h and p-type polysilicon films 132a, 136a, 140a, and 144a (FIGS. 85A to 85C) as in the step previously described with reference to FIGS. 28A to 28C in the first embodiment. At this time, a silicon nitride film 128 functions as an etching stopper film. In the embodiment, cylindrical holes 154a to 154h are formed, but the invention is not limited to the cylindrical holes, and holes of various shapes of prism holes, elliptic cylindrical holes, etc., may be formed.

Next, an insulating film 210 is formed on the full face of a substrate 100 (FIGS. 86A to 86C). In the embodiment, a silicon nitride film having a thickness of about 2 nm is formed, but the thickness and the material of the insulating film are not limited to them.

Next, a part of the insulating film 210 and a part of the silicon nitride film 128 are etched and removed by reactive ion etching. Next, n-type polysilicon is deposited on the full face of the substrate 100 and n-type polysilicon layers 212a to 212h, and insulating films 210a to 210h are formed using CMP or etching back (FIGS. 87A to 87C). In the embodiment, n-type polysilicon is formed, but n-type amorphous silicon may be formed and annealed, thereby forming n-type polysilicon layers.

Then, various wirings are formed and the memory device region 3 of the nonvolatile semiconductor memory 600 is complete.

Ninth Embodiment

In the description of the first to eighth embodiments, each selection transistor 20 (vertical transistor 20) of the memory device region 3 is placed below the memory devices by way of example. In a ninth embodiment, an example wherein each selection transistor 20 of a memory device region 3 is placed above memory devices and an example wherein each selection transistor 20 is placed above and below memory devices will be discussed. The selection transistor placement examples of the embodiment can be applied to all embodiments described above.

In FIGS. 88A and 88B, the nonvolatile semiconductor memory 1 according to the first embodiment is taken as an example. FIG. 88A shows a configuration example wherein each selection transistor 20 of the memory device region 3 is placed below the memory devices as described above in the first to eighth embodiments.

FIG. 88B shows a configuration example wherein each selection transistor 20 of the memory device region 3 is placed above the memory devices. In the example shown in FIG. 88B, memory devices 15a to 15d are formed and then each selection transistor 20 is formed.

Figure 89:
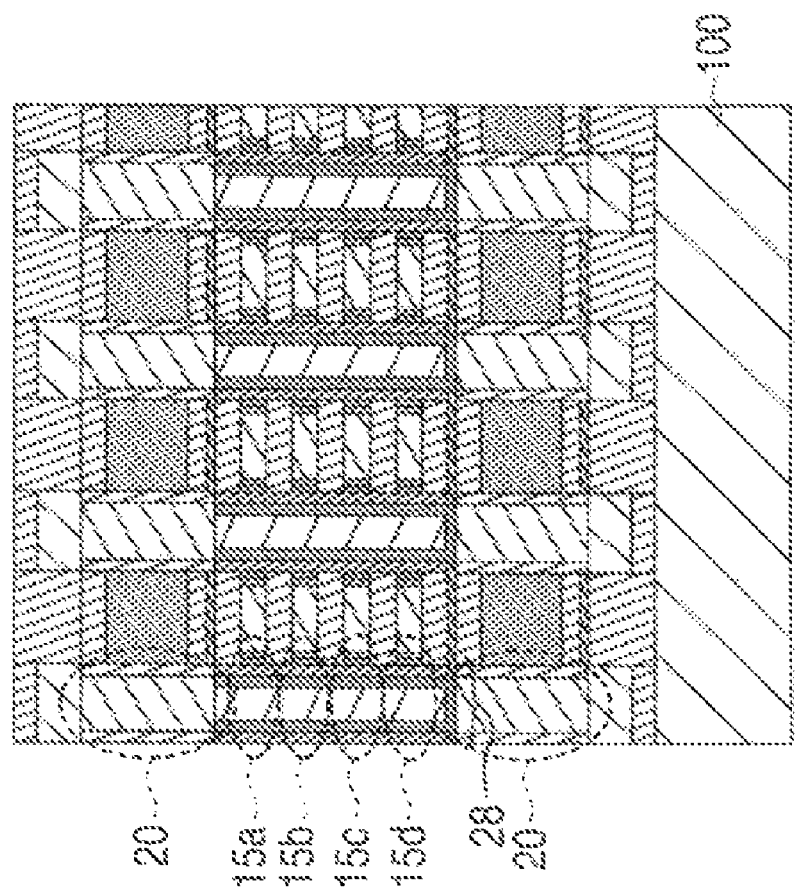
FIG. 89 is a sectional view of a memory device region of the nonvolatile semiconductor memory according to the tenth embodiment.

FIG. 89 shows a configuration example wherein each selection transistor 20 of the memory device region 3 is placed above and below the memory devices. In the example shown in FIG. 89, a lower selection transistor 20 is formed and memory devices 15a to 15d are formed and then an upper selection transistor 20 is formed. The structure shown in FIG. 89 is adopted, whereby the circuit configuration described with reference to FIGS. 10 to 12 can be implemented.

Tenth Embodiment

In the description of the first to eighth embodiments of the invention, the width of each memory device 15 and the selection transistor 20 of the memory device region 3 is smaller than the width of the word line WL and when viewed from above, the memory devices 15 and the selection transistor 20 are placed within the word line by way of example. In a tenth embodiment, the width of each memory device 15 and each selection transistor 20 of a memory device region 3 is larger than the width of a word line WL, and the memory devices 15 are placed protruding from the word line when viewed from above. The placement example of the memory devices 15 and the selection transistors 20 of the embodiment can be applied to all embodiments described above.

Figure 90A:
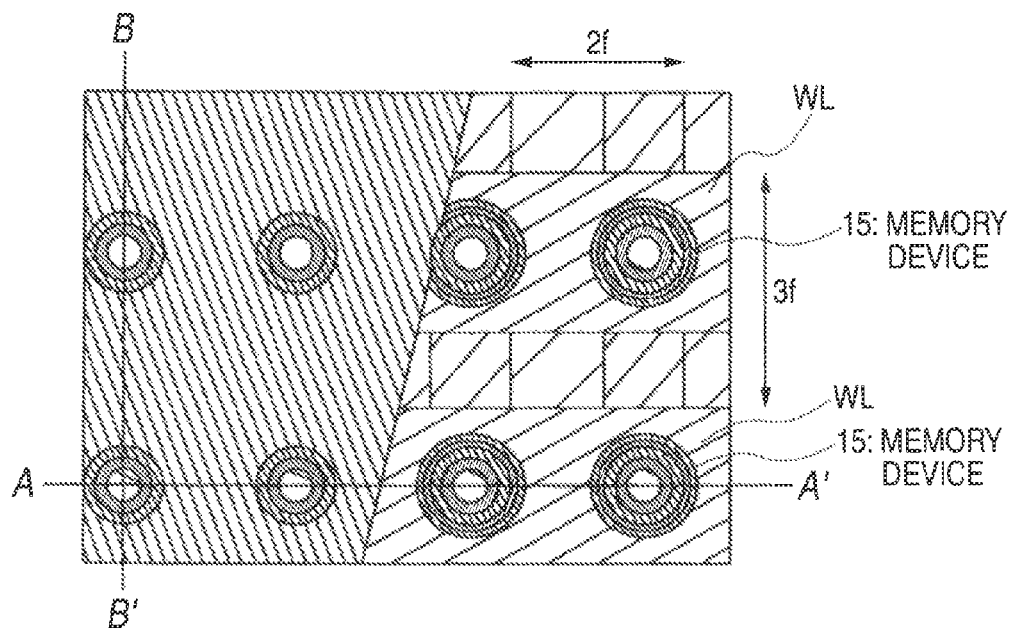
FIG. 90A is a top view of memory device region 3 of nonvolatile semiconductor memory according to one embodiment.
Figure 90B:
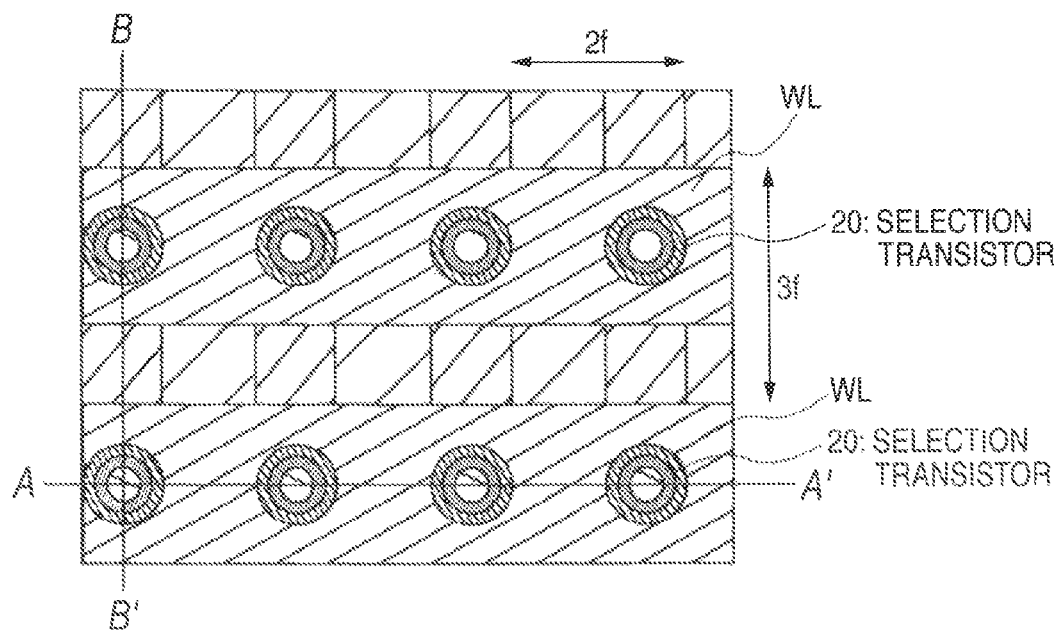
FIG. 90B is a top view of selection transistor section of nonvolatile semiconductor memory according to one embodiment.

In FIGS. 90A and 90B, the nonvolatile semiconductor memory 1 according to the first embodiment is taken as an example. FIG. 90A corresponds to FIG. 2C described above in the first embodiment. Also in a part of FIG. 90A, the upper structure thereof is stripped for convenience of the description. FIG. 90B is a top view to show the structure of selection transistor 20 section. In the examples shown in FIGS. 90A and 90B, if the minimum machining dimension is F, the length of the memory device 15 in the A-A' direction thereof is 3 F and the length in the B-B' direction is 2 F and if one memory device string has n memory devices 15 (if n memory devices are stacked), the effective area of each memory device 15 is 6 $F^2/n$.

Figure 91A:
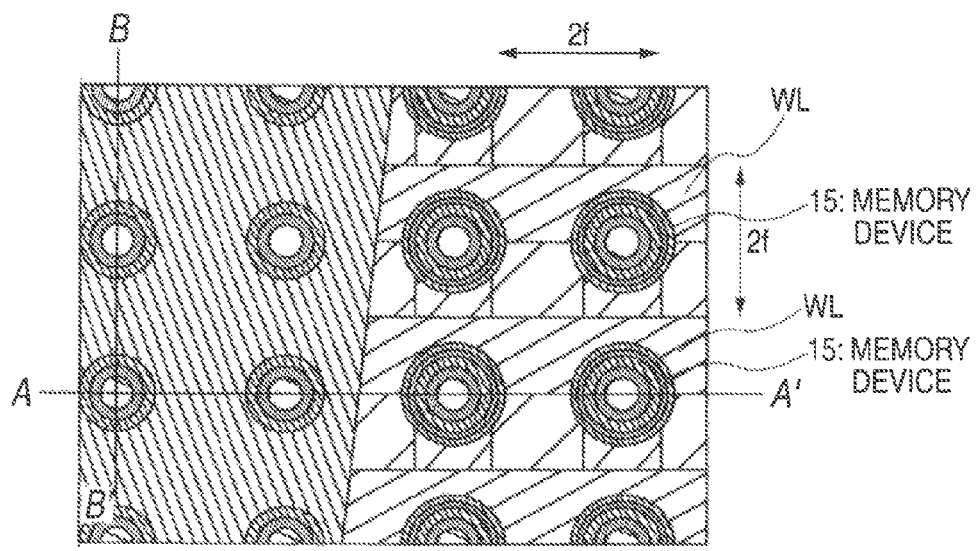
FIG. 91A is a top view of memory device region 3 of nonvolatile semiconductor memory according to one embodiment.
Figure 91B:
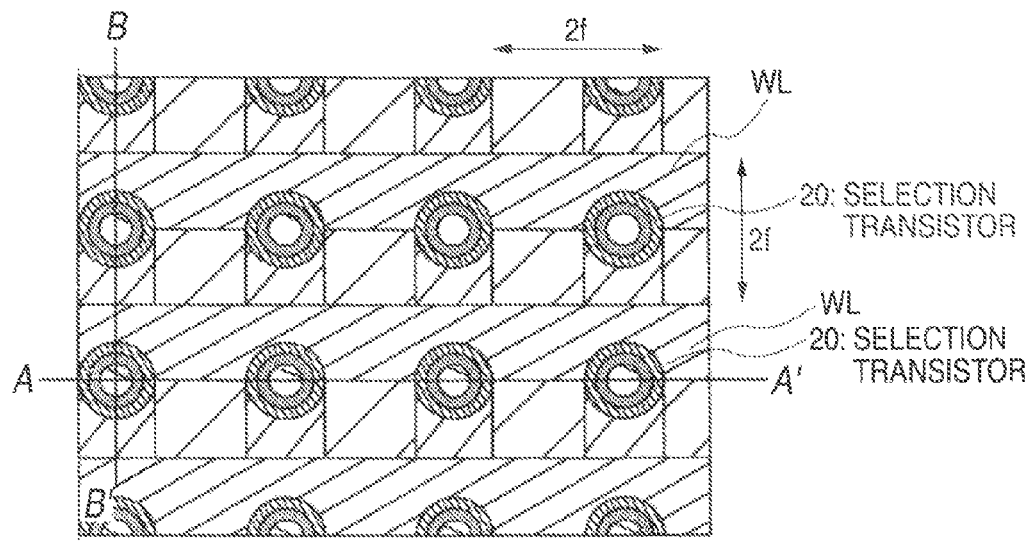
FIG. 91B is a top view of selection transistor section of nonvolatile semiconductor memory according to one embodiment.

Like FIG. 90A, FIG. 91A is a top view of the memory device region 3 of the nonvolatile semiconductor memory 1 according to the first embodiment. Also in a part of FIG. 91A, the upper structure thereof is stripped for convenience of the description. FIG. 91B is a top view to show the structure of selection transistor 20 section. In the embodiment, the width of each memory device 15 and each selection transistor 20 of the memory device region 3 is larger than the width of the word line WL, and the memory devices 15 are placed protruding from the word line when viewed from above. In the examples shown in FIGS. 91A and 91B, if the minimum machining dimension is F, the length of the memory device 15 in the A-A' direction thereof is 2 F and the length in the B-B' direction is 2 F and if one memory device string has n memory devices 15 (if n memory devices are stacked), the effective area of each memory device 15 is 4 $F^2/n$. Therefore, the placement structure of the memory devices and the selection transistors shown in FIGS. 91A and 91B is adopted, whereby nonvolatile semiconductor memory excellent in the area efficiency can be provided.

Although the present invention has been described in the descriptions of the embodiments thereof, it should not be understood that the description and the drawings constituting a part of the disclosure of the present invention limit this invention. Various alternative embodiments, examples and operation techniques will become apparent from this disclosure to those skilled in the art.

For example, although the source lines 9 of each layer are shaped in a plate-like shape, a slit (a groove) maybe formed in each of the source lines 9. Additionally, the source lines 9 of each layer may be shaped in a comb-like shape.

Although the electrically breakdownable insulating film is placed between p and n of pn junction of the memory device 15 in the nonvolatile semiconductor memory 600 according to the eighth embodiment, the electrically breakdownable insulating film may be placed in series of the pn junction.

According to an aspect of the present invention, there is provided a nonvolatile semiconductor memory in which chip area is reduced.

What is claimed is:

1. A nonvolatile semiconductor memory comprising:
   a semiconductor substrate;
   an insulating layer that is formed on the semiconductor substrate;
   a first conductive layer that is formed on the insulating layer;
   a plurality of first memory devices each including:
      a first outer semiconductor formed in the first conductive layer, the first outer semiconductor having a first characteristic that is one of a n-type or a p-type;
      a first inner semiconductor formed in the first outer semiconductor, the first inner semiconductor having a second characteristic that is the other of the n-type or the p-type; and
      a first resistance change element that is formed in the first inner semiconductor;
   an interlayer insulating layer that is formed on the first conductive layer;
   a second conductive layer formed on the interlayer insulating layer;
   a plurality of second memory devices each including:
      a second outer semiconductor formed in the second conductive layer, the second outer semiconductor having the first characteristic;
      a second inner semiconductor formed in the second outer semiconductor, the second inner semiconductor having the second characteristic; and
      a second resistance change element that is formed in the second inner semiconductor; and
   a columnar conductor penetrating through the first conductive layer, the interlayer insulating layer, and the second conductive layer in the first resistance change element and the second resistance change element.

2. The nonvolatile semiconductor memory according to claim 1, wherein the plurality of first and second memory devices are placed within the same plane.

3. The nonvolatile semiconductor memory according to claim 1, wherein the plurality of first and second memory devices are arranged in a matrix.

4. The nonvolatile semiconductor memory according to claim 1, further comprising:
   a plurality of word lines;
   a plurality of bit lines; and
   a plurality of selection transistors each including:
      a gate terminal connected to corresponding one of the plurality of word lines,
      a first terminal connected to corresponding one of the plurality of bit lines, and
      a second terminal connected to corresponding one of the other ends of the plurality of first and second memory devices.

5. The nonvolatile semiconductor memory according to claim 4, wherein the plurality of selection transistors are disposed below the plurality of first and second memory devices.

6. The nonvolatile semiconductor memory according to claim 4, wherein the plurality of selection transistors are disposed above the plurality of first and second memory devices.

7. The nonvolatile semiconductor memory according to claim 4, wherein the plurality of selection transistors are disposed below and above the plurality of first and second memory devices.

8. The nonvolatile semiconductor memory according to claim 1, wherein the plurality of first and second memory devices are placed within a plurality of parallel planes.

9. The nonvolatile semiconductor memory according to claim 8, wherein the plurality of first and second memory devices are placed within the plurality of parallel planes, and
wherein the plurality of first and second memory devices are arranged in a matrix in corresponding one of the plurality of parallel planes.

10. The nonvolatile semiconductor memory according to claim 1, wherein the first and second resistance change elements include:
a metal oxide.

11. The nonvolatile semiconductor memory according to claim 1, wherein the first and second resistance change elements include:
a phase change film.

12. The nonvolatile semiconductor memory according to claim 1, wherein the first and second resistance change elements include:
a ferromagnetic film.

13. The nonvolatile semiconductor memory according to claim 1, wherein the first and second resistance change elements include:
a CER material.

14. The nonvolatile semiconductor memory according to claim 1, wherein the first and second resistance change elements include:
an electrolyte material.

15. The nonvolatile semiconductor memory according to claim 1, wherein the first and second resistance change elements include:
an electrically breakdownable insulating film.

16. The nonvolatile semiconductor memory according to claim 1, wherein the first and second resistance change elements include:
a thin insulating film.

17. A nonvolatile semiconductor memory comprising:
a semiconductor substrate;
an insulating layer formed on the semiconductor substrate;
a first conductive layer formed on the insulating layer;
a first interlayer insulating layer formed on the first conductive layer;
a second conductive layer formed on the first interlayer insulating layer;
a first memory device including:
a first n-type semiconductor formed in the first conductive layer,
a first p-type semiconductor formed in the first n-type semiconductor,
a first metal silicide formed in the first p-type semiconductor, and
a first metal oxide formed in the first metal silicide;
a second memory device including:
a second n-type semiconductor formed in the second conductive layer,
a second p-type semiconductor formed in the second n-type semiconductor,
a second metal silicide formed in the second p-type semiconductor, and
a second metal oxide formed in the second metal silicide; and
a columnar conductor penetrating through the first conductive layer, the first interlayer insulating layer and the second conductive layer in the first metal oxide and the second metal oxide.

18. A nonvolatile semiconductor memory comprising:
a semiconductor substrate;
an insulating layer that is formed on the semiconductor substrate;
a first conductive layer that is formed on the insulating layer;
a plurality of first memory devices each including:
a first outer semiconductor formed in the first conductive layer, the first outer semiconductor having a first characteristic that is one of a n-type or a p-type; and
a first inner semiconductor formed in the first outer semiconductor, the first inner semiconductor having a second characteristic that is the other of the n-type or the p-type;
an interlayer insulating layer that is formed on the first conductive layer;
a second conductive layer formed on the interlayer insulating layer;
a plurality of second memory devices each including:
a second outer semiconductor formed in the second conductive layer, the second outer semiconductor having the first characteristic; and
a second inner semiconductor formed in the second outer semiconductor, the second inner semiconductor having the second characteristic; and
an electrolyte material formed to fill-up a hole penetrating through the first conductive layer, the interlayer insulating layer, and the second conductive layer in the first inner semiconductor and the second inner semiconductor.

* * * * *